US008035028B2

(12) United States Patent
Moslehi

(10) Patent No.: US 8,035,028 B2
(45) Date of Patent: *Oct. 11, 2011

(54) PYRAMIDAL THREE-DIMENSIONAL THIN-FILM SOLAR CELLS

(75) Inventor: Mehrdad Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 319 days.

This patent is subject to a terminal disclaimer.

(21) Appl. No.: 11/868,493

(22) Filed: Oct. 6, 2007

(65) Prior Publication Data

US 2008/0289684 A1  Nov. 27, 2008

Related U.S. Application Data

(60) Provisional application No. 60/828,678, filed on Oct. 9, 2006, provisional application No. 60/886,303, filed on Jan. 24, 2007.

(51) Int. Cl.
*H01L 31/00* (2006.01)
(52) U.S. Cl. .......................... 136/255; 136/256; 136/261
(58) Field of Classification Search .................. 136/255, 136/256, 261
See application file for complete search history.

(56) References Cited

U.S. PATENT DOCUMENTS

| 4,043,894 | A | 8/1977 | Gibbs |
| 4,070,206 | A | 1/1978 | Kressel et al. |
| 4,082,570 | A | 4/1978 | House et al. |
| 4,165,252 | A | 8/1979 | Gibbs |
| 4,249,959 | A | 2/1981 | Jebens |
| 4,251,679 | A | 2/1981 | Zwan |
| 4,348,254 | A | 9/1982 | Lindmayer |
| 4,361,950 | A | 12/1982 | Amick |
| 4,409,423 | A | 10/1983 | Holt |
| 4,427,839 | A | 1/1984 | Hall |
| 4,461,922 | A | 7/1984 | Gay et al. |
| 4,479,847 | A | 10/1984 | McCaldin et al. |
| 4,626,613 | A * | 12/1986 | Wenham et al. ............. 136/255 |
| 4,672,023 | A | 6/1987 | Leung |
| 4,922,277 | A | 5/1990 | Carlson |
| 5,024,953 | A * | 6/1991 | Uematsu et al. ................ 438/71 |
| 5,073,230 | A | 12/1991 | Maracas et al. |

(Continued)

FOREIGN PATENT DOCUMENTS

JP         06-260670 A        9/1994

(Continued)

OTHER PUBLICATIONS

K.Van Nieuwenhuysen et al, Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

(Continued)

*Primary Examiner* — Basia Ridley
*Assistant Examiner* — Allison Bourke
(74) *Attorney, Agent, or Firm* — Hulsey, P.C.; William N. Hulsey, III; John Temple Keller

(57) ABSTRACT

A pyramidal three-dimensional thin-film solar cell, comprising a pyramidal three-dimensional thin-film solar cell substrate comprising a plurality of pyramid-shaped unit cells with emitter junction regions and doped base regions, emitter metallization regions and base metallization regions. Optionally, the pyramidal three-dimensional thin-film solar cell may be mounted on a rear mirror for improved light trapping and conversion efficiency.

7 Claims, 84 Drawing Sheets

U.S. PATENT DOCUMENTS

| | | | |
|---|---|---|---|
| 5,112,453 | A | 5/1992 | Behr et al. |
| 5,208,068 | A | 5/1993 | Davis |
| 5,248,621 | A | 9/1993 | Sano |
| 5,316,593 | A | 5/1994 | Olson et al. |
| 5,348,618 | A | 9/1994 | Canham et al. |
| 5,397,400 | A | 3/1995 | Matsuno et al. |
| 5,458,755 | A | 10/1995 | Fujiyama et al. |
| 5,459,099 | A | 10/1995 | Hsu |
| 5,494,832 | A | 2/1996 | Lehmann et al. |
| 5,538,564 | A | 7/1996 | Kaschmitter |
| 5,645,684 | A | 7/1997 | Keller |
| 5,660,680 | A | 8/1997 | Keller |
| 5,681,392 | A | 10/1997 | Swain |
| 5,882,988 | A | 3/1999 | Haberern et al. |
| 5,899,360 | A | 5/1999 | Mack et al. |
| 5,928,438 | A | 7/1999 | Salami |
| 6,058,945 | A | 5/2000 | Fujiyama et al. |
| 6,091,021 | A | 7/2000 | Ruby |
| 6,096,229 | A | 8/2000 | Shahid |
| 6,114,046 | A | 9/2000 | Hanoka |
| 6,127,623 | A | 10/2000 | Nakamura et al. |
| 6,143,629 | A | 11/2000 | Sato |
| 6,204,443 | B1 | 3/2001 | Kiso et al. |
| 6,225,193 | B1 | 5/2001 | Simpson et al. |
| 6,294,725 | B1 | 9/2001 | Hirschberg et al. |
| 6,331,208 | B1 | 12/2001 | Nishida et al. |
| 6,399,143 | B1 | 6/2002 | Sun et al. |
| 6,416,647 | B1 | 7/2002 | Dordi et al. |
| 6,428,620 | B1 | 8/2002 | Yamagata et al. |
| 6,429,037 | B1 | 8/2002 | Wenham et al. |
| 6,441,297 | B1 | 8/2002 | Keller et al. |
| 6,448,155 | B1 | 9/2002 | Iwasaki et al. |
| 6,461,932 | B1 | 10/2002 | Wang |
| 6,524,880 | B2 | 2/2003 | Moon et al. |
| 6,534,336 | B1 | 3/2003 | Iwane |
| 6,551,908 | B2 | 4/2003 | Ukiyo et al. |
| 6,555,443 | B1 | 4/2003 | Artmann et al. |
| 6,566,235 | B2 | 5/2003 | Nishida et al. |
| 6,602,760 | B2 | 8/2003 | Poortmans et al. |
| 6,602,767 | B2 | 8/2003 | Nishida et al. |
| 6,613,148 | B1 | 9/2003 | Rasmussen |
| 6,624,009 | B1 | 9/2003 | Green et al. |
| 6,645,833 | B2 | 11/2003 | Brendel |
| 6,649,485 | B2 | 11/2003 | Solanki et al. |
| 6,653,722 | B2 | 11/2003 | Blalock |
| 6,664,169 | B1 | 12/2003 | Iwasaki et al. |
| 6,756,289 | B1 | 6/2004 | Nakagawa et al. |
| 6,818,104 | B2 | 11/2004 | Iwasake et al. |
| 6,881,644 | B2 | 4/2005 | Malik et al. |
| 6,946,052 | B2 | 9/2005 | Yanagita et al. |
| 6,964,732 | B2 | 11/2005 | Solanki |
| 7,014,748 | B2 | 3/2006 | Matsumura et al. |
| 7,022,585 | B2 | 4/2006 | Solanki et al. |
| 7,026,237 | B2 | 4/2006 | Lamb |
| 7,309,658 | B2 | 12/2007 | Lazovsky et al. |
| 7,368,756 | B2 | 5/2008 | Bruhns et al. |
| 7,402,523 | B2 | 7/2008 | Nishimura |
| 2002/0153039 | A1 | 10/2002 | Moon et al. |
| 2002/0168592 | A1 | 11/2002 | Vezenov |
| 2002/0179140 | A1 | 12/2002 | Toyomura |
| 2003/0017712 | A1 | 1/2003 | Brendel |
| 2003/0039843 | A1 | 2/2003 | Johnson |
| 2003/0124761 | A1 | 7/2003 | Baert |
| 2004/0028875 | A1 | 2/2004 | Van Rijn |
| 2004/0173790 | A1 | 9/2004 | Yeo |
| 2004/0175893 | A1 | 9/2004 | Vatus et al. |
| 2004/0192044 | A1 | 9/2004 | Degertekin et al. |
| 2004/0259335 | A1 | 12/2004 | Narayanan |
| 2004/0265587 | A1 | 12/2004 | Koyanagi |
| 2005/0160970 | A1 | 7/2005 | Niira |
| 2005/0172998 | A1 | 8/2005 | Gee et al. |
| 2005/0176164 | A1 | 8/2005 | Gee et al. |
| 2005/0177343 | A1 | 8/2005 | Nagae |
| 2005/0199279 | A1 | 9/2005 | Yoshimine et al. |
| 2005/0272225 | A1 | 12/2005 | Weber et al. |
| 2005/0274410 | A1 | 12/2005 | Yuuki et al. |
| 2005/0281982 | A1 | 12/2005 | Li |
| 2006/0021565 | A1 | 2/2006 | Zahler et al. |
| 2006/0043495 | A1 | 3/2006 | Uno |
| 2006/0054212 | A1 | 3/2006 | Fraas et al. |
| 2006/0070884 | A1 | 4/2006 | Momoi et al. |
| 2006/0105492 | A1 | 5/2006 | Veres et al. |
| 2006/0177988 | A1 | 8/2006 | Shea et al. |
| 2006/0196536 | A1 | 9/2006 | Fujioka |
| 2006/0231031 | A1 | 10/2006 | Dings et al. |
| 2006/0266916 | A1 | 11/2006 | Miller et al. |
| 2006/0283495 | A1 | 12/2006 | Gibson |
| 2006/0286775 | A1 | 12/2006 | Singh et al. |
| 2007/0077770 | A1 | 4/2007 | Wang et al. |
| 2007/0082499 | A1 | 4/2007 | Jung et al. |
| 2008/0047601 | A1 | 2/2008 | Nag et al. |
| 2008/0128641 | A1 | 6/2008 | Henley et al. |
| 2008/0157283 | A1 | 7/2008 | Moslehi |
| 2008/0210294 | A1 | 9/2008 | Moslehi |
| 2008/0264477 | A1 | 10/2008 | Moslehi |
| 2008/0289684 | A1 | 11/2008 | Moslehi |
| 2008/0295887 | A1 | 12/2008 | Moslehi |
| 2009/0042320 | A1 | 2/2009 | Wang et al. |
| 2009/0107545 | A1 | 4/2009 | Moslehi |
| 2009/0301549 | A1 | 12/2009 | Moslehi |
| 2010/0022074 | A1 | 1/2010 | Wang et al. |
| 2010/0116316 | A1 | 5/2010 | Moslehi et al. |

FOREIGN PATENT DOCUMENTS

| | | |
|---|---|---|
| JP | 2002-299661 A | 10/2002 |
| JP | 20022299661 A | 10/2002 |
| WO | PCT/EP99/08573 | 5/2000 |
| WO | WO 00/28116 | 5/2000 |

OTHER PUBLICATIONS

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

J.H.Werner et al, From Polycrystalline to Single Crystalline Silicon on Glass, Thin Solid Films, 2001, pp. 95-100, vol. 383, Issue 1-2, Elsevier Science B.V., Germany.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

Takao Yonehara, et al, Epitaxial Layer Transfer by Bond and Etch Back of Porous Si, Applied Physics Letter 64, Apr. 18, 1994, vol. 16, American Institute of Physics.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

F.Duerinckx, et al, Reorganized Porous Silicon Bragg Reflectors for Thin-Film Silicon Solar Cells, IEEE Electron Device Letters, Oct. 2006, vol. 27, No. 10.

C.Berge, 150-mm Layer Transfer for Monocrystalline Silicon Solar Cells, Solar Energy Materials & Solar Cells, 2006, pp. 3102-3107, vol. 90, Elsevier B.V.

Alvin D. Compaan, Photovoltaics: Clean Power for the 21st Century, Solar Energy Materials & Solar Cells, 2006, pp. 2170-2180, vol. 90, Elsevier B.V.

H.J.Kim, et al, Large-Area Thin-Film Free-Standing Monocrystalline Si Solar cells by Layer Transfer, Leuven, Belgium, IEEE.

S.Hegedus, Thin Film Solar Modules: The Low Cost, High Throughput and Versatile Alternative to Si Wafers, Progress in Photovoltaics: Research and Applications, 2006, pp. 393-411, vol. 14, John Wiley & Sons, Ltd.

P.R.Hageman, et al, Large Area, Thin Film Epitaxial Lift Off III/V Solar Cells, 25th PVSC, 1996, May 13-17, Washington D.C., IEEE.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

K.L.Chopra, et al, Thin-Film Solar Cells: An Overview, Progress in Photovoltaics: Research and Applications, 2004, pp. 69-92, vol. 12, John Wiley & Sons, Ltd.

Richard M. Swanson, A Vision for Crystalline Silicon Photovoltaics, Progress in Photovoltaics: Research and Applications, 2006, pp. 443-453, vol. 14, John Wiley & Sons, Ltd.

Prometheus Institute, U.S. Solar Industry Year in Review: U.S. Solar Energy Industry Charging Ahead, (SEIA) The Solar Energy Industry Association.

Francois J. Henley, Layer-Transfer Quality Cleave Principles, SiGen, 2005, Jul. 8, pp. 1-6, The Silicon Genesis Corporation, San Jose, California.

Photovoltaic Technology Research Advisory Council, A Vision for Photovoltaic Technology, 2005, pp. 1-41, European Commission Publications Office.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Alvin D. Compaan, Photovoltaics: Clean Power for the 21st Century, Solar Energy Materials & Solar Cells, 2006, pp. 2170-2180, vol. 90, Elsevier B.V.

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342, 1977.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association, 2006.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

Competitive Advantages of Current Invention

1. < 1 gram of silicon per watt
2. Decoupled from silicon supply chain
3. No polysilicon feedstock cost
4. No crystal growth cost
5. No wire saw cost
6. No wafer saw damage removal cost
7. No texturing cost
8. No lithography cost for cell processing
9. Fewer process steps - self aligned flow
10. Reduced PV fab capital cost
11. >60% reduction in module mfg. cost/Wp
12. Ultra-high-efficiency cells & modules

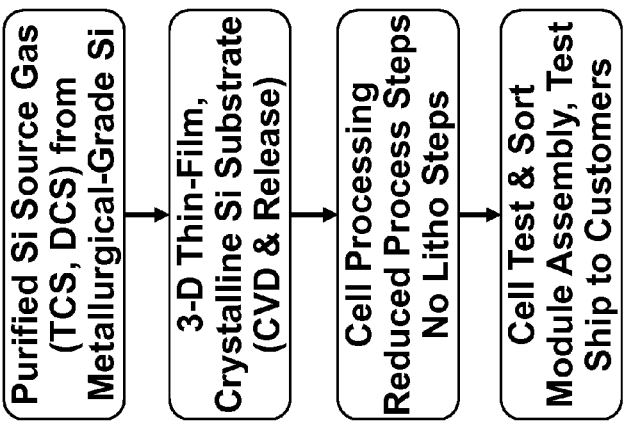

Purified Si Source Gas (TCS, DCS) from Metallurgical-Grade Si → 3-D Thin-Film, Crystalline Si Substrate (CVD & Release) → Cell Processing Reduced Process Steps No Litho Steps → Cell Test & Sort Module Assembly, Test Ship to Customers

*FIG. 4*

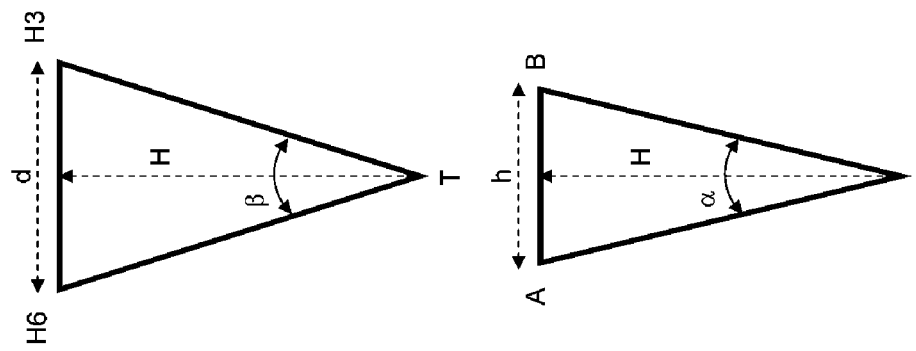
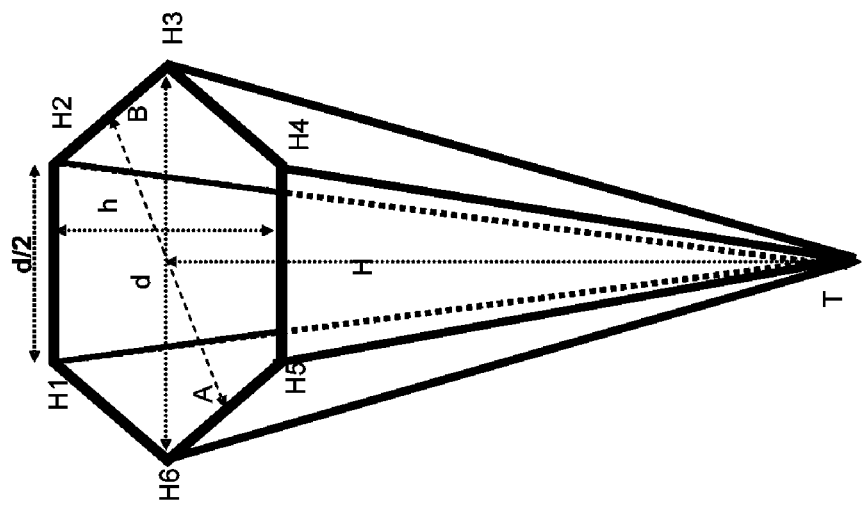
FIG. 65

PYRAMIDAL THREE-DIMENSIONAL THIN-FILM SOLAR CELLS

This application claims the benefit of provisional patent applications 60/828,678 filed on Oct. 9, 2006 and 60/886,303 filed on Jan. 24, 2007, which are hereby incorporated by reference.

FIELD

This disclosure relates in general to the field of photovoltaics and solar cells, and more particularly to three-dimensional (3-D) Thin-Film Solar Cells (TFSCs) and methods for manufacturing same. Even more particularly, the presently disclosed subject matter relates to pyramidal 3-D TFSCs and methods for manufacturing same.

DESCRIPTION OF THE RELATED ART

Renewable, high-efficiency, and cost-effective sources of energy are becoming a growing need on a global scale. Increasingly expensive, unreliable, and environmentally-risky fossil fuels and a rising global demand for energy, including electricity, have created the need for alternate, secure, clean, widely available, cost-effective, environmentally-friendly, and renewable forms of energy. Solar photovoltaic (PV) electricity generation using solar cells is uniquely suited to meet the needs of residential, commercial, industrial, and centralized utility applications. Key attributes that make solar energy attractive are the abundant, worldwide, point-of-use supply of sunlight, environmental friendliness, scalability (from milliwatts to megawatts), secure point-of-use generation of solar electricity, and excellent distributed energy economics. The sun provides more energy to the earth in one hour than the annual energy consumption of the entire world. Much of the earth's surface receives a significant amount of annual sun-hours which may be effectively harnessed for clean and secure electricity generation. A key driver for this market pull is a rising public awareness of environmentally-benign technologies. However, due to relatively low solar cell efficiencies (e.g., less than 12% for most thin-film technologies and roughly 12% to 18% for most crystalline silicon solar cell technologies), high costs of raw materials (e.g., silicon for crystalline silicon wafer solar cells) and manufacturing processes, limitations on cost-effective and efficient electrical storage, and a general lack of infrastructure to support solar cell proliferation, to date there has been limited use of this energy solution (currently, electricity generation by solar photovoltaics accounts for less than 0.1% of total worldwide electricity generation).

For commercial applications, cost of energy to the end-user (e.g., in cents/kWh for electricity) should be sufficiently low and comparable to or even better than that from utility grids using conventional electricity generation sources. The solar photovoltaic electricity generation, which currently accounts for less than 0.1% of the global electricity generation, may be substantially expanded if it achieves cost parity with conventional grid electricity. As the costs of solar cells and modules (typically expressed as $/W$_p$) are reduced, grid-tied solar photovoltaic applications are gaining acceptance at an accelerated pace, making them an attractive option for significant proliferation in electricity generation.

In the price-sensitive solar cell market, two principal technology options exist. On the one hand, crystalline silicon (c-Si) wafers may serve as the basis for solar cell formation (currently accounting for more than 90% of the solar PV market). On the other hand, thin-film (amorphous and polycrystalline) technologies using silicon and other semiconductor absorber materials (such as amorphous silicon, CdTe, or CIGS) may offer significant cost advantages compared to crystalline silicon wafer-based solar cells. These different approaches are at opposite ends of the price-performance scale. Crystalline silicon wafers offer higher performance, but at higher costs (due to the relatively high cost of starting monocrystalline and multicrystalline silicon wafers). Thin-film technologies may offer lower manufacturing costs, but typically at lower performance levels (i.e., lower efficiencies). For both approaches, the price-per-watt typically increases as cell efficiencies rise (due to higher material and/or manufacturing costs).

Due to a rapid annual growth rate of more than 40% during the past ten years and the concurrent demands for silicon material by both semiconductor microelectronics and solar PV industries, the solar PV industry has been experiencing a shortage of polysilicon feedstock supply. The polysilicon feedstock shortage has significantly constrained the solar PV industry growth, particularly during the past several years. In fact, the solar cell industry currently consumes over half of the worldwide production of high-purity polysilicon feedstock. Within the last few years, the contract price of polysilicon has increased from roughly $30/kg to roughly $85/kg, with spot prices exceeding $250/kg. This has led to large increases in the price of monocrystalline and multicrystalline silicon wafers, which now account for roughly half of the total solar module manufacturing cost.

The trend in the mainstream crystalline silicon (c-Si) wafer solar cell industry has been to scale down wafer thicknesses to below 200 microns (in order to reduce the amount of silicon material in grams used per watt of solar cell rated peak power). For example, monocrystalline silicon wafer solar cells are projected to scale down to a thickness of roughly 120 microns by 2012, from a current wafer thickness of roughly 200 microns. Multicrystalline silicon wafer solar cells are projected to scale down to a thickness of roughly 180 microns by 2012, from a current average wafer thickness of roughly 260 microns. This wafer thickness reduction, however, presents additional challenges related to mechanical rigidity, manufacturing yield, and solar cell efficiency. Despite its high cost, crystalline silicon (c-Si) technology still dominates the solar cell market, mainly due to higher efficiencies and synergies with the established microelectronics industry and supply chain. Currently, c-Si accounts for slightly over 90% of the solar cell market (95% when ribbon silicon is included).

Historically, crystalline silicon solar cells have achieved a 20% cost reduction for each doubling of cumulative global cell production (measured in megawatts or MW$_p$ and gigawatts or GW$_p$). It is projected that through innovative cost reduction and efficiency enhancement methods, the cost of electricity derived from grid-connected rooftop solar photovoltaic modules may become comparable to the cost of electricity purchased from the utility grid in five to ten years. A 2005 survey of the commercially available monocrystalline silicon and multicrystalline silicon solar modules reports the solar module efficiencies then in the range of 9.1% to 16.1%, with a median efficiency value of about 12.5%. Commercial crystalline silicon modules usually show a rapid initial efficiency degradation of 1% to 3% (relative) due to various effects, including photodegradation effects in wafered solar cells (e.g., wafer minority carrier lifetime degradation). Monocrystalline silicon wafer solar cell efficiencies are projected to increase to roughly 20.5% by 2012, from a current efficiency of roughly 16.5% (leading-edge commercially available monocrystalline silicon solar cell and solar module efficiencies are currently about 21.5% and 18%, respectively). Multicrystalline silicon wafer solar cell efficiencies are projected to increase to roughly 18% by 2012, from a current efficiency level of roughly 15.5%.

State-of-the-art crystalline silicon solar cell manufacturing currently uses about 10 grams of high-purity polysilicon feedstock per peak watt ($g/W_p$), resulting in a polysilicon feedstock material cost of about $0.85/W_p$ (assuming a polysilicon price of $85/kg). Over the next five years, the projected trends of solar cell wafer thickness reduction (e.g., to less than 200 micron wafers) and a long-term assumed price of about $20/kg for solar-grade polysilicon may reduce the polysilicon feedstock cost (in $g/W_p$) by about a factor of four to eight to about $0.10/W_p$ to $0.20/W_p$. Thus, any competing solar cell technologies should benchmark their manufacturing cost goals against this reduced raw material cost number. For a given cell efficiency, silicon wafer thickness reduction presents a prime opportunity for solar cell cost reduction by reducing the amount of polysilicon feedstock consumed per watt of peak solar power.

The cost associated with wire saws, amounting to about $0.25/W_p$ for current silicon solar cells provides another wafer-related cost component for silicon wafer solar cells. Innovative and cost-effective technologies that eliminate the kerf losses associated with sawing and slicing should further facilitate silicon solar cell cost reductions. It is projected that the wafer-based crystalline silicon solar module manufacturing cost (which is currently on the order of $2.10 per watt to more than $2.70 per watt) may be reduced to the range of roughly $1.50/W_p$ to $1.80/W_p$ by the year 2012, in part due to wafer sawing kerf loss reduction to roughly 130 microns by 2012 from the current value of roughly 200 microns. The overall cost reductions for wafer-based crystalline silicon solar cells may come from various sources including: lower cost polysilicon feedstock, thinner wafers, higher cell-level efficiencies, reduced wafer sawing kerf losses, and increased economy of scale or manufacturing volume.

State-of-the-art silicon wafer solar cell fabrication facilities ("solar fabs") typically produce 125 mm×125 mm up to 156 mm×156 mm solar cells today. The trend in crystalline silicon wafer solar cells is toward thinner and larger wafers. The monocrystalline and cast (as well as ribbon) multicrystalline silicon solar cell wafer thicknesses in leading-edge solar cells used for power generation modules are projected to be reduced to around 150 and 200 microns, respectively, by around 2009-2010. Any cost-effective, high-efficiency, innovative silicon solar cell technology which enables a substantial reduction of the silicon material consumption (e.g., wafer or film thickness) per $W_p$ of cell power compared to the above-mentioned current and projected 2009-2010 numbers may offer significant promise as a viable commercial solar cell technology for solar photovoltaic applications (e.g., residential, commercial, and industrial rooftop as well as large-scale centralized utilities electrical power generation applications).

Higher solar cell efficiencies have favorable effects on the entire solar cell value chain and levelized cost of energy (LCOE in $/kWh) due to reduced material consumption and cost as well as reduced balance-of-system (BOS) costs (e.g., area-related solar module installation and inverter costs). The current mainstream commercial crystalline solar cells provide efficiencies on the order of 14% to 17%. It is expected that the projected crystalline silicon solar cell efficiencies in commercial solar cells may approach around 19% and 17% for monocrystalline and multicrystalline silicon solar cells, respectively, by the year 2009. A key area for new solar cell business opportunities is development of innovative cell structures and simplified process flows which may drive efficiencies up while lowering overall solar cell and module manufacturing costs. For alternative (e.g., thin-film PV) approaches to succeed over the mainstream wafer-based crystalline silicon solar cell technologies, they should provide higher efficiencies at even lower manufacturing costs compared to the projected efficiency and cost numbers for the mainstream wafer-based crystalline silicon solar cells when the new technology is fully commercialized.

Economy-of-scale fab cost reduction associated with high-volume solar fab capacities is a key factor impacting LCOE. The state-of-the-art high-volume solar photovoltaic fabs have annual production capacities on the order of or in excess of 50 $MW_p$ to 100 $MW_p$ ($MW_p$=1 million $W_p$). High-volume solar photovoltaic fab capacities are expected to increase substantially to annual production rates of several hundred MWP or even approaching 1 $GW_p$ ($GW_p$=1 billion $W_p$) in the coming decade. While very-high-volume solar fabs in the range of 100 $MW_p$ to 1 $GW_p$ should facilitate longer term cost reductions (including LCOE) through high-volume manufacturing economies of scale, the relatively high initial fab investment costs, which may easily exceed $100M, may impose certain limits on solar photovoltaic fab construction options. Ideally, the preference may be to develop innovative crystalline silicon solar cell designs and simplified manufacturing processes which facilitate substantial manufacturing cost reductions in solar cells and modules even in smaller-scale (and less capital intensive) fabs with modest production volumes (e.g., annual production volumes in the range of 5 $MW_p$ to 50 $MW_p$). This type of technology would allow for modest-volume solar photovoltaic fabs with modest fab setup and operation costs. Reduced fab setup and operation costs would further facilitate global proliferation of cost-effective solar modules, enabling construction of a multitude of very affordable modest-volume fabs (in contrast to having to set up very expensive high-volume fabs in order to achieve sufficient economy of scale for manufacturing cost reduction). Of course, an innovative solar cell technology that meets the above-mentioned criteria for cost-effective, modest-volume fabs (i.e., meeting the LCOE roadmap requirements even at modest production volumes in low-cost fabs set up for simplified solar cell processing), may also be applicable to very-high-volume (e.g., greater than 100 $MW_p$) solar fabs. Such solar photovoltaic fabs can take further advantage of the economies of scale associated with increased volume.

Thin-film solar cell (TFSC) technologies (e.g., amorphous silicon, CdTe, and CIGS) require little absorber material (usually much less than 10 microns in thickness) to absorb typical standard "Air Mass 1.5" (AM-1.5) solar illumination due to absorption bands that are well matched to the solar spectrum. The TFSC absorber material may be deposited on inexpensive substrates such as glass or flexible metallic or non-metallic substrates. TFSCs typically offer low cost, reduced module weight, reduced materials consumption, and a capability for using flexible substrates, but are usually much lower in efficiency (e.g., usually 5% to 12%). In the case of prior art thin crystalline silicon films, there are a number of major problems and challenges with the use of flat silicon films (such as epitaxially growth silicon films with thicknesses below 50 microns) for low-cost, high-performance solar cells. These include: relatively low solar module efficiencies (typically 7% to 12%), field degradation of module efficiencies, scarce and expensive absorber materials (e.g., In and Se for CIGS and Te for CdTe), limited validation of system field reliability, and adverse environmental impact of non-silicon technologies such as CIS/CIGS and CdTe.

Prior art FIG. 1 shows process flow 10 for fabricating c-Si TFSCs using planar silicon thin-film absorber layers produced by epitaxial silicon. This prior art TFSC fabrication process flow uses several shadow mask process steps to form the cell structure. The cell absorber is simply a thin planar film of c-Si formed by silicon epitaxial growth processing. The cell uses frontside silicon texturing to improve light trapping and a detached rear aluminum mirror to improve the cell efficiency. Step 12 starts with single-crystal p$^+$ CZ silicon. Step 14 involves electrochemical HF etching of silicon to form 2-layer porous silicon comprising a 1 micron top layer with 20% porosity and a 200 nanometer rear layer with greater than 50% porosity. Step 16 involves a hydrogen (H$_2$) anneal at 1100° C. for 30 minutes. Step 18 involves epitaxial silicon growth at 1100° C. using trichlorosilane or SiHCl$_3$ (deposition rate of 1 micron per minute), forming 2 microns of p$^{+-}$Si and 30 microns of p-Si. Step 20 involves frontside surface texturing by wet KOH etching to form upright surface pyramids. Step 22 involves the first shadow mask process, with LPCVD silicon nitride (SiN$_x$) deposition through a shadow mask to define emitter diffusion windows. Step 24 involves solid source phosphorus diffusion at 830° C. (to achieve 80Ω/square for the n$^+$ doped junction). Step 26 involves the second shadow mask process, with frontside metallization (titanium/Pd/silver grid) by evaporation through shadow mask. Step 28 involves emitter surface passivation by hydrogenated PVD or PECVD SiN$_x$. Step 30 involves contact frontside busbar by a conductive adhesive. Step 32 involves gluing the cell frontside to MgF$_2$-coated glass using clear glue. Step 34 involves separating the cell from silicon wafer by mechanical stress. Step 36 involves the third shadow mask process, with backside aluminum metallization using evaporation through shadow mask. Finally, step 38 involves attaching an aluminum reflector at 200 micron spacing from the cell backside.

Prior art FIG. 2 shows another process flow method 40 for fabrication of solar cells on silicon wafers with self-aligned selective emitter and metallization. This prior art process uses laser processing to pattern the top cell dielectric layer while melting the underlying silicon to form the heavily-doped n$^{++}$ emitter contact diffusion regions (after formation of the lightly diffused selective emitter regions by rapid thermal annealing). Step 42 starts with single-crystal p-type silicon. Step 44 involves saw damage removal etch and anisotropic texturing etch in dilute NaOH at 90° C. Step 46 involves spin-on application and drying of phosphorus diffusion source. Step 48 involves rapid thermal annealing to form lightly diffused emitter (80 to 200Ω/square). Step 50 involves application of backside metal contact by vacuum evaporation or screen printing of aluminum or silver/aluminum alloy, followed by drying. Step 52 involves backside metal sintering/firing (e.g., at 820° C. in oxygen/nitrogen) for a screen-printed contact (fires the metal paste while oxidizing the dielectric to raise its resistance to the metal plating solution). Step 54 involves laser processing to pattern the top dielectric layer while melting the underlying silicon to form the n$^{++}$ contact diffusion region. Step 56 involves dilute HF etch to prepare metal plating surface. Step 58 involves electroless nickel plating at 90° C. for five minutes. Step 60 involves nickel sintering at 350° C. to 450° C. (in nitrogen, argon, or forming gas). Step 62 involves an additional 2 minutes of nickel plating followed by long electroless copper plating to form thick high-conductivity copper film. Step 64 involves flash immersion silver (silver) deposition on copper surface. Finally, step 66 involves edged junction isolation (e.g., using laser grooving, edge cleavage, or plasma etching).

With regard to the prior art crystalline silicon (c-Si) thin-film solar cell (TFSC) technology, there are difficulties associated with sufficient surface texturing of the thin silicon film to reduce surface reflectance losses, while reducing the crystalline silicon film thickness. This places a limit on the minimum flat (co-planar) monocrystalline silicon thickness due to production yield and cell performance (efficiency) considerations. In the case of a flat or co-planar film, it is essential to use surface texturing since the reflectance of an untextured crystalline silicon film is quite excessive (can be greater than 30%) and results in substantial optical reflection losses and degradation of the external quantum efficiency. Thus, reduction of reflectance-induced photon losses in co-planar epitaxial silicon films requires effective surface texturing which itself places a limit on the minimum epitaxial silicon layer thickness. Depending on the film surface texturing requirements and processes, the minimum crystalline silicon layer thickness may be on the order of at least 10 microns (so that the texturing process does not break through any portions of the crystalline silicon layer).

In addition, substantially reduced mean optical path lengths in thin planar crystalline silicon films result in reduced photon absorption, particularly for photons with energies near the infrared bandgap of silicon (800 to 1100 nanometers), resulting in reduced solar cell quantum efficiency (reduced short-circuit current or $J_{sc}$). This results in serious degradation of the solar cell efficiency due to reduced cell quantum efficiency and reduced $J_{sc}$. For instance, in a co-planar (flat) crystalline silicon absorber layer with thickness of 20 microns, a solar light beam impacting the cell at a near-normal angle would have an effective path length equal to the film thickness, far too short for the solar radiation photons with energies near the infrared bandgap of silicon (i.e., with wavelengths of roughly 800 to 1100 nanometers) to be absorbed effectively in the silicon thin film. In fact, a reduction of the active cell silicon thickness to below roughly 50 microns results in appreciable reduction of $J_{sc}$ and the resulting solar cell efficiency, with this degradation effect rapidly accelerating when the silicon film thickness is reduced below roughly 20 microns. Thus, a co-planar thin crystalline silicon film may also require effective light trapping using both top surface texturing and rear surface back reflection of the light exiting the back surface of the crystalline silicon film in order to create effective optical path lengths equal to a large multiple of the crystalline silicon film thickness.

The prior art technologies using this approach mostly use either back reflection through internal reflection of the light at the crystalline silicon film/silicon substrate, or reflection from a blanket backside contact (such as a back surface field aluminum contact/mirror). The back reflectance provided by these techniques may not be great (e.g., roughly 70% effective near-IR rear reflectance), constraining the performance gain that would have otherwise been achieved by an optimal back reflector. The problem with this approach is that the primary incident beam always passes the crystalline silicon film only once. Any subsequent second passes of the primary incident beam photons are dependent on the back surface reflection.

There is also the problem of lack of rigidity and mechanical support of the thin film during cell and module processing steps. This problem relates to the mechanical strength of a large-area (e.g., 200 mm×200 mm) thin silicon film. It is well known that reducing the large-area crystalline silicon wafer thickness to below 100 microns results in a substantial loss of cell substrate mechanical strength/rigidity, and such thin wafers tend to be flexible and very difficult to handle without breakage during cell fabrication process flow.

Large-area, co-planar (flat) crystalline silicon films thinner than, for instance, 50 microns must be properly mounted and supported on a cost-effective support or handle substrate in order to achieve acceptable yield for solar cell and module manufacturing. One approach is to grow and retain the thin epitaxial film on a relatively low-cost (e.g., metallurgical-grade) silicon substrate (over which the epitaxial layer is grown); however, this approach suffers from some inherent problems constraining the ultimate solar cell efficiency. Another approach is to release or lift off the epitaxial silicon film from its (reusable) parent silicon substrate and subsequently place it on a cheaper non-silicon support or handle substrate to provide mechanical strength through the solar cell process flow. This approach may suffer from any thermal coefficient of expansion (TCE) mismatch between the support/handle substrate and silicon film during any high-temperature oxidation and anneal processes, as well as potential contamination of the thin epitaxial silicon film from the non-silicon support substrate (both creating possible manufacturing yield and performance/efficiency degradation problems).

The cost of the monocrystalline silicon film growth process using silicon epitaxy, particularly for thicker epitaxial films with thicknesses in excess of 30 microns is an additional issue which should be addressed. Using a relatively small epitaxial film thickness (in one embodiment, much below 30 microns) may lower the cost of epitaxy to an attractive range. However, this would present various challenges for fabrication of planar silicon thin-film solar cells. As stated, thinner co-planar (flat) epitaxial films (e.g., in the range of much less than 30 microns) produce a number of problems and challenges, including a lack of film mechanical strength, constraints limiting effective surface texturing of thin silicon films for low surface reflectance and reduced optical reflectance losses, relatively short optical path lengths, and reduced cell quantum efficiencies. Effective light trapping is essential for enhanced thin-film c-Si solar cell efficiencies. The requirement for effective light trapping is based on a combination of front surface texturing and back surface mirror, while achieving sufficiently low surface recombination velocities (for high cell efficiencies). This is very difficult to achieve in the co-planar (flat) c-Si thin film solar cells.

High-performance c-Si thin-film solar cells require some patterning steps or patterned processing steps (e.g., for formation of selective emitter, frontside emitter or backside emitter wrap-through metallization contacts, backside base metallization contacts, etc.). These patterning steps are usually achieved using photolithography, screen printing, and/or shadow-mask deposition (e.g., shadow-mask sputtering or evaporation) processes. The use of photolithography and/or screen printing and/or shadow-mask deposition patterning steps usually increases the manufacturing process flow complexity and cost, and may also detrimentally impact the fabrication yield as well as the ultimate achievable solar cell efficiency.

Therefore a need has arisen for a thin-film solar cell (TFSC) which corrects the problems identified above.

Yet a further need exists to address shortcomings of existing mainstream c-Si solar cell technology. This includes reducing the amount of polysilicon feedstock consumed per peak watt of solar power, and eliminating the kerf losses associated with sawing and slicing; thus, substantially reducing the overall solar cell manufacturing cost.

A further need exists for innovative solar cell structures and simplified process flows, increasing cell and module efficiencies while significantly lowering the overall solar cell and module manufacturing costs. A still further need exists for innovative c-Si solar cell designs and simplified self-aligned manufacturing processes which facilitate substantial solar cell and module cost reduction even in fabs with modest production volumes, enabling low to mid-volume solar cell fabs with modest fab setup and operation costs (thus, achieving economies of scale for manufacturing cost reduction at substantially lower fab volumes than the prior art fabs).

A still further need exists to address shortcomings of existing TFSC technology. This includes addressing difficulties associated with sufficient surface texturing of the thin planar silicon films to reduce surface reflectance losses, which currently places a limit on the minimum flat (co-planar) crystalline silicon thickness due to production yield and cell performance considerations. A still further need exists for effective light trapping based on a combination of front surface texturing and back surface mirror, while achieving low surface recombination velocities (for high cell efficiencies).

A still further need exists to address additional shortcomings of existing TFSC technologies. This includes the problem of lack of rigidity and mechanical support of the thin film substrate during cell and module processing steps, thus, necessitating the use of support or handle substrates (made of silicon or another material) for the TFSC substrates. This further includes the cost of the epitaxial silicon film growth process, particularly for thicker epitaxial films required for planar crystalline silicon TFSCs. This further includes the requirement of multiple photolithography and/or screen printing and/or shadow-mask processing/patterning steps which usually increase the manufacturing process flow complexity and cost, and may also detrimentally impact the fabrication yield as well as the ultimate achievable solar cell efficiency.

SUMMARY

In accordance with the present disclosure, pyramidal three-dimensional thin-film solar cells (3-D TFSCs) are provided. The pyramidal 3-D TFSCs of the disclosed subject matter substantially eliminate or reduce disadvantages and problems associated with previously developed TFSCs, both in terms of efficiency and manufacturing cost.

According to one aspect of the disclosed subject matter, there is provided a pyramidal 3-D TFSC, comprising a pyramidal 3-D TFSC substrate, wherein said pyramidal 3-D TFSC substrate comprises a plurality of pyramid-shaped unit cells.

According to another aspect of the disclosed subject matter, there is provided a pyramidal 3-D TFSC, comprising a pyramidal 3-D TFSC substrate, wherein said pyramidal 3-D TFSC substrate comprises a plurality of unit cells with pyramid-shaped cavities.

Optionally, the pyramidal 3-D TFSCs may be mounted on a rear mirror for improved light trapping and conversion efficiency.

According to still another aspect of the disclosed subject matter, there is a provided a pyramidal 3-D TFSC. The pyramidal 3-D TFSC comprises a pyramidal 3-D TFSC substrate with emitter junction regions and doped base regions. The pyramidal 3-D TFSC further includes emitter metallization regions and base metallization regions. The pyramidal 3-D TFSC substrate comprises a plurality of pyramid-shaped unit cells.

More specifically, the disclosed subject matter includes a pyramidal 3-D TFSC substrate made of silicon, and even more specifically made of crystalline silicon.

More specifically, the disclosed subject matter includes a pyramidal 3-D TFSC substrate with a pyramid-array design, and even more specifically, a hexagonal-pyramid design or a polygon-pyramid design, among others.

More specifically, the disclosed subject matter includes pyramidal 3-D TFSC with an integrated rear mirror or a detached rear mirror.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein.

Figure 1:
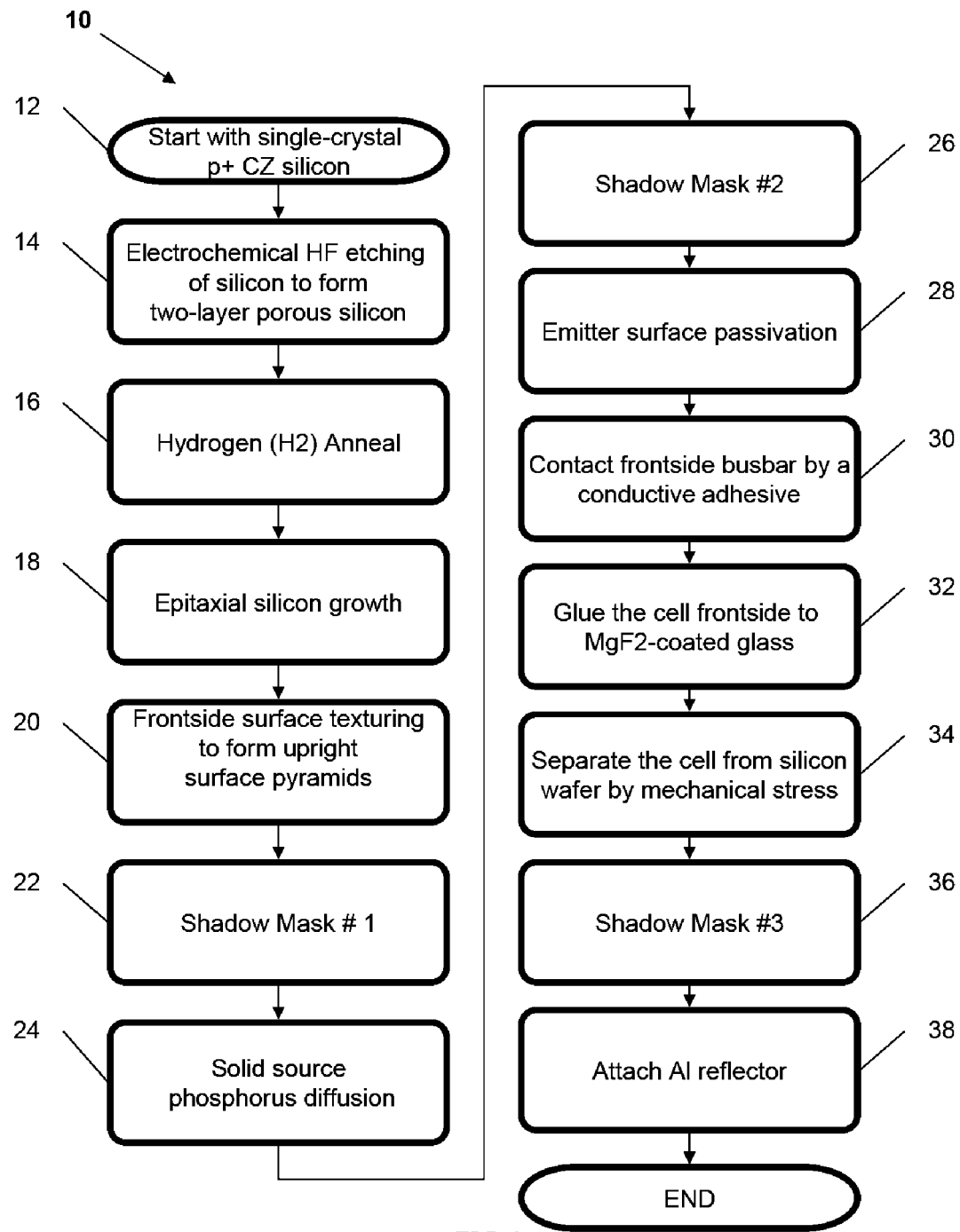
FIG. 1 (PRIOR ART) shows a prior art process flow for fabricating crystalline silicon (c-Si) thin-film solar cells (TFSCs) using planar silicon thin-film absorber layers produced by silicon epitaxy.
Figure 2:
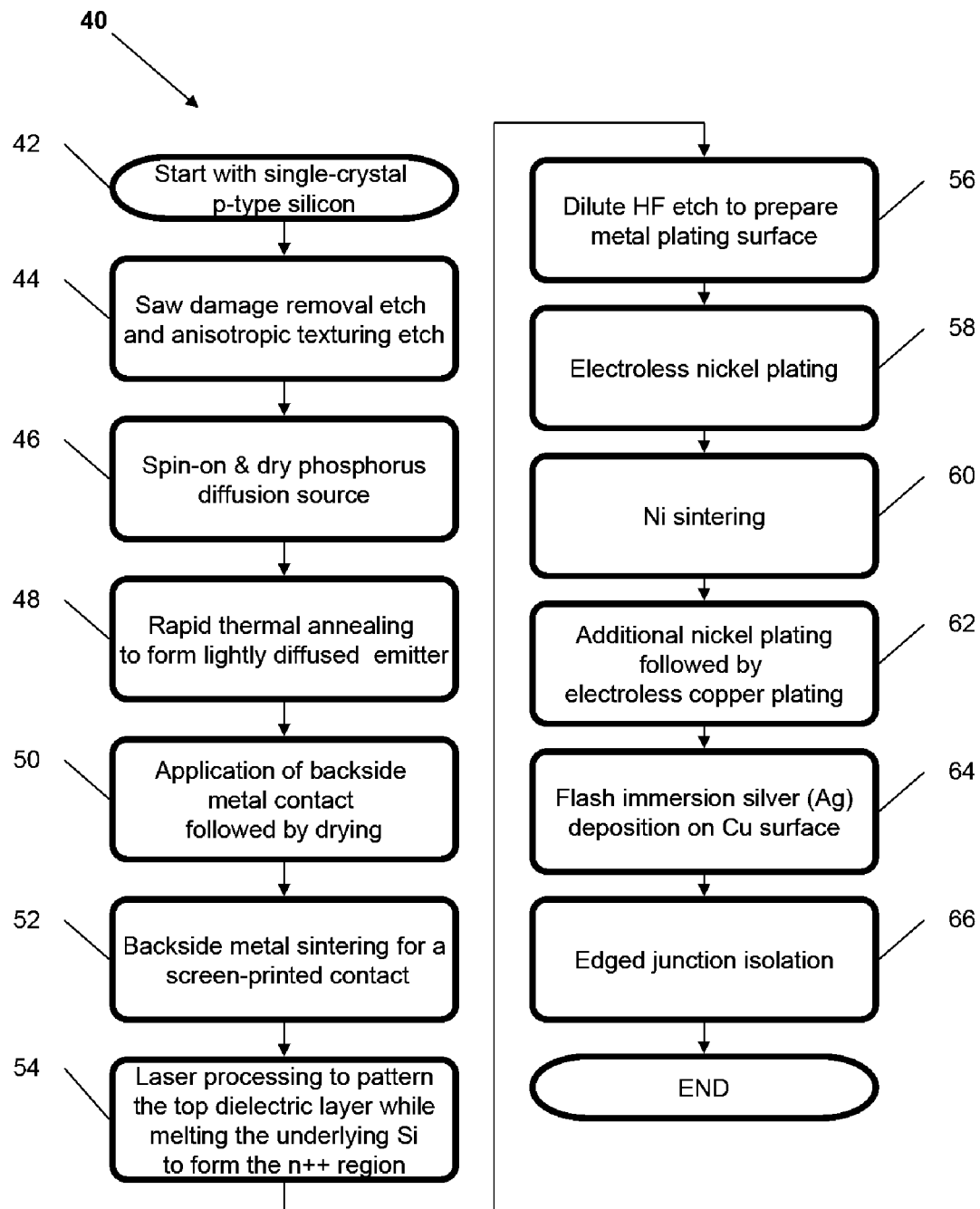
FIG. 2 (PRIOR ART) shows a prior art process flow for fabrication of solar cells on silicon wafers including self-aligned selective emitter and metallization.
Figure 3:
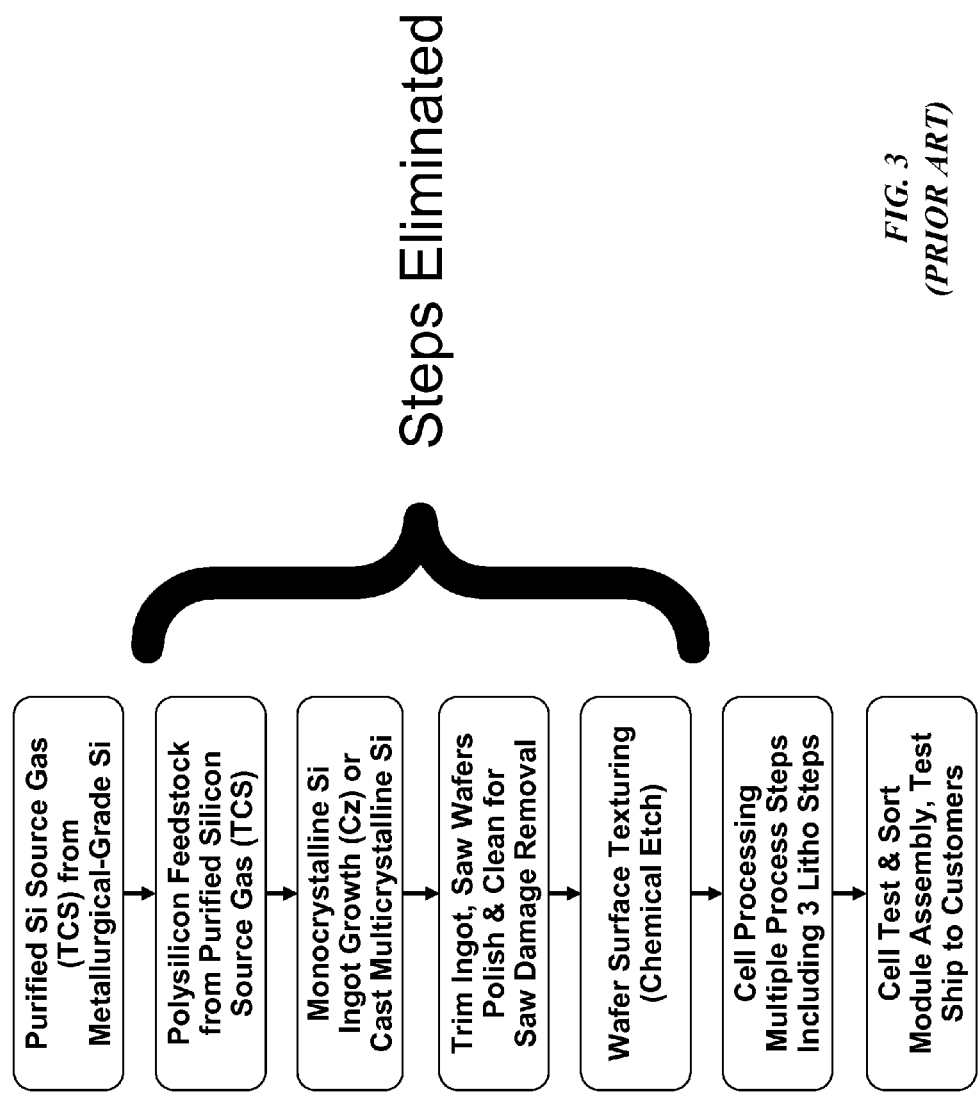
Figure 5:
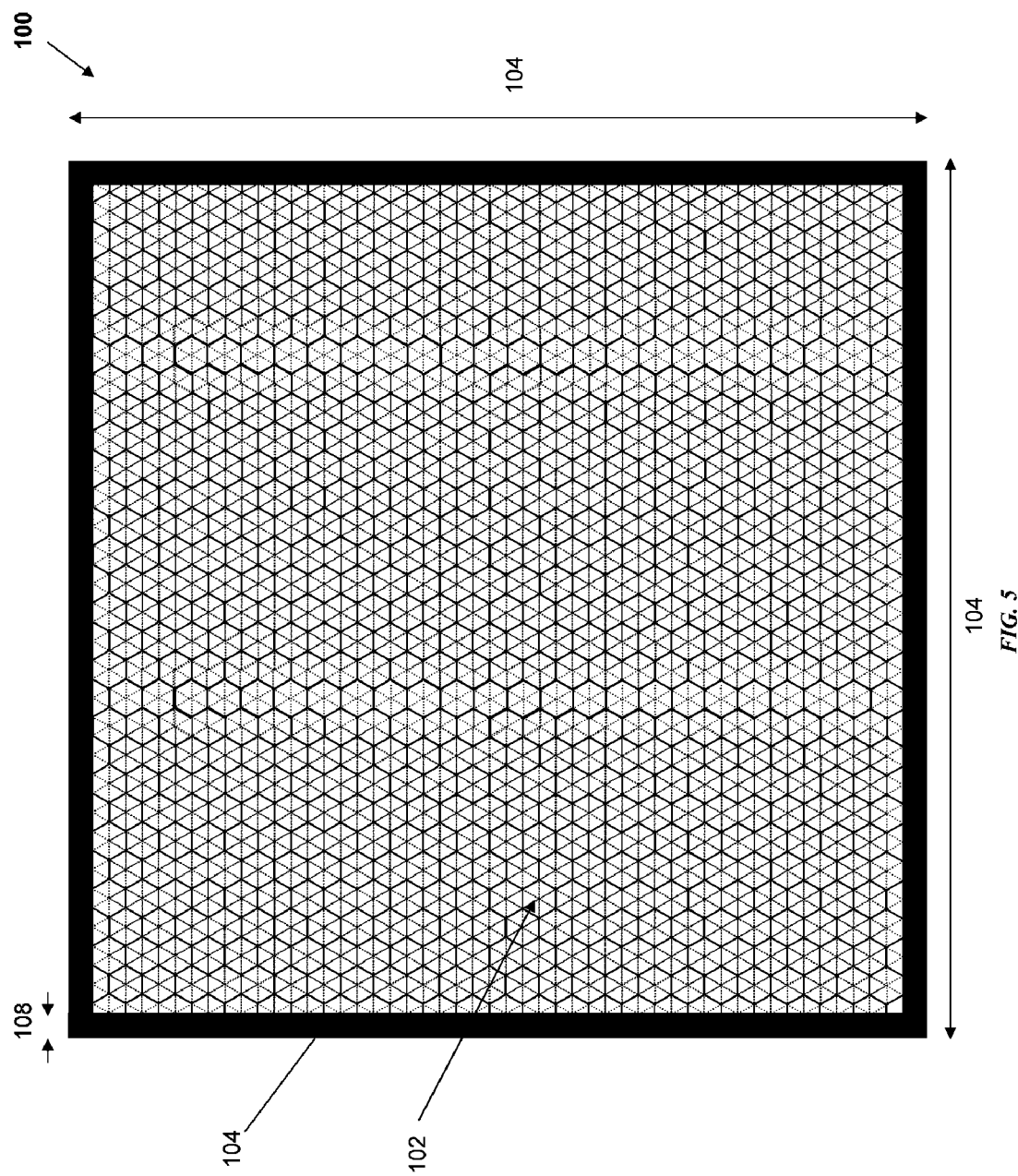
Figure 6:
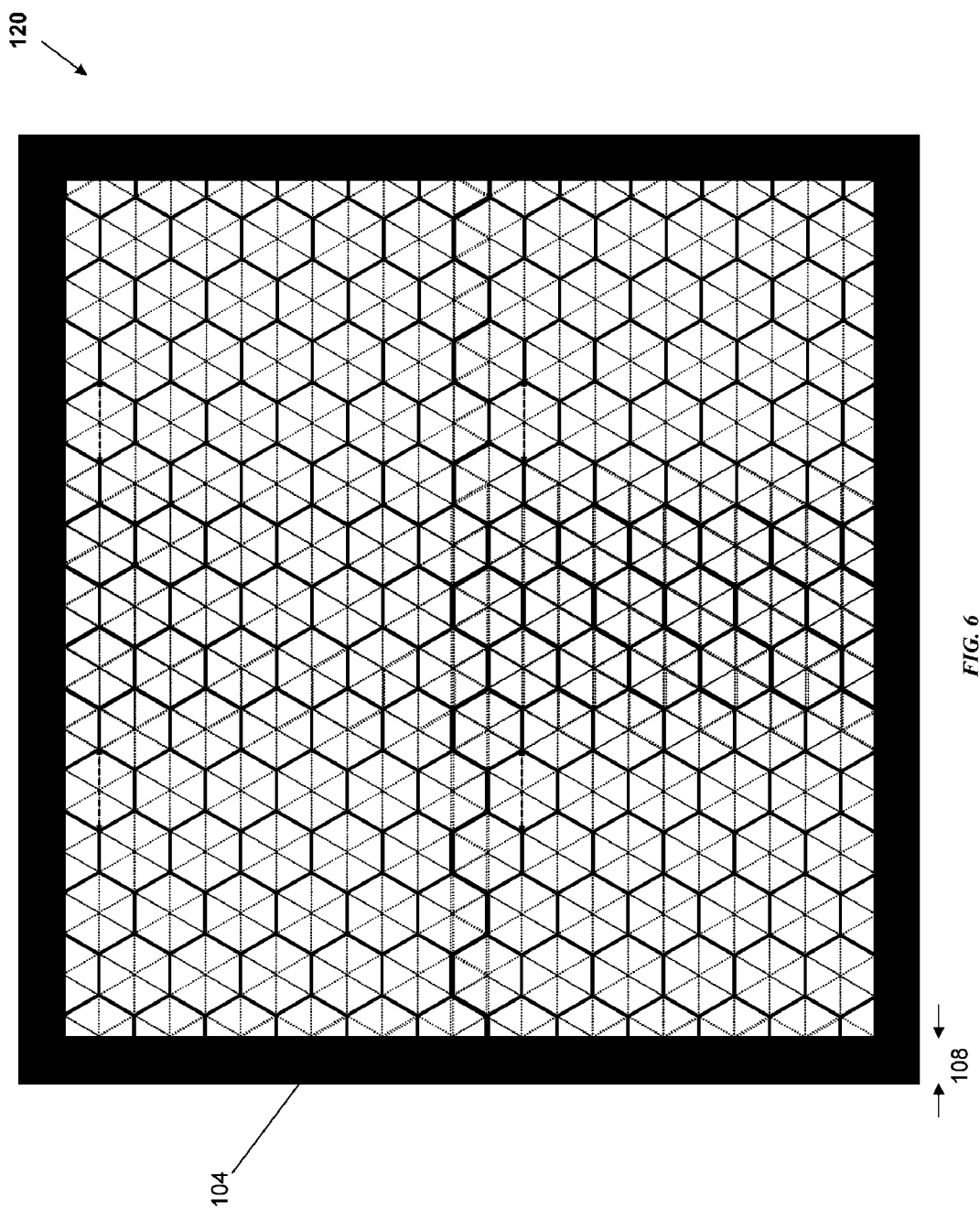
Figure 7:
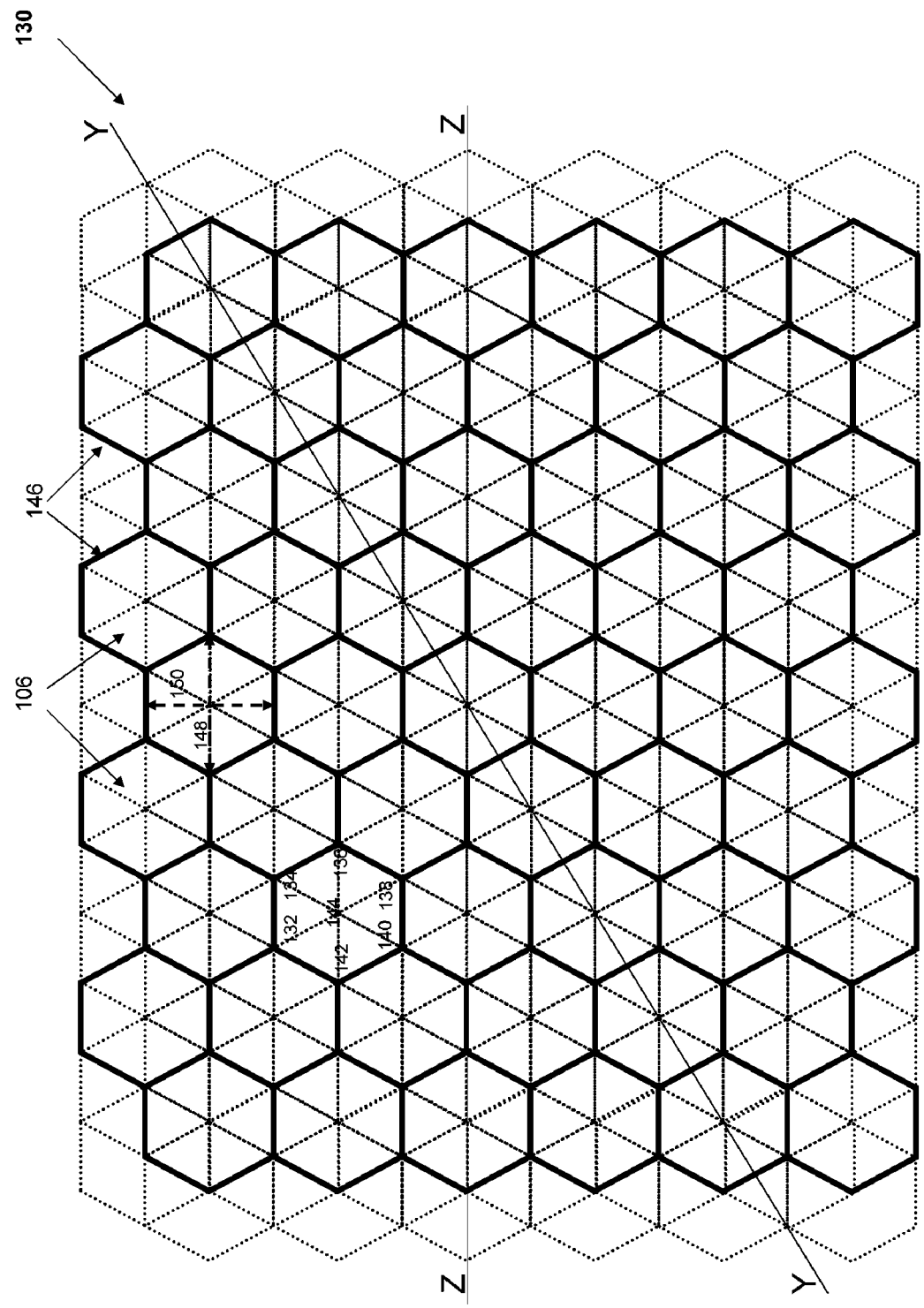
Figure 8:
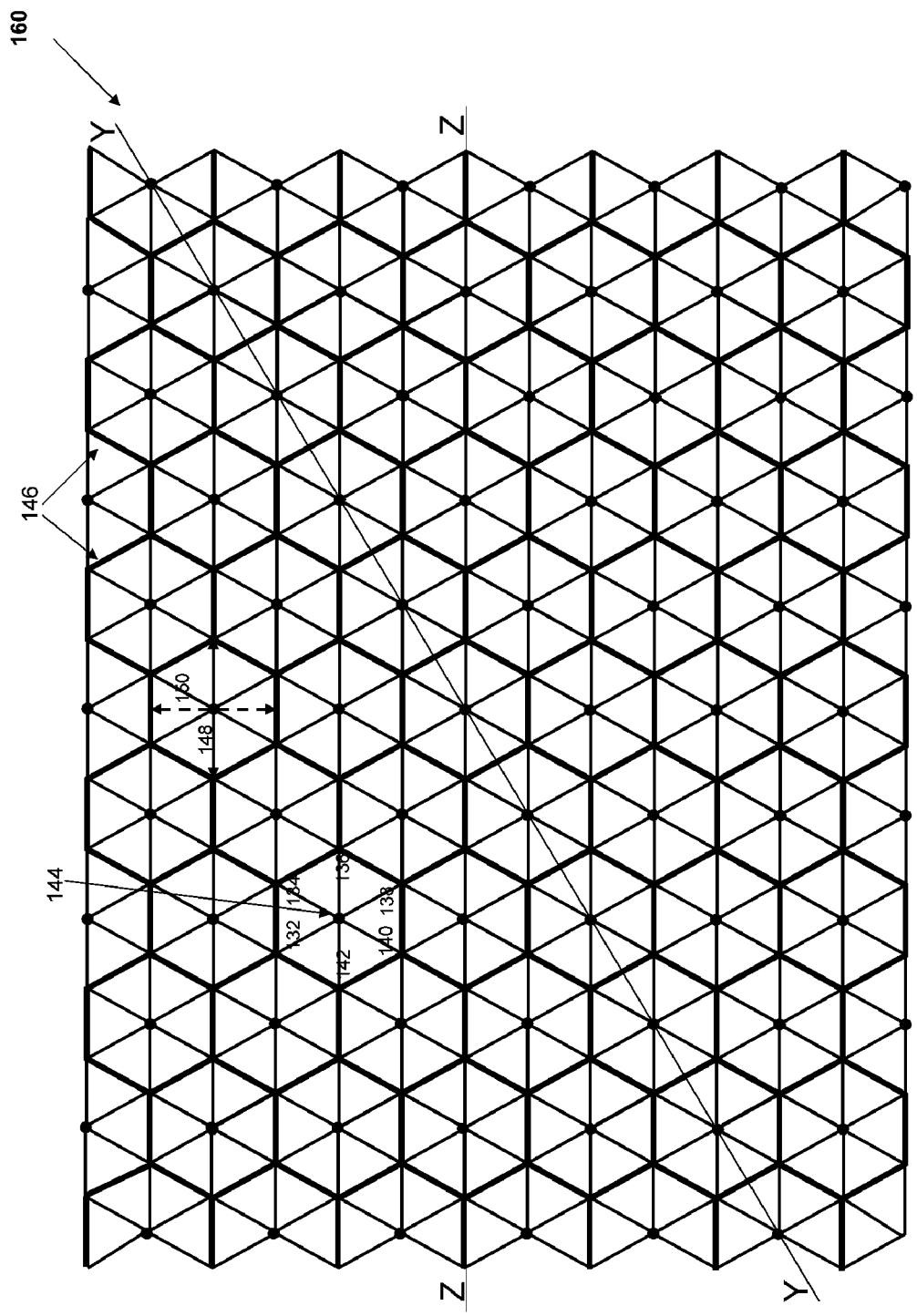
Figure 9:
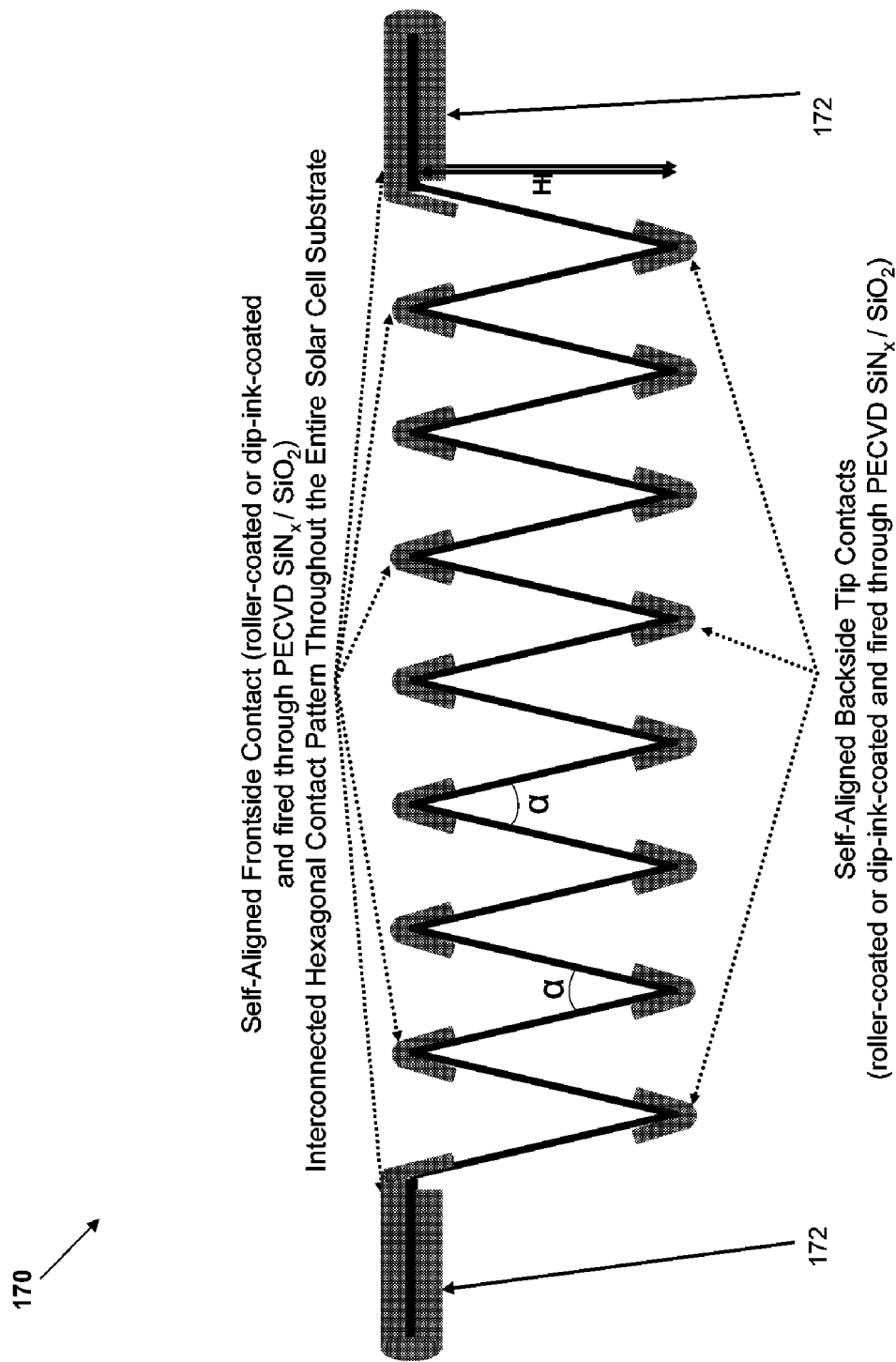
Figure 10:
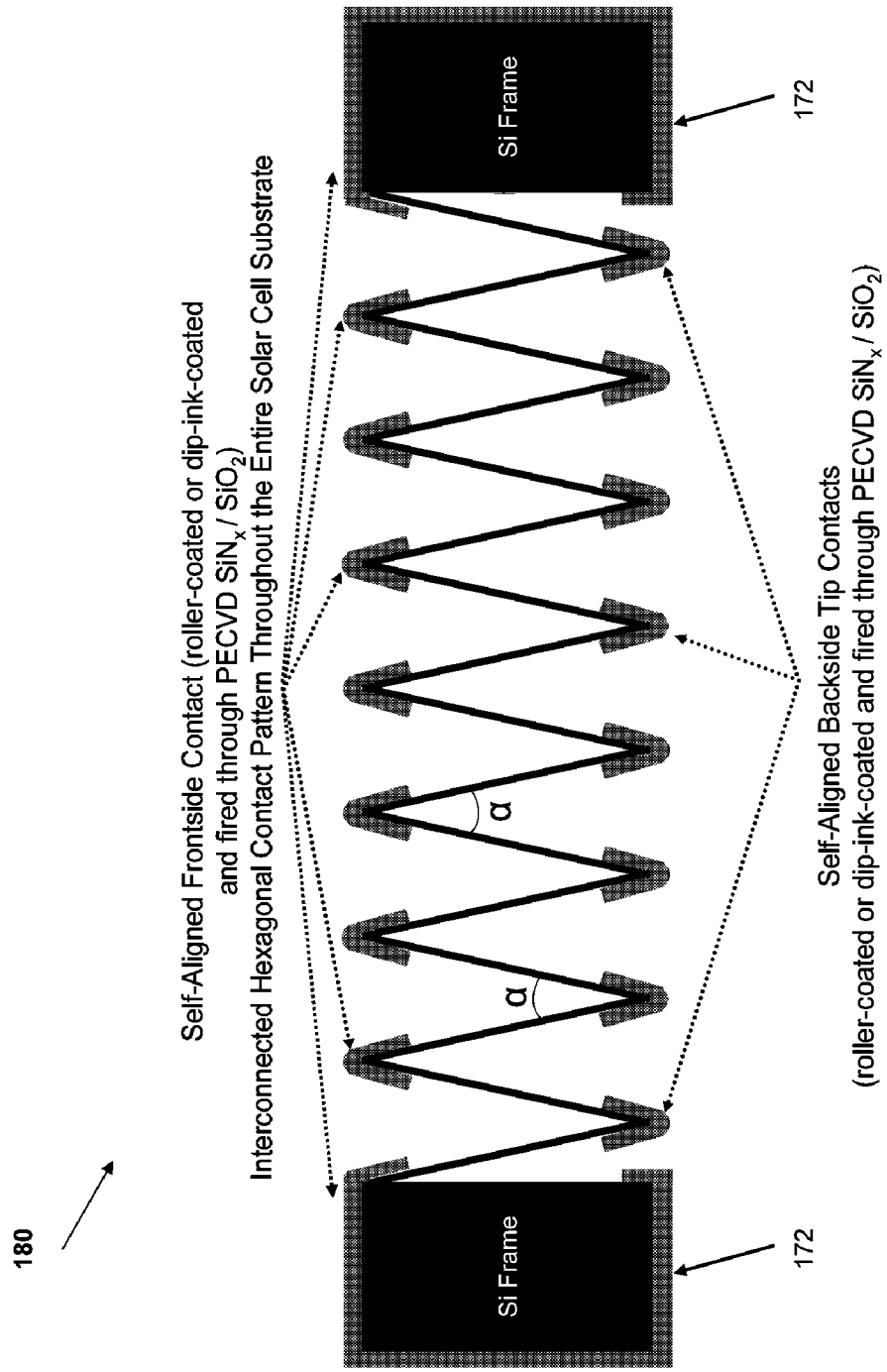
Figure 11:
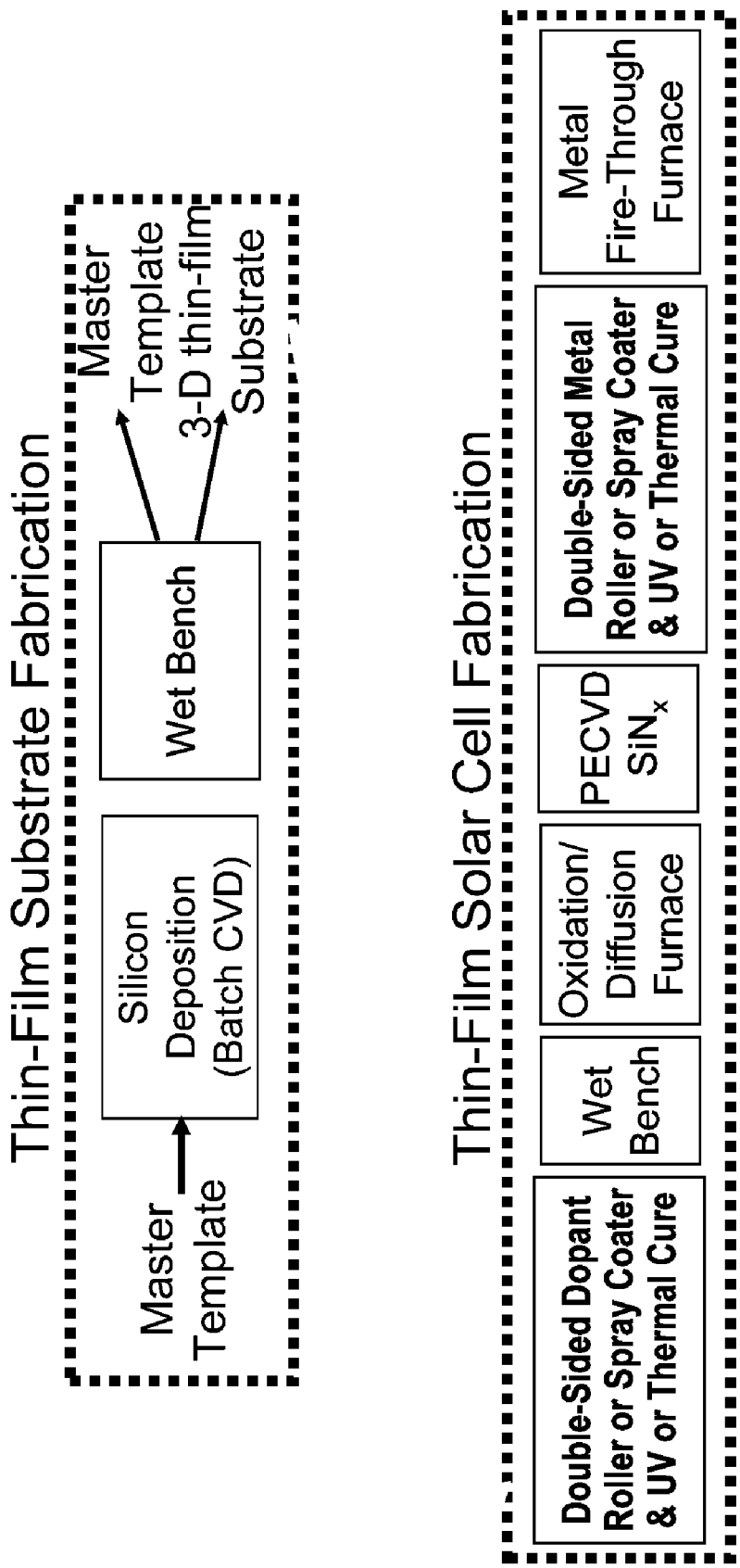
Figure 12:
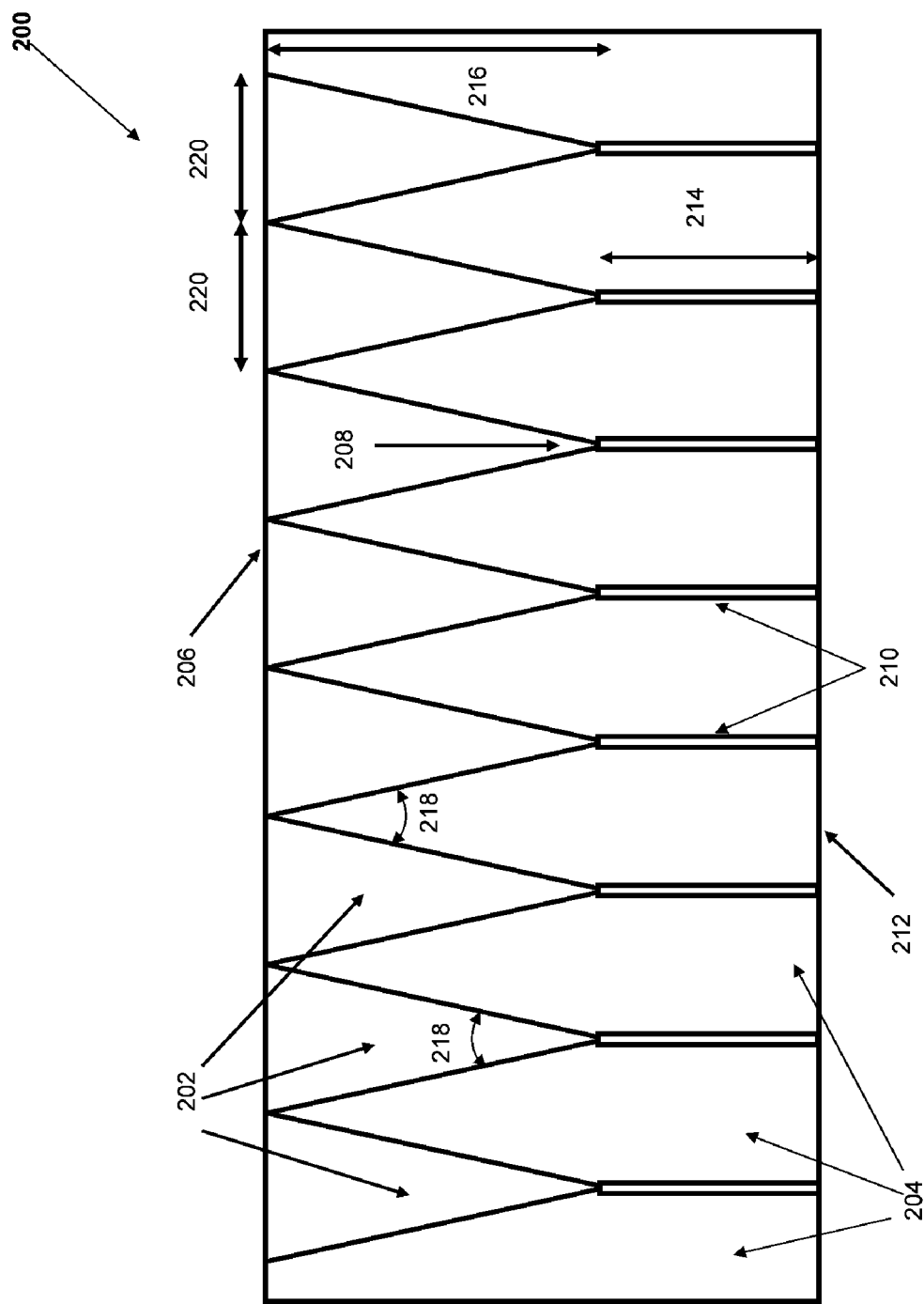
Figure 13:
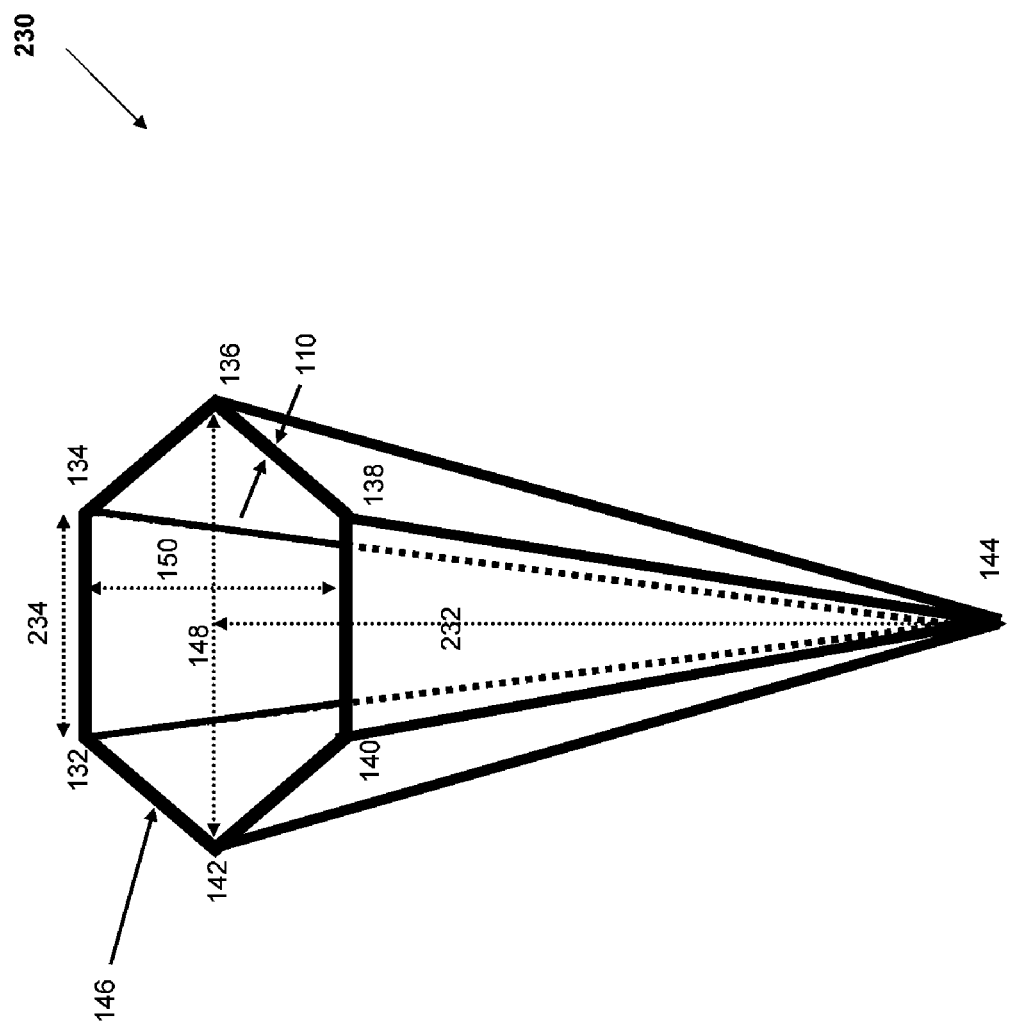
Figure 14:
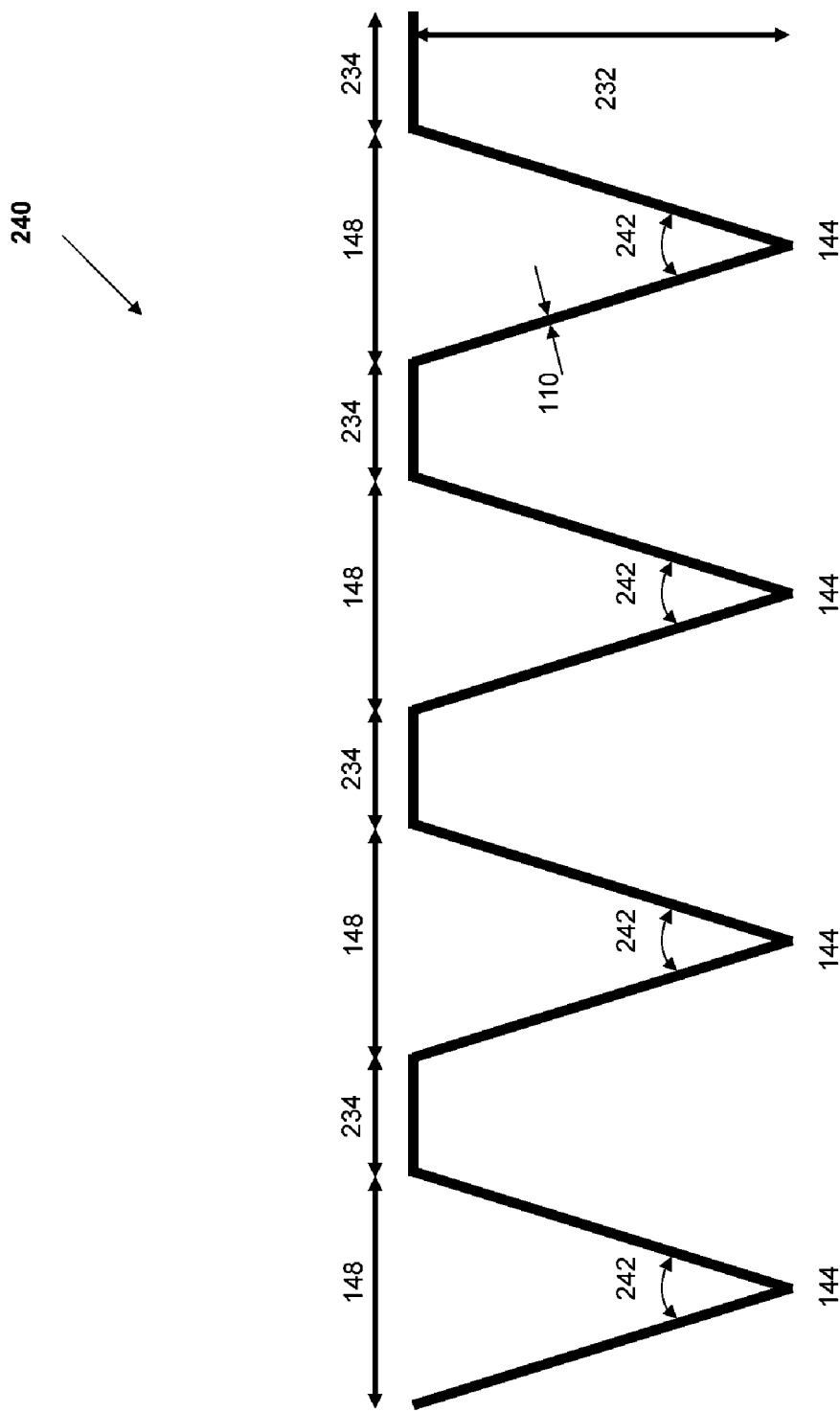
Figure 15:
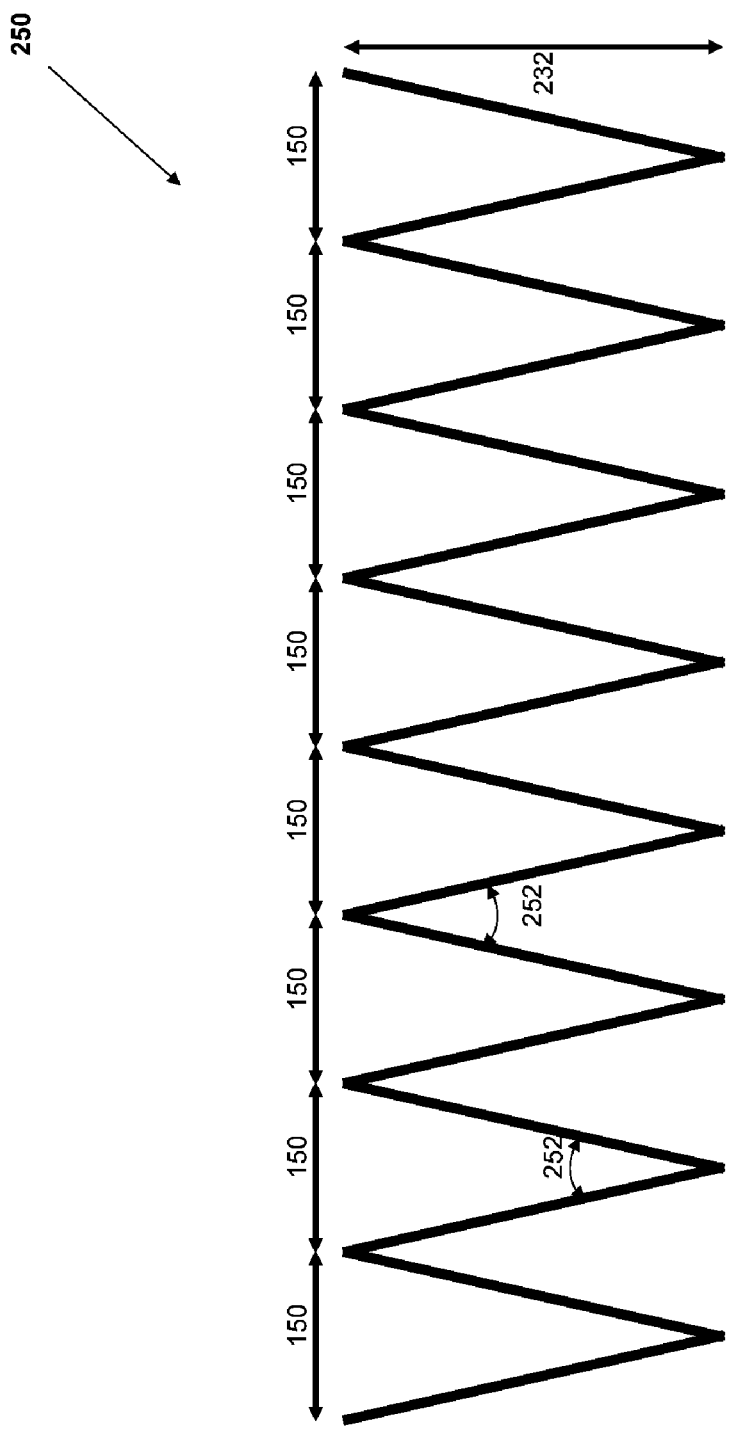
Figure 16:
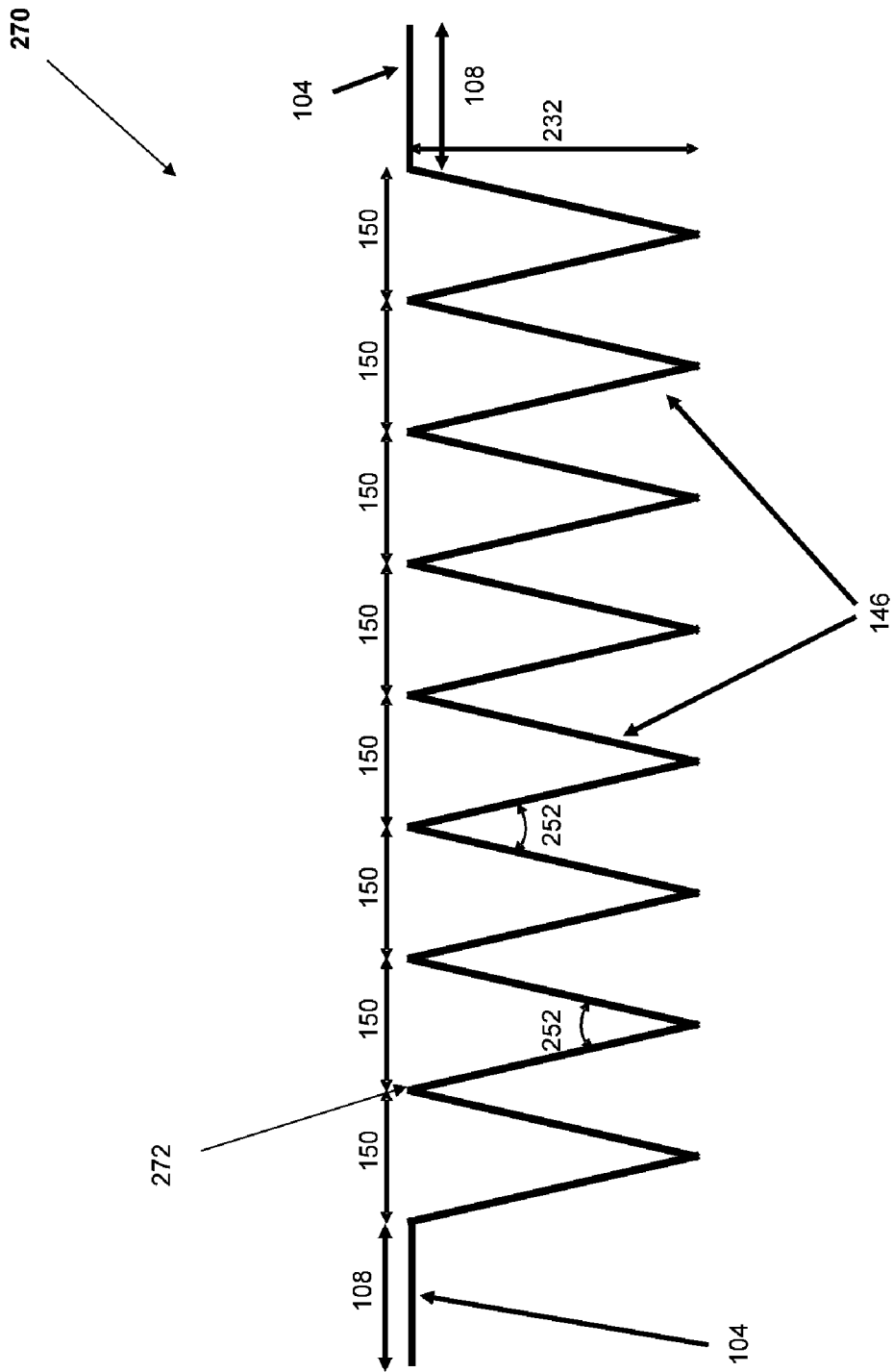
Figure 17:
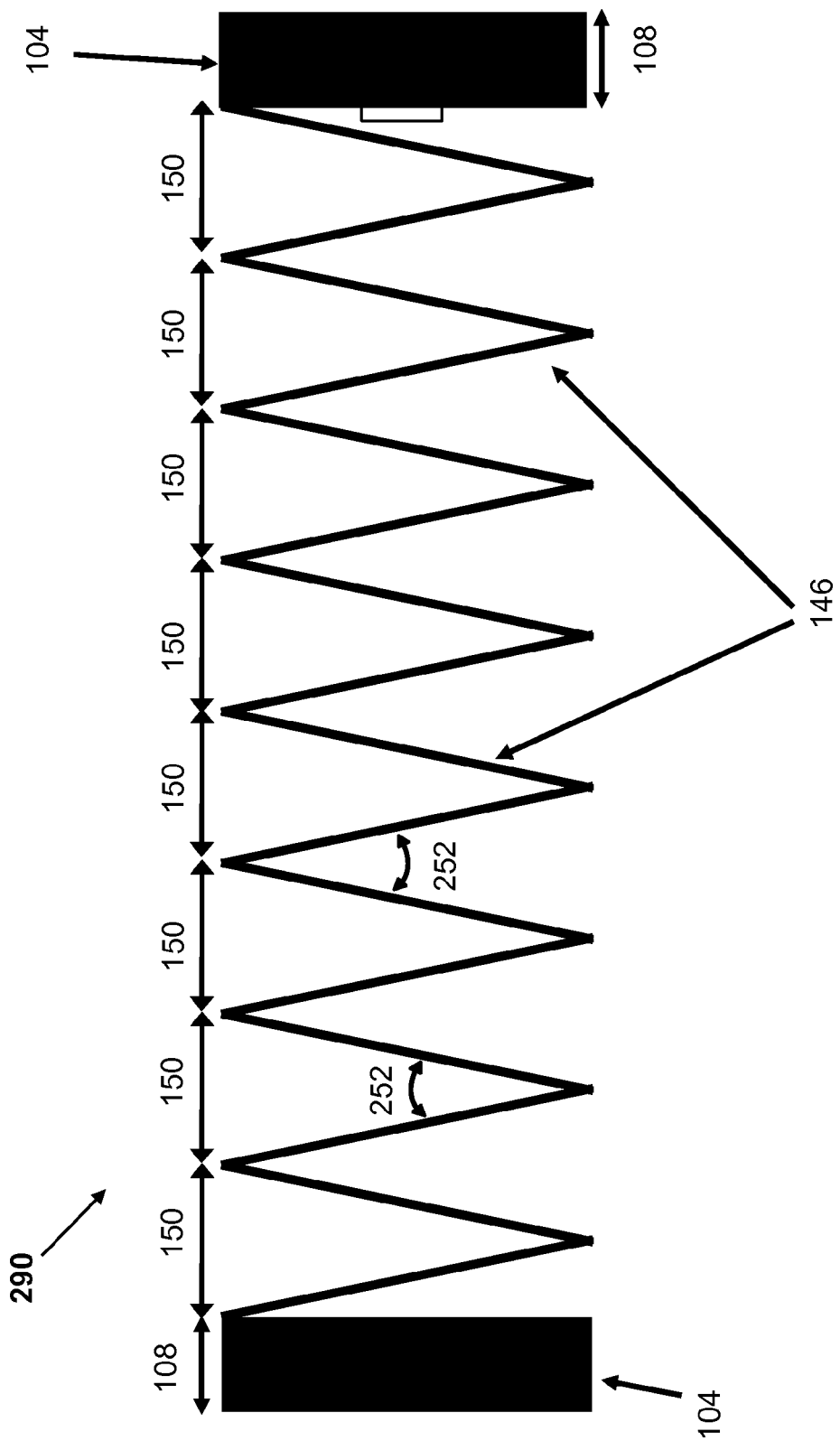
Figure 18:
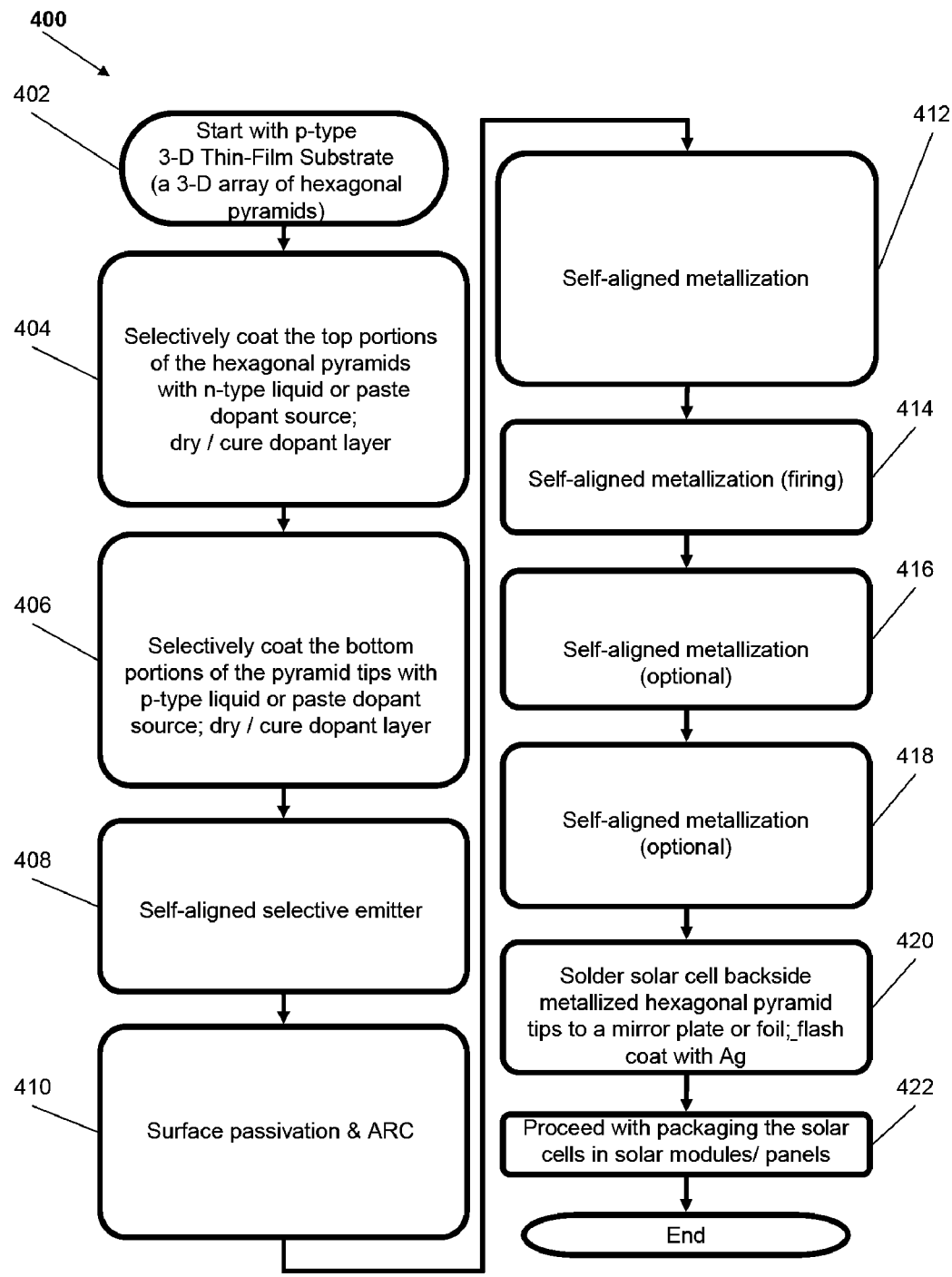
Figure 19:
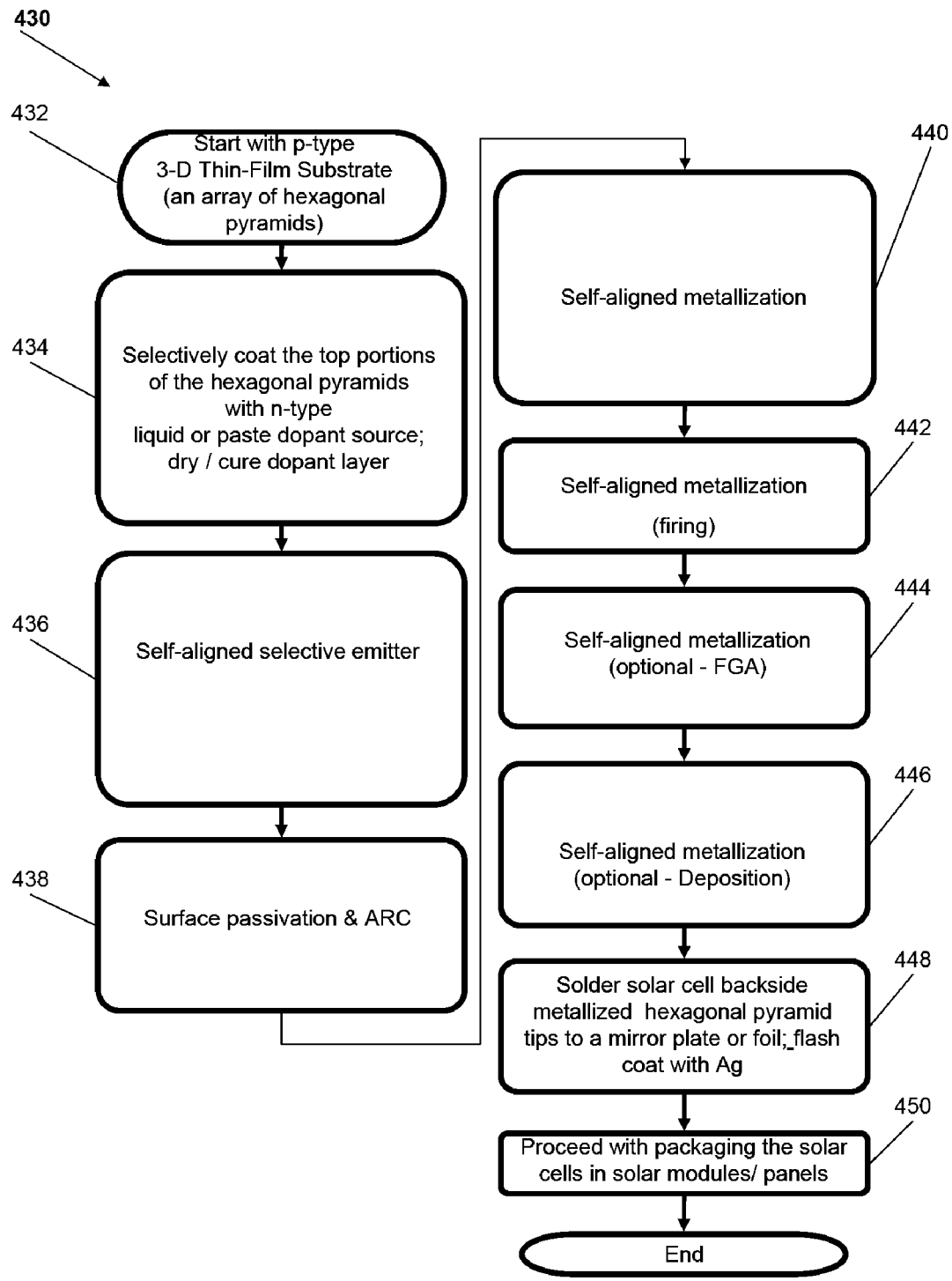
Figure 20:
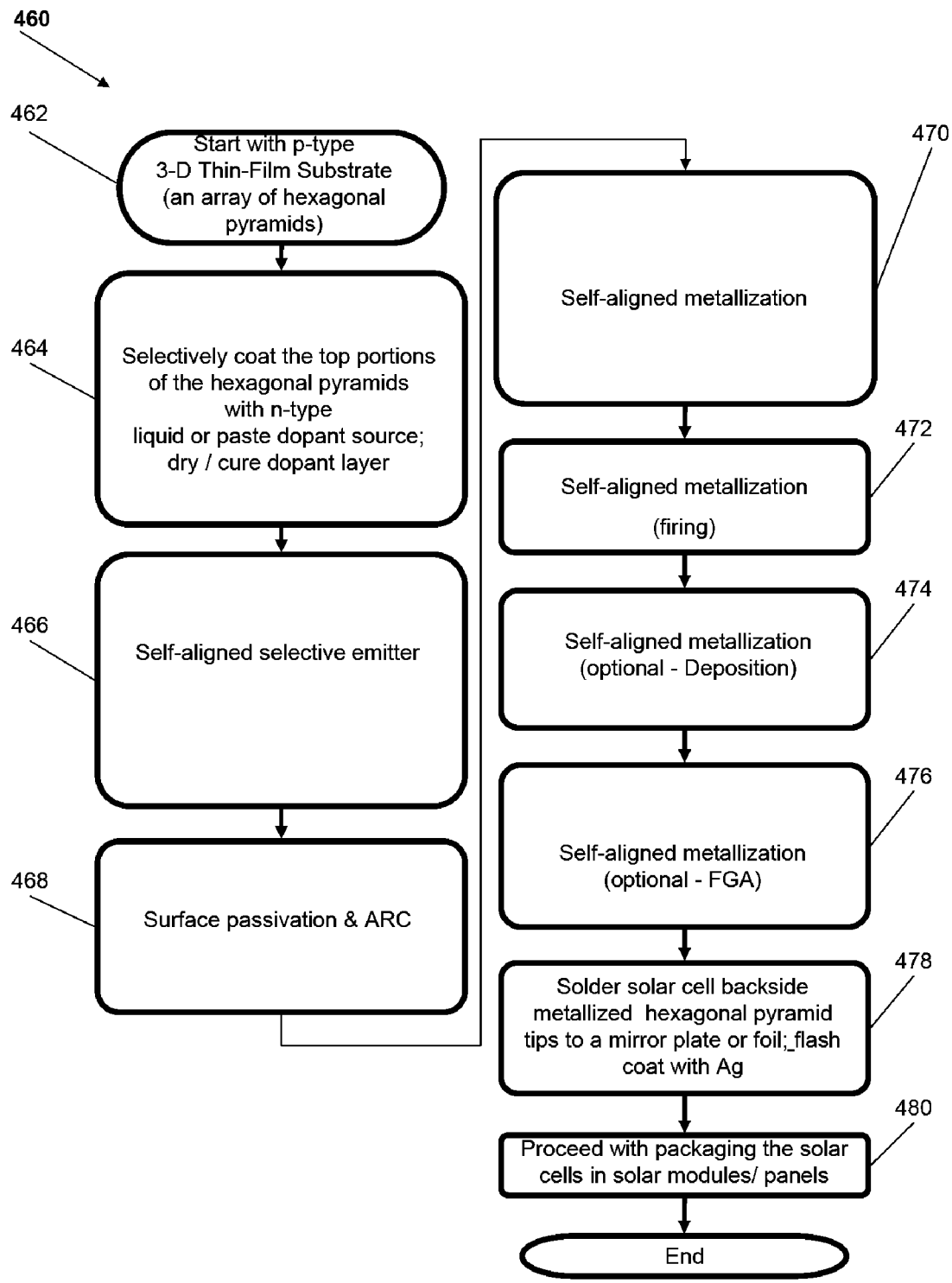
Figure 26:
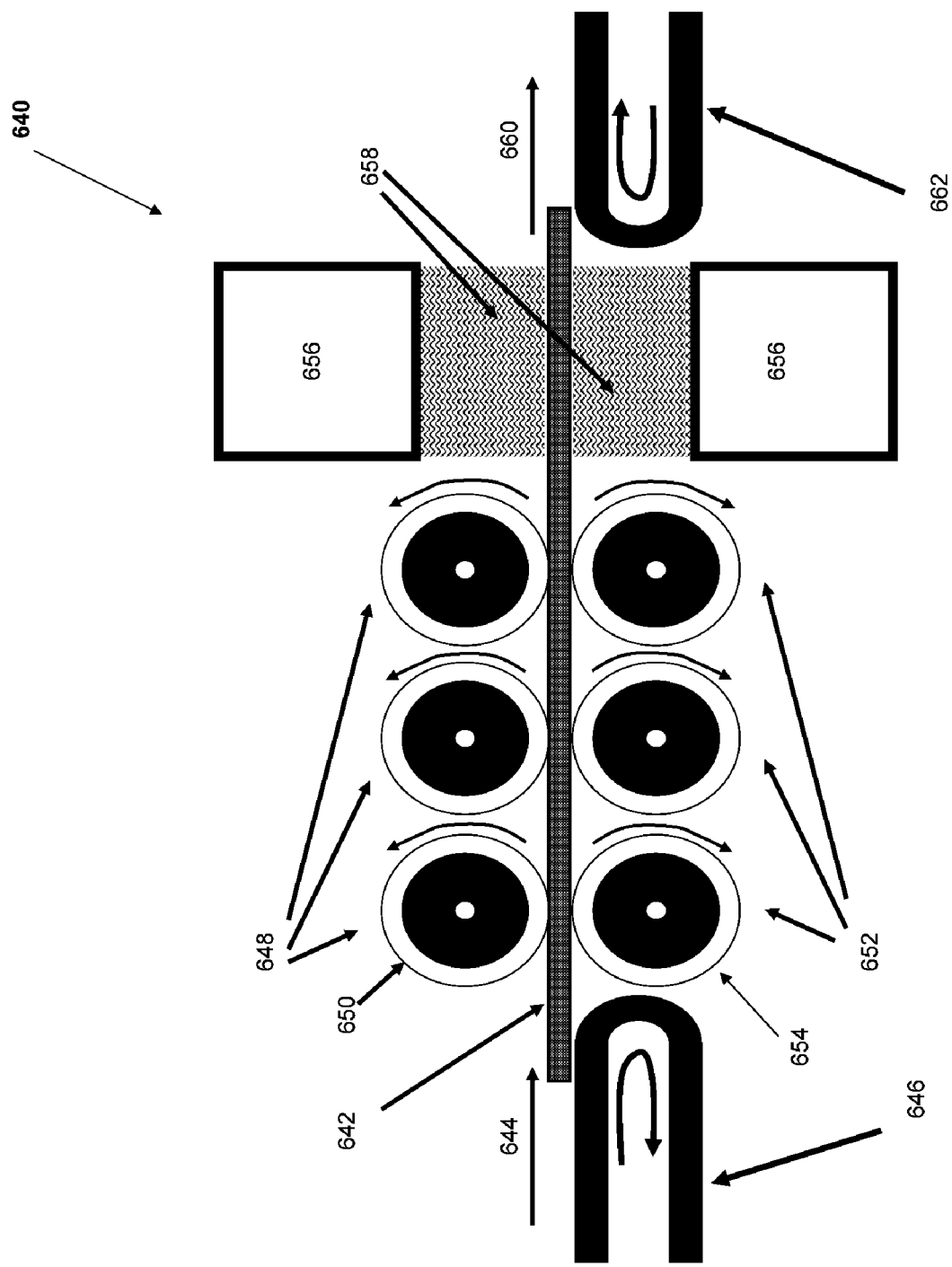
Figure 27:
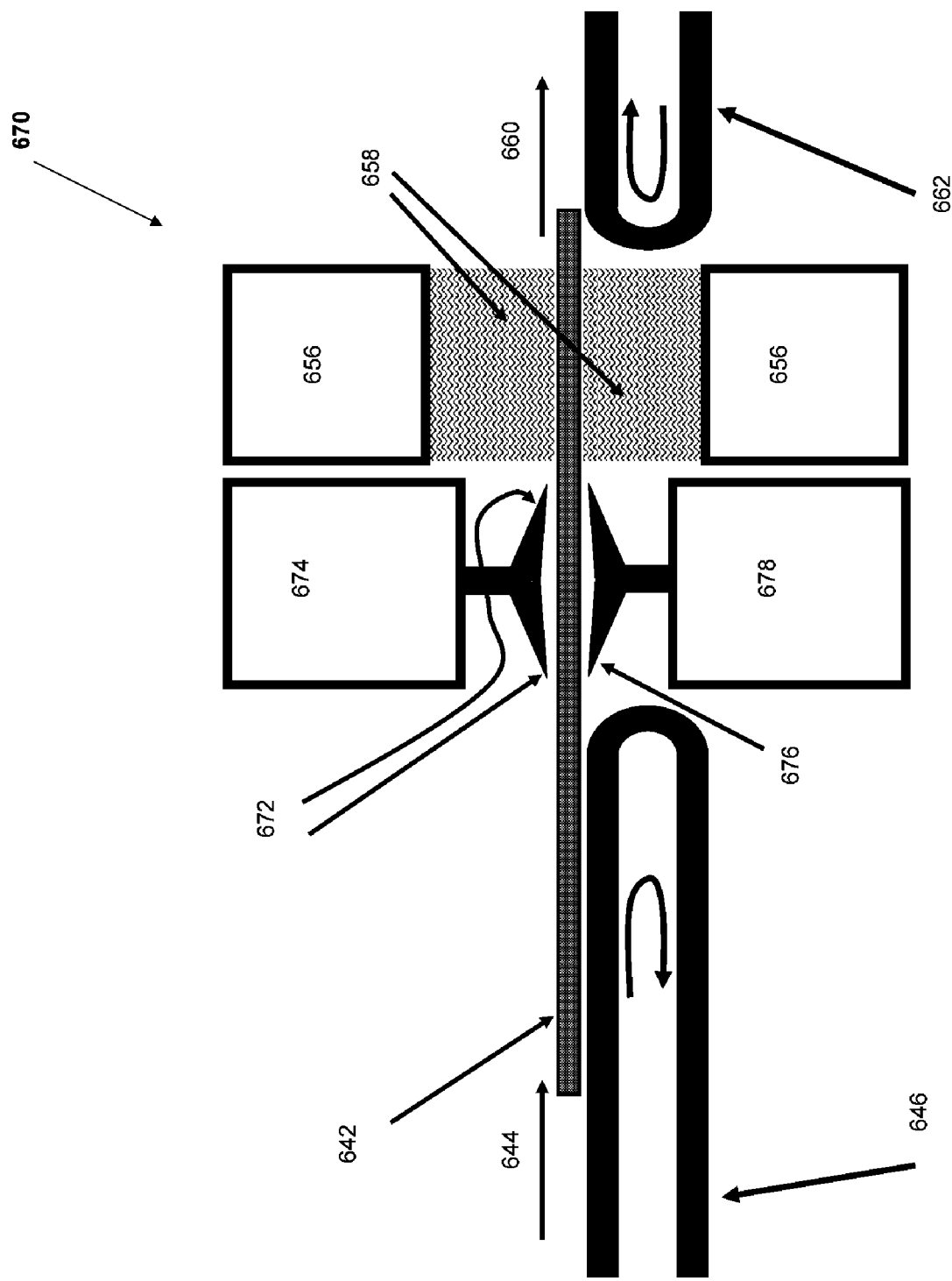
Figure 28:
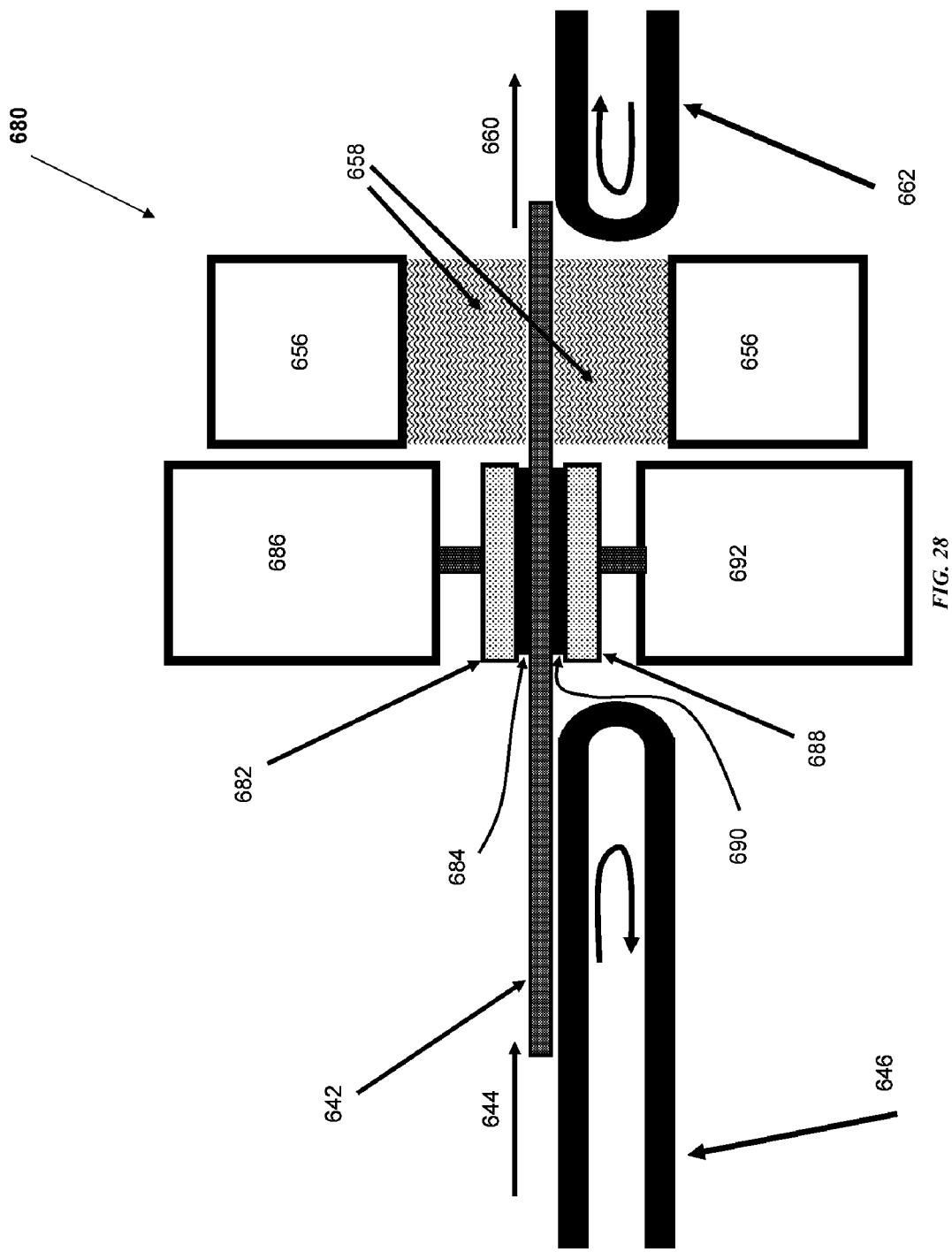
Figure 29:
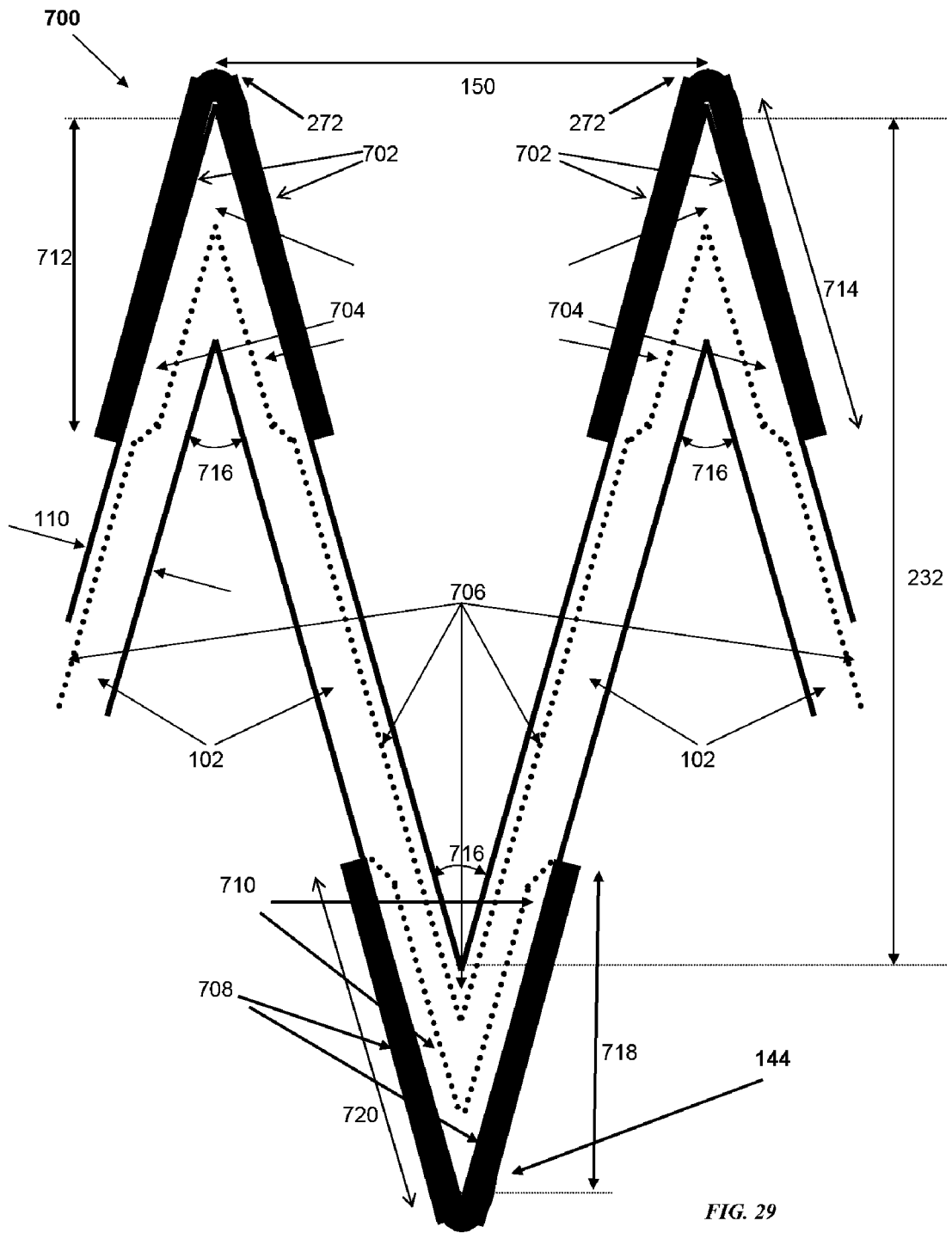
Figure 30:
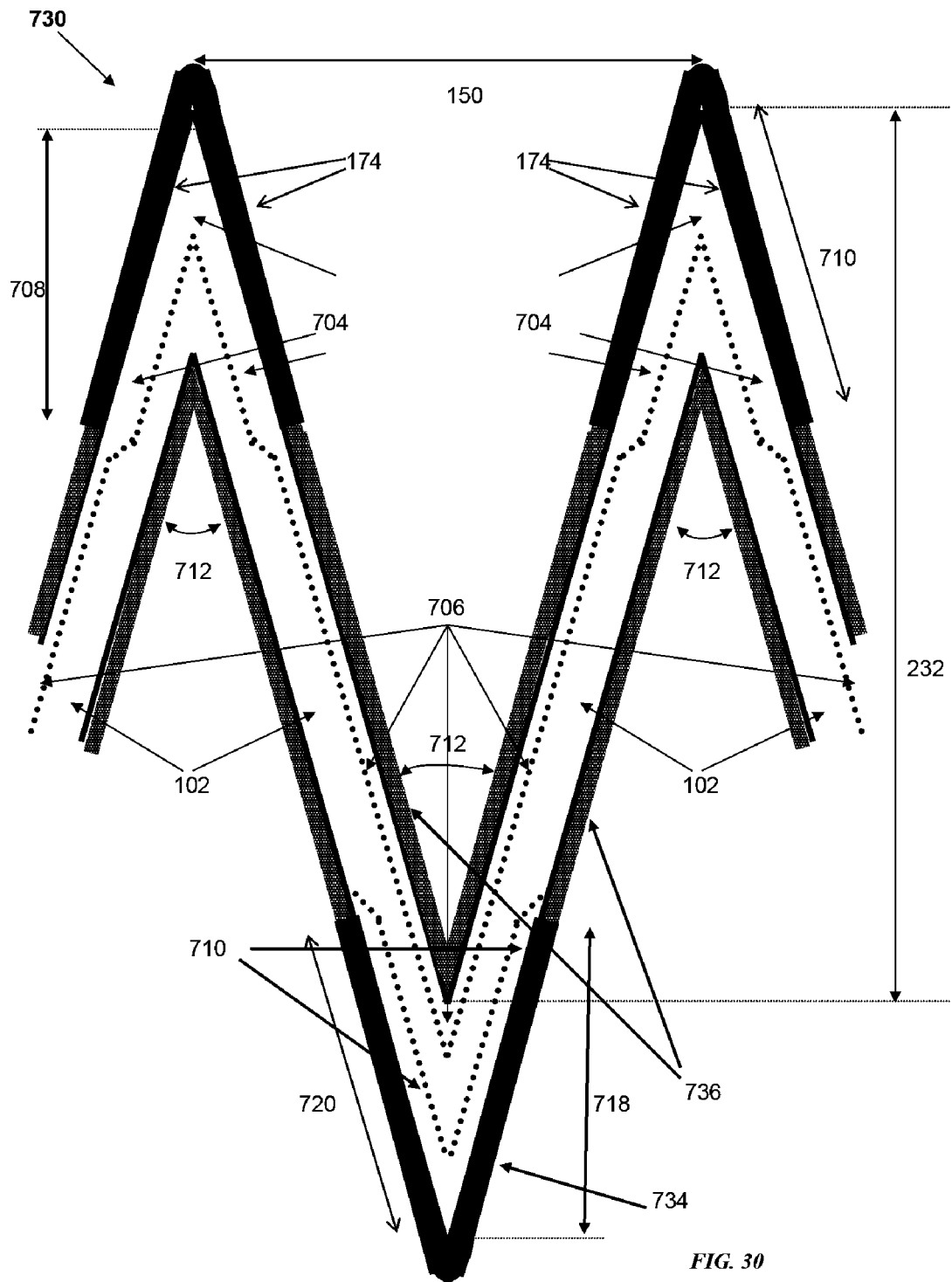
Figure 31:
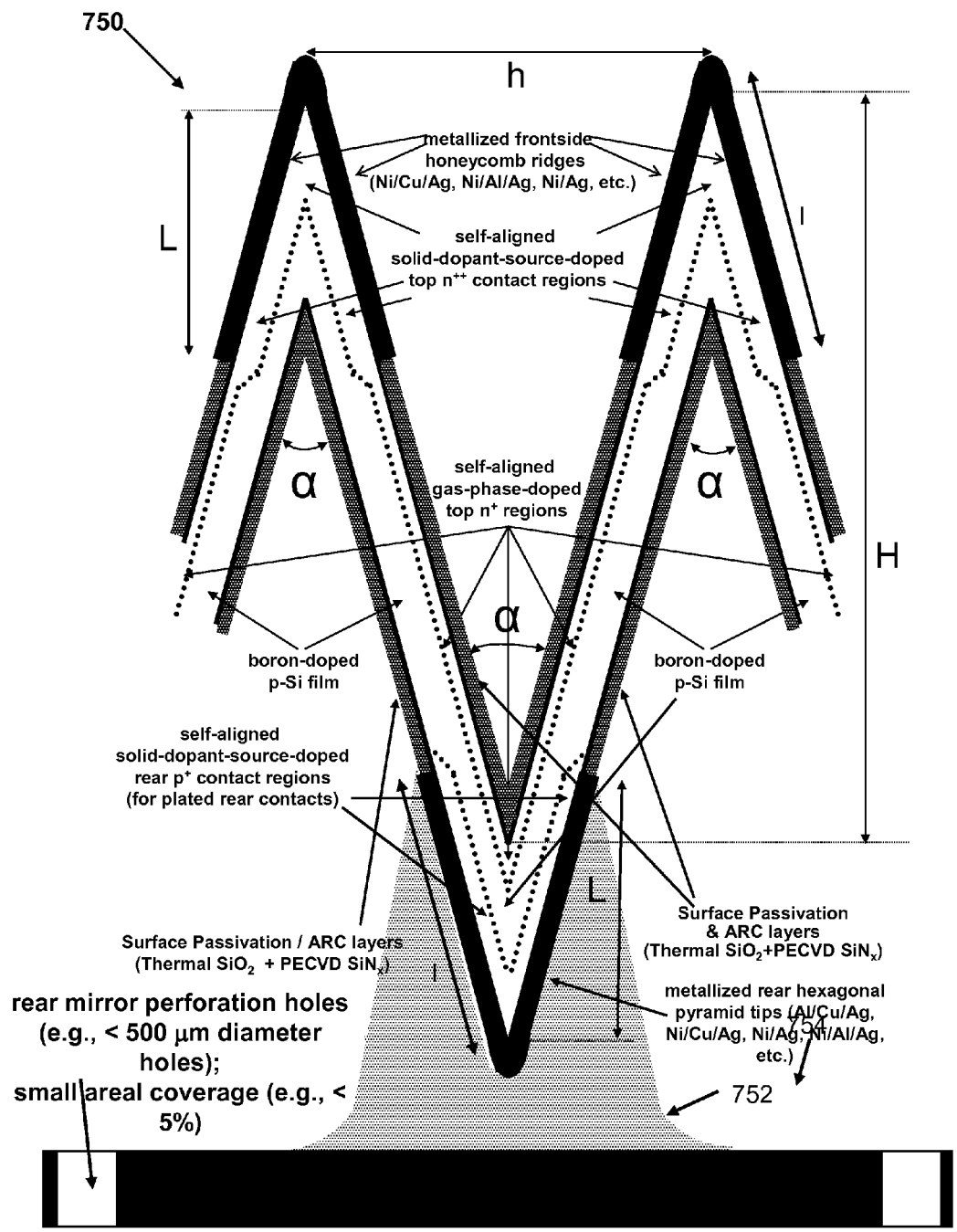
Figure 32:
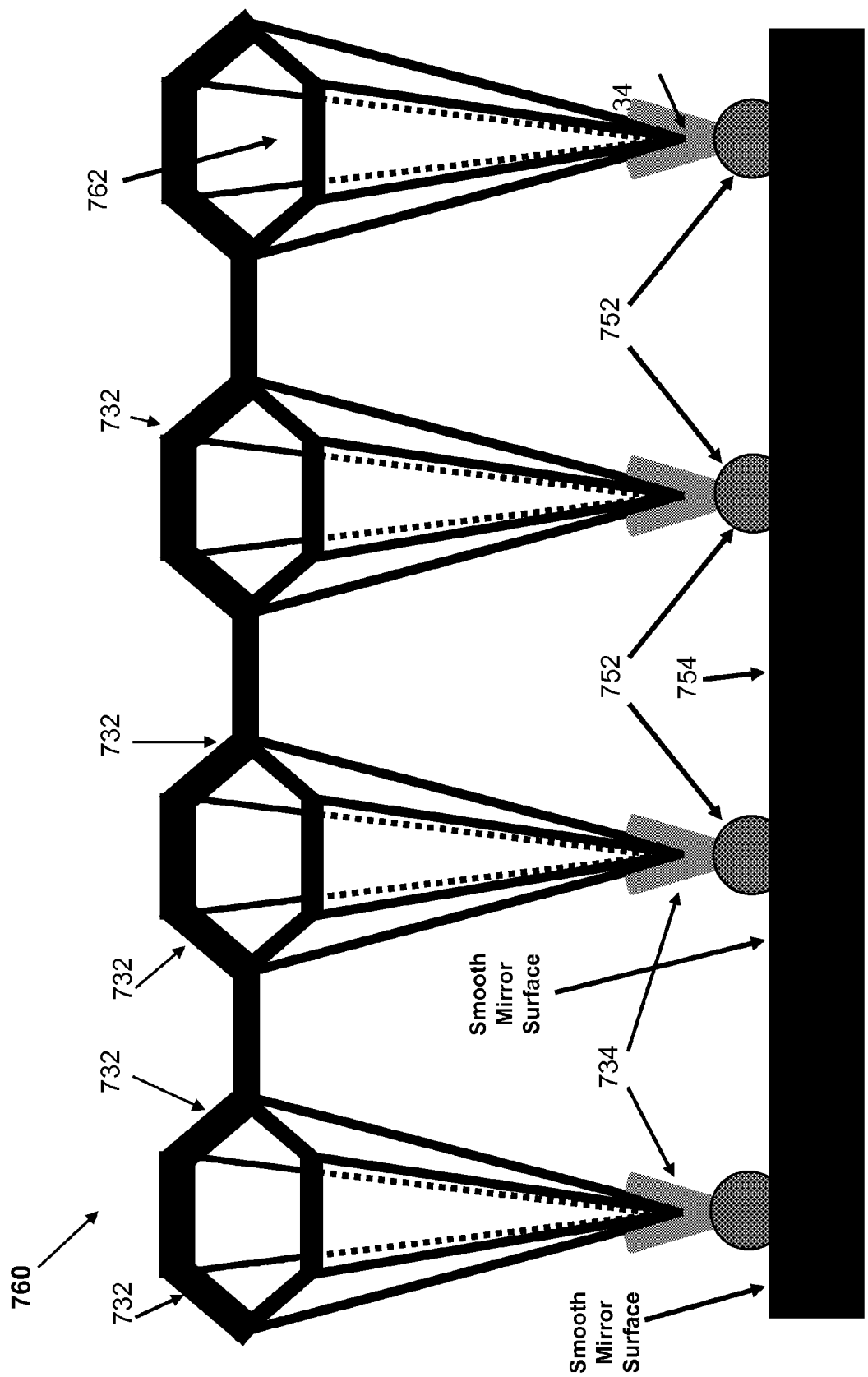
Figure 33:
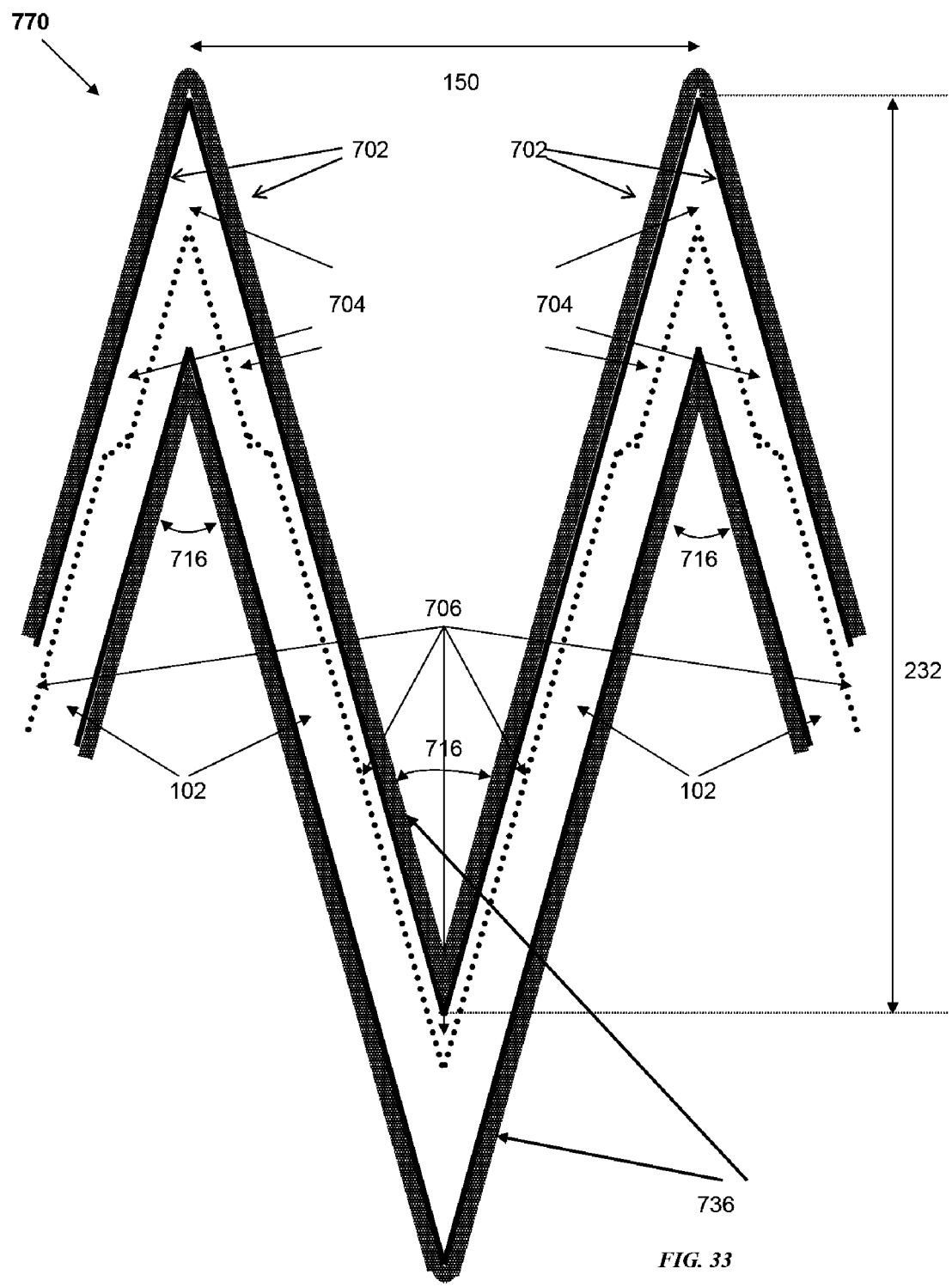
Figure 34:
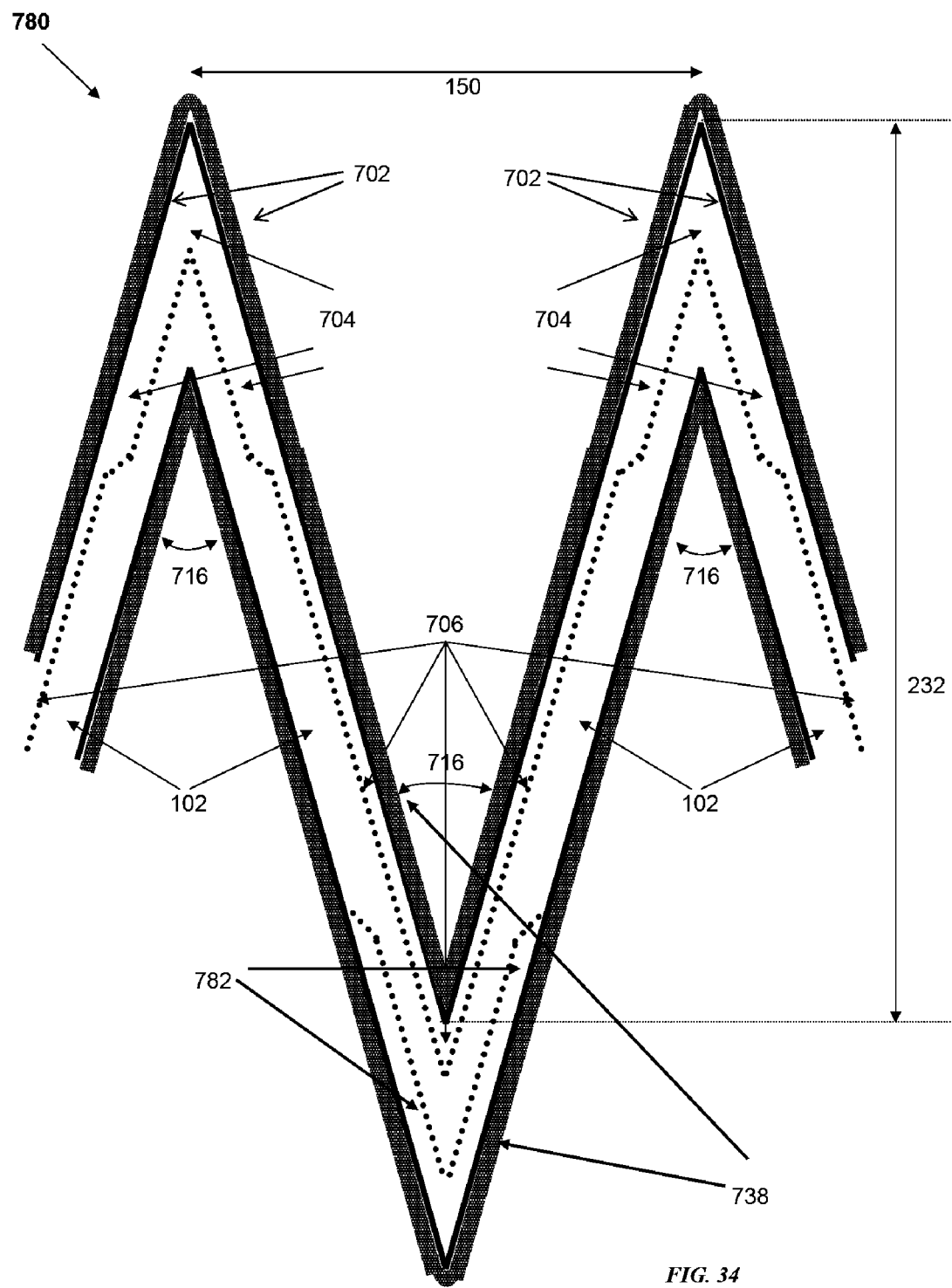
Figure 35:
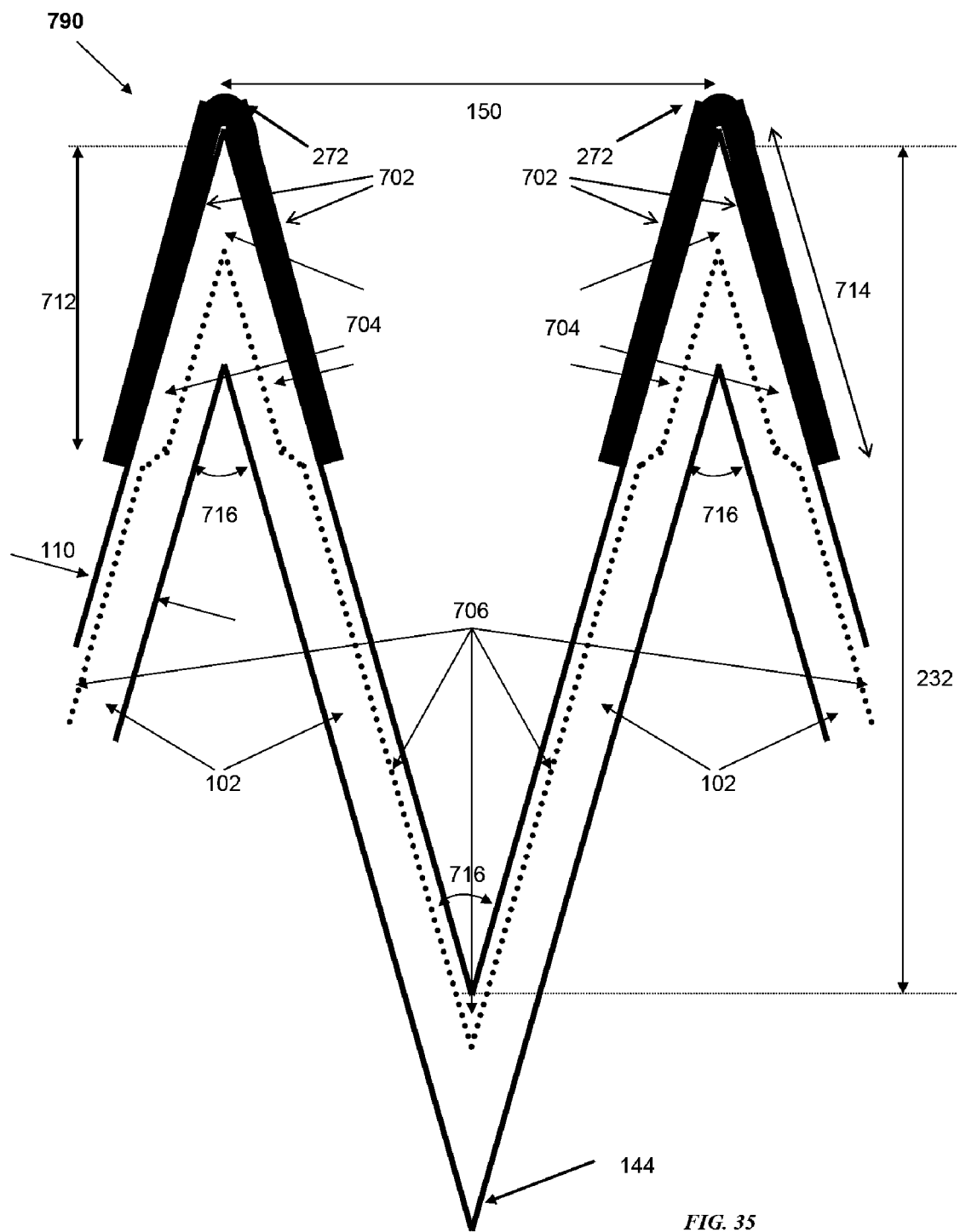
Figure 36:
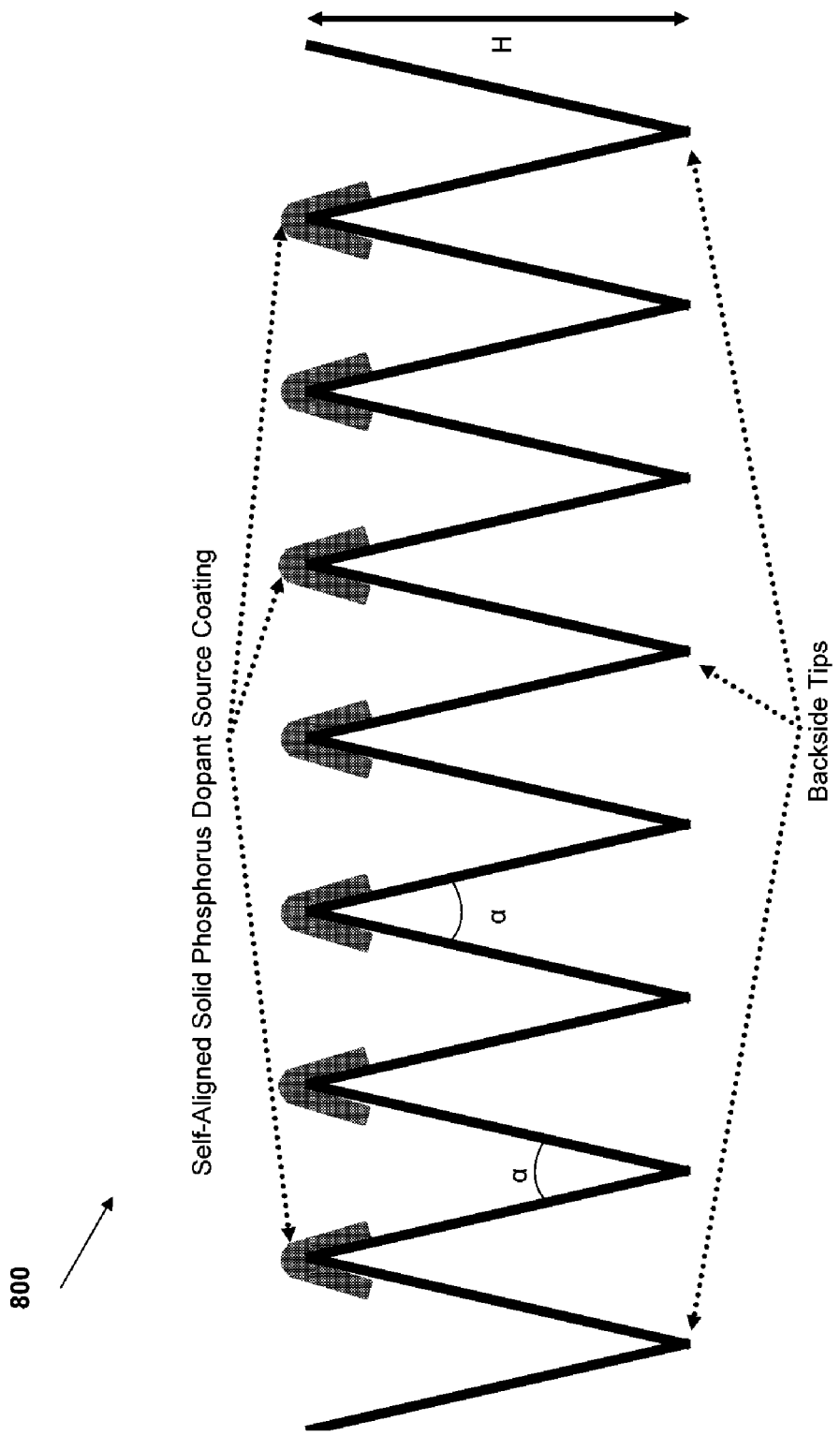
Figure 37:
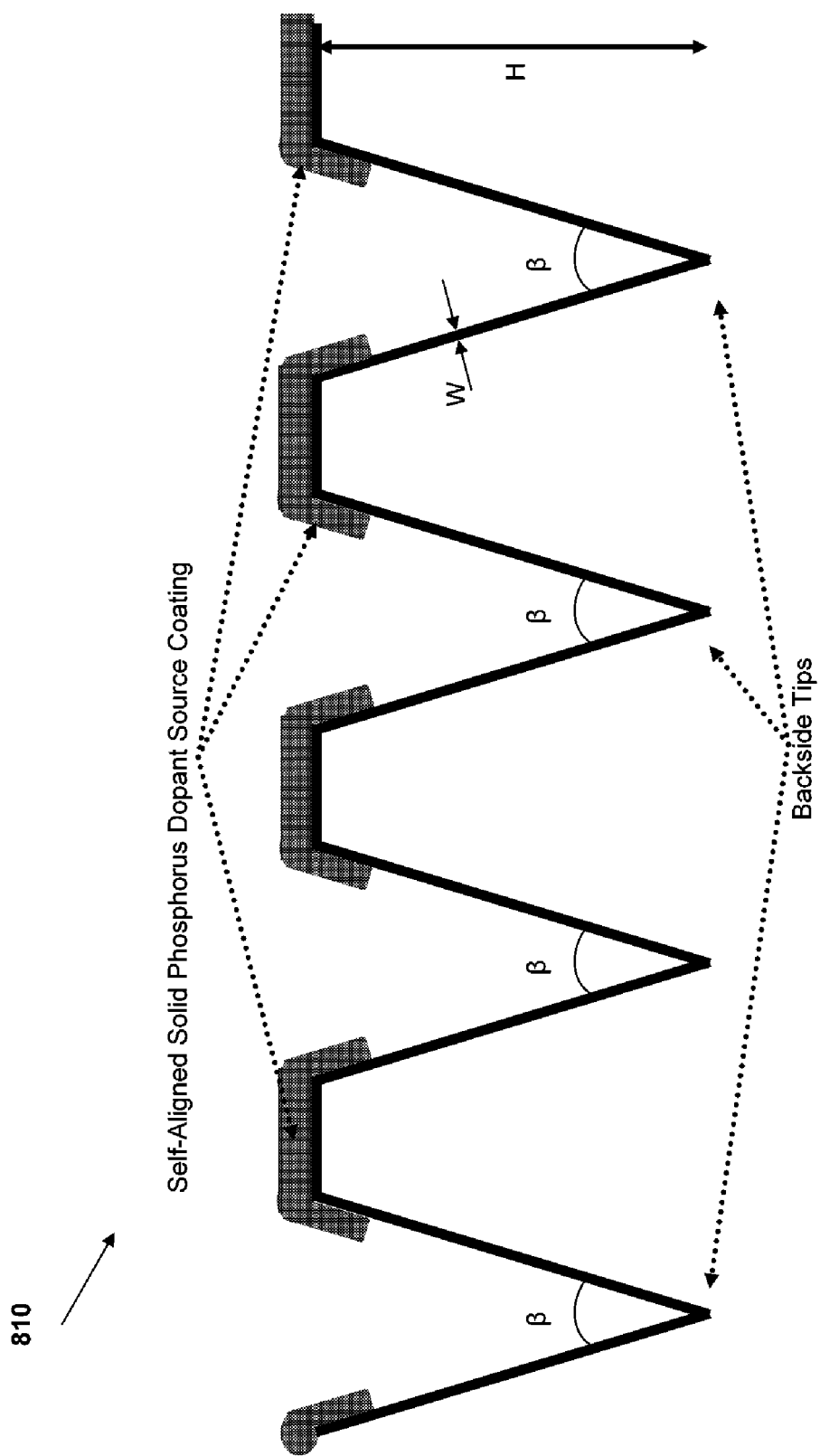
Figure 38:
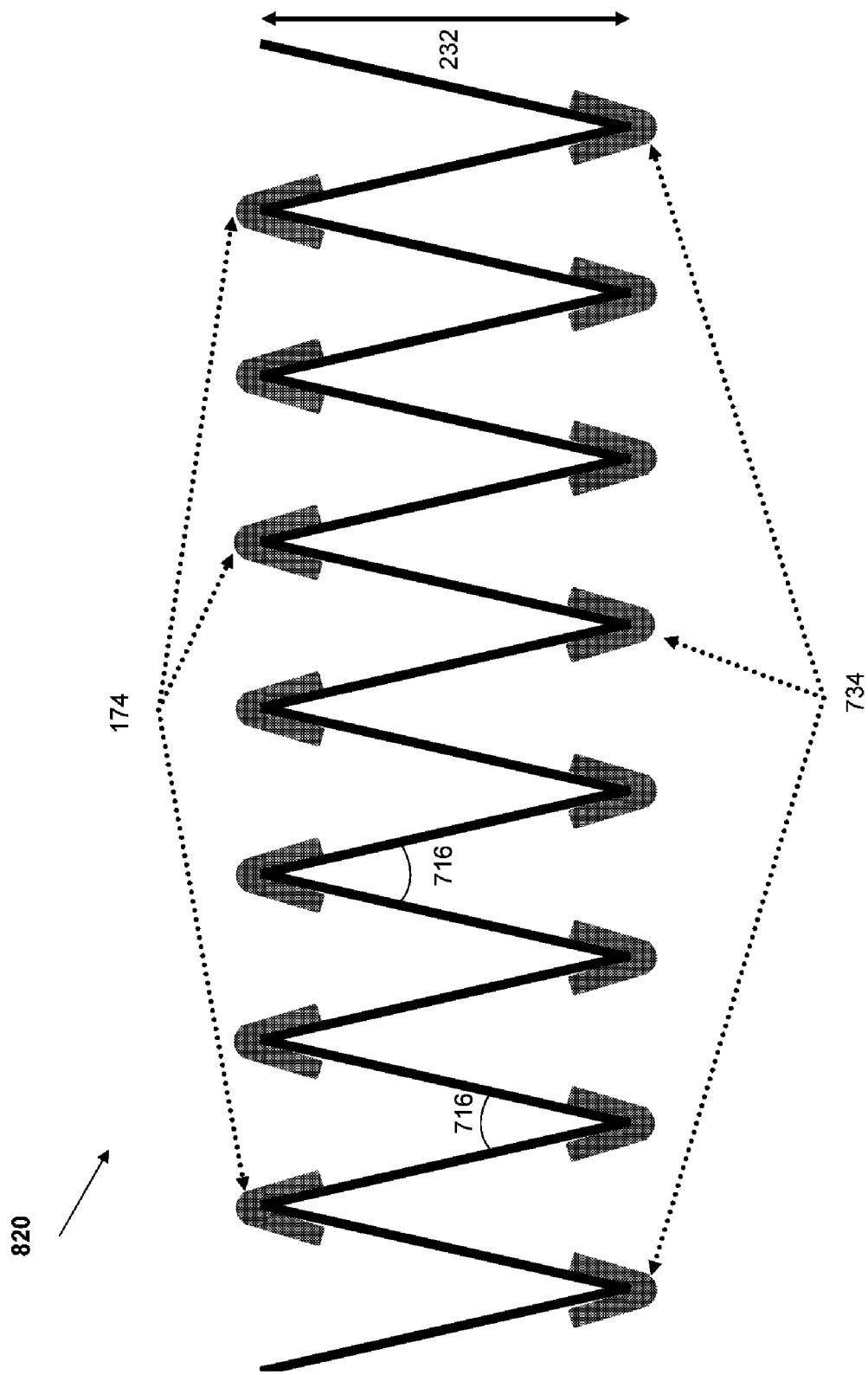
Figure 39:
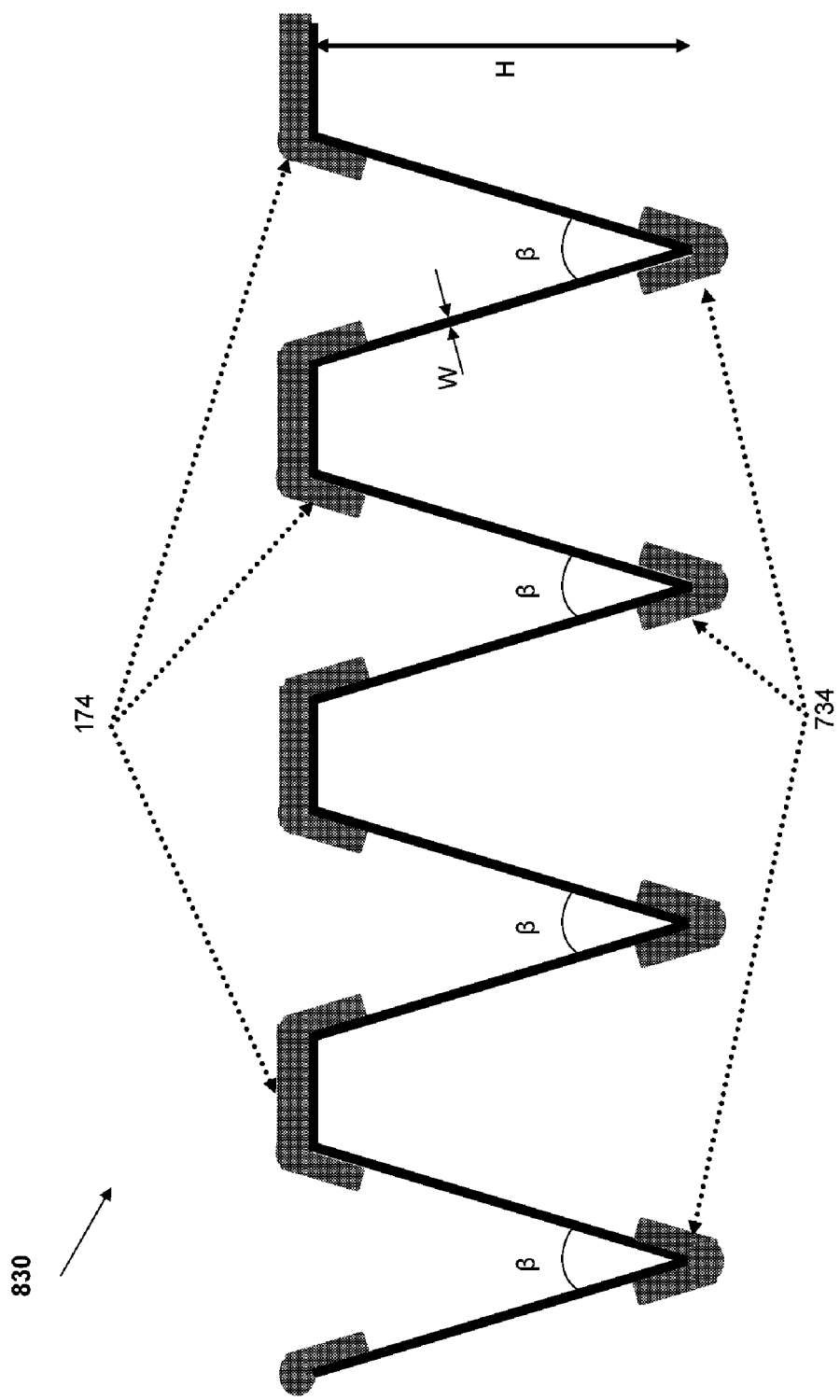
Figure 40:
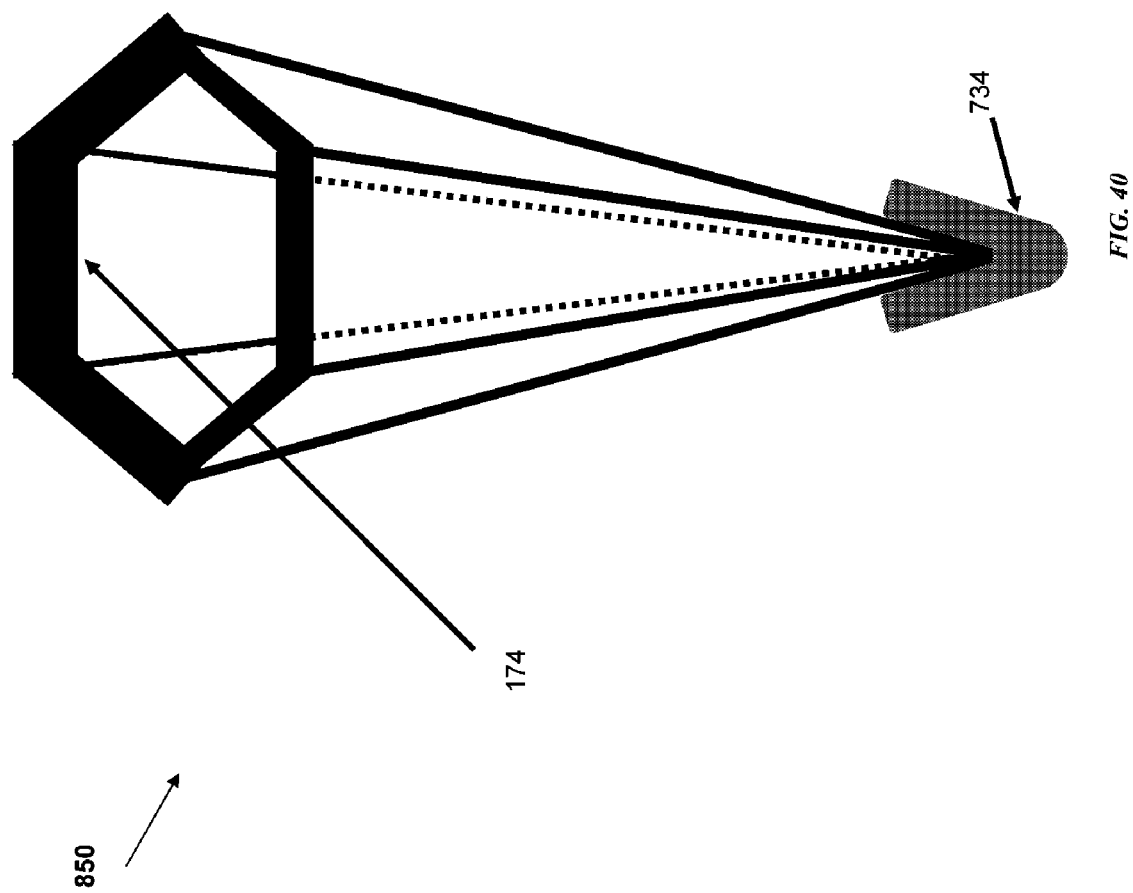
Figure 41:
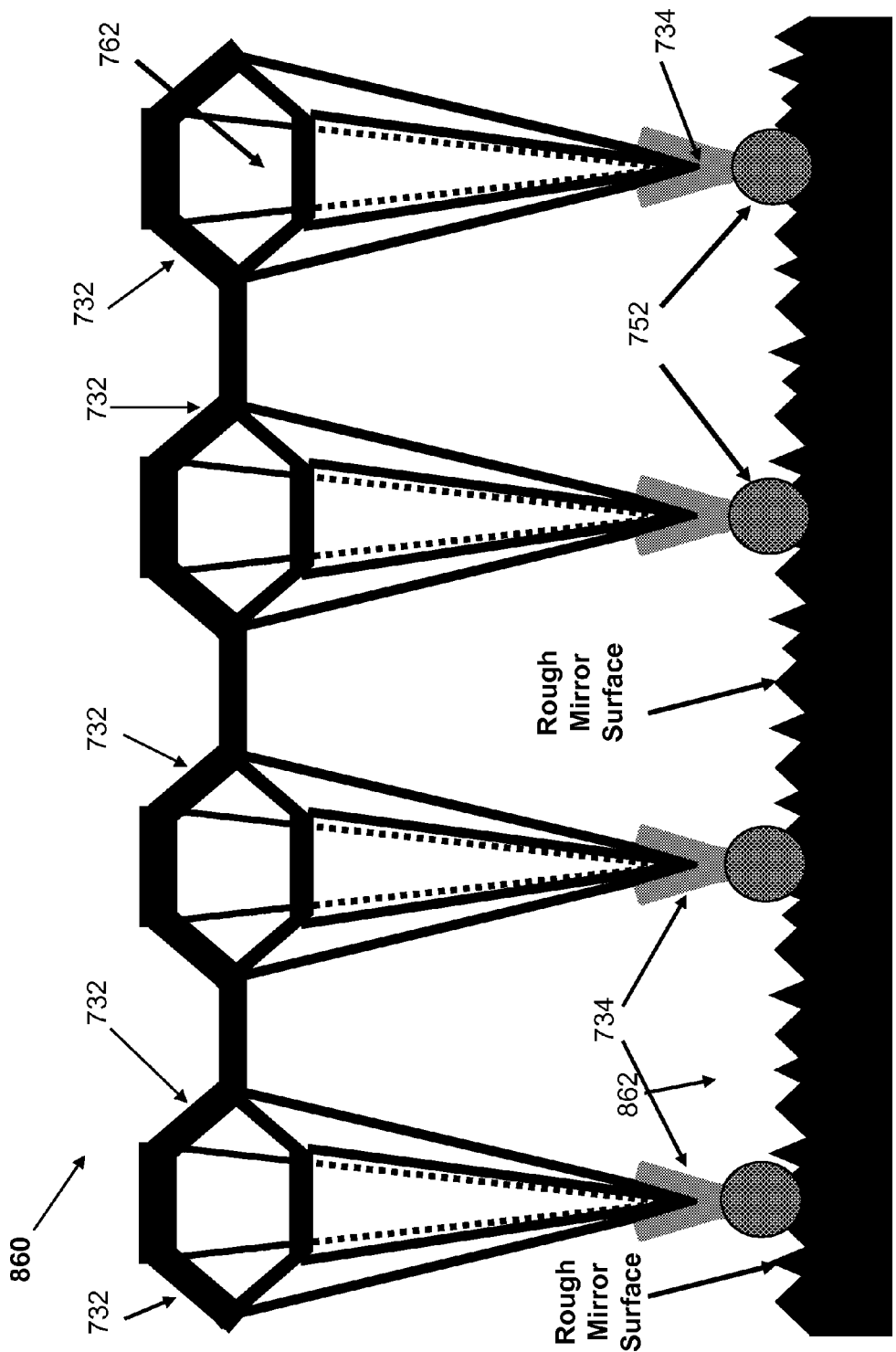
Figure 42:
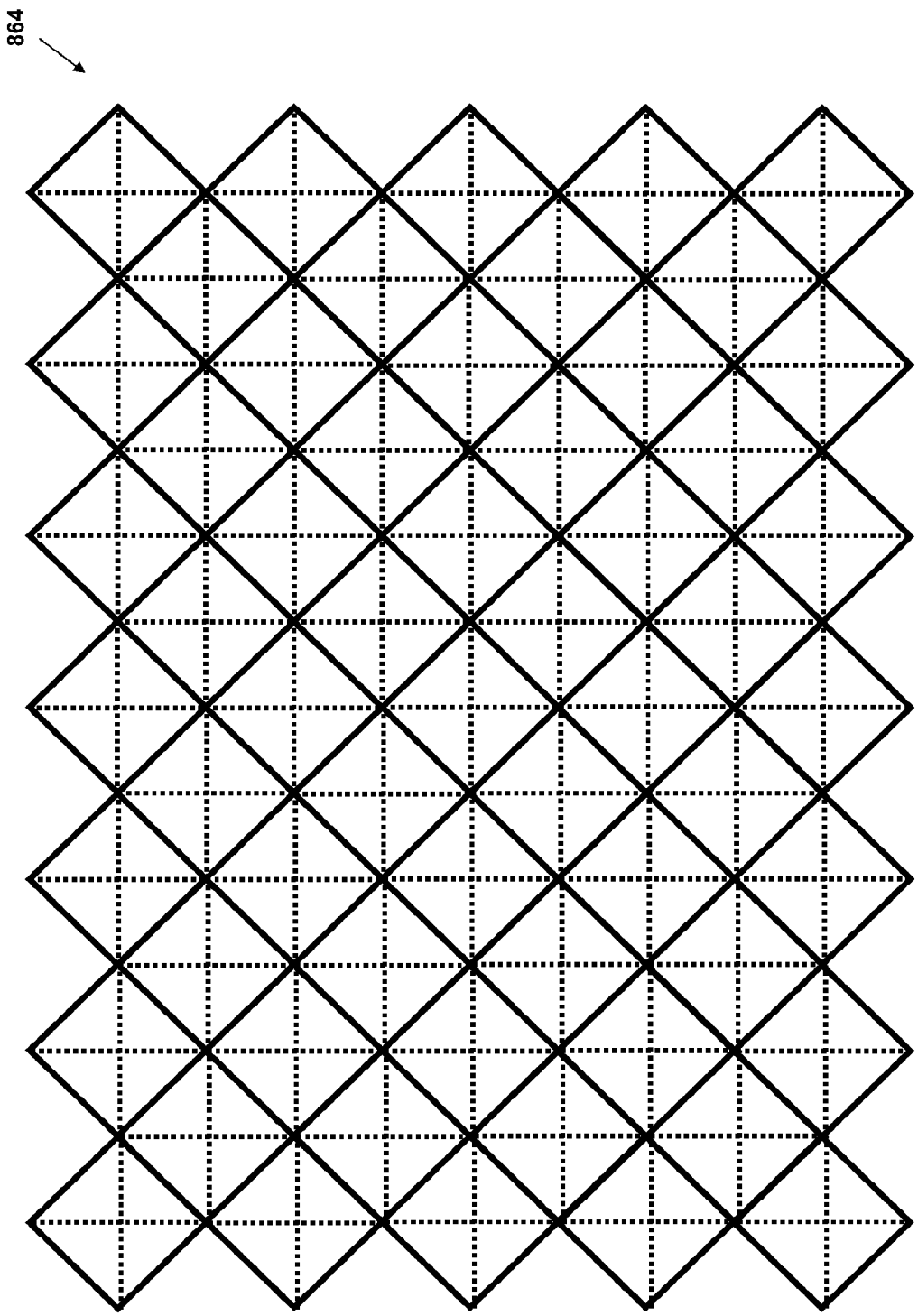
Figure 43:
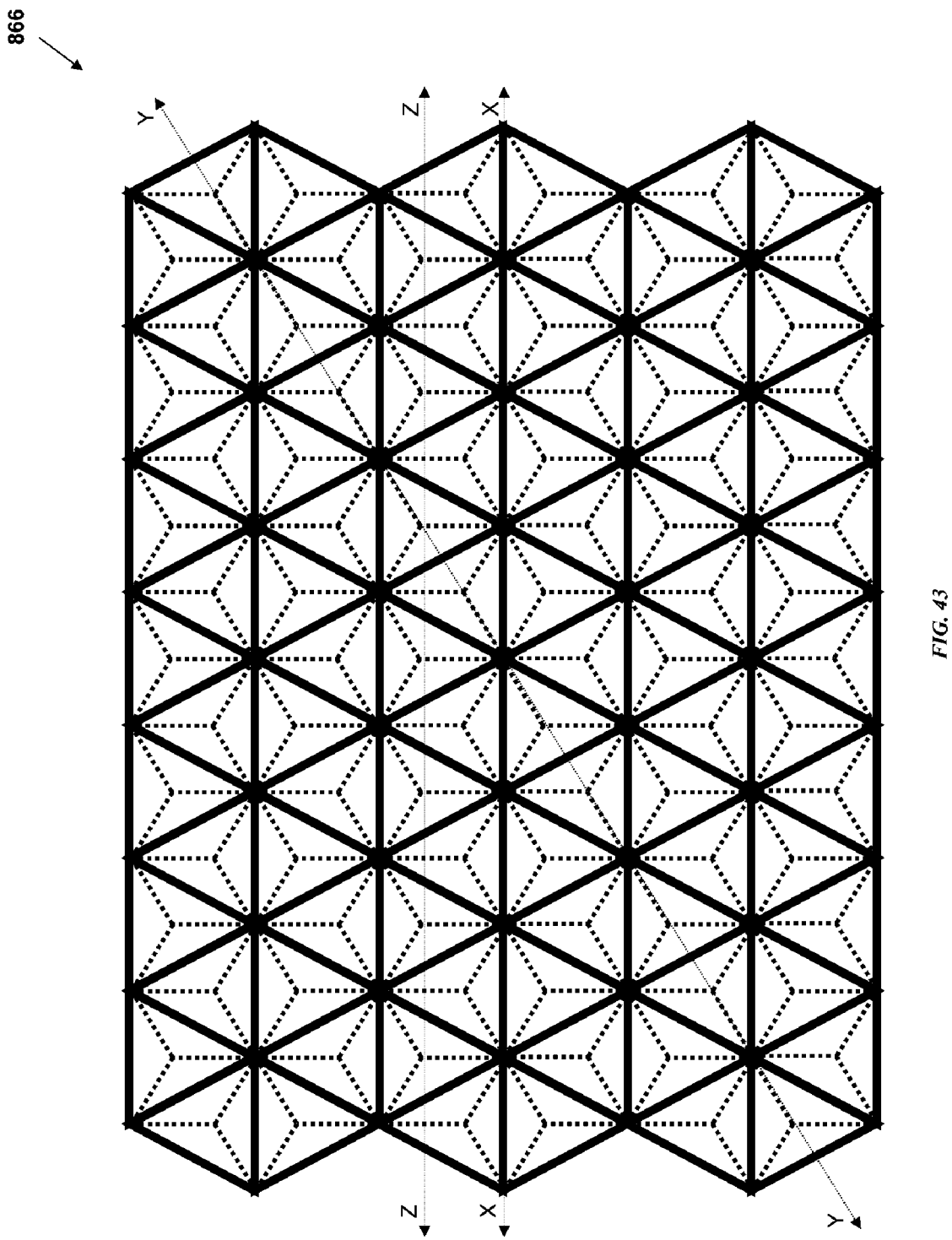
Figure 44:
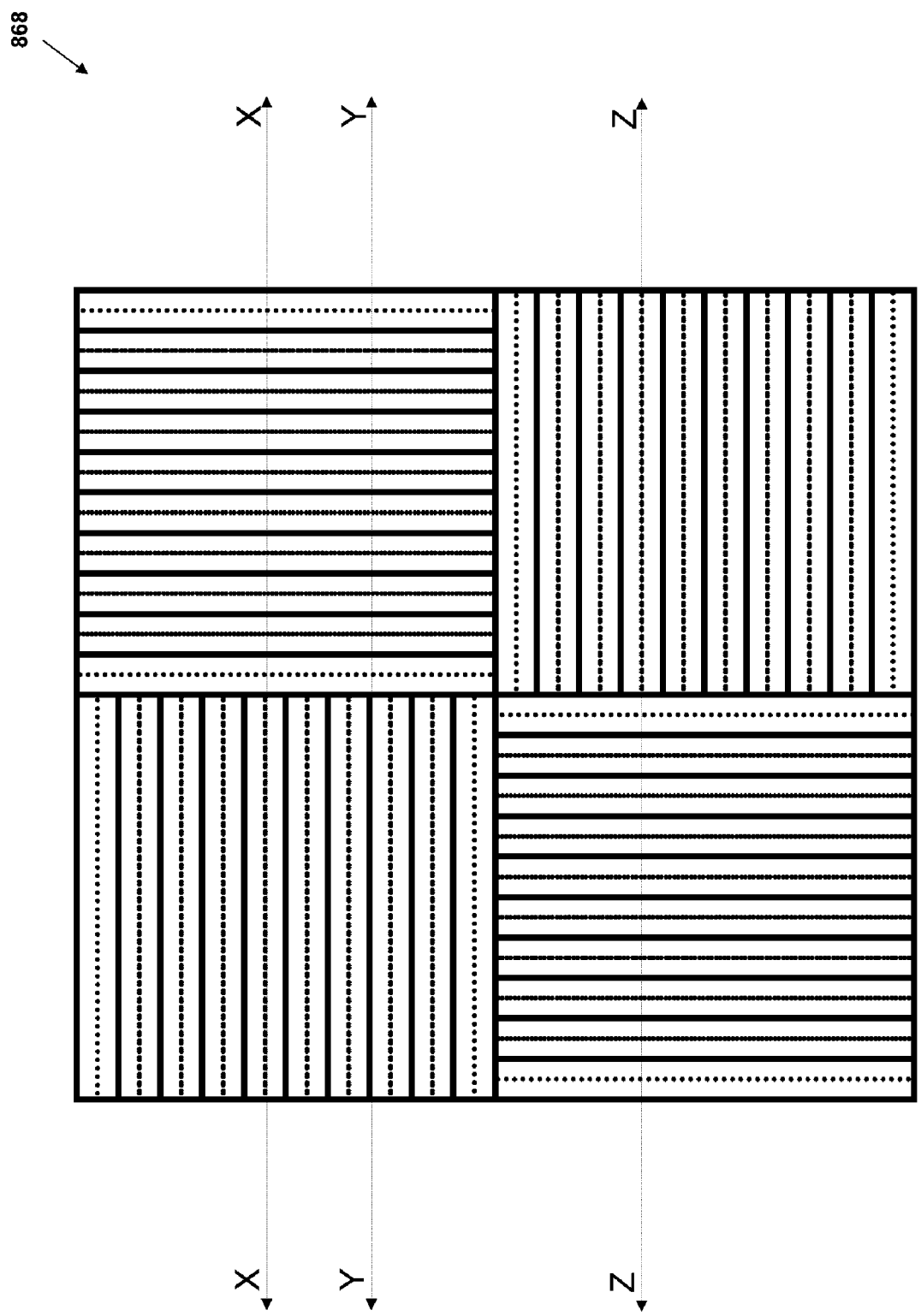
Figure 45:
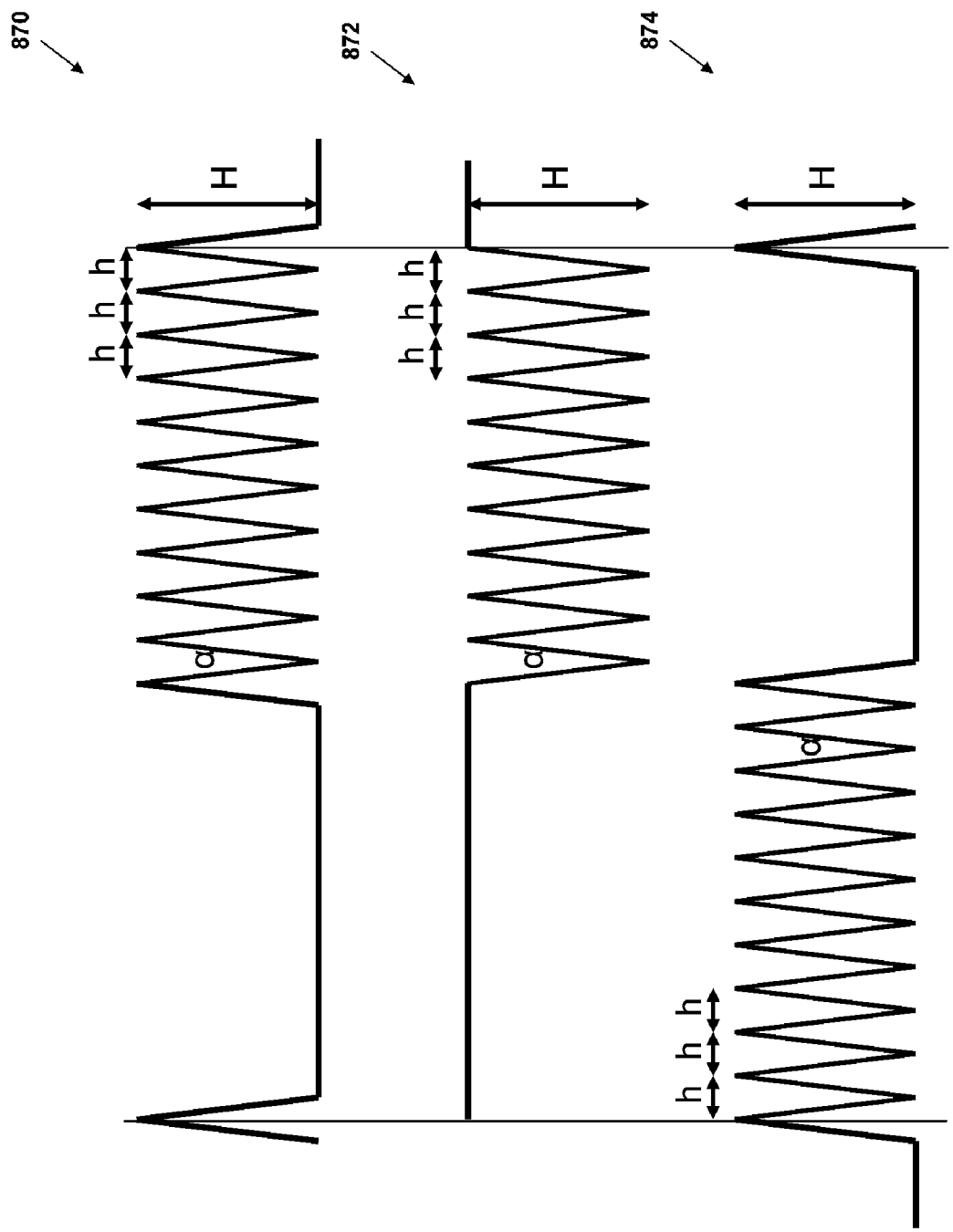
Figure 46:
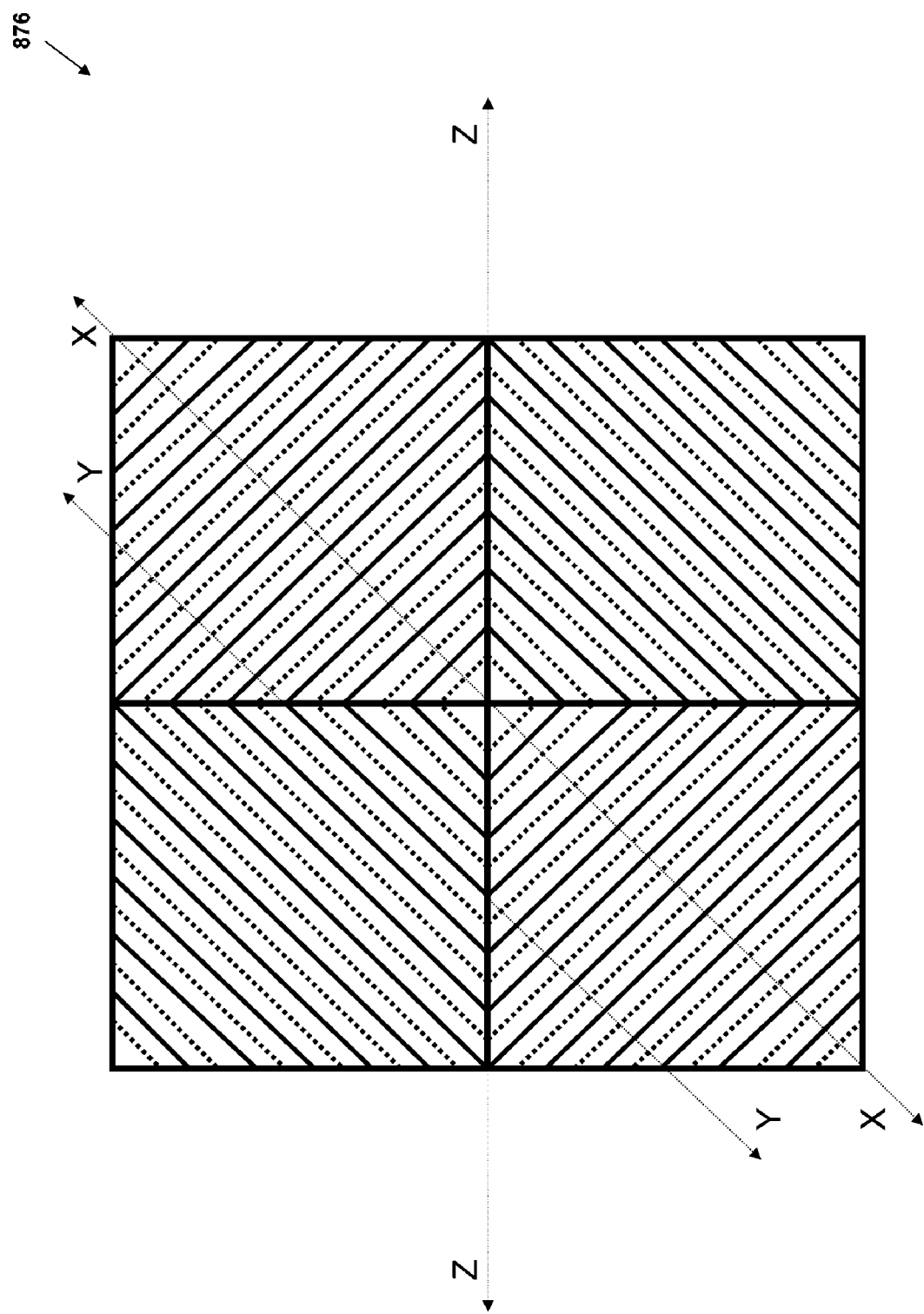
Figure 47:
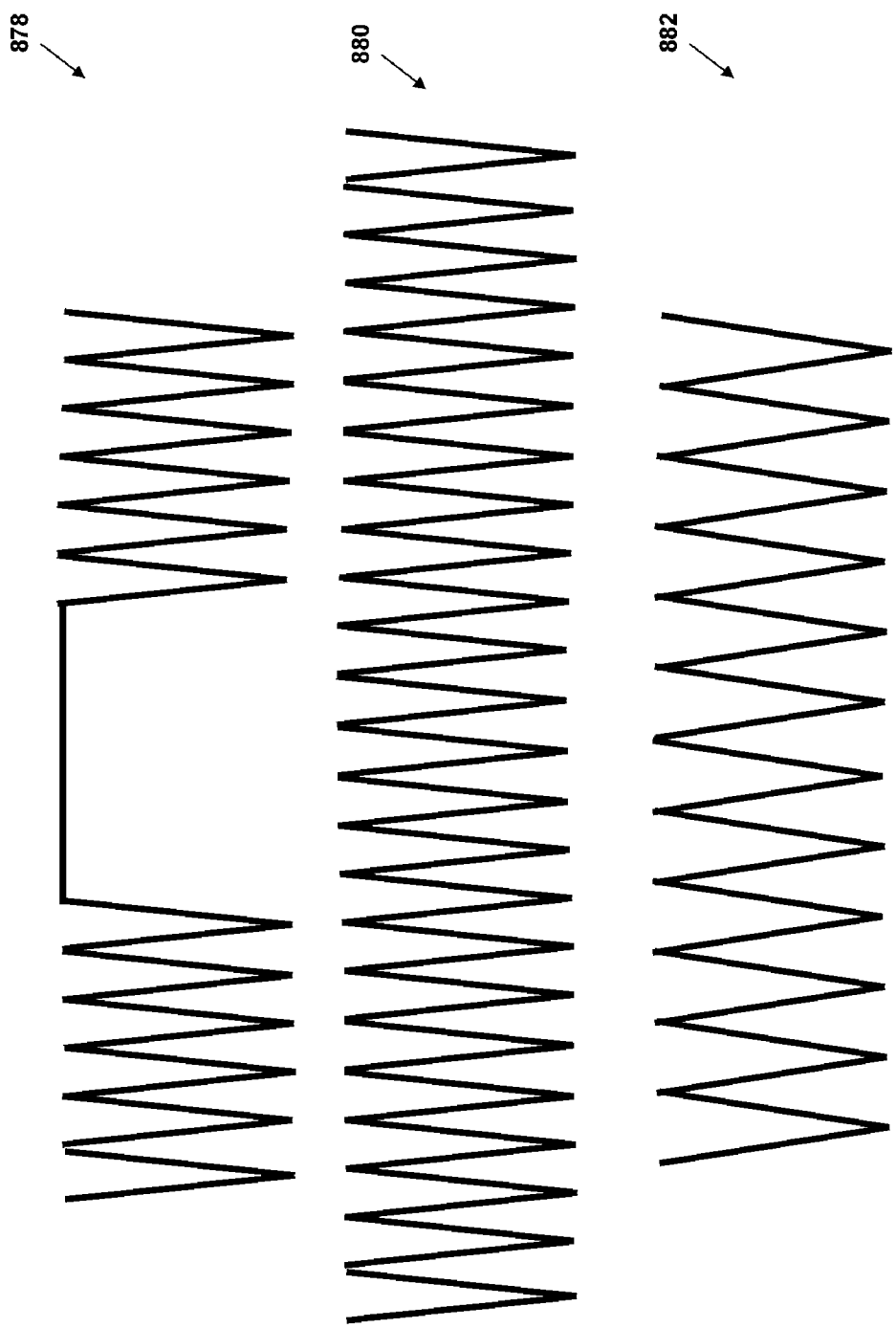
Figure 48:
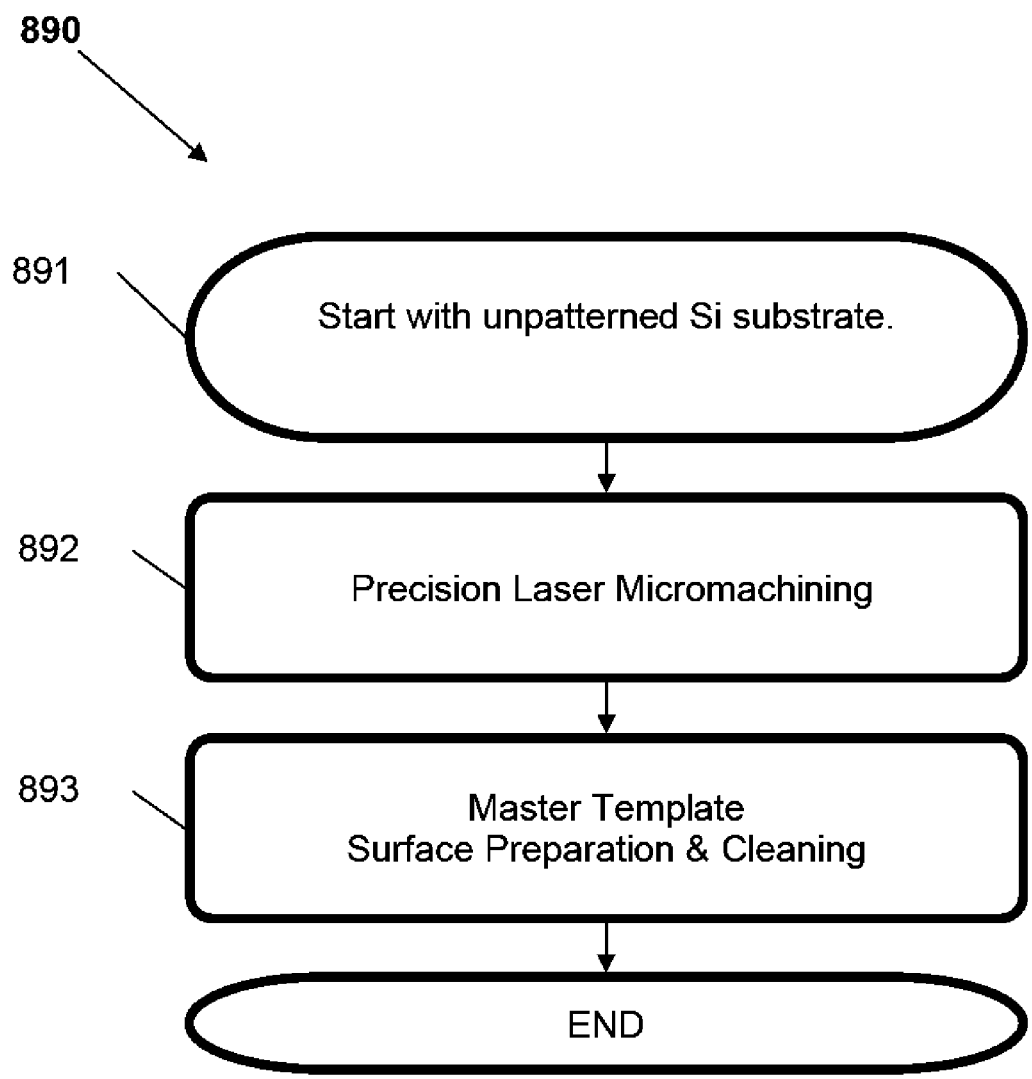
Figure 49:
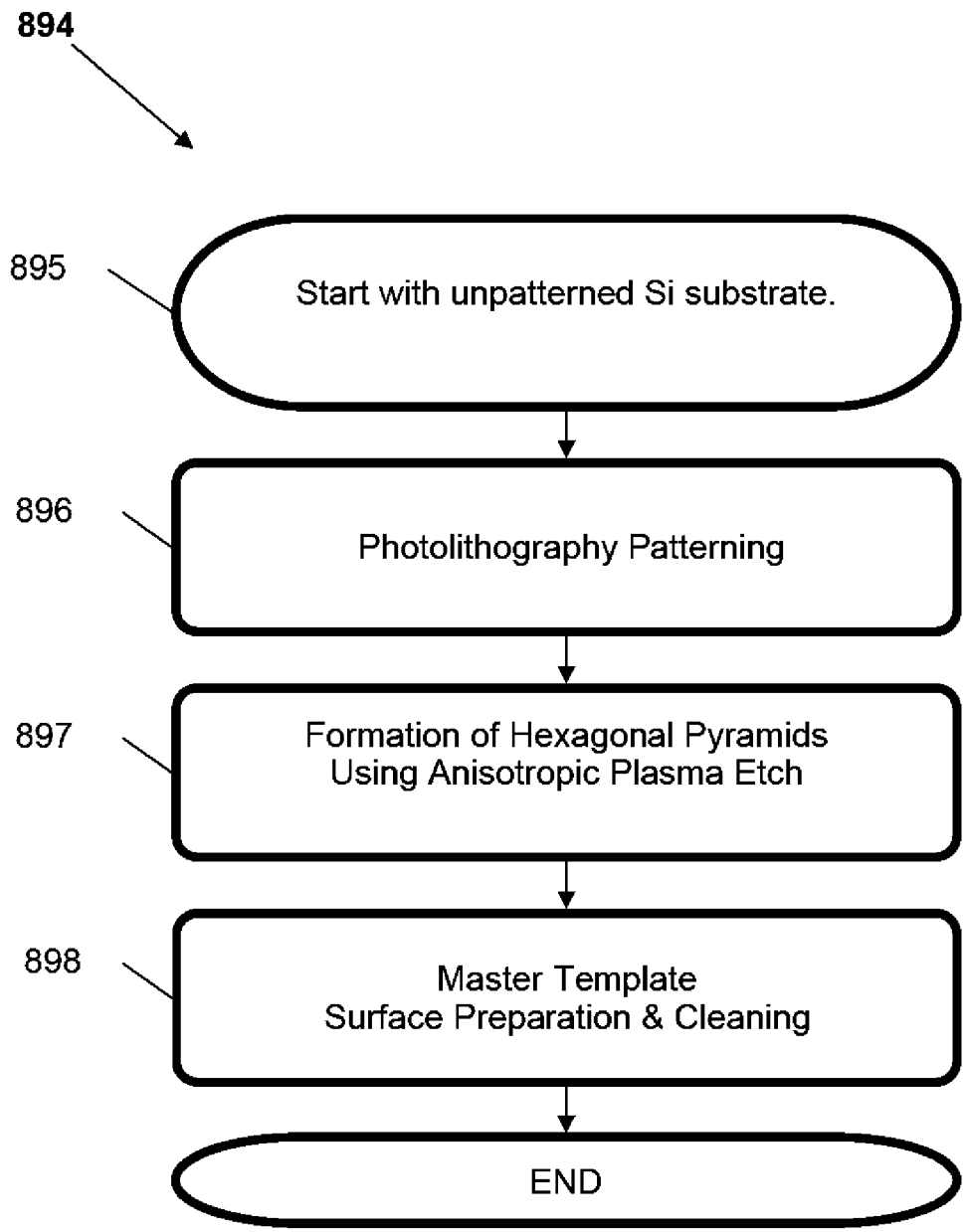
Figure 54:
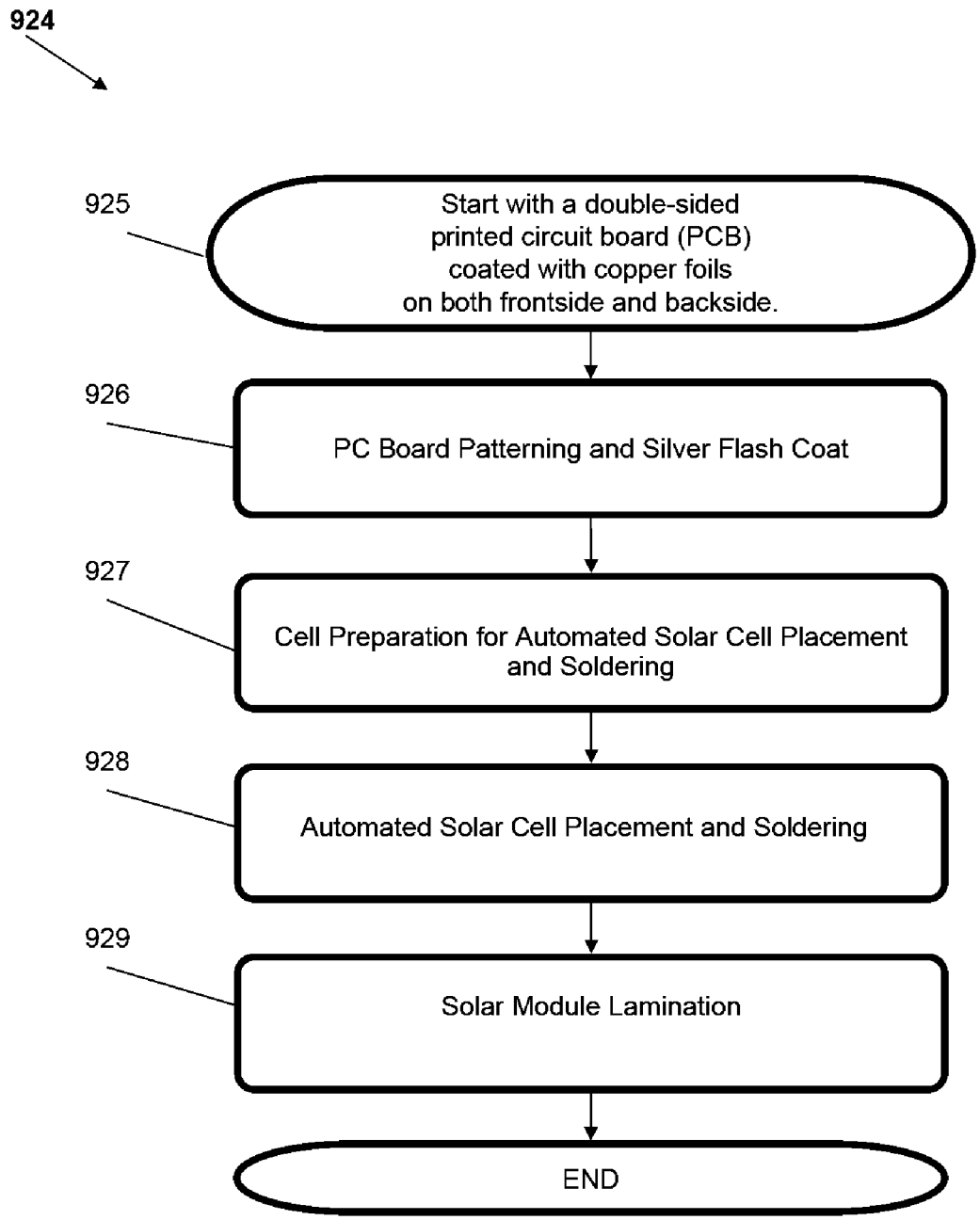
Figure 55:
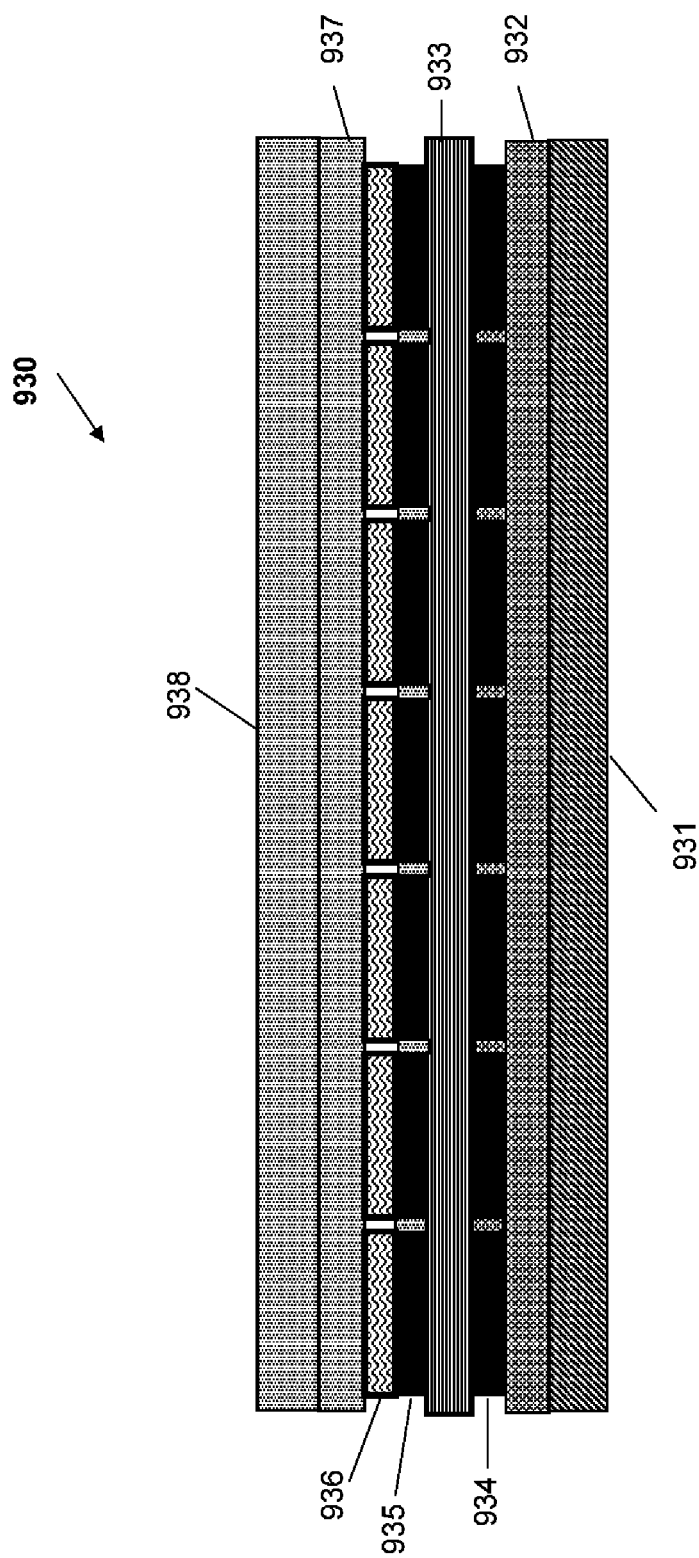
Figure 56:
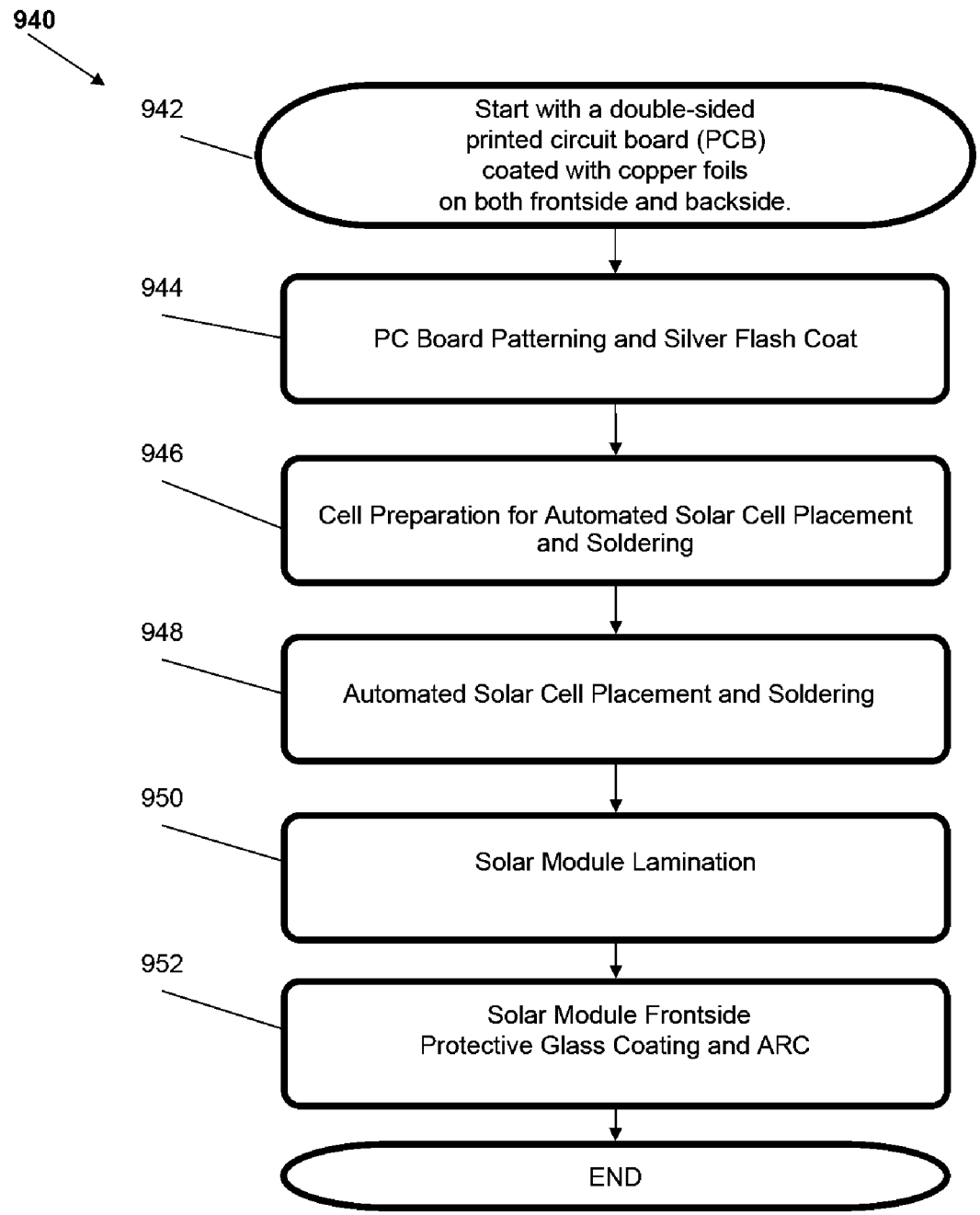
Figure 57:
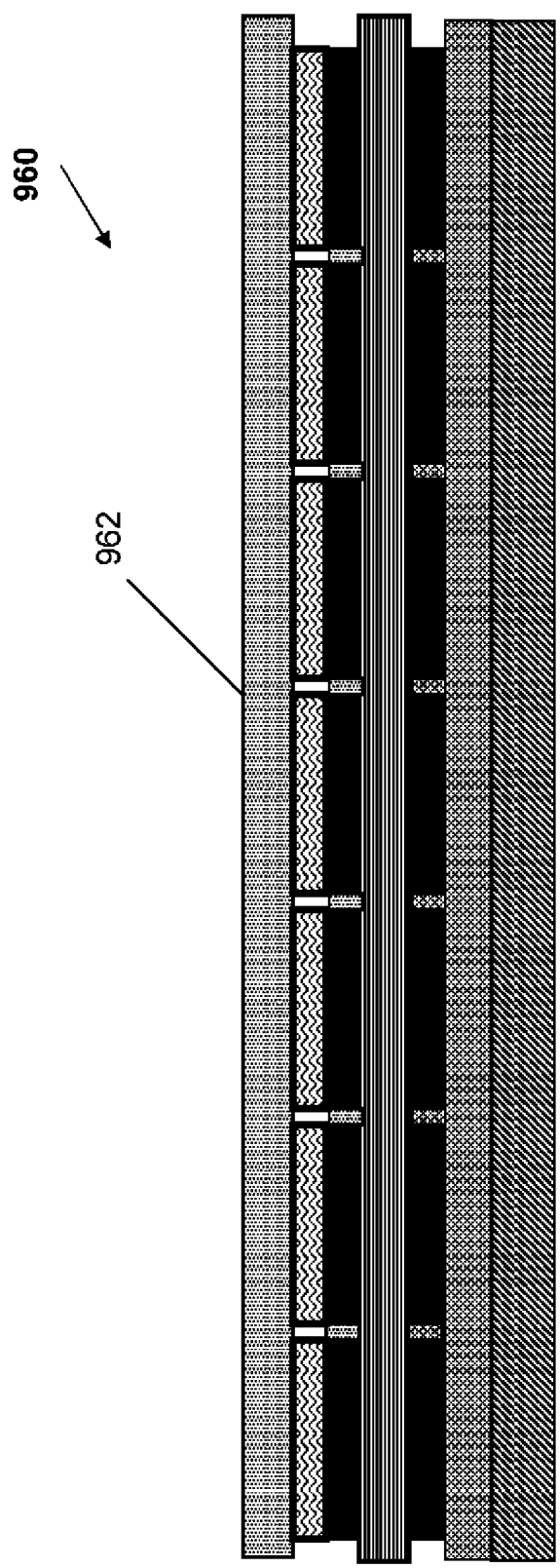
Figure 58:
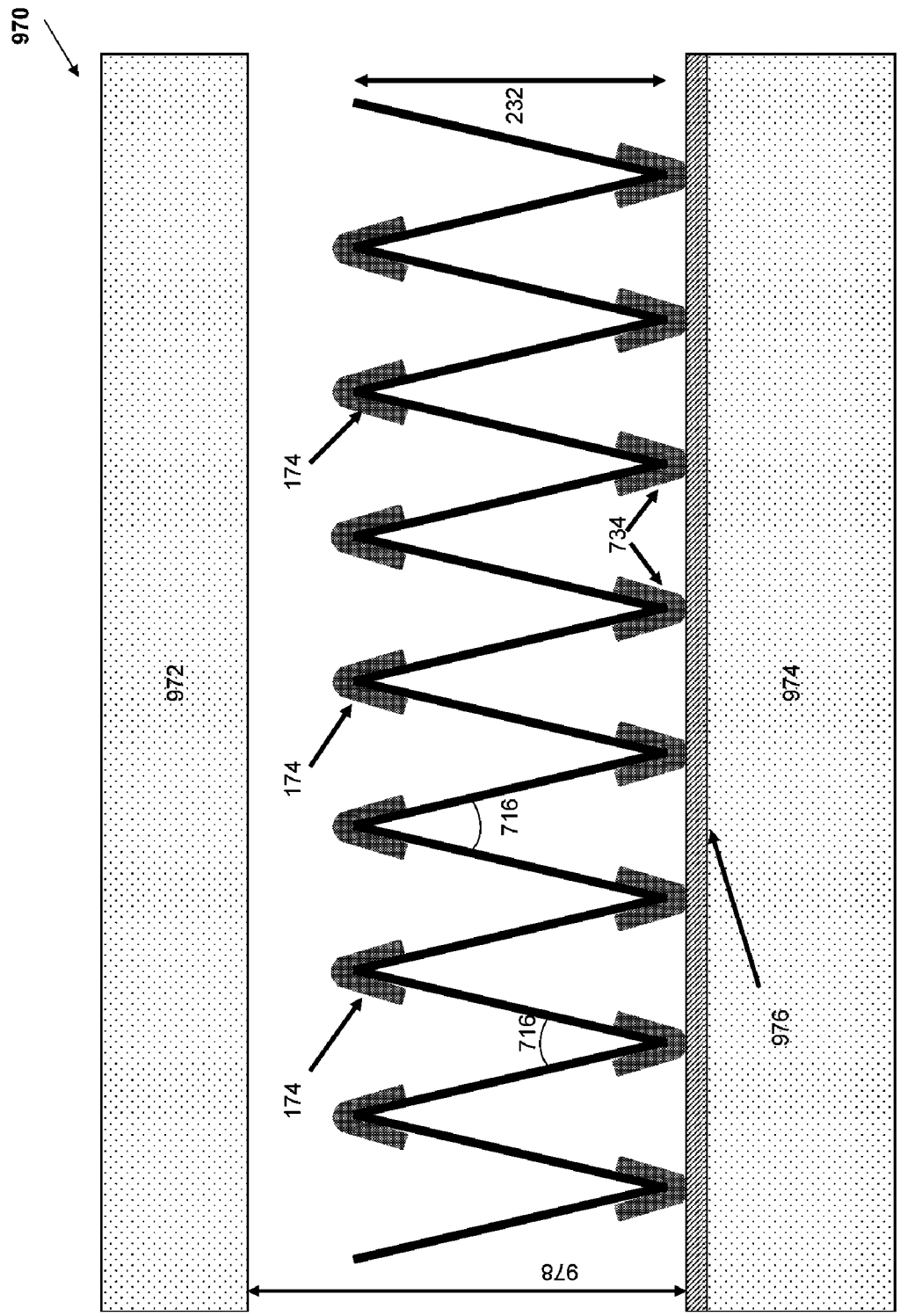
Figure 59:
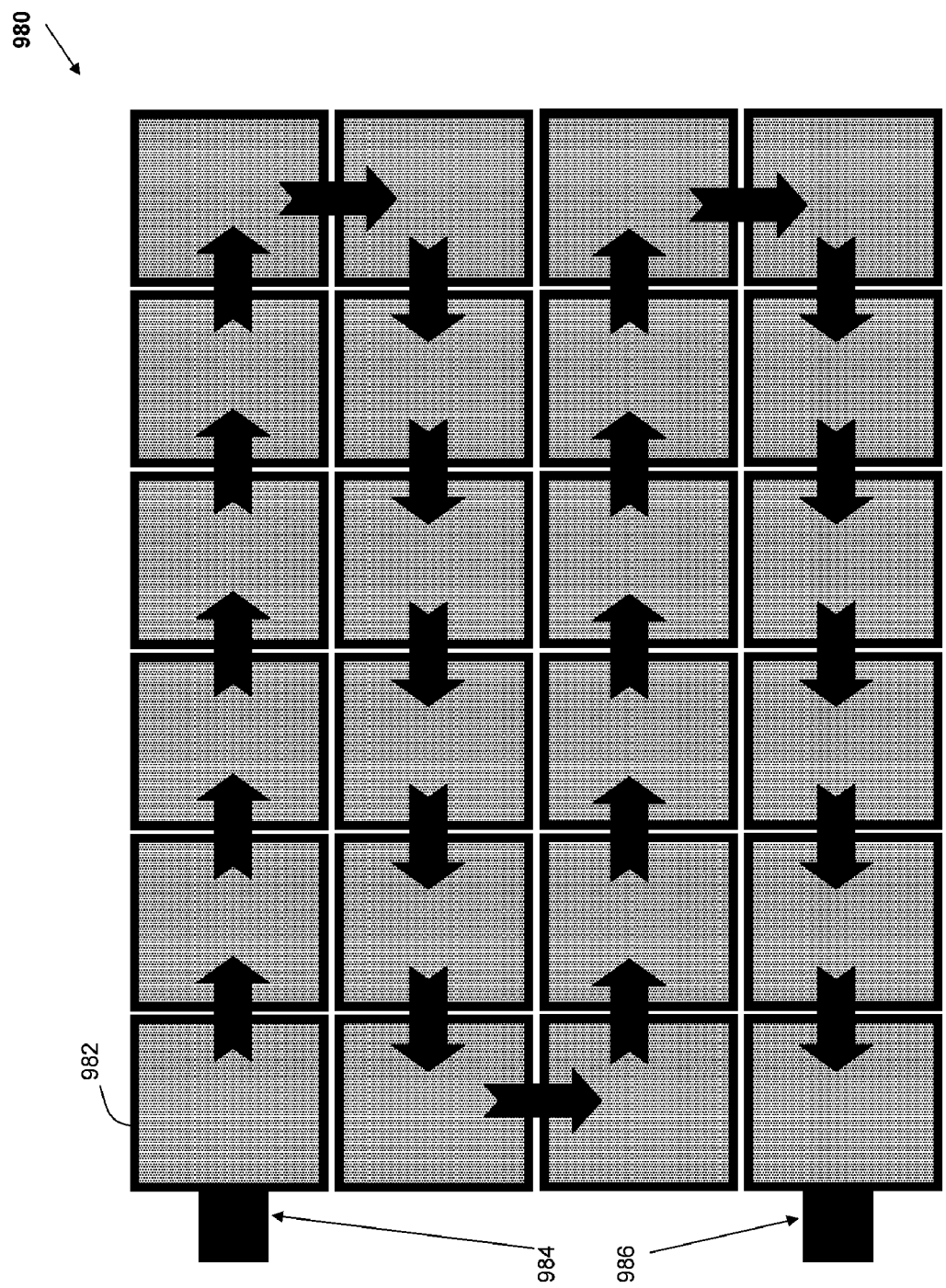
Figure 60:
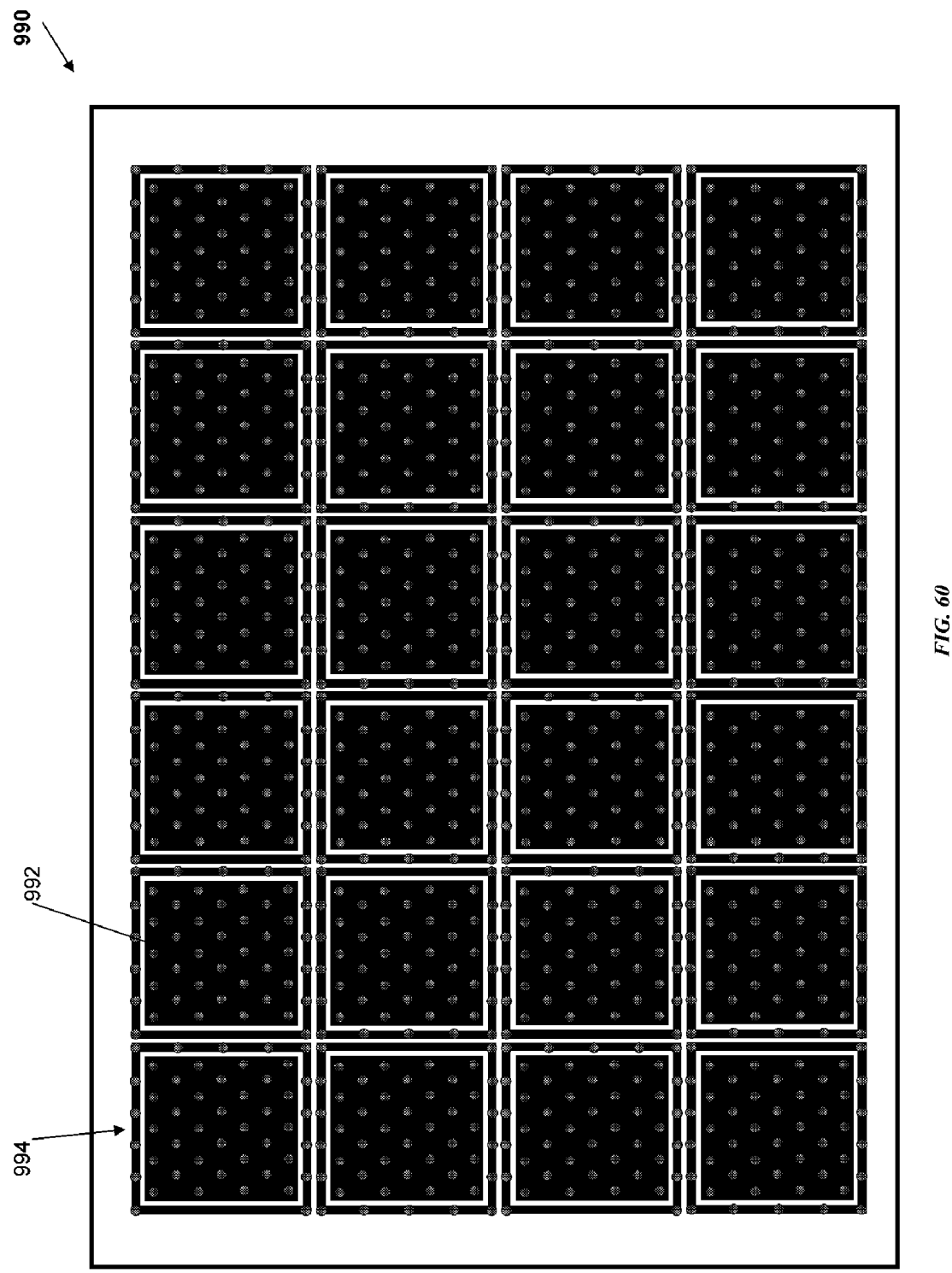
Figure 61:
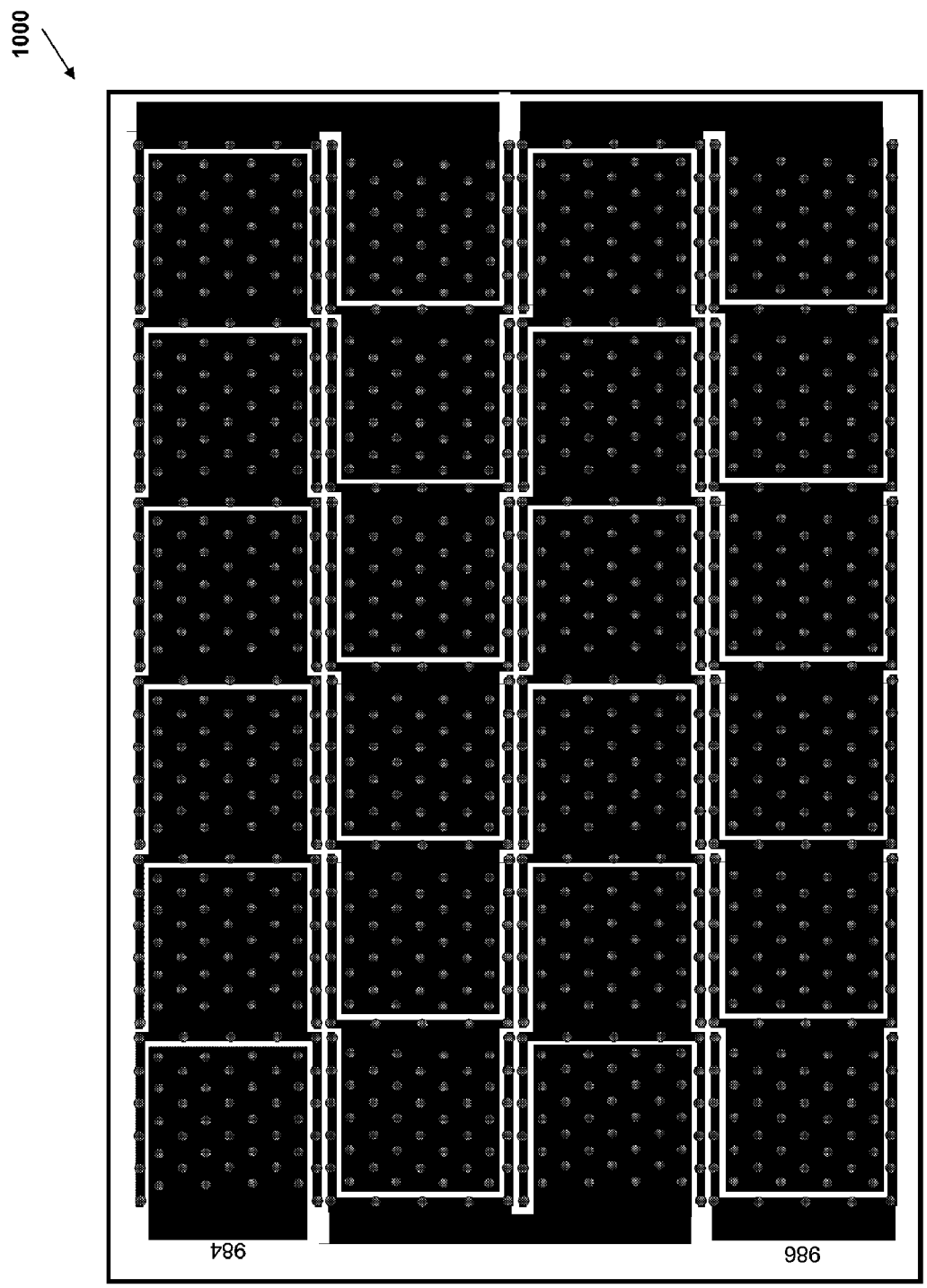
Figure 62:
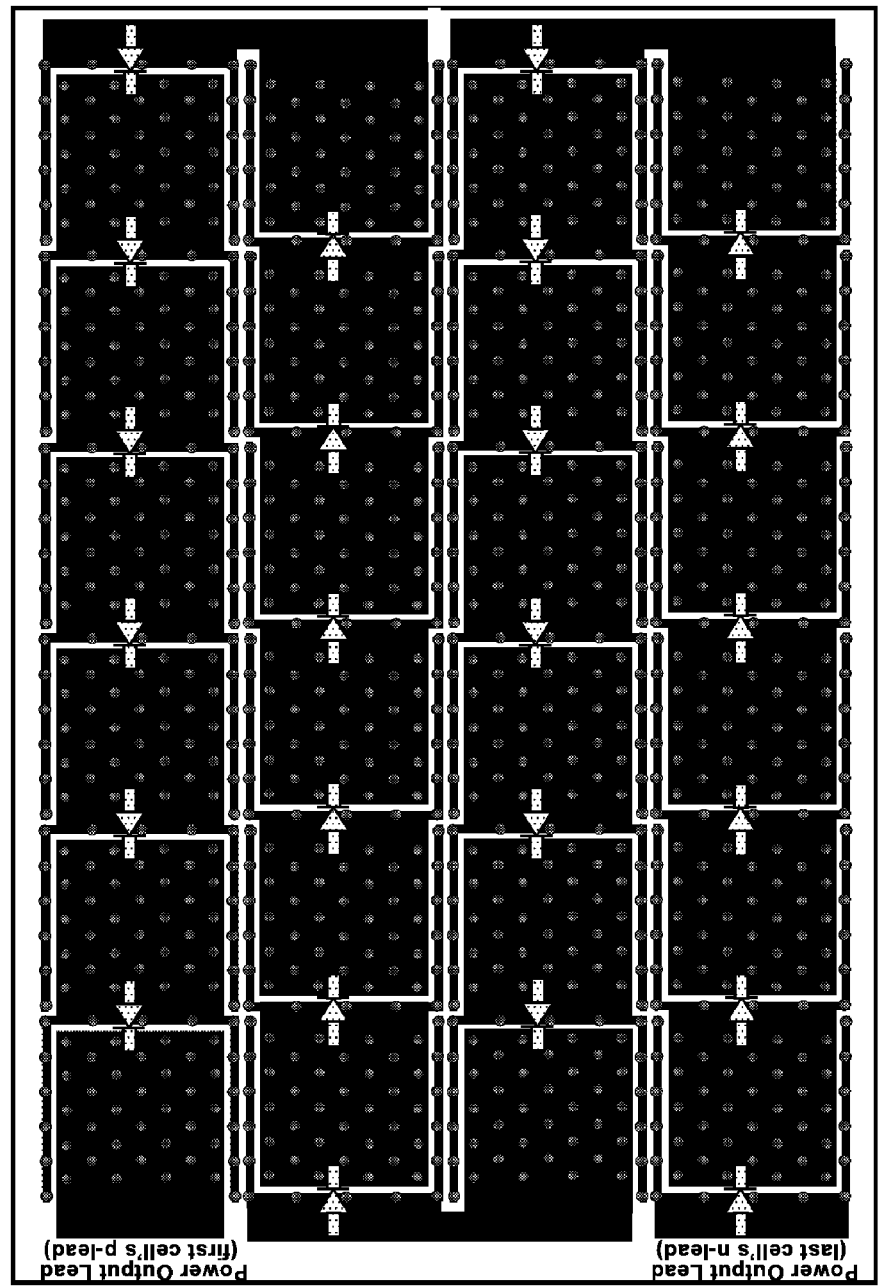
Figure 63:
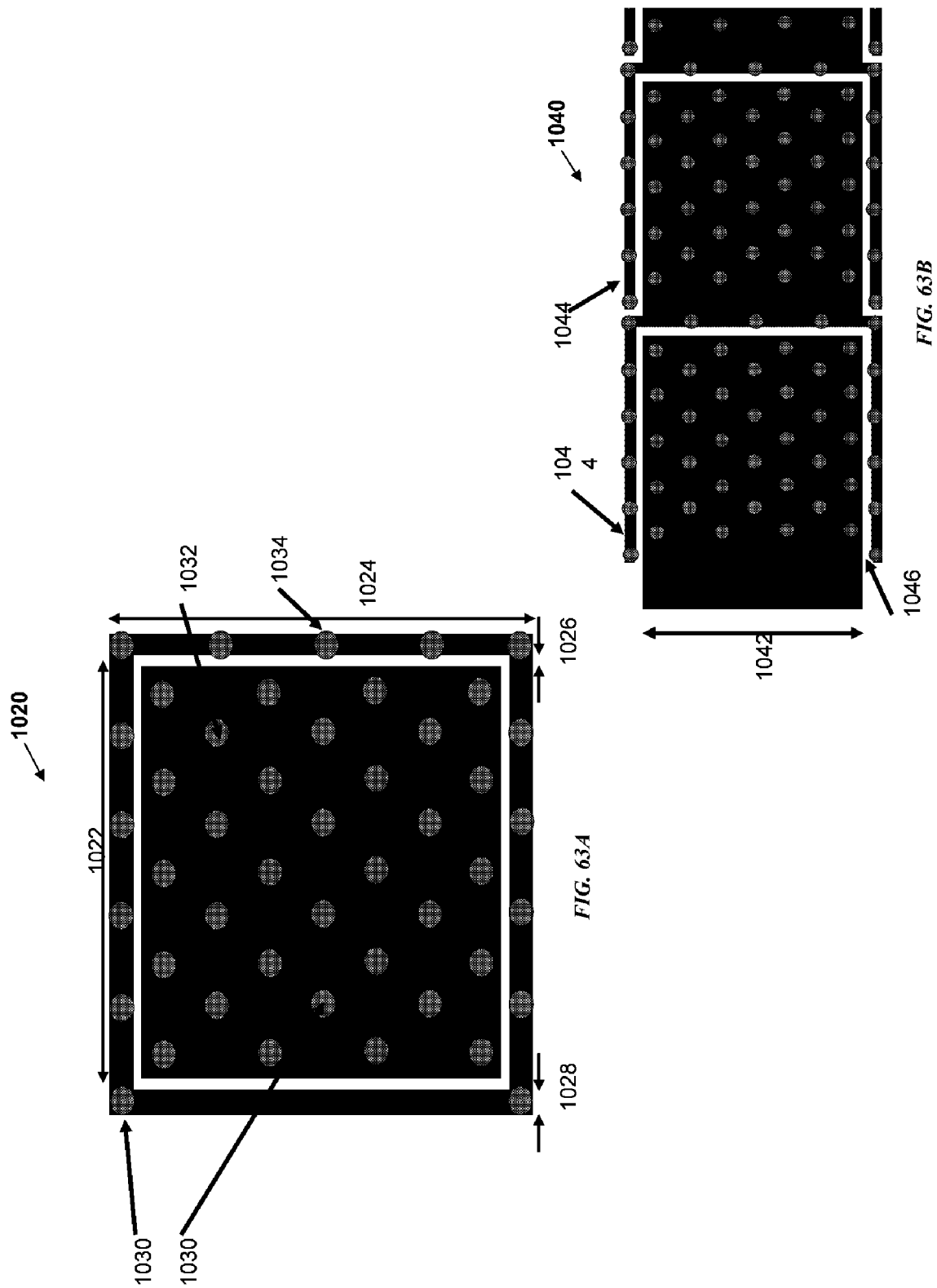
Figure 64:
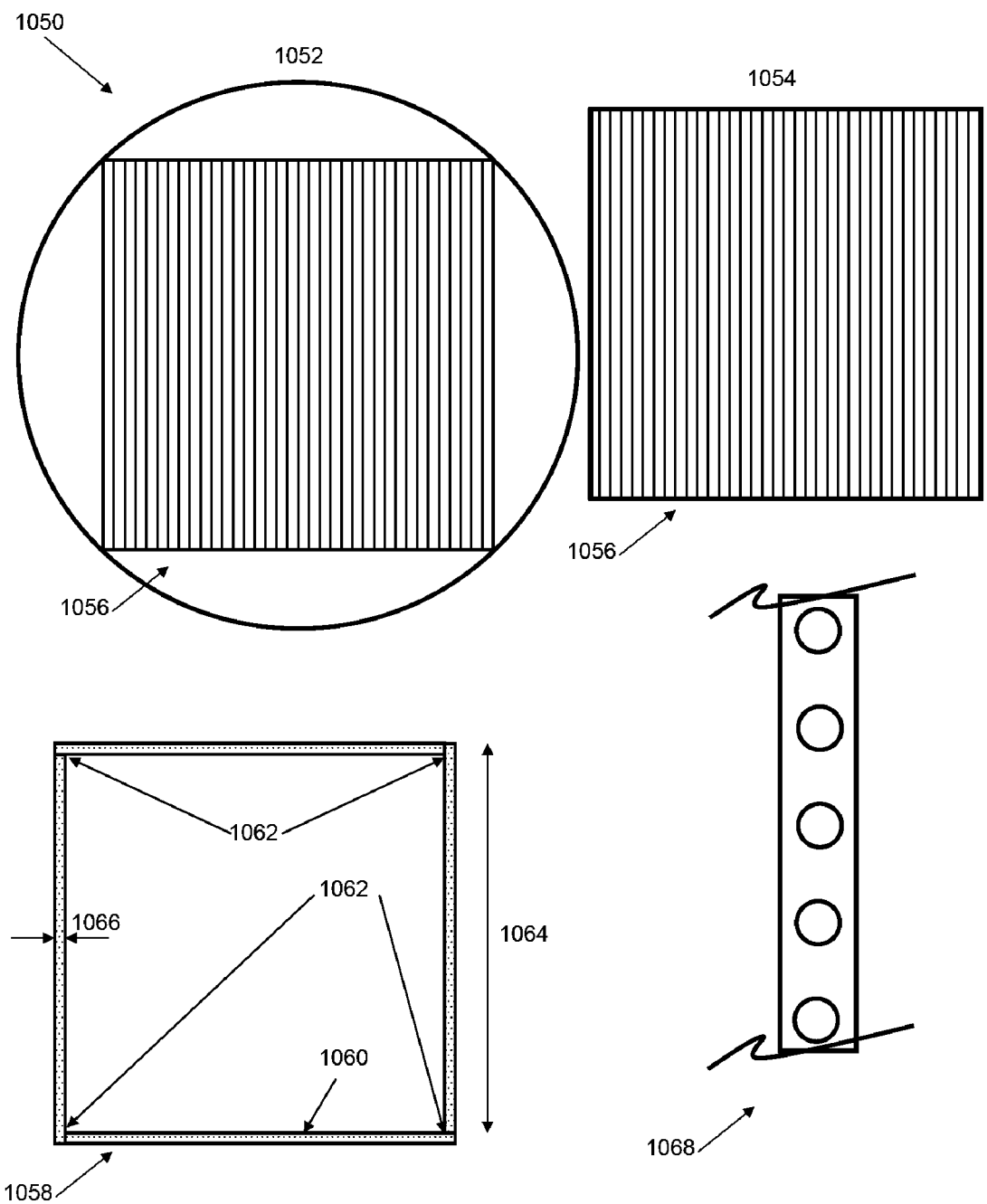
Figure 66:
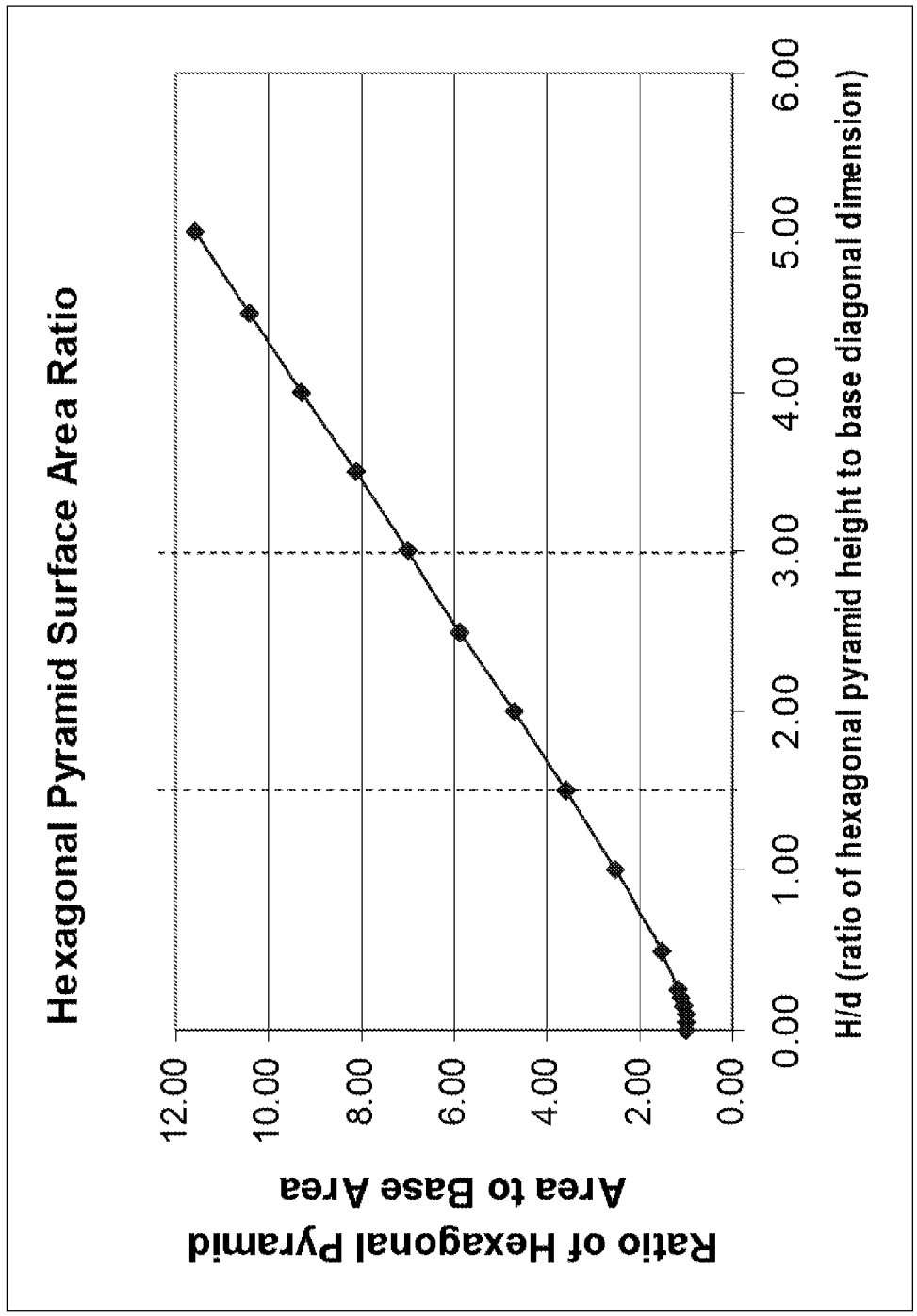
Figure 67:
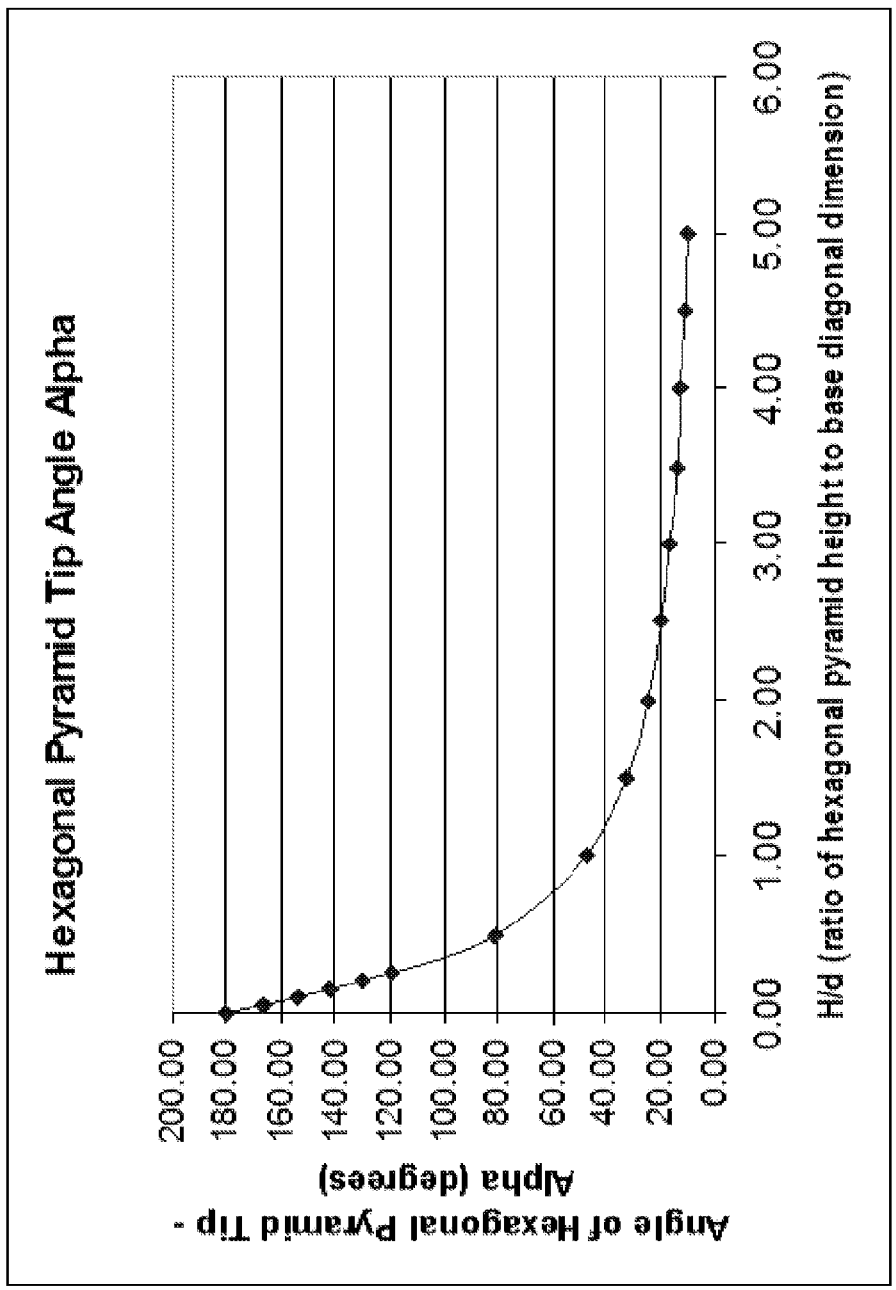
Figure 68:
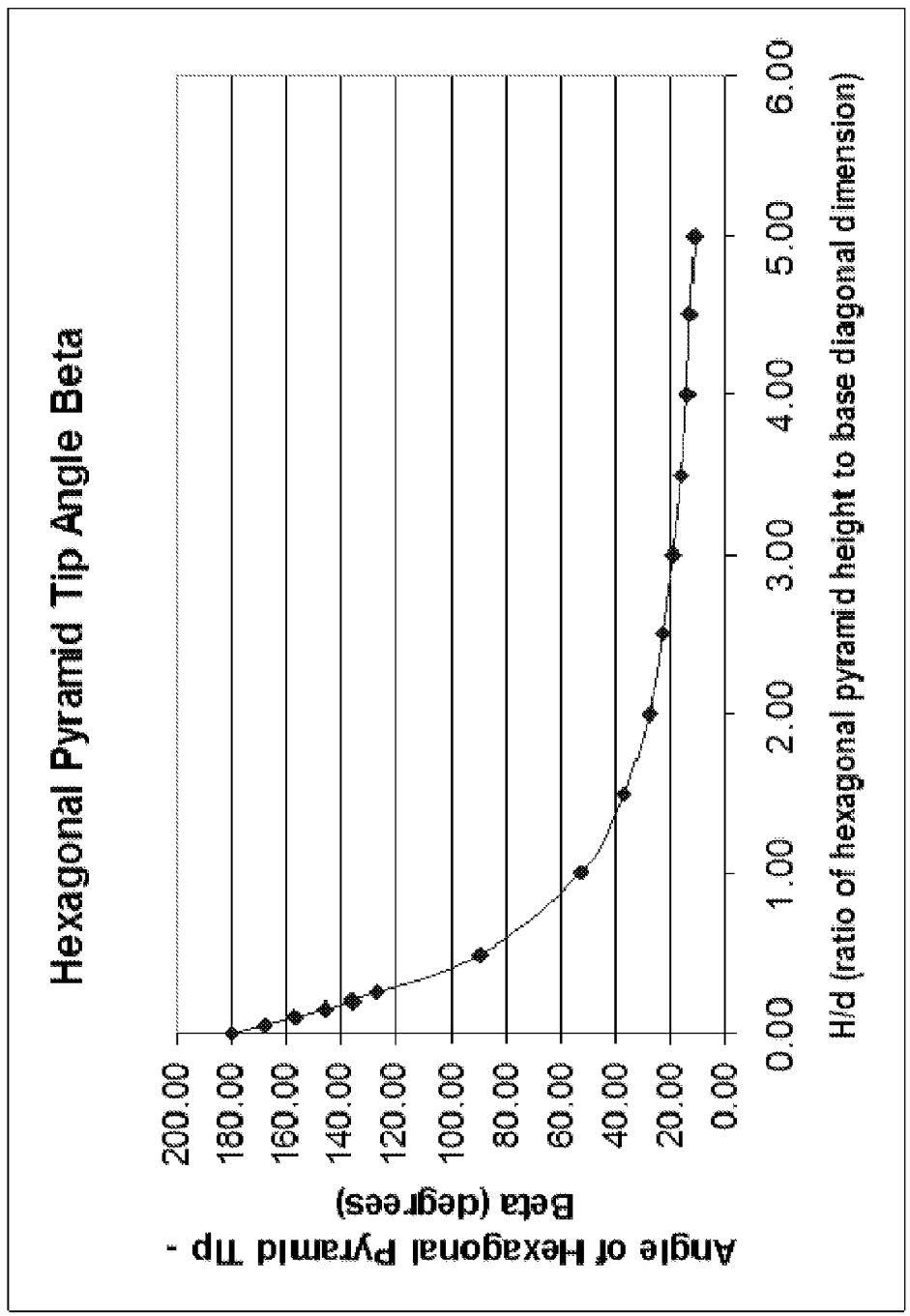
Figure 69:
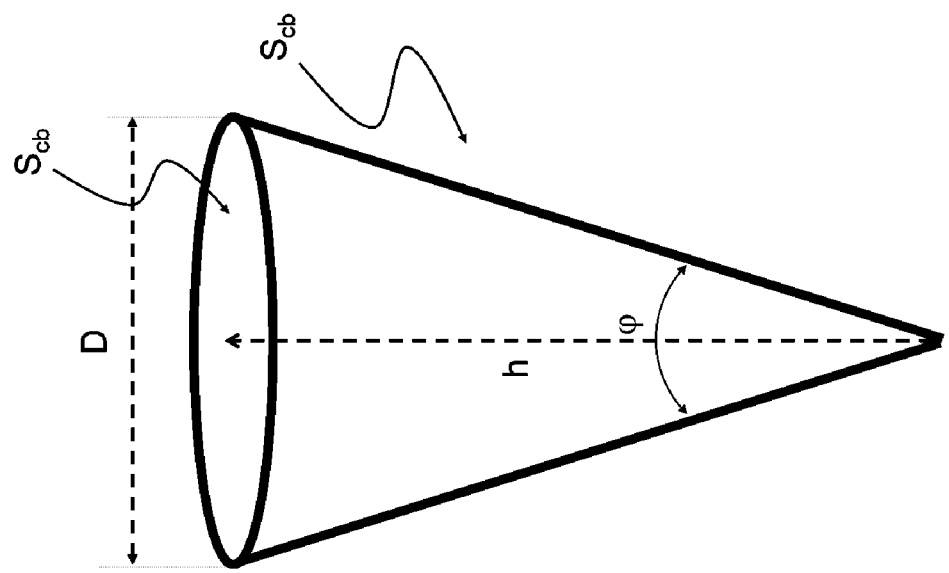
Figure 70:
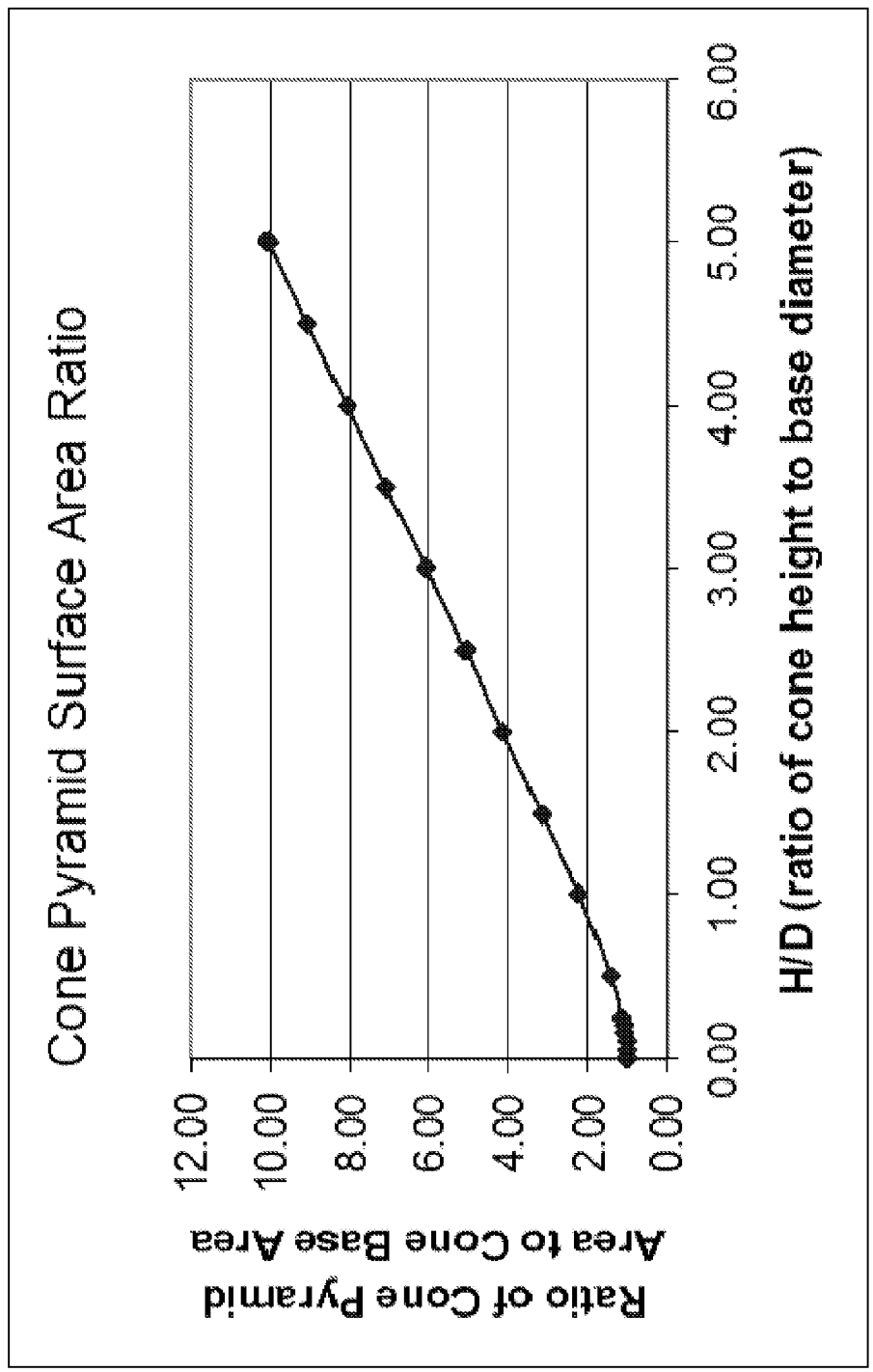
Figure 71:
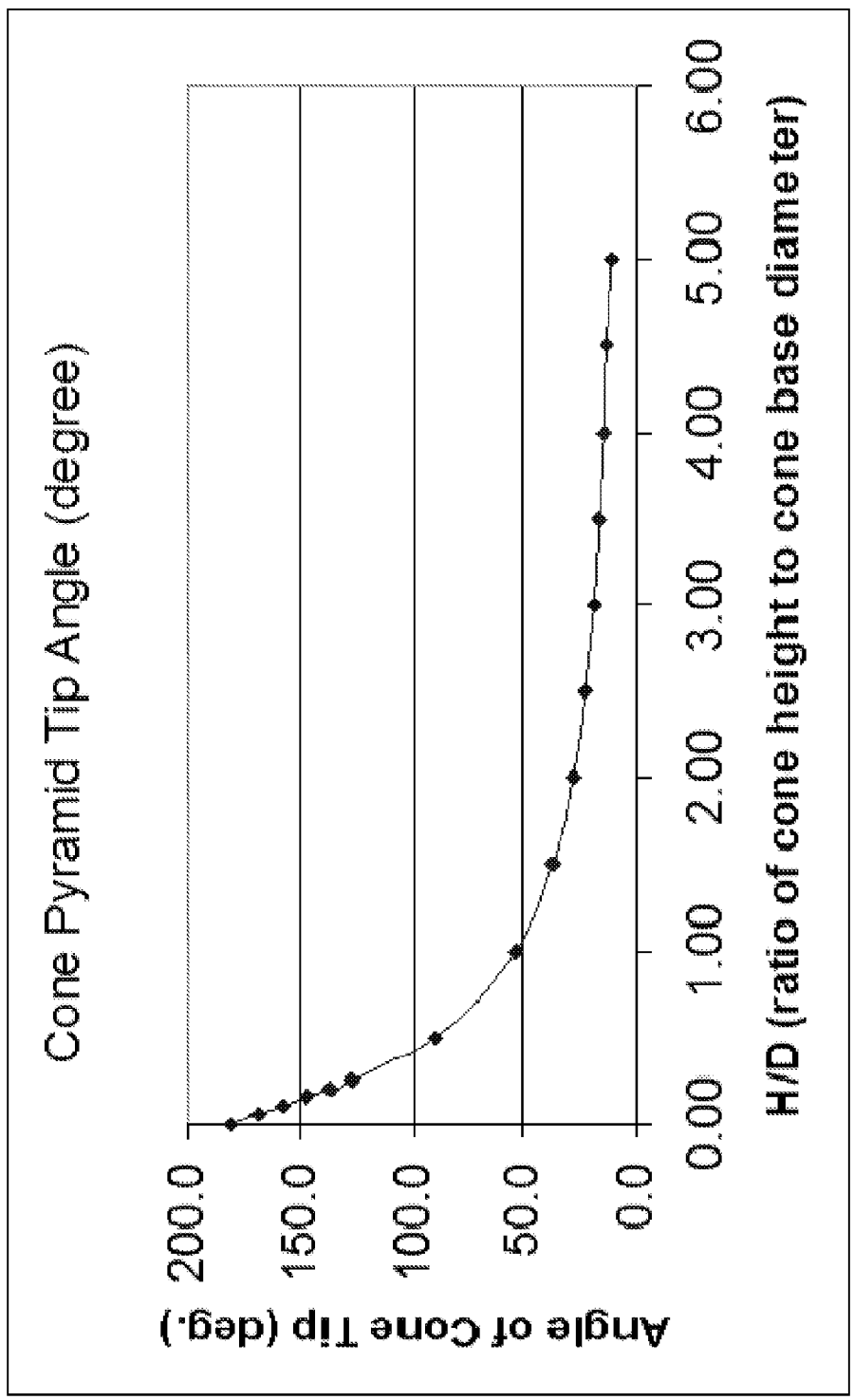
Figure 72:
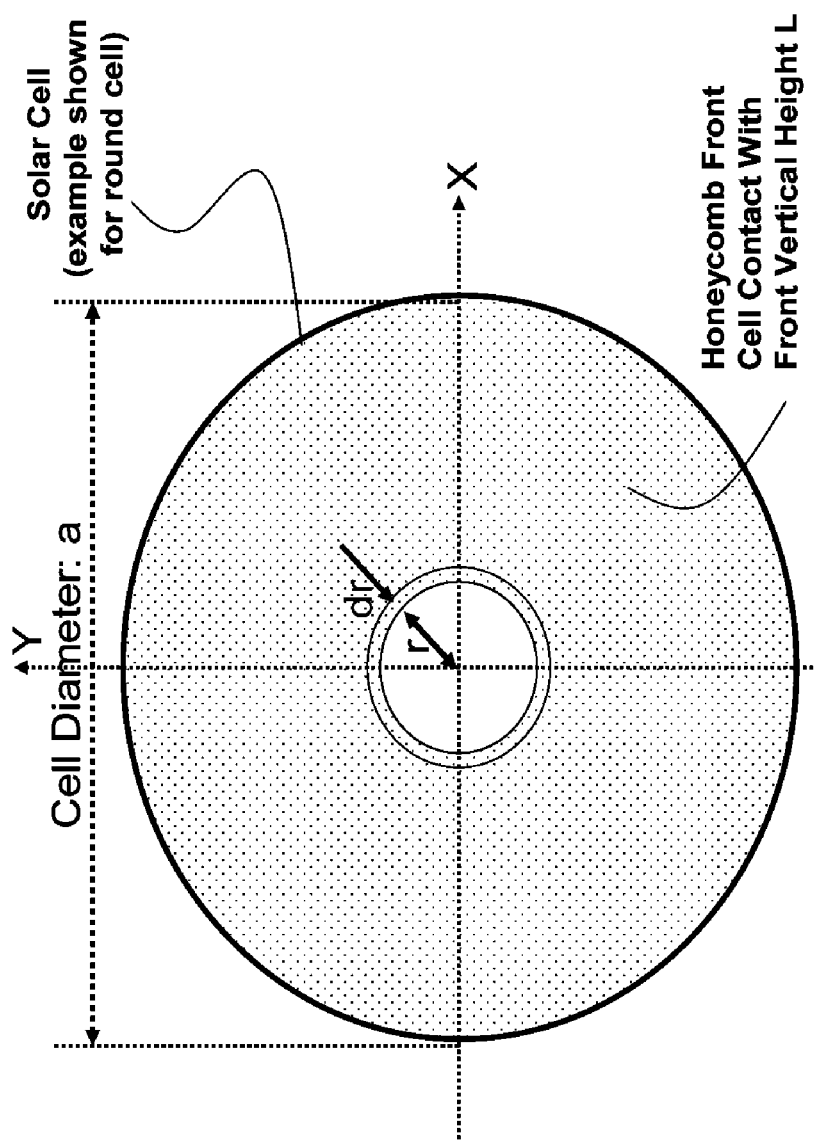
Figure 73:
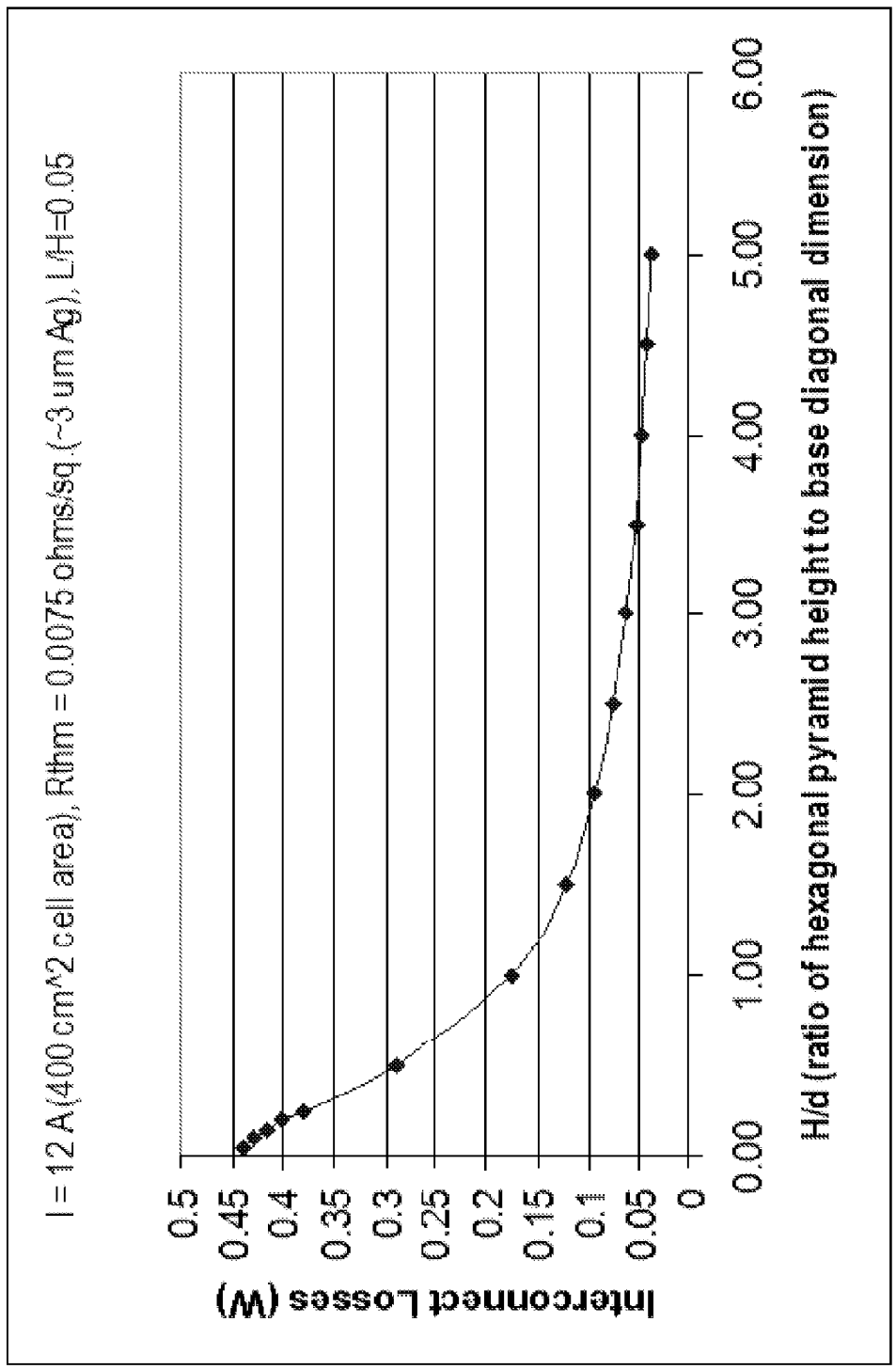
Figure 74:
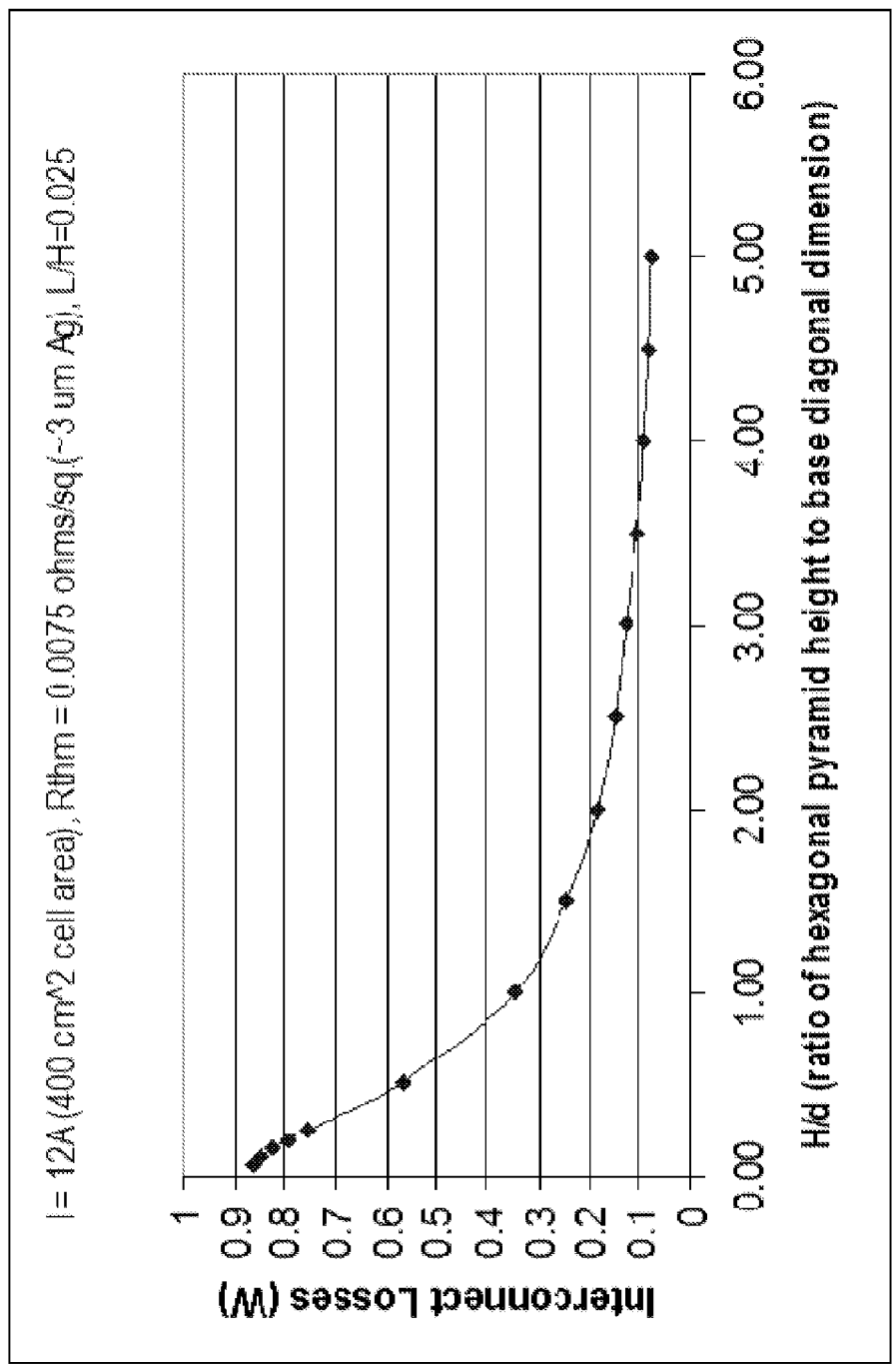

FIG. 3 (PRIOR ART) summarizes the key process steps eliminated by the current disclosure, compared to the prior art;

FIG. 4 provides an overview of the 3-D TFSC substrate and solar cell fabrication process flow;

FIG. 5 shows a top view of a honeycomb hexagonal-pyramid array design TFSC substrate, with a peripheral planar silicon frame;

FIG. 6 shows a top view of an alternative honeycomb hexagonal-pyramid array design TFSC substrate, with a larger thickness peripheral planar frame;

FIGS. 7 and 8 show the Y-Y and Z-Z cross-sectional axes on an embodiment of a hexagonal-pyramidal (honeycomb) 3-D TFSC substrate;

FIG. 9 shows a YY cross-sectional views after self-aligned formation of the emitter and base contacts and solar cell interconnects;

FIG. 10 shows a view of a 3-D self-supporting hexagonal-pyramid TFSC substrate with thick silicon frame, compared to the thin frame shown in FIG. 9;

FIG. 11 summarizes the high-level process flow and the competitive advantages of the current disclosure, compared to the prior art;

FIG. 12 shows a Y-Y cross-sectional view of an embodiment of a template;

FIG. 13 shows a 3-D view of a single unit cell in a hexagonal-pyramidal 3-D TFSC substrate;

FIG. 14 shows a schematic ZZ cross-sectional-view of an embodiment of a 3-D hexagonal-pyramid TFSC substrate;

FIG. 15 shows a schematic YY cross-sectional-view of an embodiment of a 3-D hexagonal-pyramid TFSC substrate;

FIG. 16 shows a YY cross-sectional view of an embodiment of a 3-D self-supporting hexagonal-pyramid TFSC substrate with thin square-shaped silicon frame;

FIG. 17 shows a YY cross-sectional view of an embodiment of a 3-D self-supporting hexagonal-pyramid TFSC substrate with thick square-shaped silicon frame;

FIGS. 18 through 20 describe process flows for fabrication of a 3-D TFSC using fire-through metallization;

FIGS. 21 through 25 describe process flows for fabrication of a 3-D TFSC using selective plating metallization;

FIG. 26 shows a schematic view of a double-sided coater setup for self-aligned application (coating) of dopant liquid or paste layers on 3-D TFSC substrate top ridges and rear surface or ridges by roller coating and in-line curing of the applied liquid/paste layers (shown in conjunction with an integrated belt-driven process equipment);

FIG. 27 shows a view of an alternative spray coater and curing setup to perform the same processes as the roller coater and curing setup of FIG. 26;

FIG. 28 shows a view of another alternative setup design using liquid-dip coating or liquid-transfer coating to perform the same processes as the roller coater and curing setup of FIG. 26 and the spray coater and curing setup of FIG. 27;

FIG. 29 shows a cross-sectional view of a 3-D substrate (showing one of the hexagonal-pyramid cells) after the above-mentioned doping process step;

FIG. 30 shows a YY cross-sectional view after self-aligned formation of the emitter and base contacts and solar cell interconnects;

FIGS. 31 and 32 show YY cross-sectional views of the 3-D hexagonal-pyramid solar cells (showing a single hexagonal-pyramid unit cell and several adjacent unit cells, respectively) after completion of the solar cell fabrication process and after soldering the rear base contacts to the rear cell mirror (and base interconnect) plate;

FIG. 33 shows a YY cross-sectional view of the 3-D hexagonal-pyramid TFSC substrate (showing one pyramid unit cell) after self-aligned roller coating of n-type dopant paste on the frontside honeycomb ridges, and after curing and furnace annealing to form the selective emitter regions and heavily-doped emitter contact regions;

FIG. 34 is similar to FIG. 33, except FIG. 34 roller coating of a p-type dopant layer and subsequent curing and anneal;

FIG. 35 shows a cross-sectional view similar to the view shown in FIG. 29. However, in the embodiment shown in FIG. 35 there is only coating of n-type dopant paste on the frontside honeycomb ridges;

FIG. 36 shows a YY cross-sectional view of a 3-D hexagonal-pyramid substrate after self-aligned formation of the frontside solid dopant source layer and selective emitter, while FIG. 37 shows a ZZ cross-sectional view;

FIG. 38 shows a YY cross-sectional view of a 3-D hexagonal-pyramid substrate after self-aligned formation of the frontside solid dopant source layer, selective emitter, as well as the self-aligned frontside emitter and rear base contacts, while FIG. 39 shows a ZZ cross-sectional view;

FIG. 40 shows a schematic quasi-3-D view of a hexagonal-pyramid unit cell after formation of the self-aligned frontside emitter contact and the rear base contact;

FIG. 41 shows a view of an alternative embodiment of solar cell assembly on the rear mirror and base interconnect (the first embodiment shown in FIG. 32);

FIG. 42 shows a top view of a 3-D TFSC substrate with a square-pyramid unit cell structure;

FIG. 43 shows a top view of a 3-D TFSC substrate with a triangular-pyramid unit cell structure;

FIG. 44 shows a top view of a 3-D TFSC substrate with an orthogonal V-groove unit cell structure;

FIG. 45 shows alternative cross sectional views of the 3-D TFSC substrate with an orthogonal V-groove unit cell structure, shown in FIG. 44;

FIG. 46 shows a top view of a 3-D TFSC substrate with an alternative orthogonal diagonal V-groove unit cell structure;

FIG. 47 shows alternative cross sectional views of the 3-D TFSC substrate with an orthogonal diagonal V-groove unit cell structure, shown in FIG. 46;

FIGS. 48 and 49 outline embodiments of process flows for fabrication of a template using either direct laser micromachining or photolithography patterning;

FIGS. 50 through 53 show embodiments of process flows for fabrication of pyramidal 3-D TFSC substrates;

FIG. 54 illustrates a first embodiment of a process flow for fabrication of solar modules with top protective glass plates and embedded PCBs of this disclosure (corresponding to the solar module structure of FIG. 55 with a PCB and a TFSC mounted on the PCB);

FIG. 55 shows a cross-sectional view of a solar module (solar panel) structure (resulting from the process flow described in FIG. 54);

FIG. 56 outlines an alternative embodiment of an assembly process flow for fabrication of solar modules (corresponding to the solar module structure of FIG. 57);

FIG. 57 shows a cross-sectional view of another embodiment of a solar module structure (resulting from the process flow described in FIG. 56);

FIG. 58 shows a view of a solar cell integrated or assembled in building windows;

FIG. 59 shows a view of a representative example of series connections of TFSCs of this disclosure in a solar module assembly;

FIG. 60 shows a view of the frontside layout of the printed-circuit board (PCB) used for solar module assembly;

FIG. 61 shows a top view of the backside layout of the printed-circuit board (PCB) used for solar module assembly, showing the series connection of the TFSCs;

FIG. 62 shows a backside view of the copper pattern on the PCB and is essentially similar to FIG. 61;

FIG. 63A shows an enlarged top view of the pattern on the frontside of the solar module printed-circuit board (PCB);

FIG. 63B shows an enlarged top view of the interconnect pattern on the backside of the solar module printed-circuit board (PCB);

FIG. 64 shows various schematic views of a thick silicon frame, silicon frame slivers, and a representative method to produce (e.g., cut) silicon slivers;

FIG. 65 (similar to FIG. 15) is provided for reference for calculations;

FIG. 66 shows the ratio of the hexagonal-pyramid sidewall area to the planar hexagonal base area ($S_{hp}/S_{hb}$) versus the height-to-base diagonal diameter ratio (H/d) of the hexagonal-pyramid unit cell;

FIGS. 67 and 68 shows calculated frontside aperture angles of the solar cell hexagonal-pyramid unit cell versus the height-to-base diagonal diameter ratio (H/d) of the hexagonal-pyramid unit cell;

FIG. 69 is provided for reference for calculations;

FIGS. 70 and 71 show the ratio of the cone-shaped unit cell sidewall area to the planar circular base area ($S_{hp}/S_{cb}$) versus the height-to-base diameter ratio (H/D) of the cone-shaped unit cell and calculated frontside aperture angle of the solar cell cone-shaped unit cell (approximation for hexagonal-pyramid units cells) versus the height-to-base diameter ratio (H/D) of the cone-shaped unit cell;

FIG. 72 may be used for reference with an approximate analytical calculation of the TFSC interconnect ohmic losses, assuming a circular substrate with hexagonal-pyramid array of unit cells;

FIGS. 73 and 74 plot the projected (calculated) interconnect-related solar cell power losses as a function of the ratio of the hexagonal-pyramid height to diagonal base dimension (H/d) for two different emitter interconnect area coverage ratios on the top of the 3-D solar cell substrate; while FIGS. 73 through 84 show plots for various values of $R_{thm}$ and L/H.

DETAILED DESCRIPTION OF THE SPECIFIC EMBODIMENTS

Preferred embodiments of the present disclosure are illustrated in the drawings, like numbers being used to refer to like and corresponding parts of the various drawings. The innovative solar cell designs and technologies of the current disclosure are based on the use of a three-dimensional (3-D), self-supporting, doped (in one embodiment, in-situ-doped) semiconductor thin film, deposited on and released from a reusable crystalline (embodiments include monocrystalline or multicrystalline silicon) semiconductor template.

A preferred semiconductor material for the 3-D TFSC substrate is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials such as germanium, silicon germanium, silicon carbide, a crystalline compound semiconductor, or a combination thereof. Additional applications include copper indium gallium selenide (CIGS) and cadmium telluride semiconductor thin films.

The 3-D TFSC designs and production technologies as well as associated module structures and assembly approaches of this disclosure effectively overcome the above-mentioned problems and challenges and enable cost-reduced fabrication of very-high-efficiency solar cells and modules using self-aligned cell process flows without the use of any photolithography patterning or screen printing or shadow-mask deposition process steps during cell fabrication (i.e., during 3-D TFSC substrate and cell fabrication after fabrication of the reusable 3-D template). The 3-D TFSC technologies of this disclosure are based on the formation of a 3-D pyramid-array TFSC substrate structure on a low-cost reusable template and its subsequent release and lift-off from the template to form a free-standing, self-supporting 3-D thin-film semiconductor substrate structure.

The current disclosure combines the benefits of TFSC fabrication on a proven high-efficiency crystalline silicon (c-Si) platform. The 3-D c-Si TFSC designs and technologies of this disclosure enable significant advancements in the areas of c-Si solar cell and module efficiency enhancement as well as manufacturing cost reduction. Based on innovative thin-film process steps, dependence on an expensive and constrained silicon wafer supply-chain is eliminated. Some of the unique advantages of the cells designs and technologies of this disclosure which enable achieving ultra-high-efficiency at reduced manufacturing cost are substantial decoupling from the traditional solar PV silicon supply chain, performance enhancement, cost reduction, and reliability improvement.

The disclosed subject matter improves solar cell efficiency by using a 3-D c-Si film as an absorber layer in conjunction with highly efficient light trapping. Use of the crystalline silicon absorber layer leverages known solar cell manufacturing techniques and supply chain, while reducing absorber layer thickness (e.g., reduced by a factor of ten or more compared to silicon wafers used for wafer-based solar cells). The disclosed method and system eliminates or substantially reduces photo-degradation and enhances open-circuit voltage ($V_{oc}$) of cells. In addition, the disclosed method and system provides efficient frontside and rear side light-trapping in conjunction with a highly reflective rear mirror for maximum absorption of incident solar flux. Also, the disclosed method and system provides a selective emitter to enhance blue response and external quantum efficiency, with minimal shadowing of the cell and reduced ohmic losses due to a unique folded emitter metallization contact design and improved module assembly.

Manufacturing cost is reduced by decreasing silicon usage (by a significant factor, e.g., 3× to over 10×), with thinner deposited c-Si films also reducing the finished solar module energy payback time to less than 1 to 2 years. Manufacturing cost is further reduced by eliminating wire sawing and related kerf losses associated with mainstream solar cell wafer manufacturing technology. Manufacturing cost is still further reduced by using self-aligned processing without any lithography or patterning steps used during the substrate and cell fabrication process flow, and a reduced number of fabrication process steps, with improved yield and cycle time. Production cost is still further reduced by using a simplified interconnection and cell-module assembly process and lightweight monolithic modules.

Operational reliability is improved by using thinner silicon films, eliminating photo-degradation and reducing temperature coefficients. Operational reliability is further improved by using a simple distributed high-conductance electrical interconnection, minimizing field failures. Operational reliability is still further improved by eliminating module glass cover (for glassless module assembly), thus reducing cost and facilitating field installation and operation. Operational reliability is still further improved by reducing the number of manufacturing process steps and process variations using in-line manufacturing process control.

The current disclosure reduces the solar module cost per watt for the user (by at least 30% to 50%) and cuts balance-of-system (BOS) and installation costs for the integrators and installers. This may offer major benefits to the global grid-tied end-users and solar system installers and integrators. The current disclosure reduces the module integration and installation cost and installed solar cell system cost per $W_p$ for the user, thereby lowering finished system cost per $W_p$. The current disclosure increases module efficiency, with higher module efficiency resulting in lower BOS cost. The lower installed solar cell system cost results in reduction of the economic break-even time to a lower fraction of the system lifetime, from roughly ½ to ⅓ for current best-of-breed c-Si solar cell systems to less than ¼ to ⅛ for the embodiments of this disclosure. The current disclosure reduces energy pay-back time (EPBT) from 3 to 7 years for best-of-breed c-Si solar cell systems to less than 1 to 2 years for the embodiments of this disclosure. Reduced EPBT substantially increases the net lifetime energy output (in kWh) for field-installed modules. The cell designs and module assemblies of this disclosure also provide stable degradation-free field operation over an extended time (e.g., 30 to 40 year life of the module), further increasing the net lifetime electrical energy output. Module manufacturing costs are expected to be 30% to 65% lower than that of the leading high-performance c-Si solar cells/modules at the time of market entry. This may shorten the ROI break-even time for the users compared to the current industry roadmap and projections. Further benefits include increased field performance stability and reliability and reduced environmental impact (non-toxic materials and shortened EPBT). Further, the cell and module designs of this disclosure are ideal for grid-tied applications where it is advantageous to maximize electricity generation from a limited building rooftop or façade area.

The absorber silicon film thickness of the current disclosure may be a value in the range of roughly 1 to 30 microns, where a thinner silicon layer is preferred for less material consumption (in one embodiment, in the range of 1 to 10 microns). Even after taking into account the effective surface area increase due to the 3-D geometric structure of the 3-D TFSC substrates, the 3-D TFSC substrates of this disclosure consume substantially less silicon material than the state-of-the-art wafer-based c-Si solar cells. Moreover, there are no sawing or kerf losses. Similarly, there is no requirement for saw damage removal since the 3-D crystalline silicon film is process-ready upon release from the reusable template. This substantially reduces the solar cell cost associated with silicon consumption. The self-supporting 3-D epitaxial silicon thin film is deposited on and released from a low-cost reusable crystalline (monocrystalline or multicrystalline) silicon substrate (template). The template may be reused numerous times before being reconditioned or recycled. The template may even be chosen from the much lower cost metallurgical-grade c-Si since any metallic impurities are prevented from contaminating the 3-D crystalline silicon film.

FIG. 3 summarizes the overall crystalline solar cell fabrication process flow of prior art techniques and highlights the specific steps eliminated by the current disclosure, compared to the prior art. FIG. 4 summarizes the overall cell and module fabrication process flow and the competitive advantages of the current disclosure, compared to the prior art. As highlighted here, the current disclosure enables fabrication of 3-D TFSC substrates and 3-D TFSCs, thus, substantially reducing consumption of semiconductor absorber material (e.g., silicon) and the cell and module manufacturing costs.

The following FIGURES show embodiments of 3-D TFSC substrate structures. The crystalline silicon film thickness is in the range of 2 to 30 microns, and preferably in the lower-end range of 2 to 10 microns. This is substantially less (by a factor of roughly 20× to 100×) than the state-of-the-art silicon solar cell wafer thickness (roughly 200 microns).

These 3-D TFSC substrates are used to fabricate 3-D pyramidal TFSCs.

FIG. 5 shows a top view 100 of a honeycomb hexagonal-pyramid array design TFSC using a TFSC substrate 102, with a peripheral planar silicon frame 104. The design includes a periodic array of high-aspect-ratio (or low-aperture-angle) hexagonal-pyramid unit cells 106. In one embodiment, frame length (S) 104 is 125 mm to over 200 mm. Silicon Frame 104 may have the same thickness as the TFSC substrate 102 or may be much thicker (e.g., silicon frame thickness=5 to 500 microns). The top surface of the frame is also preferably used as the top solar cell interconnect (it is metallized along with the top honeycomb contacts, and is electrically connected to the honeycomb contacts). In one embodiment, the width 108 of the frame 104 is roughly 125 microns to 1 mm. The film thickness 110 of the TFSC substrate is roughly 2 to 30 microns, preferably 2 to 10 microns. Typically, there are millions (or as few as thousands) of these hexagonal-pyramid unit cells 106 form a large-area (e.g., 200 mm×200 mm) TFSC substrate 102.

FIG. 6 shows a top view 120 of an alternative honeycomb hexagonal-pyramid array design TFSC substrate 102, with a larger thickness 108 peripheral planar silicon frame 104.

When referring to the following FIGURES, the YY and ZZ axes are shown in FIGS. 7 and 8.

FIG. 7 shows a top view 130 of a regular (equilateral) hexagonal-pyramid 3-D TFSC substrate 102, formed using the process steps outlined above. Each hexagonal unit cell 106 contains hexagonal unit cell points ($H_1$, $H_2$, $H_3$, $H_4$, $H_5$, and $H_6$) 132, 134, 136, 138, 140, and 142, with the bottom tip (which will form the back contact) of the hexagonal-pyramid shown as point 144. FIG. 7 further shows the hexagonal-pyramid 3-D TFSC substrate sidewalls 146; the diagonal dimension of the unit cell hexagon (d) 148; and hexagonal unit cell horizontal distance (h) 150. In one embodiment, the hexagonal-pyramid 3-D TFSC substrate sidewalls 146 are between 2 and 30 microns thick.

FIG. 8 shows a bottom view 160 of the TFSC substrate 102 shown in FIG. 7. In this view, the hexagonal-pyramid rear (bottom) tips 144 are shown at the centers of the hexagons. The honeycomb hexagons are the bottom views of the top honeycomb ridges of the 3-D TFSC substrate.

FIG. 9 shows a view 170 of multiple unit cells 106, with self-aligned peripheral emitter wrap-around contact 172 connected to the solar cell hexagonal frontside emitter contact at the frame edge. Note that both frontside 174 and backside contacts 176 are accessible on the rear side of the cell for ease of automated module assembly.

FIG. 10 shows a view 180 of a 3-D self-supporting hexagonal-pyramid TFSC substrate with thick silicon frame, compared to the thin frame shown in FIG. 9. The thick frame may have a width of roughly 500 to 1000 microns and may be fused to a 3-D TFSC substrate 102 during the epitaxial silicon deposition process (by placing the thick silicon frame on the reusable silicon template) or after silicon epitaxy and 3-D substrate release (by e-beam welding).

FIG. 11 provides an overview of the 3-D TFSC substrate and cell fabrication process flow. Focusing on the top of FIG. 11 illustrating the 3-D TFSC substrate fabrication, note that the first step in this process flow uses a pre-fabricated template. The template with a pre-fabricated 3-D trench or groove pattern may be used for formation of 3-D TFSC substrates, which are then used in the formation of 3-D TFSCs, substantially eliminating or reducing disadvantages and problems associated with previously developed TFSCs and the wafer-based crystalline silicon cell technologies. The template is capable of being used numerous times (e.g., tens to hundreds of times) to fabricate numerous 3-D TFSC substrates before being reconditioned or recycled. In one embodiment, the template may be used hundreds of times to fabricate 3-D TFSC substrates before being recycled. The template may be reused for as long as it remains relatively free of dislocations and/or for as long as it maintains an acceptable trench or groove pattern with widths and surface conditions within acceptable control limits (e.g., as gauged by in-line metrology).

FIG. 12 shows a Y-Y cross-sectional view of a template 200 showing hexagonal-pyramid trenches 202 between posts 204, formed in the substrate frontside 206 using the process flows described above. The bottom 208 of the trenches 202 connects to through-wafer backside, preferably small-diameter, holes 212 which connect to the template backside 130. In one embodiment, the holes 212 are 1 to 10 microns in diameter. The holes 210 are used for subsequent wet etching of the sacrificial layer and 3-D silicon film release and lift-off. The template 200 has dimensions of L 214 (in one embodiment, 0 to 25 microns although it may also be much larger up to several hundred microns), 3-D unit cell height H 216, pyramidal angle α 218, and unit cell aperture diameter h 20. A hexagonal-pyramid 3-D TFSC substrate (not shown) is fabricated by first forming a suitable relatively conformal thin sacrificial layer (in one embodiment, porous silicon) on the template, then filling in the trenches 202 between hexagonal-pyramid posts 206, and subsequently releasing the hexagonal-pyramid 3-D TFSC substrate by selectively etching the sacrificial layer (not shown) deposited between the hexagonal-pyramid 3-D TFSC substrate and the template.

The following FIGURES show embodiments of 3-D TFSC substrate structures. The crystalline silicon film thickness is in the range of 2 to 30 microns, and preferably in the lower-end range of 2 to 10 microns. This is substantially less (by a factor of roughly 20× to 100×) than the state-of-the-art silicon solar cell wafer thickness (roughly 200 microns).

FIG. 13 shows a quasi 3-D view 230 of an individual hexagonal-pyramid unit cell 106 of the TFSC substrate 102 shown above. The top hexagonal opening of the unit cell 106 forms the frontside self-aligned interconnected contacts of the thin-film solar cell (TFSC). Also shown in this view is the width (W) 110 of the semiconductor film forming the sidewalls of the hexagonal-pyramid cell 106 and the height (H) 232 of the cell 106, and d/2 234.

FIG. 14 shows a ZZ cross-sectional-view 240 of the 3-D hexagonal-pyramid TFSC substrate 102, showing the hexagonal-pyramid top aperture angles β 242. The bottom tips 144 of the triangles are the rear tips of the hexagonal-pyramids (where the base contacts will be placed). The solid line shows the 3-D TFSC substrate thin-film silicon layer, with thickness 110 (in one embodiment, roughly 1 to 25 microns thick). FIG. 15 shows a YY cross-sectional-view 250 of the hexagonal-pyramid TFSC substrate 102, showing the hexagonal-pyramid top aperture angles α 252.

FIG. 16 shows a YY cross-sectional view 270 (not to scale) of an embodiment of a 3-D self-supporting hexagonal-pyramid TFSC substrate 102 with thin square-shaped silicon frame 104 (like the frame 104 shown in FIG. 5), with thickness the same as the film thickness 110. The silicon frame width (W) 108 is between 50 and 250 microns. Note that the width of the top hexagonal honeycomb silicon ridges 272 is preferably much smaller than h 150 and H 232. In one embodiment, the width of the top honeycomb ridges 272 is roughly 0.5 microns to less than 5 microns.

FIG. 17 shows a YY cross-sectional view 290 (not to scale) of an embodiment of a 3-D self-supporting hexagonal-pyramid TFSC substrate 102 with thicker square-shaped silicon frame 104 (like the frame 104 shown in FIG. 6). Note that the thickness of the frame is not the same as the film thickness 110. Instead, the thick silicon frame may be roughly 100 to 500 microns thick. The silicon frame width (W) 108 is between 50 and 250 microns. The thick peripheral silicon frame may be preferably made of low-cost metallurgical-grade silicon and may be attached to the 3-D TFSC substrate using one of the following methods: (i) thick silicon frame placed on the reusable silicon template and fused to the 3-D thin-film silicon film during the epitaxial silicon growth process; (ii) e-beam welding of the 3-D TFSC substrate to the thick silicon frame (after lift-off/release of the 3-D TFSC substrate from the reusable silicon template); or (iii) thermal bonding (under clamping pressure) of the thick silicon frame to the 3-D TFSC substrate. The thick silicon frame maybe used for enhanced mechanical support and rigidity of the 3-D TFSC substrate.

The following section details the process of using the 3-D TFSC substrates described above to fabricate 3-D thin-film solar cells (TFSCs). Specifically, the following FIGURES illustrate embodiments of process flows using alternative methods of fire-through metallization and selective plating metallization. These process flows do not use any photolithography or screen printing processes. The 3-D hexagonal-pyramid structural design of the solar cell substrate enables self-aligned processing throughout the entire cell process flow. The emitter and base contacts and metallized regions cover relatively small fractions of the frontside emitter and backside base areas, respectively. As indicated, selective emitter and base doping is achieved by self-aligned application of the n-type and p-type dopant pastes to the top and bottom of the 3-D hexagonal-pyramid substrate, preferably using double-sided roller coating method. The 3-D substrate is then cured and moves on to a belt furnace to form the $n^+$ selective emitter on the frontside and the $p^{+-}$doped base on the rear side of the 3-D substrate. A preferred n-type dopant source is phosphorus and a preferred p-type dopant source is boron.

FIGS. 18 through 20 describe process flows using fire-through metallization, while FIGS. 21 through 25 describe process flows using selective plating metallization.

Process flow 400 shown in FIG. 18 describes an embodiment using fire-through metallization, with a forming gas anneal (FGA) step after copper (Cu) or silver (Ag) plating. Step 402 starts with a p-type 3-D silicon TFSC substrate. Step 404 involves selectively coating the top portions of the hexagonal-pyramids (in one embodiment, the top 2 to 10 microns in height) with n-type liquid or paste dopant source. Coating is performed by self-aligned roller coating using dopant paste/liquid, or liquid-dip coating by dipping in a controlled liquid dopant source depth. The dopant layer is then dried/cured (250° C. to 400° C. or UV). Step 406 involves formation of self-aligned emitter contacts. The bottom portions of the pyramid tips are selectively coated (in one embodiment, about 2 to 10 microns in height) with p-type liquid or paste dopant source. Coating is performed by self-aligned roller coating using dopant paste/liquid, or liquid-dip coating by dipping in a controlled liquid dopant source depth. The dopant layer is then dried/cured (250° C. to 400° C. or UV). Step 408 involves self-aligned selective emitter formation, where the top $n^+p$ and $n^{++}p$ junctions and rear $p^+$ tips are concurrently formed by an anneal (e.g., 800° C. to 950° C.). The dopant layer drying and annealing may be performed sequentially in a single belt furnace. Preferably, the substrate may be annealed face down on a heated planar surface, or with pairs of substrates in frontside face-to-face contact, in order to facilitate gas-phase doping formation of $n^+$ regions. In step 410 (Surface passivation and ARC), the dopant source layer and native oxide are stripped (in one embodiment, using dilute HF). Thin oxide is grown by steam oxidation (e.g., 3 to 10 nm @ 850° C. to 950° C.); and $SiN_x$ ARC is then deposited by PECVD. Both layers are formed on both silicon sides, with PECVD-$SiN_x$ also providing H passivation of silicon. In step 412 (Self-aligned metallization), the top portions of the hexagonal-pyramids are selectively coated (to a height less than the dopant source) with metal (Ag) paste using self-aligned roller coating, then dried and cured. The bottom tips of the hexagonal-pyramids are then selectively coated on the rear side with metal (Al or Ag) paste by self-aligned roller coating, then dried and cured. In step 414 (Self-aligned metallization (firing)), the front (Ag) and rear (Al, Ag) metallized regions are formed by firing through the thermal oxide/PECVD $SiN_x$ layers. Step 416 involves an optional self-aligned metallization step, where an FGA is performed (e.g., 300° C. to 450° C.) to reduce front and rear interconnect resistance values and help with surface/bulk passivation. Step 418 involves an optional self-aligned metallization step, where Cu or Ag are selectively/concurrently deposited (e.g., 1 to 5 microns) on the metallized top honeycomb ridges and bottom hexagonal-pyramid tips by plating. Metallized regions are then flash coated with Ag. In step 420, the solar cell backside metallized hexagonal-pyramid tips are soldered to a Cu or Ag mirror plate or foil (may be perforated), then flash coated with Ag. The rear mirror also serves as the rear electrical connector. Finally, in step 422, the solar cells can be packaged into solar modules/panels.

An alternative fire-through metallization process flow 430 is described in FIG. 19. Emitter contacts and interconnects are made on the top honeycomb ridges whereas the base contacts are made on rear hexagonal-pyramid tips. In this embodiment the rear base contact regions are heavily doped by Al during the fire-through process (no separate $p^+$ rear base doping used by boron dopant source). Forming gas anneal (FGA) performed after Cu and/or Ag plating. Step 432 (providing the substrate) corresponds to step 402 in FIG. 18; and step 434 (selectively coating the top portions) corresponds to step 404. However, step 406 (selective coating of bottom portions) is not performed next. Instead, subsequent steps 436 to 450 correspond to steps 408 to 422.

Another alternative fire-through metallization process flow 460 is described in FIG. 20. Compared to process flow 430 in FIG. 19, the forming gas anneal (FGA) step is performed before Cu and/or Ag plating. Specifically, steps 444 and 446 from FIG. 19 are reversed, noted in steps 474 and 476 of FIG. 20.

As noted above, FIGS. 21 through 25 describe process flows using selective plating metallization.

Figure 21:
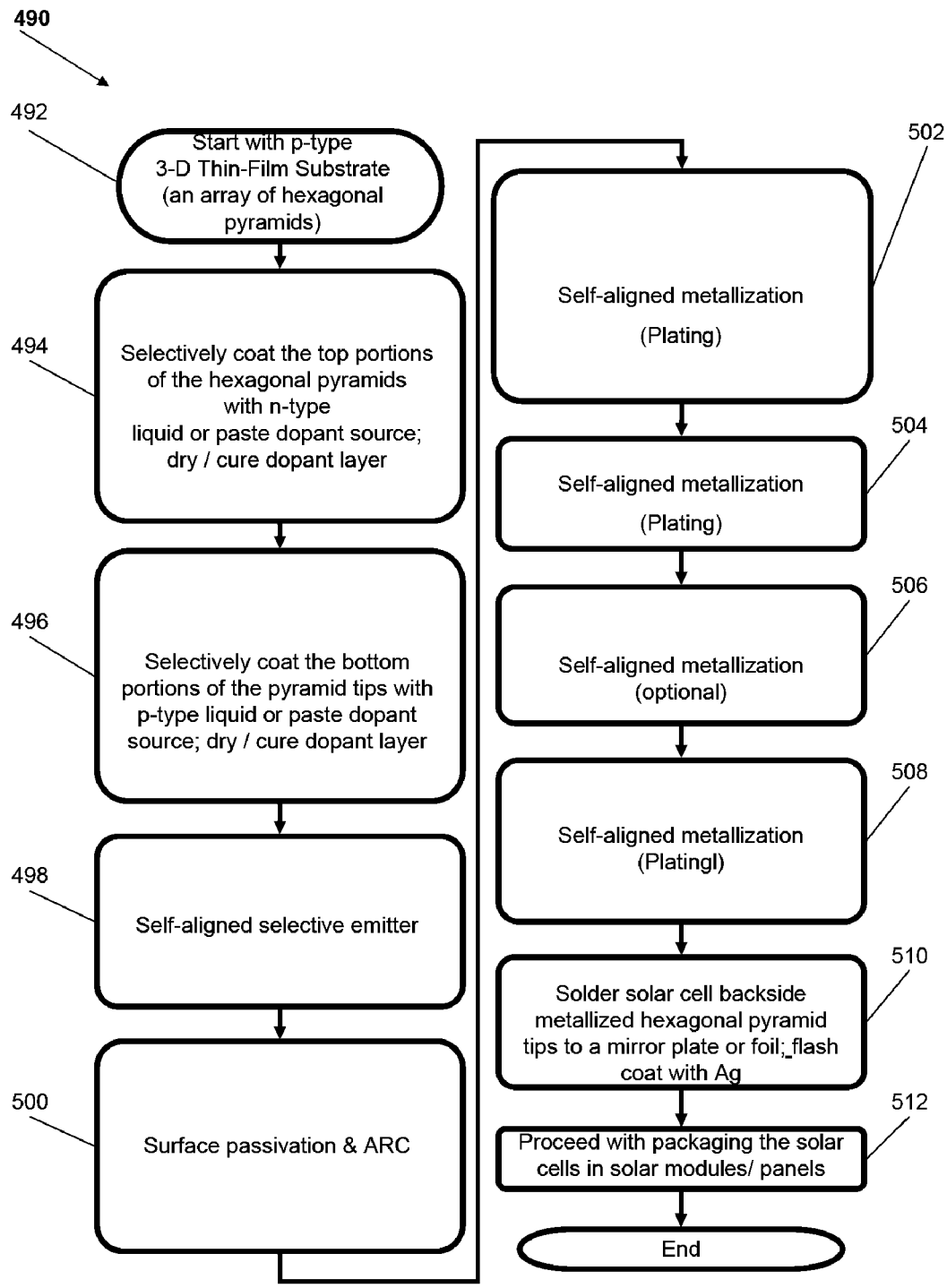

Process flow 490 shown in FIG. 21 describes an embodiment using selective plating metallization. Step 492 (providing a substrate) corresponds to step 402 in FIG. 18; step 494 (selectively coating the top portions) corresponds to step 404; step 496 (selectively coating the bottom portions) corresponds to step 406; step 498 corresponds to step 408; and step 500 corresponds to step 410. However, step 502 (self-aligned metallization) involves selectively etching the top portions of the hexagonal-pyramids (to a height less than the dopant source) by self-aligned roller coating in etchant paste, followed by rinsing, and repeating the process on the rear hexagonal-pyramid tips. Step 504 (self-aligned metallization) involves concurrently forming the front and rear metallized regions by a single plating process (e.g., Ag, Ni, Pt, Ti, Co, Ta). Step 506 involves an optional self-aligned metallization step where a forming gas anneal (FGA) is performed (e.g., 300 to 450° C.), to reduce front and rear interconnect resistance values and help with surface/bulk passivation. Step 508 involves self-aligned metallization where Cu or Ag is selectively/concurrently deposited (e.g., 1 to 5 microns) on the metallized top honeycomb ridges and bottom hexagonal-pyramid tips by plating. Step 510 (solder) and step 512 (proceed with packaging) are the same as above.

Figure 22:
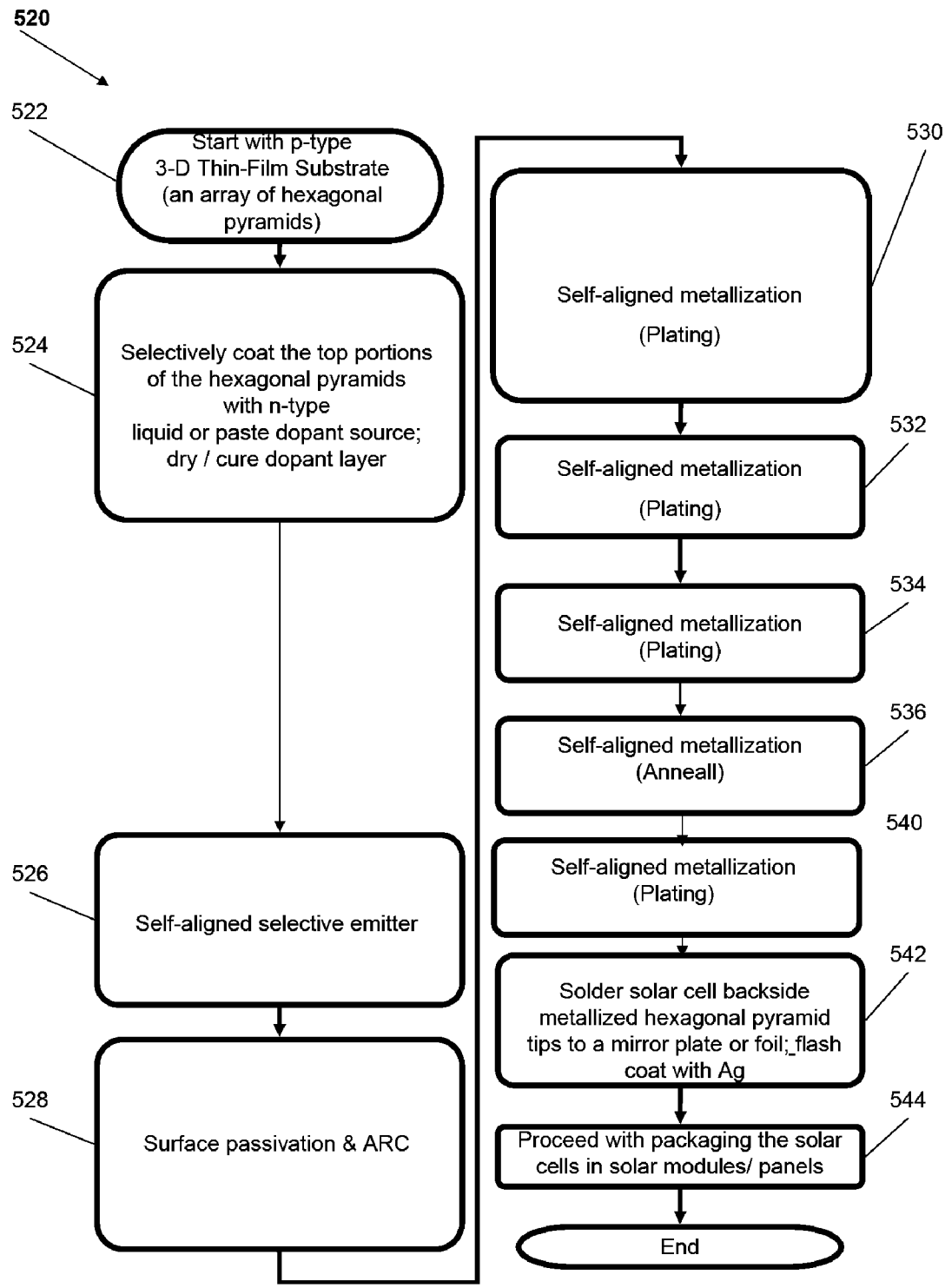

An alternative selective plating metallization process flow 520 is described in FIG. 22. No $p^+$ dopant paste coating is used for rear base contact doping. The rear base $p^+$ contact doping is performed by Al doping in the base contact regions using an anneal process after rear base tip Al metallization using plating. Step 522 (providing the substrate) corresponds to step 492 in FIG. 18; and step 524 (selectively coating the top portions) corresponds to step 494. However, step 496 (selective coating of bottom portions) is not performed next. Instead, step 526 (self-aligned selective emitter) is performed next, corresponding to step 498. Step 528 (Surface passivation and ARC) corresponds to step 500; and step 530 (self-aligned metallization) corresponds to step 502. In step 532, the rear metallized regions are selectively formed by an Al rear plating process (e.g., dip plate the rear/backside only). In step 534, metal (Ag, Ni) is selectively plated on front exposed honeycomb $n^{++}$ doped regions and rear Al-metallized regions. Step 536 involves performing an FGA (300 to 450° C.) to form Al-doped rear $p^+$ tips. The FGA reduces front and rear interconnect resistance values and helps with surface/bulk passivation. Step 538 (plating) corresponds to step 508; step 540 (solder) corresponds to step 510; and step 542 (proceed with packaging) corresponds to step 512.

Figure 23:
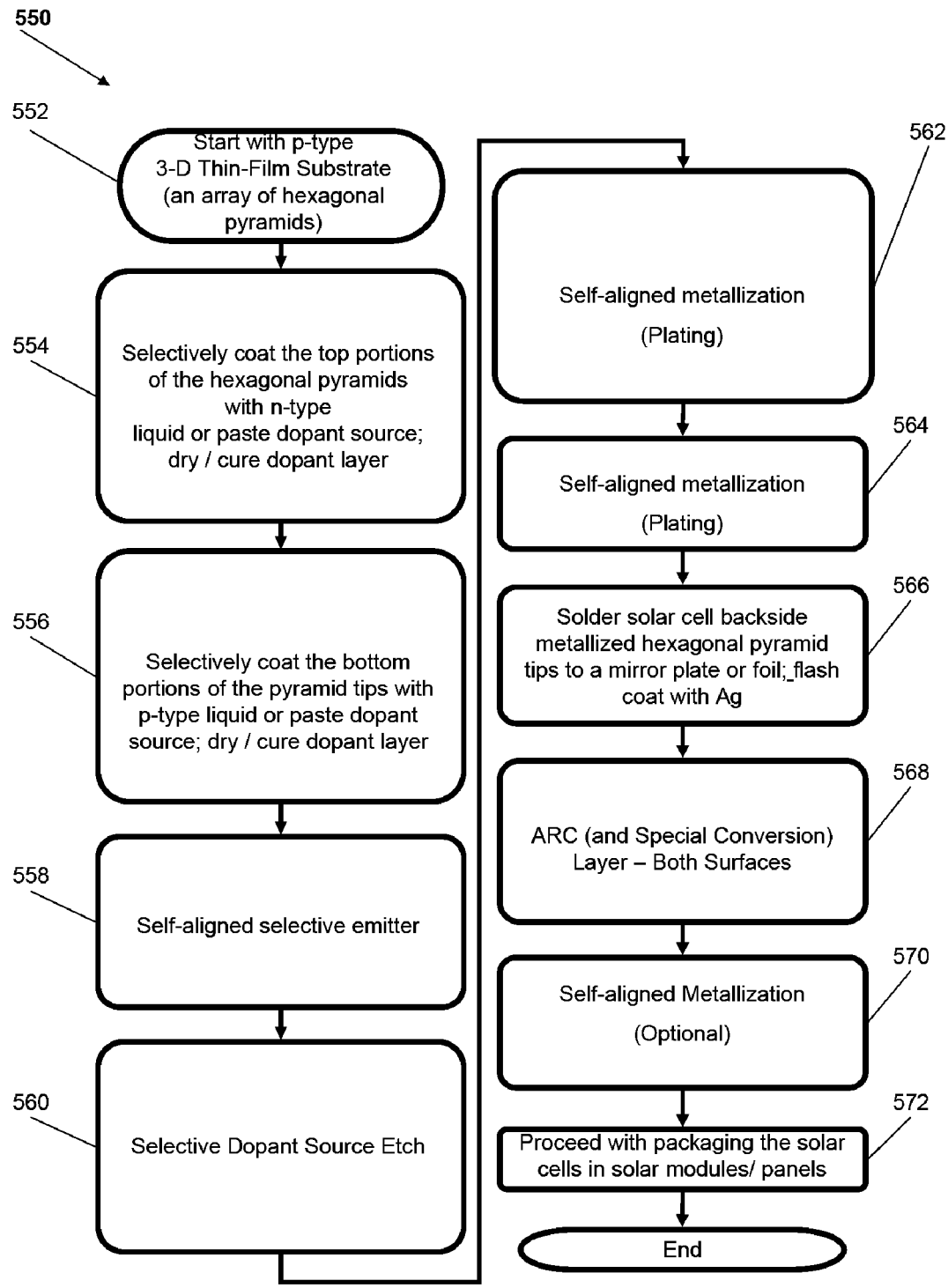

Another alternative selective plating metallization process flow 550 is described in FIG. 23. In contrast to the embodiment is FIG. 21, no roller paste etching process is used here. Instead the process here uses selective etching of dopant source layers. Steps 552 (providing a substrate), step 554 (selectively coating the top portions), and step 556 (selectively coating the bottom portions) correspond to steps 492 to 496 in FIG. 21. Step 558 (self-aligned selective emitter) involves concurrently forming the top $n^+p$ and $n^{++}p$ junctions and rear $p^+$ tips by an anneal (e.g., 800 to 950 C), sequentially first in an inert ($Ar, N_2$) and then oxidizing (steam) ambient to grow 5 to 50 nm of thermal oxide. The dopant layer drying and anneal may also be performed sequentially in a single belt furnace. Step 560 involves selectively etching the dopant source layers while removing only a small portion of oxide, using a wet etch with high etch selectivity compared to thermal oxide. Step 562 (plating) corresponds to step 504; and step 564 (plating) corresponds to step 508. Step 566 involves soldering (Pb-free solder) backside metallized hexagonal-pyramid tips to an Al mirror plate or foil (may be perforated), then flash coating with Ag. The rear mirror also serves as the rear electrical connector. Step 568 involves concurrently depositing ARC layer (e.g., low-temperature PECVD $SiN_x$) on both front and rear surfaces. The ARC layer may also include spectral down-conversion. The ARC layer also helps with additional H passivation. Note that the peripheries of frontside solar cell and rear mirror should be masked during PECVD to facilitate cell/module interconnects. Step 570 (FGA) corresponds to step 504, and step 572 (packaging) is the same as above.

Figure 24:
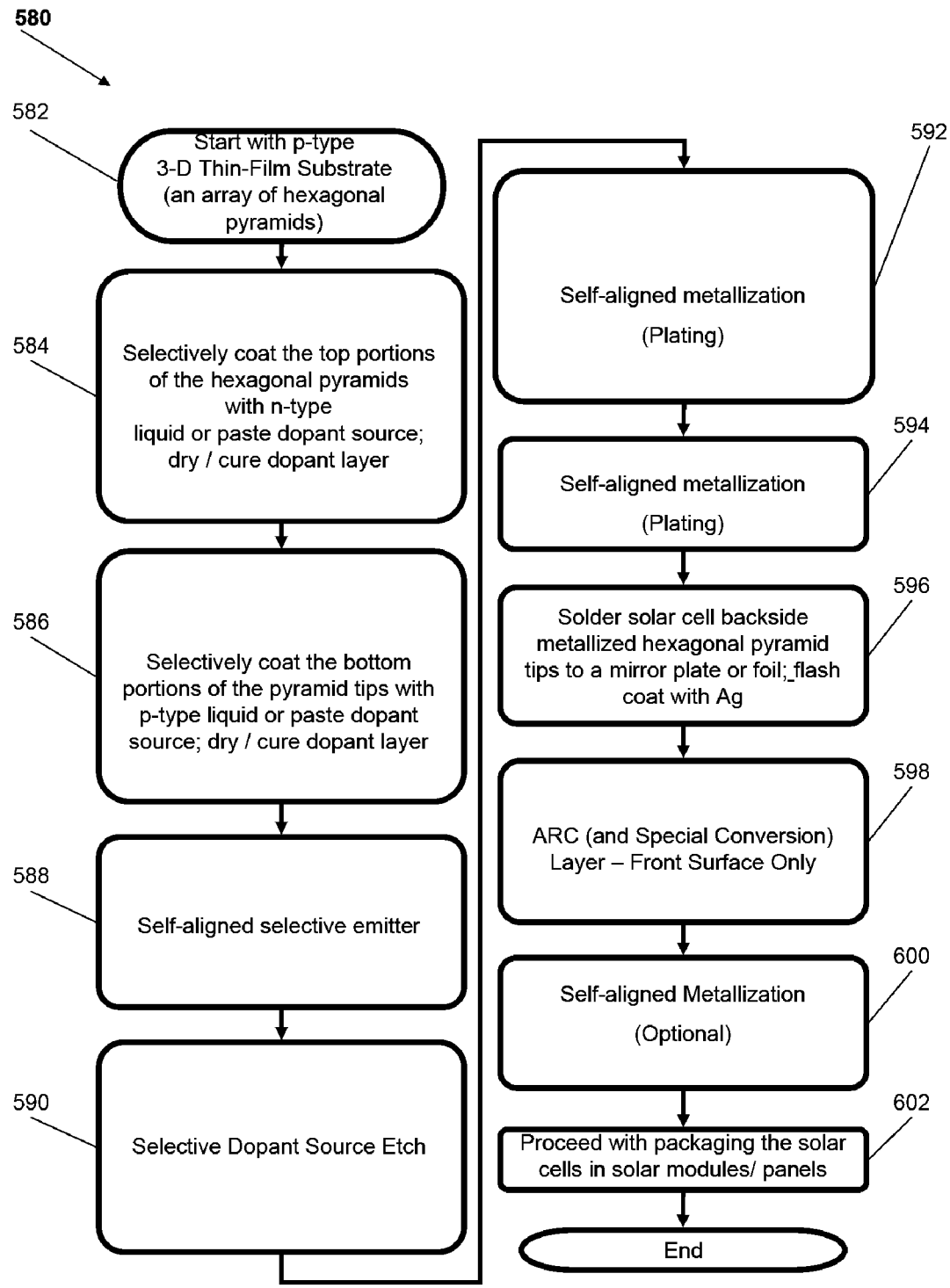

Another alternative selective plating metallization process flow 580 is described in FIG. 24. Compared to process flow 550 from FIG. 23, this process uses only one high temperature (anneal and oxidation) process step. Steps 582 to 596 are the same as steps 552 to 566 in FIG. 23. However, in step 598, an ARC layer (e.g., low temperature PECVD $SiN_x$) is deposited on solar cell front surface only. Steps 600 and 602 are the same as steps 570 and 572 in FIG. 23.

Figure 25:
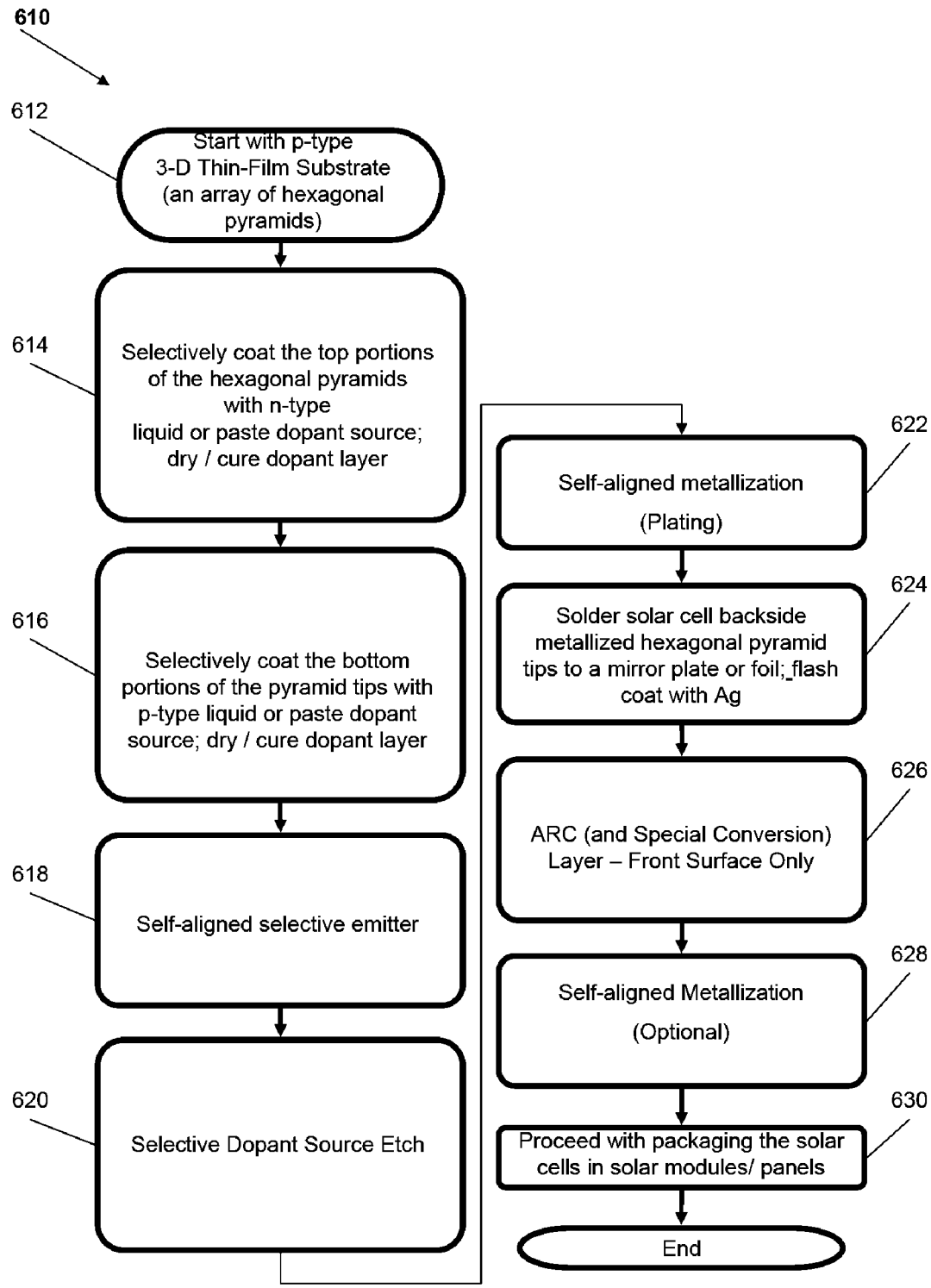

Another alternative selective plating metallization process flow 610 is described in FIG. 25. Like process flow 580 from FIG. 24, this process uses only one high temperature (anneal and oxidation) process step. Steps 612 to 620 correspond to steps 582 to 590 from FIG. 24. However, step 592 (plating) is not performed. Instead, only plating step 594 is performed, corresponding to step 622. Steps 624 to 630 correspond to steps 596 to 602 from FIG. 24.

The above process steps may be performed on integrated in-line process equipment. For example, FIG. 26 shows a view 640 of a setup for performing the two process steps of liquid/paste coating and UV or IR curing prior to furnace anneal, allowing for subsequent formation of selective emitter and base regions after anneal in an in-line diffusion furnace. This integrated in-line process equipment allows for self-aligned formation of dopant liquid or paste coating on the 3-D TFSC substrate top ridges and rear ridges by roller coating. Roller coating may be performed using an atmospheric-pressure, belt-driven coating and curing equipment integrated in line with a diffusion furnace. In one embodiment, the top ridges are coated with n-type dopant liquid/paste; the rear ridges are coated with p-type dopant liquid/paste.

The 3-D TFSC substrate 642 is shown moving in 644 on input conveyor belt 646. The rotating top rollers 648, with top roller pads 650, apply a controlled downward force to coat the top ridges with n-type paste. The rotating rear rollers 652, with rear roller pads 654, apply a controlled upward force to coat the rear ridges with p-type paste. Multilayer materials may be coated on each side of the 3-D TFSC substrate by applying (or flowing) a different liquid or paste material to each roller on the top 648 and/or rear 652 set of rollers. The 3-D TFSC substrate 642 next moves into the curing area where the dopant liquid/paste layers are concurrently formed using a curing lamp 656 which uses IR or UV curing beams 658. The 3-D TFSC substrate 642 is next shown moving out 660 to the output conveyor belt 662, which may move the substrate 642 to an in-line diffusion furnace, where the $n^+$ and $p^+$ contacts and selective emitter regions are concurrently formed.

A similar roller coater setup may be properly configured and used for applying metal liquid/paste coatings (e.g., silver and/or aluminum liquid or paste sources), curing the metal liquid/paste source, and performing subsequent thermal anneal in an in-line atmospheric furnace (resistively-heated or lam-heated furnace) for fire-through metallization in order to form the emitter and base contact metallization (and whenever applicable, also to form the aluminum-doped $p^{++}$ base contact regions).

FIG. 27 shows a view 670 of an alternative setup design to perform the same processes as the roller coater/curing/furnace setup of FIG. 26. The setup in FIG. 27 may be used for self-aligned formation of dopant source liquid/paste coating on the 3-D TFSC substrate top ridges and rear ridges by angled spray coating. This setup also may utilize an in-line atmospheric-pressure coating and curing and diffusion equipment configuration which can be easily integrated with an in-line diffusion furnace. As with the roller coater setup in FIG. 26, multilayer materials may be coated on each side of the substrate by using multiple sets of spray nozzles connected to different liquid sources (not shown here) and applying (or flowing) a different liquid source material to each nozzle on the top and/or rear set of spray nozzles. This is an alternative technique to the roller coating system shown in FIG. 26. In one embodiment, the top ridges are coated with n-type dopant liquid/paste (such as phosphorus); the rear ridges are coated with p-type dopant liquid/paste (such as boron). Referring to FIG. 27, the 3-D TFSC substrate 642 is shown moving in 644 on input conveyor belt 646. Angled nozzles 672 spray n-type dopant liquid onto the surface at a sharp angle with respect to the surface (nozzles cover wafer width). This n-type dopant liquid comes from an n-type liquid dopant source and nozzle reservoir/pump 674. Angled nozzles 676 spray p-type dopant liquid onto the surface at a sharp angle with respect to the surface (nozzles cover wafer width). This p-type dopant liquid comes from a p-type liquid dopant source and nozzle pump 678. The 3-D TFSC substrate 642 next moves into the curing area where the dopant liquid/paste layers are concurrently formed using a curing lamp 656 which uses IR or UV curing beams 658. The 3-D TFSC substrate 642 is next shown moving out 660 to the output conveyor belt 662, which may move the substrate 642 to an in-line diffusion furnace, where the $n^+$ and $p^+$ contacts and selective emitter regions are concurrently formed.

The angled spray technique limits the vertical height of the liquid/paste coating to a portion of the ridges and prevents the liquid source from coating the inner parts of the hexagonal pyramid cavity sidewalls and/or rears. This type of in-line (or another drive method) processing system may also be used for applying metal source liquid (e.g., silver and/or aluminum source liquid) for fire-through metallization applications as well as applying liquid etchant for selective etching of dielectrics (e.g., oxide and/or solid dopant source layer) from the top and/or rear hexagonal-pyramid ridges.

FIG. 28 shows a view 680 of another alternative setup to perform the same processes as the in-line roller coater/curing setup of FIG. 26 and the in-line spray coater/curing setup of FIG. 27. The setup in FIG. 28 may be used for self-aligned formation of dopant liquid/paste coating on the 3-D TFSC substrate top ridges and rear ridges by liquid-dip coating. This setup also may utilize an in-line atmospheric-pressure coating and curing equipment configuration to be attached to the input stage of an in-line diffusion (or fire-through) furnace.

In one embodiment, the top ridges are coated with n-type dopant liquid/paste (such as phosphorus); the rear ridges are coated with p-type dopant liquid/paste (such as boron). The 3-D TFSC substrate 642 is shown moving in 644 on input conveyor belt 646. Liquid film dispenser containing n-type liquid dopant source 682 applies a controlled thickness n-type liquid dopant film 684. This n-type dopant liquid comes from n-type liquid dopant source and liquid level and depth controller 686. Liquid film dispenser containing p-Type liquid dopant source (with peripheral air levitation) 688 applies a controlled thickness p-type liquid dopant film 690. This p-type dopant liquid comes from p-type liquid dopant source and liquid level and depth controller 692. The 3-D TFSC substrate 642 next moves into the curing area where the dopant liquid/paste layers are concurrently formed using a curing lamp 656 which uses IR or UV curing beams 658. The 3-D TFSC substrate 642 is next shown moving out 660 to the output conveyor belt 662, which may move the substrate 642 to an in-line diffusion furnace, where the $n^+$ and $p^+$ contacts and selective emitter regions are concurrently formed.

As in the setups in FIGS. 26 and 27, multilayer materials may be coated on each side of the 3-D TFSC substrate by using multiple sets of liquid-dip applicators (not shown here) and applying (or flowing) a different liquid source material to each liquid-dip applicator on the top and/or rear set of applicators. This type of processing system may also be used for applying metal liquid for fire-through metallization as well as applying liquid etchant for selective etching of dielectrics (e.g., oxide and/or solid dopant source layer) from the top and/or rear ridges.

The following section shows cross-sectional views of the TFSC substrate during various stages of the process flows outlined above. In the following FIGURES, the relative dimensions are not shown to scale.

FIG. 29 shows a cross-sectional view 700 of the 3-D substrate 102 (showing one of the hexagonal-pyramid cells 106) after the above-mentioned doping process step in a suitable process equipment such as an in line belt-driven equipment (roller coating or spray coating or liquid-dip coating or another liquid/paste-transfer coating of dopant liquids/pastes, drying/curing, and diffusion furnace anneal). In regard to the n-type (e.g., phosphorus) dopant paste or liquid 702 covering the top portion of the hexagonal ridges 272, the single furnace anneal process in the diffusion furnace (e.g., at roughly 800° C. to 950° C.) produces more heavily-doped contact diffusion regions 704 with higher surface phosphorus concentrations on the top silicon hexagonal ridges directly in contact with and underneath the cured n-type dopant solid source layer 702. Through gas or vapor-phase transport of the vaporized dopant source to the adjacent frontside regions within the hexagonal-pyramid cavities, the furnace anneal/diffusion process concurrently dopes the remaining frontside surface regions 706 not covered with the solid dopant source layer with phosphorus with smaller surface concentration and smaller dose, thus, creating self-aligned selective emitter regions with lighter surface doping. These less heavily doped regions 706 improve the blue response of the solar cell, while the more heavily doped ridges 704 will minimize the frontside contact resistance of the solar cell for improved cell emitter contact metallization. Similarly, the same furnace anneal process produces more heavily doped $p^{+-}$doped 708 hexagonal-pyramid rear tips 144 for low base contact resistance, while the remaining backside base regions 710 are less heavily doped on the surface. In the embodiment shown in FIG. 29, L 712 is much less than H 232 and much less than h 150, with H 232 between 100 and 500 microns, while L 712 is between 2 and 20 microns. Also shown are l 714 and α 716, where $l=L/\cos(\alpha/2)$ and $\alpha/2=\tan^{-1}(h/2H)$. Also shown are L' 718, and l' 720, where l' is the slanted height of heavily doped junction region.

FIG. 30 shows YY cross-sectional views 730 and 740 after self-aligned formation of the emitter and base contacts and solar cell interconnects. As shown, the emitter contact is preferably wrapped around (or it may be wrapped-through frame holes not shown) the 3-D substrate frame to make all the cell contacts on the rear side of the solar cell (for ease of solar module assembly automation). As shown in FIG. 30, the self-aligned frontside honeycomb contacts 174 are placed within the more heavily $n^{+-}$doped top ridges 704 of the honeycomb structure (thus, producing very low contact resistance). The remaining top regions not covered by the emitter contacts (which is most of the hexagonal-pyramid sidewall area doped by proximity vapor-phase doping from the adjacent solid dopant source regions) has the less heavily doped $n^+$ selective emitter regions, enabling excellent solar cell blue response. The base metallization contacts 176 on the rear side hexagonal-pyramid tips cover the more heavily $p^{+-}$doped regions (formed by direct contact with the solid dopant source layer), resulting in low base contact metallization resistance. The remaining base surface regions on the rear side of the 3-D substrate are less heavily doped with boron (by proximity vapor-phase doping from the adjacent solid dopant source regions), enabling very low surface recombination velocity and improved cell performance. Also shown is surface passivation & ARC layers (thermal $SiO_2$ and PECVD or PVD hydrogenated $SiN_x$) 736.

FIGS. 31 and 32 show YY cross-sectional views 750 and 760 of the 3-D hexagonal-pyramid solar cells (showing a single hexagonal-pyramid unit cell and several adjacent unit cells, respectively) after completion of the solar cell fabrication process and after soldering (or connecting with a suitable electrically conductive epoxy) 752 the rear base contacts 176 (rear hexagonal-pyramid metallized tips) to the rear cell mirror 754 (and base interconnect) plate. This mirror/interconnect plate may be made of a number of materials, preferably Ag-coated Cu or Ag-coated Al (or any other suitable electrically conductive and optically reflecting material). The combination of the highly reflective rear mirror and the 3-D hexagonal-pyramid structure of the solar cell (and the frontside honeycomb pattern aperture 762 of the solar cell) ensure extremely efficient light trapping, enabling ultra-high-efficiency solar cells using very thin crystalline silicon films.

The following FIGURES show alternative views, corresponding to various steps in the process flows for fabrication of TFSCs outlined above.

FIG. 33 shows a YY cross-sectional view 770 of the 3-D hexagonal-pyramid TFSC substrate 102 (showing one pyramid unit cell) after self-aligned roller coating (or spray coating or liquid-dip coating or another suitable liquid-transfer coating) of n-type dopant paste/liquid 702 on the frontside honeycomb ridges 272, and after drying/curing and furnace annealing, preferably in an in-line belt furnace, to form the selective emitter regions and heavily-doped emitter contact diffusion regions (the preferred embodiment applies both n-type and p-type dopant pastes or liquids on the frontside and backside, respectively, before a single furnace anneal/diffusion process to form the doped diffusion regions, including selective emitter junction regions). This structure shows the unit cell after short thermal oxidation (e.g., to grow 5 nm to 100 nm thermal oxide) and PVD or PECVD ARC layer ($SiN_x$) formation. The dotted lines show the doped regions (after further processing, the unit cell structure is shown in FIG. 29). This embodiment shows no prior $p^+$ base contact doping (it will be done by Al doping in conjunction with Al rear base contact formation using a base contact firing process).

FIG. 34 is similar to FIG. 33, except FIG. 34 shows $p^+$ base contact doping by roller coating (or spray coating or liquid-dip coating or another suitable liquid-transfer coating) of a p-type dopant layer and subsequent curing and anneal (same anneal as emitter). Self-aligned solid-dopant-source-doped rear $p^+$ contact regions 782 (for plated rear base contacts) are illustrated using dotted lines.

FIG. 35 shows a cross-sectional view 790 similar to the view 700 shown in FIG. 29. However, in the embodiment shown in FIG. 35 there is only coating of n-type dopant paste/liquid on the frontside honeycomb ridges. There is no $p^+$ dopant paste/liquid applied to the backside.

FIG. 36 shows a YY cross-sectional view 800 of a 3-D hexagonal-pyramid substrate 102 after self-aligned formation of the frontside (top) solid $n^+$ (e.g., doped with phosphorus) solid dopant source layer and selective emitter. This structure leads to the structure shown in FIG. 41. The frontside pattern consists of honeycomb ridges which will be subsequently used for formation of the emitter contacts/interconnects. FIG. 37 shows a ZZ cross-sectional view 810.

FIG. 38 shows a YY cross-sectional view 820 of a 3-D hexagonal-pyramid substrate 200 after self-aligned formation of the frontside (top) solid $n^+$ (e.g., doped with phosphorus) and $p^+$ solid dopant source layer, selective emitter, as well as the self-aligned frontside emitter and rear base contacts (shown with fire-through metallization but selective plating may also be used to obtain the same structure). This structure leads to the structure shown in FIG. 41. The frontside pattern consists of honeycomb ridges which will be subsequently used for formation of the emitter contacts/interconnects. FIG. 39 shows a ZZ cross-sectional view 830.

FIG. 40 shows a schematic quasi-3-D view 850 of a hexagonal-pyramid unit cell of one embodiment of a 3-D TFSC substrate structure of the disclosed subject matter after formation of the self-aligned frontside emitter contact (on the honeycomb ridges) and the rear base contact (on the hexagonal-pyramid rear tips). Solar light enter the solar cell from the topside into the hexagonal-pyramid unit cell cavities.

Finally, FIG. 41 shows a view 860 of an alternative embodiment of solar cell assembly on the rear mirror and base interconnect (the first embodiment shown in FIG. 32). In contrast to FIG. 32 shown with a specular rear mirror, this embodiment uses a diffused rear base mirror 862 (with a roughened Ag-coated surface to scatter the reflected light back into the 3-D cell structure).

The previous section illustrated a preferred embodiment of a hexagonal-pyramid TFSC substrate. Alternative embodiments may use alternative designs for the unit cells such as inverted pyramid unit cells with polygon bases, including square pyramid, triangular pyramid, etc.; other embodiments may include 3-D TFSC substrates with V-groove or orthogonal V-groove patterns, etc. For example, FIG. 42 shows a top view 864 of a 3-D TFSC substrate with a square-pyramid unit cell structure. The primary difference between this pattern and the preferred embodiment hexagonal-pyramid unit cell pattern is the top base (or pyramid aperture) geometry (square base versus hexagonal base for the inverted pyramid unit cells). The vertical height and base area values of the square pyramid unit cells are comparable to those of the hexagonal-pyramid unit cells (similar considerations apply). Another example is shown in FIG. 43, which shows a top view 866 of a 3-D TFSC substrate with a triangular-pyramid unit cell structure. The primary difference between this pattern and the preferred embodiment hexagonal-pyramid unit cell pattern is the top base or pyramid aperture geometry (triangular base versus hexagonal base for the inverted pyramid unit cells). The vertical height and base area values of the triangular pyramid unit cells are comparable to those of the hexagonal-pyramid unit cells (similar considerations apply).

FIG. 44 shows a top view 868 of a 3-D TFSC substrate with an orthogonal V-groove unit cell structure. The orthogonal V-groove unit cell preferably has four adjacent rectangular or square-shaped arrays of V-grooves, with the V-grooves in each pair of adjacent sub-unit cells running perpendicular to each other. A 3-D TFSC substrate uses a large number of the orthogonal unit cells shown above. The ranges for height and width of the V-grooves in the orthogonal V-groove unit cells are similar to the height and diameter ranges of the hexagonal-pyramid unit cells, respectively. Each square-shaped sub-unit cell (four sub-unit cells shown above produce one orthogonal V-groove unit cell) may have tens to hundreds of V-grooves. The orthogonal V-groove structure provides additional mechanical rigidity compared to the standard V-groove structure with parallel V-grooves on the entire substrate. The dotted lines depict the V-groove trench bottoms whereas the solid lines show the top ridges of the V-grooves. FIG. 45 shows XX 870, YY 872, and ZZ 874 cross sectional views of the 3-D TFSC substrate with an orthogonal V-groove unit cell structure, shown in FIG. 44.

FIG. 46 shows a top view 876 of a 3-D TFSC substrate with an alternative orthogonal diagonal V-groove unit cell structure, compared to the orthogonal V-groove unit cell structure shown in FIG. 44. The orthogonal diagonal V-groove unit cell preferably has four adjacent rectangular or square-shaped arrays of V-grooves, with the V-grooves in each pair of adjacent sub-unit cells running perpendicular to each other. The orthogonal V-groove structure provides additional mechanical rigidity compared to the standard V-groove structure with parallel V-grooves on the entire substrate. FIG. 47 shows YY 878, XX 880, and ZZ 882 cross sectional views of the 3-D TFSC substrate with an alternative orthogonal diagonal V-groove unit cell structure, shown in FIG. 46.

In the following section, alternative embodiments of process flows for fabricating templates using either lithography and etch techniques or laser micromachining (or laser drilling) are described. The templates are then used and reused numerous times to fabricate the 3-D TFSC substrates for 3-D TFSC fabrication.

Templates may be fabricated using electronic-grade silicon wafers, solar-grade silicon wafers, or lower-cost metallurgical-grade silicon wafers. Moreover, templates made of silicon can be fabricated either using monocrystalline or multicrystalline silicon wafers. The starting template wafer may either be a standard polished wafer (after saw damage removal) or even a lower grade wafer immediately after wire sawing (without saw damage removal). The latter may further reduce the cost of the templates. The relatively low cost of each template is spread over numerous 3-D TFSC substrates, resulting in much lower TFSC substrate and finished module costs compared to the standard state-of-the-art (e.g., 200 microns thick) solar-grade monocrystalline and multicrystalline silicon wafers and associated modules.

For further explaining how a template is fabricated, FIG. 48 shows an embodiment of a process flow 890. The process begins with step 891, where an unpatterned monocrystalline silicon or multicrystalline silicon, either square-shaped or round substrate (e.g., 200 mm×200 mm square or 200-mm round) is provided. The starting template wafer may be a wafer prepared by wire saw either with or without saw damage removal (the latter may further reduce the cost of template). The starting template wafer may also be made of a lower purity (and lower cost) metallurgical-grade silicon. In one embodiment, the substrate is roughly 200 to 800 microns thick. Optionally, step 891 includes performing gettering on a low-cost metallurgical-grade silicon and/or performing a surface texturing etch (e.g., using isotropic acid texturing by a mixture of nitric acid and hydrofluoric acid, or using alkaline texturing in KOH/IPA) to create an optional textured template surface. Step 892 involves the use of programmable precision laser micromachining to form the desired periodic array of deep trenches. This process may be performed in a controlled atmospheric ambient based on either physical ablation or a combination of physical ablation and laser-assisted chemical etching. Step 893 involves template surface preparation and cleaning. This includes stripping the patterned photoresist layer from the substrate. The template substrate is then cleaned in a wet bench prior to subsequent thermal deposition processing to form the TFSC substrates. Such cleaning may involve DRIE-induced polymer removal (using a suitable wet etchant such as a mixture of sulfuric acid and hydrogen peroxide) followed by an isotropic silicon wet etch (such as in a mixture of nitric acid and hydrofluoric acid) in order to isotropically remove a thin layer (e.g., on the order of 10 to 500 nanometers) of silicon from the trench sidewalls and bottoms. This may remove any surface and buried contaminants, such as any surface and embedded metallic and/or polymeric/organic contaminants introduced by the deep RIE (DRIE) process, from the sidewalls and bottoms of the DRIE-produced template trenches. Template processing may complete after a deionized (DI) water rinse and drying. Optionally and if desired, the template wafer may also go through a standard pre-diffusion (or pre-thermal processing) wafer cleaning process such as a so-called RCA wet clean prior to the above-mentioned DI water rinsing and drying. Another optional surface preparation step (either performed instead of or after the wet isotropic silicon etch process) includes performing a short thermal oxidation (e.g., to grow 5 to 100 nanometers of sacrificial silicon dioxide), followed by wet hydrofluoric acid (HF) oxide strip (to remove any residual contaminants from the patterned template). If no optional oxide growth/HF strip is used, an optional dilute HF etch may performed to remove the native oxide layer and to passivate the surface with hydrogen (forming Si—H bonds) in preparation for subsequent 3-D TFSC substrate fabrication. After the completion of step 893, the resulting template may then be used and reused multiple times to fabricate 3-D (e.g. hexagonal-pyramid) TFSC substrates.

An alternative embodiment of a process flow 894 for patterning of a template is outlined in FIG. 49, which uses photolithography and etch instead of direct laser micromachining. Step 895 (providing an unpatterned substrate) corresponds to step 891 of FIG. 48. Step 896 uses photolithography patterning (in one embodiment, using a relatively low-cost contact or proximity aligner/patterning) to produce a mask pattern such as hexagonal-pyramid pattern in photoresist (i.e., interconnected hexagonal openings in the photoresist layer). The process sequence includes the formation of an oxide and/or nitride (optional) layer, photoresist coating (e.g., spin-on or spray coating) and pre-bake, photolithography exposure through a hexagonal-array mask, and photoresist development and post-bake. One embodiment includes an optional hard mask layer ($SiO_2$ and/or $SiN_x$; for example, a thin thermally grown oxide layer can be used as an optional hard mask) below the photoresist (although the process may be performed without the use of any hard mask layer by placing the photoresist coating directly on silicon). When using a hard mask layer, the exposed portions of the hard mask layer are etched after photoresist patterning (thus, forming hexagonal openings). Such etching of the exposed hard mask layer may be simply performed using a wet etchant such as hydrofluoric acid for oxide hard mask or using plasma etching. Step 897 involves formation of hexagonal-pyramids using anisotropic plasma etch; where a high-rate deep reactive ion etch (DRIE) process forms a closely-packed array of deep (e.g., 100 to 400 microns) hexagonal-pyramid shaped trenches (i.e., pyramidal trenches with sloped sidewalls) in silicon. The photoresist and/or oxide and/or nitride hard mask layer(s) are used for pattern transfer from the patterned photoresist layer to silicon substrate. In one embodiment, the deep RIE (DRIE) process parameters are set to produce a controlled-angle hexagonal-pyramid sidewall slope. The RIE is allowed to produce small-diameter (e.g., less than 5 microns) holes at the bottom of pyramids by punching through the substrate backside. Alternatively, separate small-diameter backside holes may be formed which connect to the bottom tips of the pyramidal trenches. Step 898 (surface preparation and cleaning) corresponds to step 893 of FIG. 48. After the completion of step 898, the resulting template may then be used and reused multiple times to fabricate 3-D (e.g. hexagonal-pyramid) TFSC substrates.

The following section outlines various process flows for fabricating 3-D pyramidal TFSC substrates using the templates described above.

Figure 50:
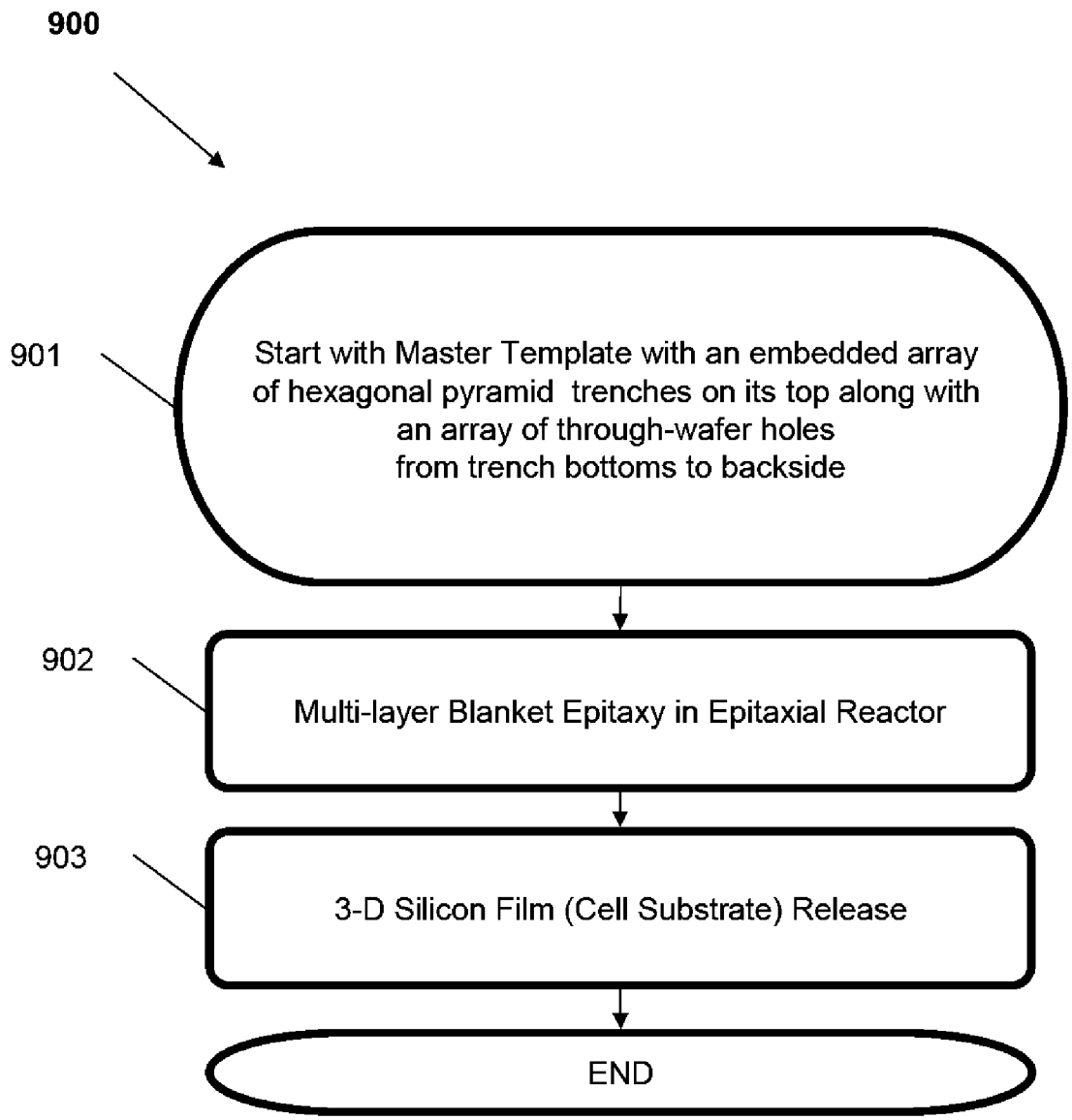

FIG. 50 shows an embodiment of a process flow 900 for fabrication of self-supporting, free-standing 3-D hexagonal-pyramid TFSC substrates. The process uses a lift-off 3-D thin-film release process based on a highly selective etch process to remove an interfacial sacrificial layer (of $Ge_{1-x}Si_x$) without any appreciable etching of silicon. The $Ge_{1-x}Si_x$ layer may be a single layer with a constant Ge fraction or a multi-layer (e.g., 2 to 3 layers) structure with varying Ge fractions. In step 901, a patterned square-shaped template is provided. This template has already been processed to form an array of hexagonal-pyramid trenches on its frontside 206 along with an array of through-wafer holes 210 from trench bottoms 208 to backside 212. Step 902 involves a multi-layer blanket epi in an epitaxial reactor. Step 902 first involves an $H_2$ or $GeH_4/H_2$ in-situ cleaning, which is performed after a standard pre-epi wet clean. Next, a thin sacrificial epi layer is deposited on the frontside only. In one embodiment, $Ge_xSi_{1-x}$ is used for the sacrificial epi layer and is between 10 and 200 nanometers. Next, a doped silicon epi layer is deposited on the frontside only. In one embodiment, the layer is p-type, boron-doped and has a thickness between 2 and 20 microns. Step 903 involves 3-D TFSC substrate release. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to etch the $Ge_xSi_{1-x}$ layer. Alternatively, a mixture of ammonia, peroxide, and water ($NH_4OH+H_2O_2+H_2O$) may be used. This process releases the silicon epi layer as a hexagonal-pyramid 3-D TFSC substrate, which may then be used for subsequent 3-D TFSC fabrication.

Depending on the emitter doping type (n-type or p-type), the in-situ base doping type is chosen to be p-type (e.g., boron) or n-type (e.g., phosphorus). The embodiments shown provide examples of boron-doped hexagonal-pyramid 3-D TFSC substrates which may be used to fabricate TFSCs with n-type, phosphorus-doped selective emitters. In an alternative embodiment, all the doping polarities may be inverted, resulting in phosphorus-doped hexagonal-pyramid 3-D TFSC substrates which may be used for fabricating cells with boron-doped selective emitters.

Figure 51:
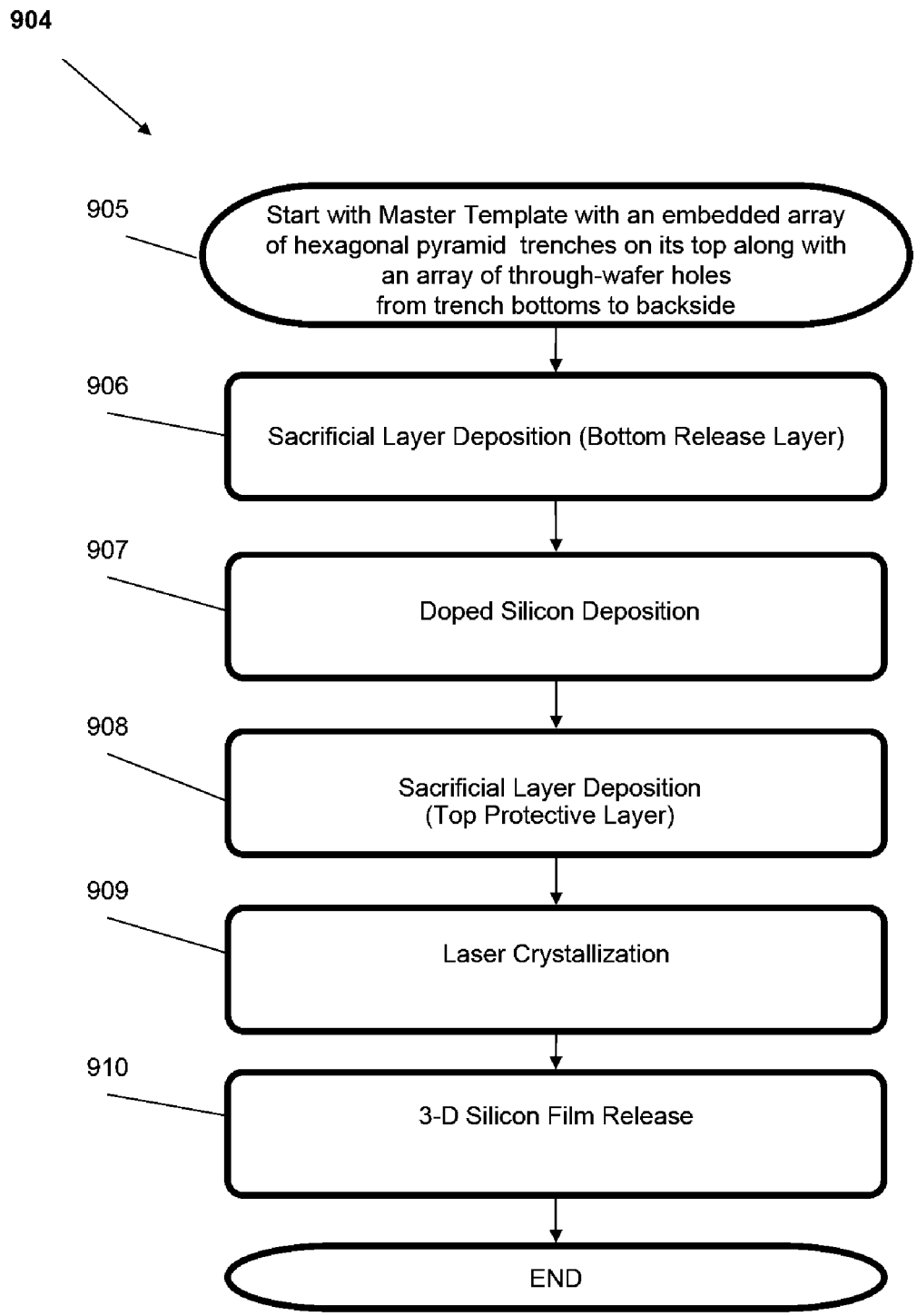

FIG. 51 shows an alternative embodiment of a process flow 904 for fabrication of self-supporting, free-standing 3-D hexagonal-pyramid TFSC substrates. The same process flow may be used for fabrication of 3-D TFSC substrates with other unit cell structures (square pyramid, triangular pyramid, orthogonal V-grooves, orthogonal diagonal V-grooves, etc.). This process uses a suitable sacrificial material layer (e.g., silicon dioxide) to facilitate the 3-D TFSC substrate release and lift-off (or removal from the template). Laser crystallization may be used to crystallize the amorphous silicon or polysilicon layer. Step 905 (providing a template) corresponds to step 901 above. Step 906 involves sacrificial layer deposition, where a thin sacrificial layer (e.g., $SiO_2$) is deposited preferably by APCVD (alternatively, use LPCVD or PECVD or even thermal oxidation). In one embodiment, this layer is between 20 nm and 200 nm of $SiO_2$. In step 907, doped (e.g., p-type) silicon layer (preferably doped amorphous silicon or polysilicon) is deposited on oxide-coated substrate (top only) by a CVD process such as PECVD (e.g., 2 to 20 microns thick; boron-doped). Step 908 involves depositing a thin sacrificial layer (e.g., $SiO_2$) as a top protective layer, preferably by chemical-vapor deposition process such as APCVD (alternatively, use LPCVD or PECVD or even thermal oxidation). In one embodiment, this layer may be 5 nm to 50 nm of $SiO_2$. In step 909, laser crystallization (preferably starting from a silicon frame at substrate edge) of doped silicon layer is performed, using a preferably square-shaped single-crystal silicon frame as laser crystallization seed (edge-to-center crystallization). Step 910 involves releasing the 3-D TFSC substrate, by performing a highly selective isotropic HF wet etching of the sacrificial $SiO_2$ layer (with high selectivity with respect to silicon) to etch off the oxide release layer between the p-type 3-D silicon film and the template (this process lifts the 3-D hexagonal-pyramid silicon film). For all embodiments, releasing the 3-D film may be aided by applying a small mechanical stress (e.g., wafer warpage) or applying ultrasonic or megasonic agitation during the release etch.

Figure 52:
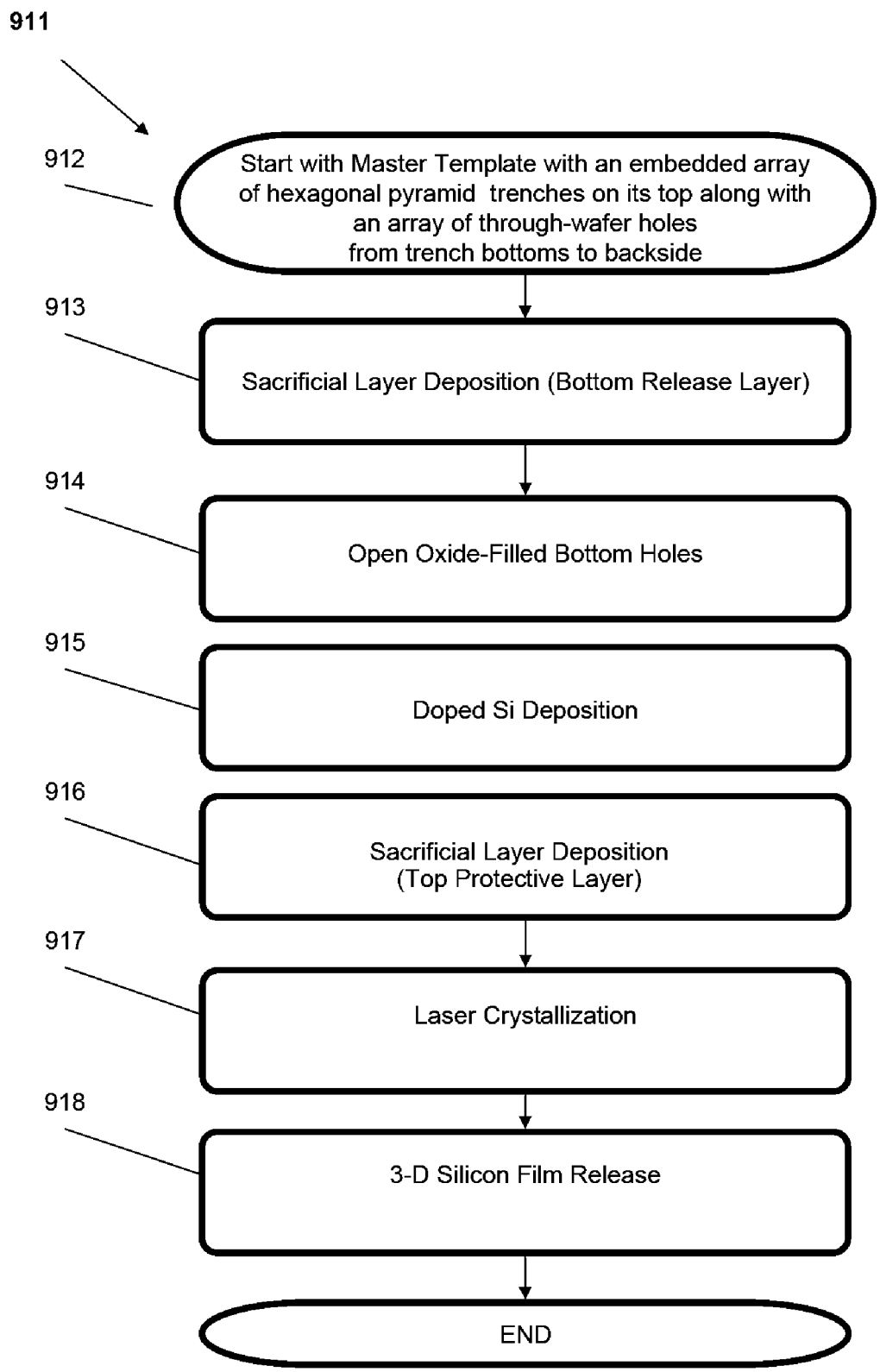

FIG. 52 shows an alternative embodiment of a process flow 911 for fabrication of self-supporting, free-standing 3-D hexagonal-pyramid TFSC substrates. The same process flow may be used for fabrication of 3-D TFSC substrates with other unit cell structures (square pyramid, triangular pyramid, orthogonal V-grooves, orthogonal diagonal V-grooves, other types of pyramids, etc.). This process uses a sacrificial or disposable material layer (e.g., silicon dioxide) to facilitate the 3-D TFSC substrate release and. Laser crystallization may be used to crystallize the amorphous silicon or polysilicon layer. Step 912 (providing a template) corresponds to step 901 above. Step 913 (sacrificial layer deposition) corresponds to step 908 above. Step 914 involves performing a backside wet etching of $SiO_2$ to re-open the oxide-filled substrate bottom holes. Step 915 (doped silicon deposition) corresponds to step 907 above; and step 916 (sacrificial layer deposition) corresponds to step 908. In step 917, laser crystallization of the doped silicon layer is performed, using the single-crystal islands at the bottom holes of hexagonal-pyramids as laser crystallization seeds. Step 918 (3-D TFSC substrate release) corresponds to step 910 above.

Figure 53:
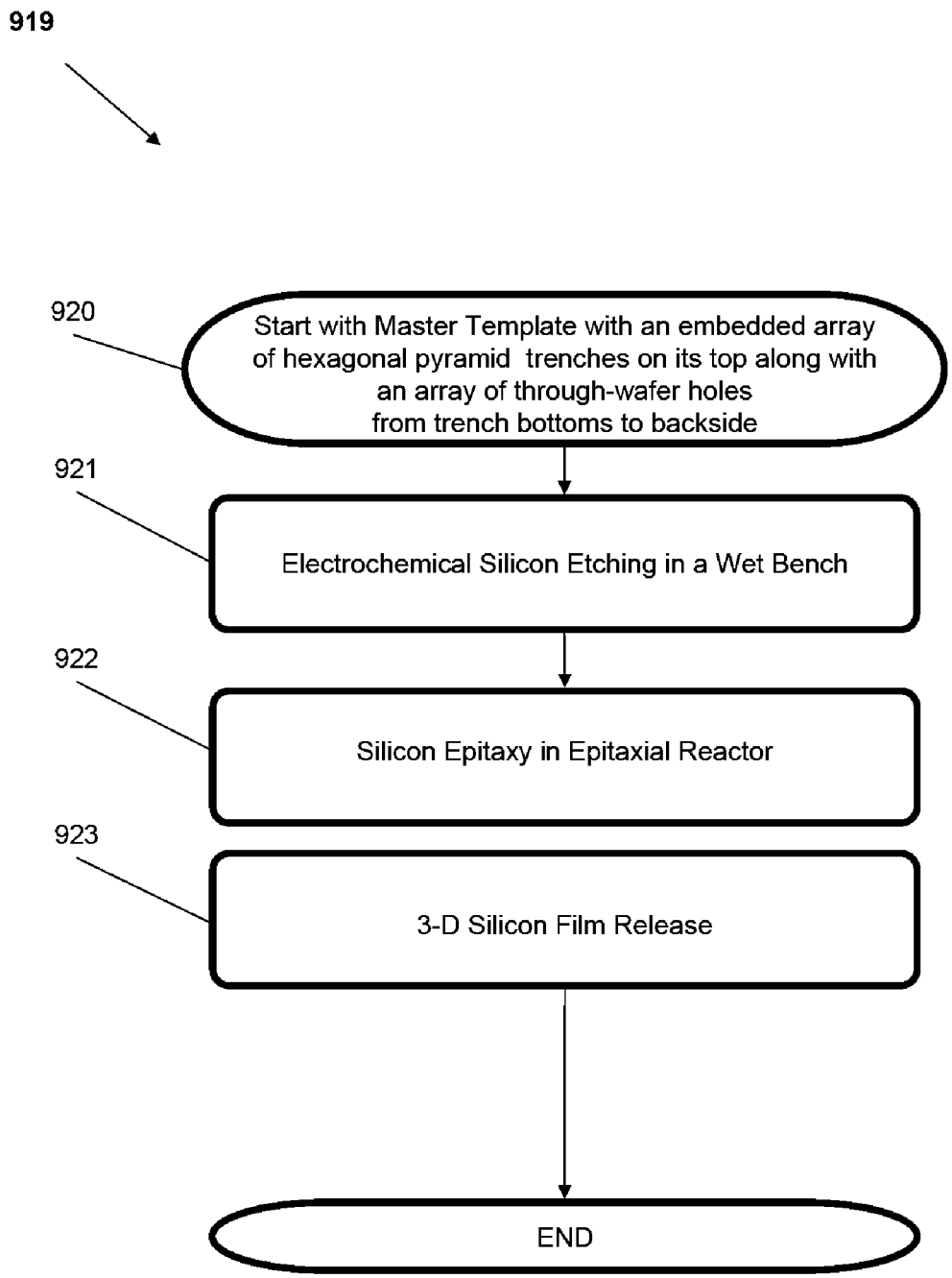

FIG. 53 shows an alternative embodiment of a process flow 919 for fabrication of self-supporting, free-standing 3-D hexagonal-pyramid TFSC substrates. The same process flow may be used for fabrication of 3-D TFSC substrates with other unit cell structures (square pyramid, triangular pyramid, orthogonal V-grooves, orthogonal diagonal V-grooves, other pyramidal unit cell structures, etc.). This process uses electrochemical silicon etching to form low and/or high porosity porous silicon layer(s) prior to semiconductor (e.g., silicon) epitaxy. Step 920 (providing a template) corresponds to step 901 above. Step 921 involves Electrochemical Silicon Etching in a Wet Bench to produce a single-layer porous silicon or a bilayer stack of a top layer of low-porosity porous silicon on a layer of high-porosity porous silicon, using electrochemical HF etching (also known as electrochemical anodization of silicon to form porous silicon). The porous silicon layer or layer stack may be formed either by direct electrochemical etching of the template substrate or by first depositing a thin layer of epitaxial silicon and then converting the thin silicon epi layer to sacrificial porous silicon using electrochemical etching. In step 922, silicon epitaxy is performed in an epitaxial reactor to form preferably monocrystalline silicon on top of the porous silicon sacrificial layer or layer stack, with the following in-situ process steps performed: $H_2$ in-situ clean; deposition of doped (e.g., p-type) silicon epi (top only) (e.g., 2 to 20 microns thick; boron-doped). Finally, in step 923, the 3-D TFSC substrate is released by either applying a mechanical stress to the substrate (e.g., by applying a slight warpage to the substrate), or simply by selective wet etching of the sacrificial porous silicon layer (or layer stack) using a suitable etchant (such as $HF+H_2O_2$ or TMAH or another suitable selective porous silicon etchant).

In the next section, various embodiments of this disclosure for making solar modules suitable for building rooftops and façades, centralized power generation, and other applications are described. Usually solar modules are made by arranging a plurality of solar cells and connecting them in series (series electrical connections) within a solar module assembly protected by a top glass layer and a rear protective material layer such as Tedlar. The cells may be connected in series in order to step up the DC voltage (while maintaining the solar module current at the same level at the level of the cell current) to facilitate high-efficiency DC-to-AC power conversion.

FIG. 54 illustrates a first embodiment of a process flow 924 for fabrication of solar modules with top protective glass plates and embedded PCBs of this disclosure (corresponding to the solar module structure of FIG. 55 with a PCB and a TFSC mounted on the PCB). This manufacturing flow is compatible with a fully automated module assembly line. This module assembly flow is based on the use of a double-sided printed-circuit board (PCB) with the cell rear mirrors/base interconnects on the PCB topside (silver-coated patterned copper on the PCB topside). For hexagonal-pyramid 3-D TFSCs with rear base layers and integrated/embedded (or attached) rear mirrors fabricated prior to module assembly (e.g., hexagonal-pyramid cells with rear base layers and thin-film rear mirrors deposited on the rear surfaces of the rear base layers using PVD or plating or roller coating/spray coating and curing), the patterned PCB copper layer does not have to be coated with a high-reflectivity mirror material (silver). In step 925, module assembly starts with a double-sided PCB coated with copper foils on both frontside and backside. The PCB area should support the desired number/layout of TFSCs (e.g., $\geq 1$ $m^2$, with a copper foil thickness on each side of roughly 10 to over 100 microns). Step 926 involves PCB interconnect patterning and silver flash coating (the latter if needed for PCB rear mirror). The PCB frontside and backside copper foils are patterned according to the desired frontside and backside interconnect layouts. Copper patterns are flash coated with a thin layer of highly reflective silver (and/or aluminum). A highly reflective diffuse mirror may be used, though a specular mirror may also be used. Step 927 involves cell preparation for automated TFSC placement and soldering. The rear metallized side of the TFSCs is roller coated (or spray coated or dip coated) with lead-free solder or an electrically conductive and thermally-conductive epoxy paste. Step 928 involves automated TFSC placement and soldering (or curing of epoxy). TFSCs are automatically picked and placed in a closely-packed array on the frontside of the PCB. The rear side of each cell sits on its designated site on the frontside of the double-sided PCB with patterned copper interconnects. The TFSC rear hexagonal-pyramid base interconnect is soldered to the PCB frontside silver-coated patterned copper islands using thermal or ultrasonic soldering. In case of using epoxy instead of solder, the epoxy layer is cured using thermal and/or IR/UV curing. The protective thin-film shunt diodes are mounted and soldered (or epoxied) on the PCB backside. An optional step is to flash coat the metal regions with a thin layer of highly reflective silver. Step 929 involves final solar module assembly and lamination. A stack of low-reflection tempered (in one embodiment, also textured) top glass, an encapsulant layer, the cell-mounted PCB, another encapsulant layer and a Tedlar or polyvinyl fluoride back sheet is prepared. Next, the module stack assembly is hermetically sealed and packaged, for instance, using vacuum-pressure lamination.

FIG. 55 shows a cross-sectional view 930 of a solar module (solar panel) structure (resulting from the process flow described in FIG. 54) with a protective back plate 931 made of a proven prior art material (e.g., Tedlar or polyvinyl fluoride film); a rear encapsulant layer 932 (EVA), a 2-sided printed-circuit board (PCB) 933 of this disclosure with rear patterned electrical interconnects 934 and top patterned electrical interconnects 935; cell rear mirrors and TFSCs 936 with rear base and wrap-around (or wrap-through) emitter contacts mounted on the frontside of the PCB, a top encapsulate layer (EVA) 937, and an anti-reflection-coated (ARC) tempered glass (in one embodiment, textured tempered glass) 938 (from rear to top), with greater than 98% transmission, with sputtered or sprayed or liquid-coated anti-reflection coating). This module structure may be assembled as a hermetically sealed package either as a frameless module or with a frame (e.g., made of aluminum). In one embodiment, the module assembly is a frameless assembly (also for reduced materials energy content and reduced energy payback time).

FIG. 56 outlines an alternative embodiment of an assembly process flow 940 for fabrication of reduced cost and reduced weight (lightweight) solar modules (corresponding to the solar module structure of FIG. 57). This flow is compatible with a fully automated module assembly. This process flow shows the assembly process without the use of a thick glass plate (thus, further reducing the weight, cost, and energy payback time of the solar modules of this disclosure) and without an EVA encapsulant layer on the top of the cells. The module topside (the frontside of assembled cells) is covered with a hard protective glass-type layer (if desired, also including a top ARC layer) with a combined thickness on the order of tens to hundreds of microns. As deposited, this frontside protective layer is effectively textured as a result of the 3-D structure of the TFSCs. The top layer may be formed by a liquid coating technique (e.g., spray coating, liquid-dip coating, or roller coating) following by a thermal or UV curing process. The thermal (or UV) cure for the liquid-spray-coated (or liquid-dip coated or roller coated) protective/AR layers may be performed as a single step together with the vacuum-pressure thermal lamination process. This embodiment results in a lightweight module assembly with reduced materials consumption, reduced cost, and reduced energy payback time. Step 942 (providing PCB) corresponds to step 902 in FIG. 54; step 944 (PCB patterning and silver flash coat) corresponds to step 904; step 946 (cell preparation) corresponds to step 906; and step 948 (automated TFSC placement) corresponds to step 908. Step 950 involves solar module lamination. A stack of the cell-mounted PCB, an encapsulant layer, and a back sheet is prepared. Next, a suitable hermetic sealing/packaging process such as vacuum-pressure lamination is performed. Step 952 involves deposition of the solar module frontside protective coating (which may be automatically textured as deposited and provides efficient light trapping for effective coupling to the TFSCs) layer and an optional ARC layer. The frontside of the solar panel is coated with a thin layer of protective material (e.g., a glass-type transparent material) and an optional top anti-reflection coating (ARC) layer using a suitable coating method. This coating (roughly tens to hundreds of microns) may be performed using liquid spray coating, liquid roller coating, liquid-dip coating, plasma spray coating or another suitable method. Next, a thermal/UV curing process is performed.

FIG. 57 shows a cross-sectional view 960 of another embodiment of a solar module structure (resulting from the process flow described in FIG. 56). Instead of a top encapsulate layer (EVA) 937, and an anti-reflection-coated (ARC) tempered glass 938, as shown in FIG. 55, there is a single frontside protective layer and anti-reflective coating layer 962. The frontside protective layer and anti-reflective coating (ARC) layer 962 is formed by liquid spray coating/curing, liquid roller coating/curing, liquid-dip coating/curing, plasma spray coating, or another suitable low-temperature coating technique. This frontside protective coating and ARC layer 962 is effectively textured for the coating layer as deposited as a result of the 3-D structure of the TFSCs (thus, no separate texturing process is needed). This is due to the fact that the coating layer may have dips (low points) over the TFSC hexagonal-pyramid cavities and peaks (high points) over the hexagonal-pyramid emitter ridges. The frontside protective layer and anti-reflective coating layer 962 may have a combined thickness in the range of tens to hundreds of microns. In one embodiment, the thickness may be approximately 30 to 300 microns. In addition to providing an anti-reflection coating (ARC) function, the stacked frontside protective/ARC layer provides excellent protection against weather/elements and force impact (e.g., hail impact) in actual outdoor field operation. Since the frontside coating is effectively and automatically textured as a result of the 3-D structure of the TFSCs, the use of a separate ARC layer on the frontside coating is optional. The textured coating may provide effective light trapping in the frontside coating for effective coupling of a very high fraction (e.g., greater than 95%) of the incident solar light intensity to the TFSCs. The frontside protective layers may also provide an optical waveguiding function to eliminate or reduce any reflection losses associated with the top emitter contact metallization.

FIG. 58 shows a view 970 of a solar cell integrated or assembled in building windows. The solar cell can allow partial visible light transmission (e.g., with transmission on the order of 10% to 30%) by creating an array of holes or slot openings in the 3-D hexagonal-pyramid solar cell substrate.

In one embodiment, the cell has a regular array of holes or slot openings to allow for 5% to 20% light transmission. This FIGURE has a magnified view of a portion of the solar glass with the hexagonal-pyramid cells (thus, the relative dimensions of the hexagonal-pyramid cell and the solar glass are not shown to scale). FIG. 58 shows frontside TFSC hexagonal emitter interconnects 174 and self-aligned backside hexagonal base contact 176. The distance 978 between the top glass plate 972 and bottom glass plate 974 may be between 1 and 12 millimeters. The hexagonal-pyramid cell parameters may be designed to allow for a desired level of light transmission through the cell (e.g., roughly 10% to 90%). The level of average light transmissivity can be controlled by the aspect ratio of the TFSCs.

FIG. 59 shows a view 980 of a representative example of series connections of TFSCs of this disclosure in a solar module assembly. This example shows 24 squared-shaped cells 982 connected in series (in a 6×4 array). The electrical connections in series are shown by arrows between the adjacent cells connected in series. Module power input 984 and output 986 leads are also shown. In actual module assemblies, the numbers of cells may be smaller or larger and the cells may be connected in series or in a combination of series and parallel. As mentioned earlier, series connection of the cells within the module assembly allows for stepping up the DC voltage for the DC-to-AC inverter (and also limiting the DC current of the solar modules for ease of module installation in the field and reliability of the module-to-module electrical connections). The printed-circuit-board (PCB) based module assembly of this disclosure supports any number of cells assembled in a module and any electrical connection configuration (series, series/parallel combination, or parallel). The TFSCs and modules of this disclosure may provide relatively lightweight solar modules with areas from less than 1 m² to several m² (e.g., 10 m²) for various applications. The cells connected in series within a module assembly are chosen based on sorting to be matched in terms of their photogenerated current (e.g., short-circuit current $I_{sc}$ and/or maximum-power current $I_m$).

The solar module structures and assembly methods of this disclosure are based on the use of a printed-circuit board (PCB) to assemble the 3-D TFSCs in a closely packed array and to connect the cells (in one embodiment in series) using the PCB plate within a module assembly. The PCB plate may have a single patterned metal (in one embodiment, copper) interconnect layer on the top of the PCB or two patterned copper layers on the top and rear surfaces of the PCB plate. FIG. 60 shows a view 990 of the frontside silver-coated copper layout of the printed-circuit board (PCB) used for solar module assembly (the square islands serve both as rear mirrors (if no integrated mirror is used with single-aperture cells, or if the cells are dual-aperture cells without base layers) and base interconnects; the peripheral square-shaped copper bands connect to the wrap-around emitter contact at the TFSC peripheral frame rear side; copper-filled via plugs connecting select regions of the PCB frontside and backside are shown as small circles). This example is shown for an array of 24 TFSCs arranged in 4 rows of 6 cells in each row (the PCB may be designed for any number and various arrangements of TFSCs). The PCB conductor (copper or aluminum) thickness may be in the range of roughly 10 to over 100 microns to provide high electrical and thermal conductivities. The PCB also serves as an effective heat sink to minimize temperature cycling of the TFSCs in operation. The PCB material may be selected to be a lightweight, high-strength material (such as suitable carbon composite materials used in aerospace industry), or even a relatively thin flexible material. The larger-area square-shaped silver-coated copper regions 992 are connected to the TFSC rear base regions (bottoms of the rear base layers for the single-aperture cells or the bottom ridges of the dual-aperture cells for the dual-aperture cells). The peripheral silver-coated copper lines 994 are electrically connected to the TFSC emitter contact metallization regions.

FIG. 61 shows a top view 1000 of the backside (optionally silver-coated) copper layout of the printed-circuit board (PCB) used for solar module assembly, showing the series connection of the TFSCs. The PCB backside may also include thin-film shunt diodes for shade protection of the TFSCs (as shown in FIG. 60). The copper-filled via plugs (shown as circles) connect the PCB frontside and backside metallization patterns in the corresponding areas. While the example shown here is for connecting 24 TFSCs in series on a solar panel, similar PCB design methodology may be applied to configure and connect any number of cells in any desired arrangements on the module. The frontside view of this PCB is shown in FIG. 60. This example is shown for an array of 24 TFSCs arranged in 4 rows of 6 cells in each row (the PCB may be designed for any number and various arrangements of TFSCs), all connected in series. The PCB conductor (copper or aluminum) thickness may be in the range of roughly 10 to over 100 microns to provide high electrical and thermal conductivities. The PCB also serves as an effective heat sink to minimize temperature cycling of the TFSCs in operation. The PCB material may be selected to be a lightweight, high-strength material (such as suitable carbon composite materials used in aerospace industry). FIG. 61 also shows power input Lead 984 (first cell's p-lead) and power output lead 986 (last cell's n-lead).

FIG. 62 shows a backside view 1010 of the copper pattern on the PCB and is essentially similar to FIG. 61. This picture also shows the use of protective thin-film shunt diodes mounted on the PCB backside pattern (for cell shadow protection).

FIG. 63A shows an enlarged top view 1020 of the silver-coated copper pattern (the pad for mounting one cell) on the frontside of the solar module printed-circuit board (PCB) used for rear mirror and also emitter and base interconnects for one of the TFSCs (relative dimensions are not shown to scale). FIG. 63A shows dimensions of $L_1$ 1022 and $L_2$ 1024 (in one embodiment, 150 millimeters to greater than 200 millimeters, where $L_2=L_1+2$ (W+S)). S 1026 may be on the order of 25 to 250 microns. The width of the peripheral copper conductor band (W) 1028 may be on the order of 50 to 500 microns. The copper-filled via plugs 1030 are shown as circles (connecting the interconnect patterns on the PCB frontside and backside in a pre-designed arrangement in order to connect the TFSCs in series or in any other desired arrangement such as series/parallel; the representative example shown here is for connecting all the cells in series in order to step up the module open-circuit voltage). The via plug 1030 diameters may be on the order of roughly 50 to 500 microns (and may be smaller than W 1028). The large central square pad serves both as the rear cell mirror and also base interconnect plane (connecting to the hexagonal-pyramid base contact metallization). The number of vias in the center square (p-region contact) (N) 1032 may be on the order of hundreds to thousands. The number of vias in the peripheral line (n-region contact) (M) 1034 may be on the order of tens to hundreds (or even thousands). The vias on the peripheral line contacting the TFSC emitter (n) regions are placed on three sides. The PCB conductor (copper or aluminum) thickness may be in the range of roughly 10 to over 100 microns to provide high electrical and thermal conductivities. The PCB plate also serves as an effective heat sink to minimize temperature cycling of the TFSCs in field operation. This FIGURE shows one of the copper interconnect/mirror pads shown in the full module PCB array of FIG. 60.

FIG. 63B shows an enlarged top view 1040 of the silver-coated copper interconnect pattern on the backside of the solar module printed-circuit board (PCB) used for emitter and base electrical interconnects for a couple of adjacent TFSCs of this disclosure (a portion of the PCB view). FIG. 63B shows the PCB backside silver-coated copper interconnect pattern for TFSCs 1 and 2 in the array. The copper pattern here is shown for connecting the TFSCs in series to step up the module open-circuit voltage. FIG. 63B shows dimensions of $L_1'$ 1042; peripheral emitter (n-region) connector linewidth W' 1044 (in one embodiment, 2 to 10 millimeters); spacing between the center base (p-region) connector plate and the peripheral emitter (n-region) connector line S' 1046 (in one embodiment, 100 microns to 1 millimeter). Note that $L_1'$ 1042 is less than $L_1$ from FIG. 63A by roughly 2 to 10 millimeters. This enables larger peripheral emitter (n-region) connector linewidth and substantially reduced ohmic losses on the PCB backside.

The 3-D TFSC substrates of this disclosure may utilize peripheral thick silicon frames, both for added mechanical support and also to facilitate formation of wrap-through or wrap-around emitter contact metallization (for ease of solar module assembly). The thick silicon frame may be separately made from very low-cost silicon material (such as metallurgical grade or reclaim silicon wafers). FIG. 64 shows various schematic views 1050 of the thick silicon frame, the silicon frame slivers, and representative method to produce (e.g., cut) silicon slivers from very-low-cost round (e.g., reject silicon from microelectronics) or square-shaped (or rectangular) cast silicon (or reclaim Si) substrates. The slivers may be made of very low-cost crystalline or multicrystalline silicon such as metallurgical-grade cast Si. A round 1052 or square-shaped 1054 silicon wafer (e.g., a 200 mm×200 mm cast metallurgical-grade silicon substrate) may be used to produce hundreds of silicon slivers 1056 by a cutting process such as laser cutting (four slivers used to make a thick silicon frame for a 3-D TFSC substrate by a welding process such as electron-beam welding).

These slivers 1056 may be used to make the thick silicon frames for the substrates shown above. The separately fabricated thick silicon frame may then be integrally attached to the 3-D TFSC substrates, in embodiment before 3-D thin-film cell processing, by one of the following techniques: electron-beam welding at several peripheral spots/junctions; attachment during the 3-D TFSC substrate fabrication silicon deposition by placing the peripheral thick silicon frame on the template and allowing seamless attachment of the thick silicon frame to the 3-D TFSC substrate by the silicon deposition process; or a clean cured epoxy.

Top view 1058 shows a thick silicon frame to be fused to the 3-D TFSC substrate. The silicon frame thickness 1060 is roughly 50 to 500 microns. There are welded (e.g., e-beam-welded) joints 1062 (four welded joints), where L 1064 is roughly 150 to 300 millimeters, and where W 1066 is roughly 100 to 1000 microns. The slivers 1056 may also have through-holes (shown in view 1068) to help with the wrap-through/wrap-around emitter metallization contacts.

The following section outlines various calculations related to the disclosed subject matter.

For given thin silicon film thickness and substrate size (e.g., 200 mm×200 mm substrate size) values, the actual amount (e.g., amount as measured by the total silicon surface area, volume, or weight) of silicon material used in the 3-D hexagonal-pyramid substrate structure is actually larger than that of a co-planar (flat) substrate with the same dimensions (e.g., 200 mm×200 mm).

FIG. 65 (similar to FIG. 13) is provided for reference for the following calculations. B is the mid-point between $H_2$ and $H_3$; A is the mid-point between $H_5$ and $H_6$; $H_1H_4=H_3H_6=H_2H_5=d$; and AB is the hexagonal unit cell aperture horizontal distance (h):

$$h=(\sqrt{3}/2)d$$

Frontside aperture angle α is the angle defined by A-T-B, and frontside aperture angle β is the angle defined by $H_6$-T-$H_3$, and can be calculated as follows:

$$\alpha=2\tan^{-1}[(\sqrt{3}\cdot d)/(4H)]$$

$$\beta=2\tan^{-1}[d/(2H)]$$

The surface area of the cone pyramid base ($S_{hb}$)

$$S_{hb}=[(3\sqrt{3})/8]\cdot d^2$$

The surface area of the cone pyramid sidewall ($S_{hp}$)

$$S_{hp}=[(3\sqrt{3})/8]\cdot d^2\cdot\sqrt{[1+(16/3)\cdot(H/d)^2]}$$

Therefore, the effective surface area enlargement factor ($S_{hp}/S_{hb}$) is:

$$S_{hp}/S_{hb}=\sqrt{[1+(16/3)\cdot(H/d)^2]}$$

To achieve very efficient light trapping within the 3-D TFSC structure and very low effective surface reflectance with a reasonable (i.e., not excessive) area enlargement factor of $S_{hp}/S_{hb}$, the aperture angles (α and β) are chosen to be preferably in the range of around 20° to around 40°.

FIG. 66 shows the ratio of the hexagonal-pyramid sidewall area to the planar hexagonal base area ($S_{hp}/S_{hb}$) versus the height-to-base diagonal diameter ratio (H/d) of the hexagonal-pyramid unit cell. The preferred H/d range for near-optimal aperture angles is shown between dashed lines (H/d roughly 1.5 to 3.0). This results in sidewall-to-base area ratio on the order of roughly 4 to 7.

FIGS. 67 and 68 shows calculated frontside aperture angles (α and β) of the solar cell hexagonal-pyramid unit cell versus the height-to-base diagonal diameter ratio (H/d) of the hexagonal-pyramid unit cell.

FIG. 69 is provided for reference for the following calculations. A hexagonal-pyramid unit cell of the 3-D substrate may be approximated by a cone (with the same height as a hexagonal-pyramid and the same base area as a hexagonal-pyramid). The aperture angle (φ) is:

$$\phi=2\tan^{-1}[D/(2H)]$$

The surface area of cone pyramid base ($S_{cb}$) is:

$$S_{cb}=(\pi D^2)/4$$

The surface area of cone pyramid sidewall ($S_{cp}$) is:

$$S_{cp}=[(\pi D^2)/4]\cdot\sqrt{[1+(2H/D)^2]}$$

Therefore, the ratio of the sidewall surface area $S_{cp}$ to the top base surface area $S_{cb}$ is:

$$S_{cp}/S_{cb}=\sqrt{[1+(2H/D)^2]}$$

FIGS. 70 and 71 show the ratio of the cone-shaped unit cell sidewall area to the planar circular base area ($S_{cp}/S_{cb}$) versus the height-to-base diameter ratio (H/D) of the cone-shaped unit cell and calculated frontside aperture angle φ of the solar cell cone-shaped unit cell (approximation for hexagonal-pyramid units cells) versus the height-to-base diameter ratio (H/D) of the cone-shaped unit cell. These FIGURES provide plots of aperture angle and surface area ratio for a cone-shaped pyramid, whereas FIGS. 66 to 68 show these plots for a hexagonal-pyramid unit cell. The results (plots) for a cone-shaped pyramid unit cell (approximation of a hexagonal-pyramid unit cell) are fairly comparable to those for the hexagonal-pyramid unit cell.

One important consideration in the TFSC and module interconnects is the total power loss associated with the electrical interconnects in the TFSCs and the solar module assembly. The hexagonal-pyramid 3-D c-Si TFSC and PCB-based module designs of this disclosure effectively address this issue, resulting in very low interconnect ohmic losses in the cells and within the module. This feature (in conjunction with the highly efficient packing of the TFSCs on the PCB-based solar module assembly) substantially narrows the efficiency gap between the TFSCs and the solar module assembly in the technology of this disclosure.

The next section relates to the basic calculations of the emitter contact metallization ohmic losses in the hexagonal-pyramid 3-D TFSCs of this disclosure. The calculations of ohmic losses for emitter contact metallization are also applicable to the base contact metallization. However, since several embodiments of this disclosure mount the 3-D TFSCs on patterned printed circuit boards (PCBs), the base contact metallization is electrically connected in a planar format to a very high conductivity copper pad; this substantially reduces the base interconnect ohmic losses (compared to the emitter interconnect ohmic losses). Therefore, in practical embodiments of this disclosure, the interconnect ohmic losses are dominated by the emitter contact metallization.

FIG. 72 may be used for reference with an approximate analytical calculation of the TFSC interconnect ohmic losses, assuming a circular substrate with hexagonal-pyramid array of unit cells base on the cell design embodiments of this disclosure. Since the overall cell interconnect ohmic losses are dominated by the top emitter contact metallization, the ohmic power loss due to the hexagonal emitter contact metallization is calculated as a function of cell current at maximum power and emitter contact metal vertical height coverage ratio L/d (ratio of the height of emitter contact metal coverage on the pyramid sidewall to the pyramid unit cell long hexagonal diagonal dimension). The analytical calculations shown here were used to produce the plots shown in the following FIGURES (FIGS. 73-87). The calculations performed and trends obtained for round substrates are also approximately applicable to square-shaped TFSC substrates.

For the following calculations: $I_0$ is the total cell current at peak power; $A=(\pi A^2)/4$, total cell area (shown for round cell); $J_0=(4 \cdot I_0)/(\pi a^2)$, cell current density; $R_{thm}$ is the sheet resistance of top honeycomb contact metal; C is the effective flat surface coverage of honeycomb contact with vertical height L; and $R_{eff}=R_{thm}/C$, where $R_{eff}$ is the effective flat surface sheet resistance of top metal contact.

Based on this, the interconnect ohmic losses as maximum cell power are:

$$P_l \cong (R_{thm}I_0^2)/\{8\pi(S_{hp}/S_{hb})[1-(1-L/H)^2]\}$$

$$P_l \cong (R_{thm}I_0^2)/\left\{8\pi[\sqrt{1+(16/3)(H/d)^2}][1-(1-L/H)^2]\right\}$$

FIGS. 73 and 74 plot the projected (calculated) interconnect-related solar cell power losses in the 3-D TFSCs of the disclosed subject matter as a function of the ratio of the hexagonal-pyramid height to diagonal base dimension (H/d) for two different emitter interconnect area coverage ratios on the top of the 3-D solar cell substrate. For H/d=2.0, the ohmic power loss experienced as a result of extracting the maximum power from a 400 cm² solar cell is projected to be around 0.1 to 0.2 W (depending on the emitter metal coverage shown for the two plots). Since the maximum solar cell power in this example is assumed to be around 8 W, the ohmic power losses for the solar cell interconnects (dominated by the emitter current collection) is projected to be between 1.25% and 2.5%. The PCB metal pattern can be designed such that the PCB interconnect ohmic power losses are much smaller than the above-mentioned solar cell interconnect power losses. Thus, the total ohmic power losses can be kept to well below 2%. This means that using the solar cell and module technology of the disclosed subject matter, the efficiency gap between the solar cells and the solar modules can be reduced to well below 2%. Thus, with a solar cell efficiency of 23%, we can have a high degree of confidence that we will achieve a solar module efficiency of at least 21%. Both FIGURES show the calculated solar cell ohmic power loss for large-area cells with 400 cm² area and 12 A current at maximum power (roughly 8 $W_p$ max power assumed). $R_{thm}$ is the sheet resistance of the emitter contact/metal layer (e.g., Ag layer or a stack of Ag on a refractory metal layer) on the honeycomb hexagonal ridges (0.0075Ω/square for both graphs). The ratio L/H (here, 0.05 in FIG. 73 and 0.025 in FIG. 74) is the ratio of the vertical coverage height of the emitter metallized contact on the honeycomb ridges to the height of the hexagonal-pyramid unit cell.

Figure 75:
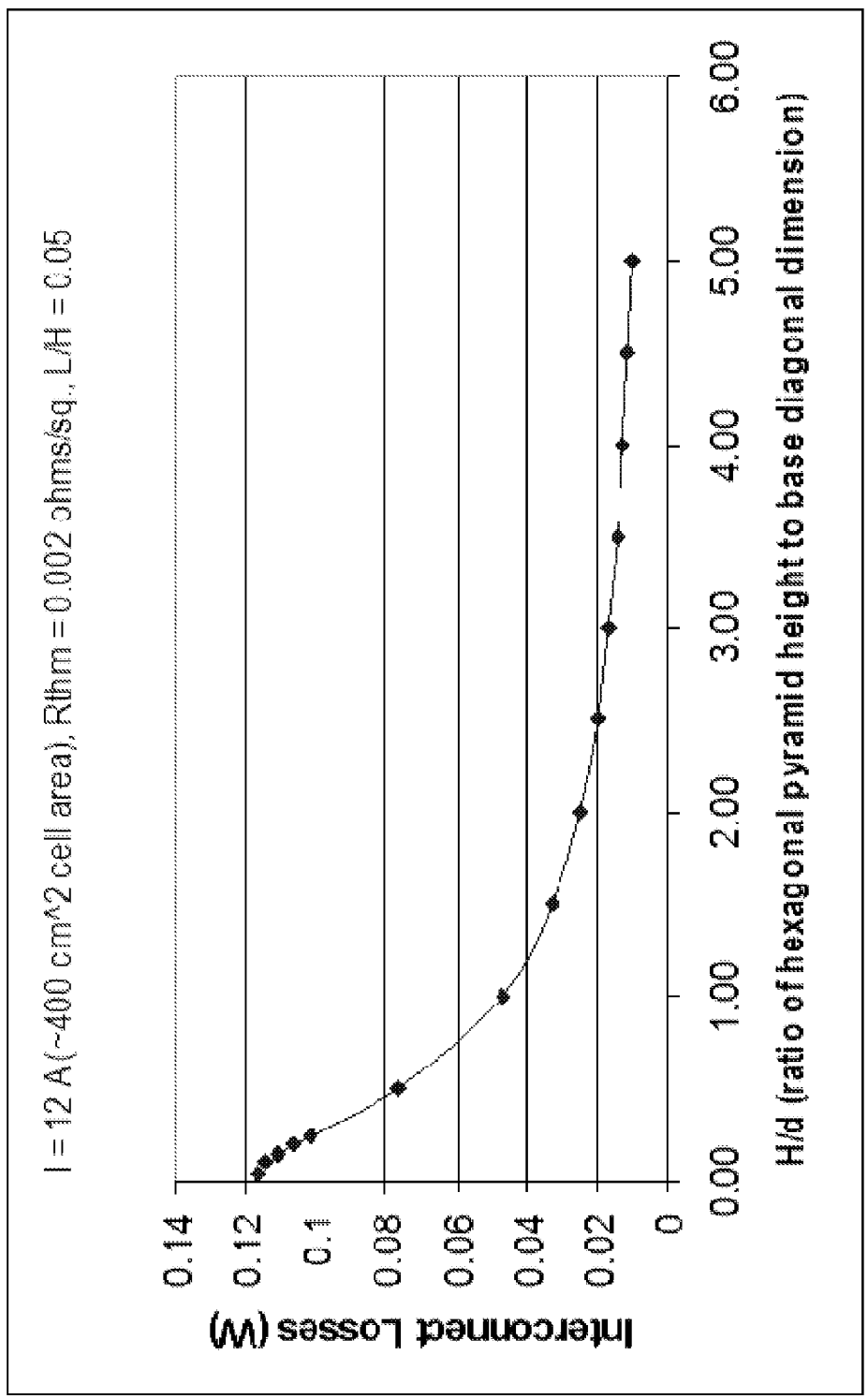
Figure 76:
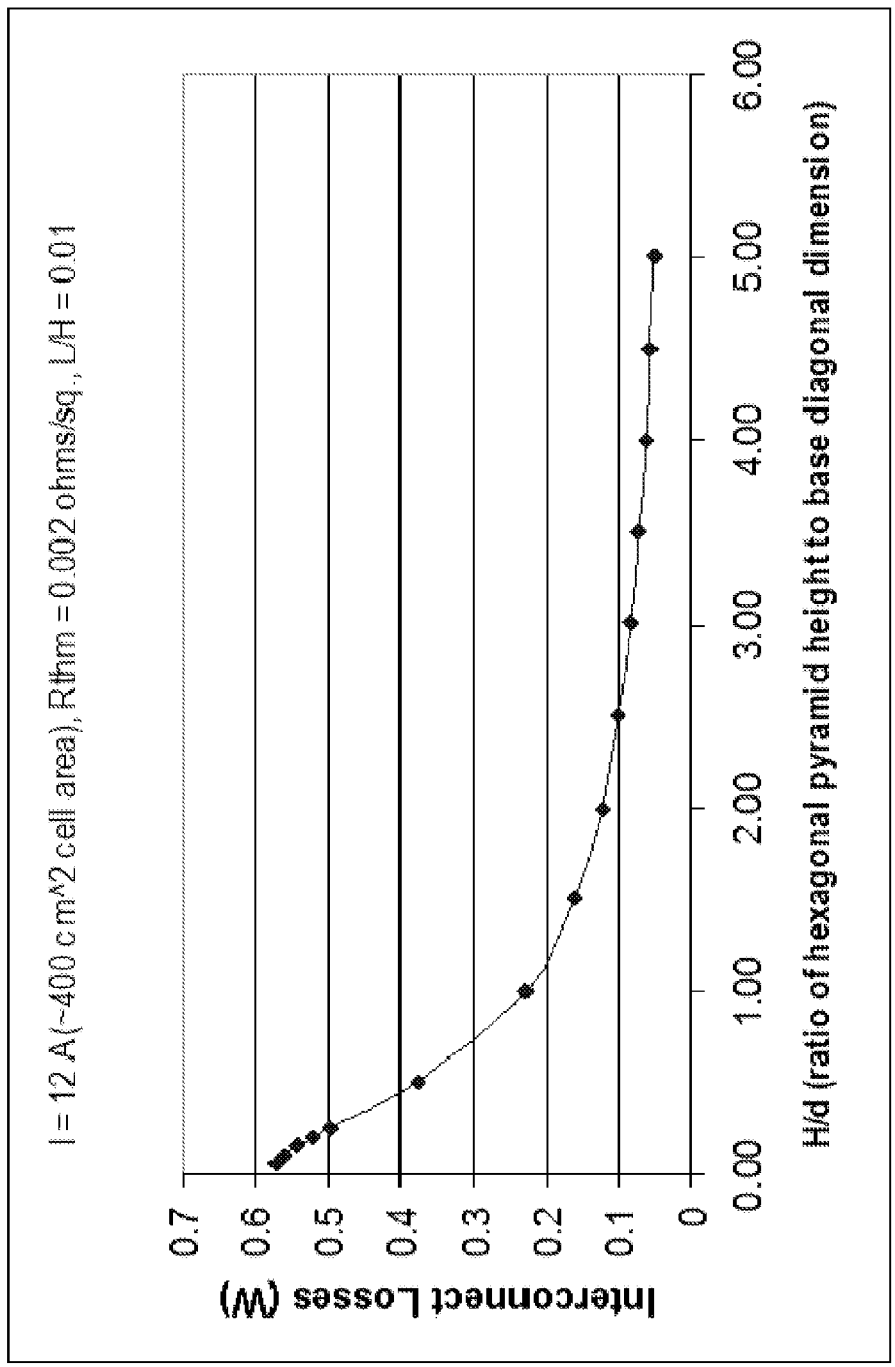
Figure 77:
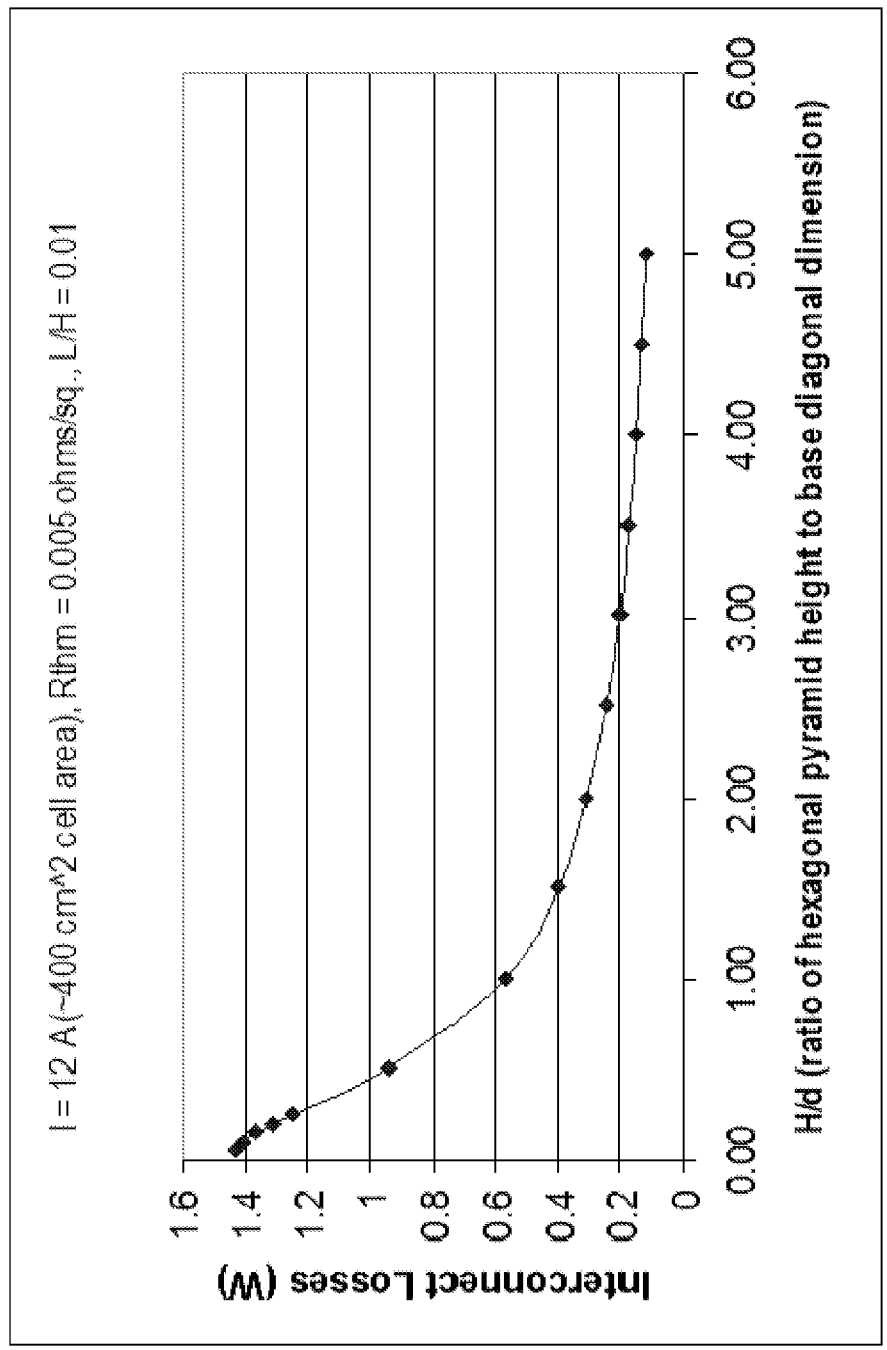
Figure 78:
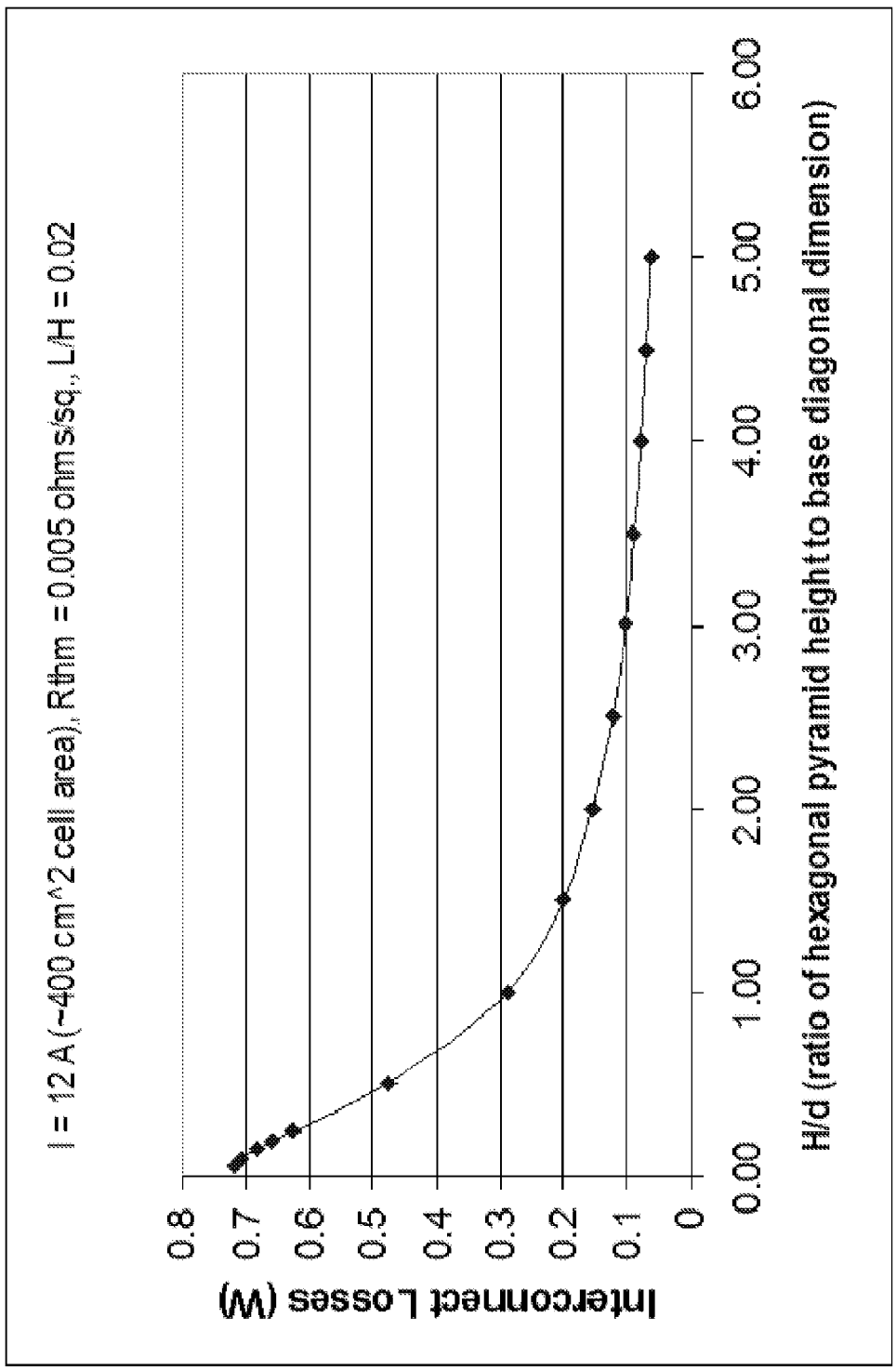
Figure 79:
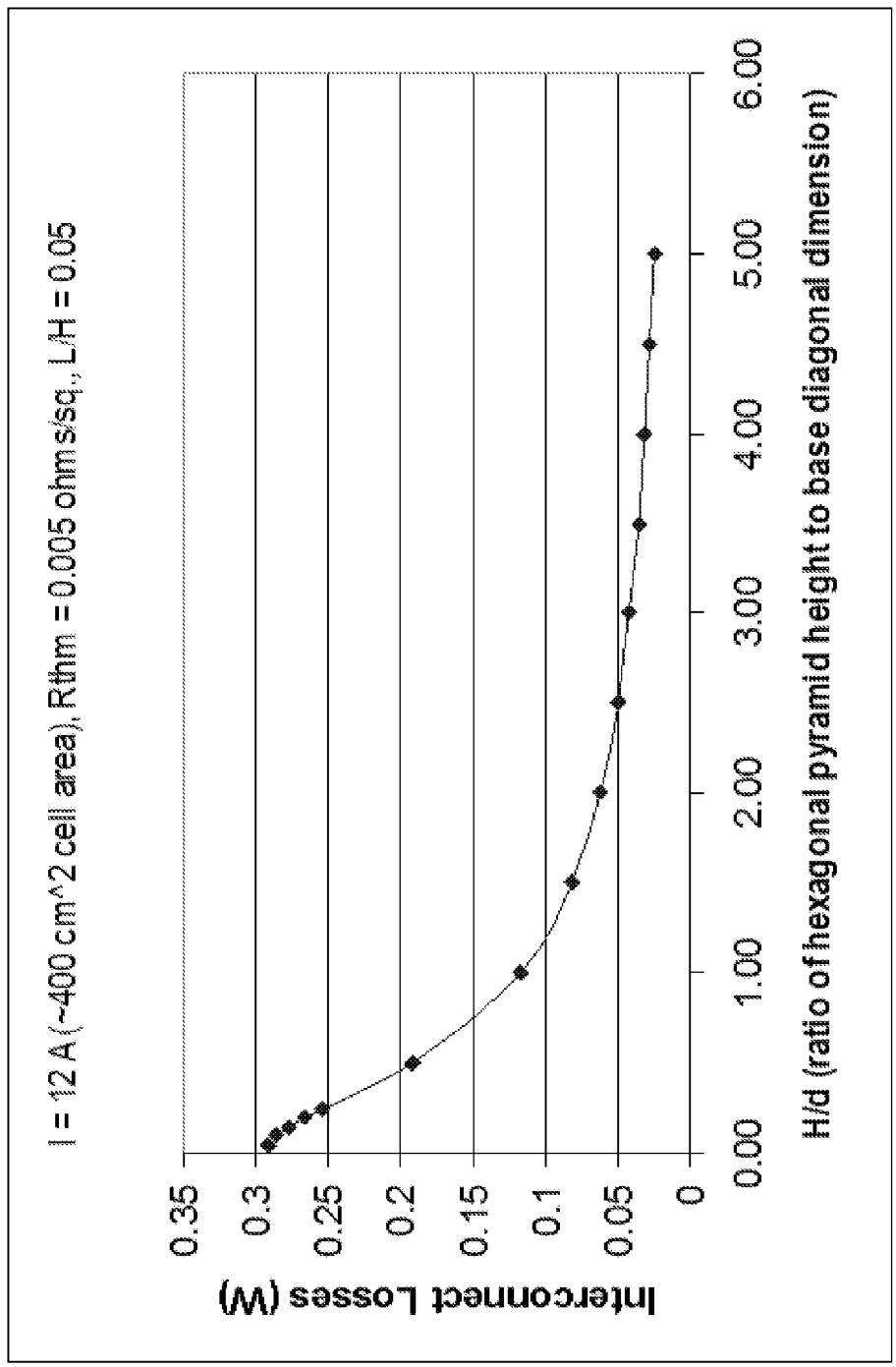
Figure 80:
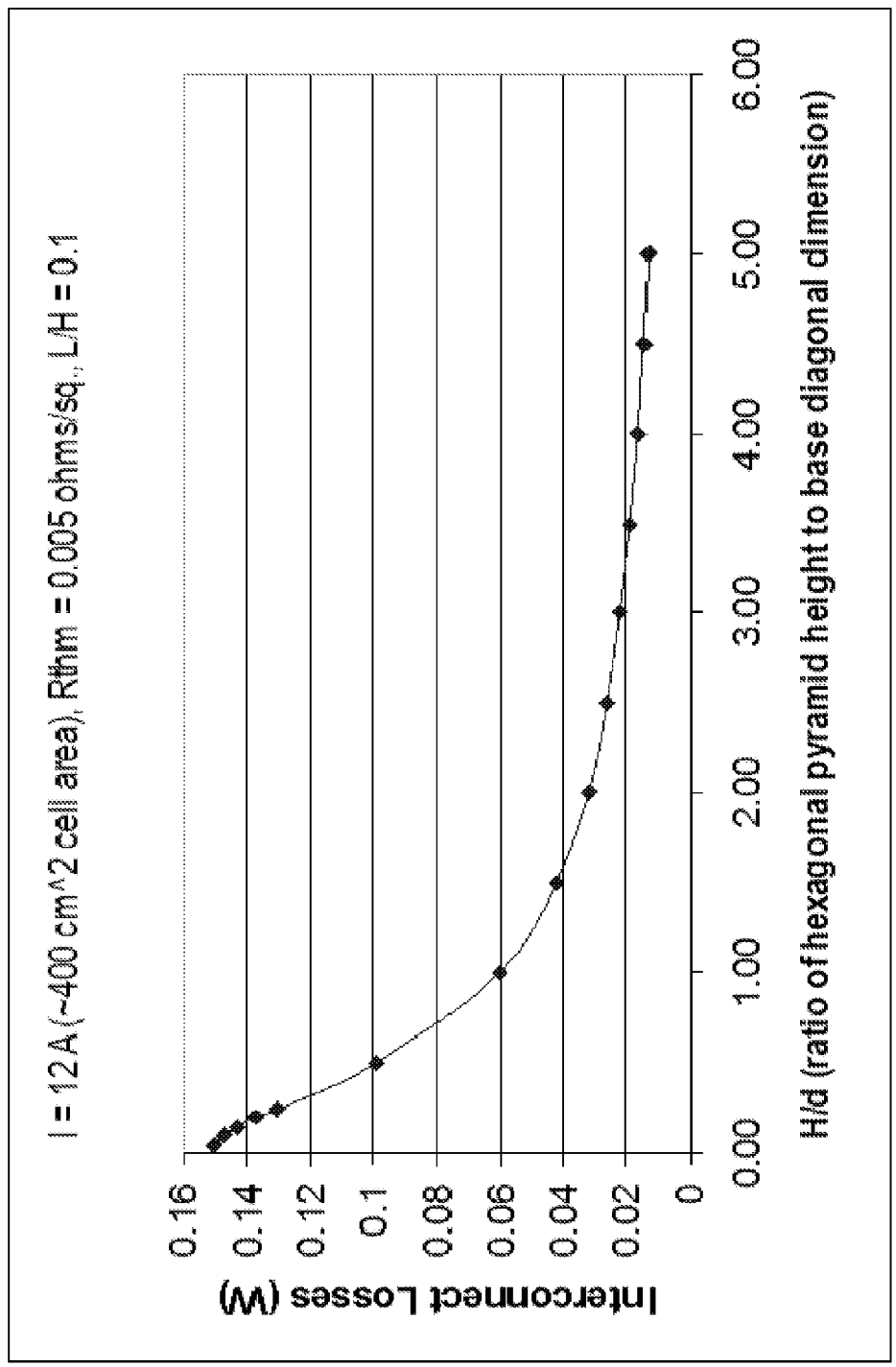
Figure 81:
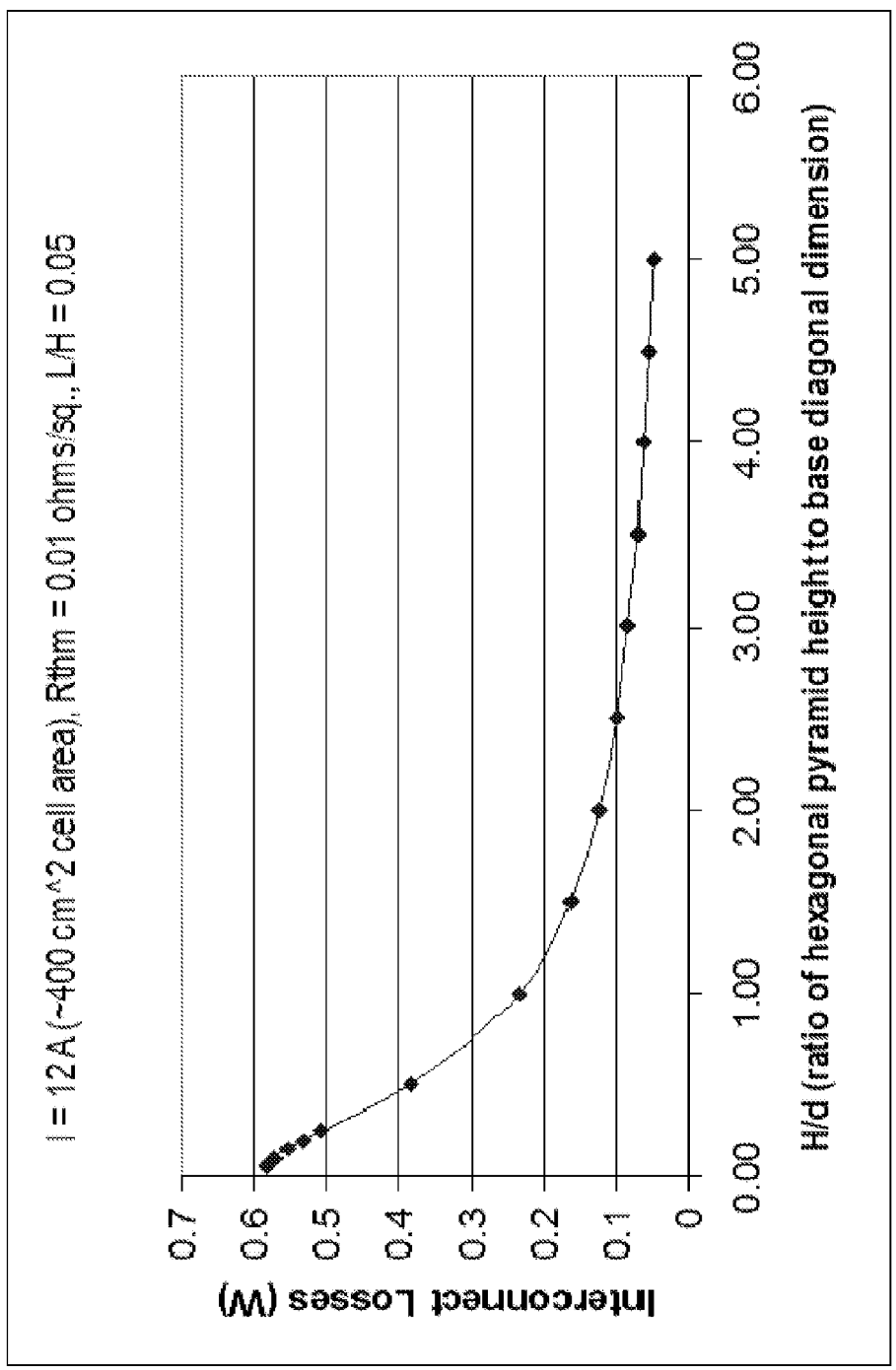
Figure 82:
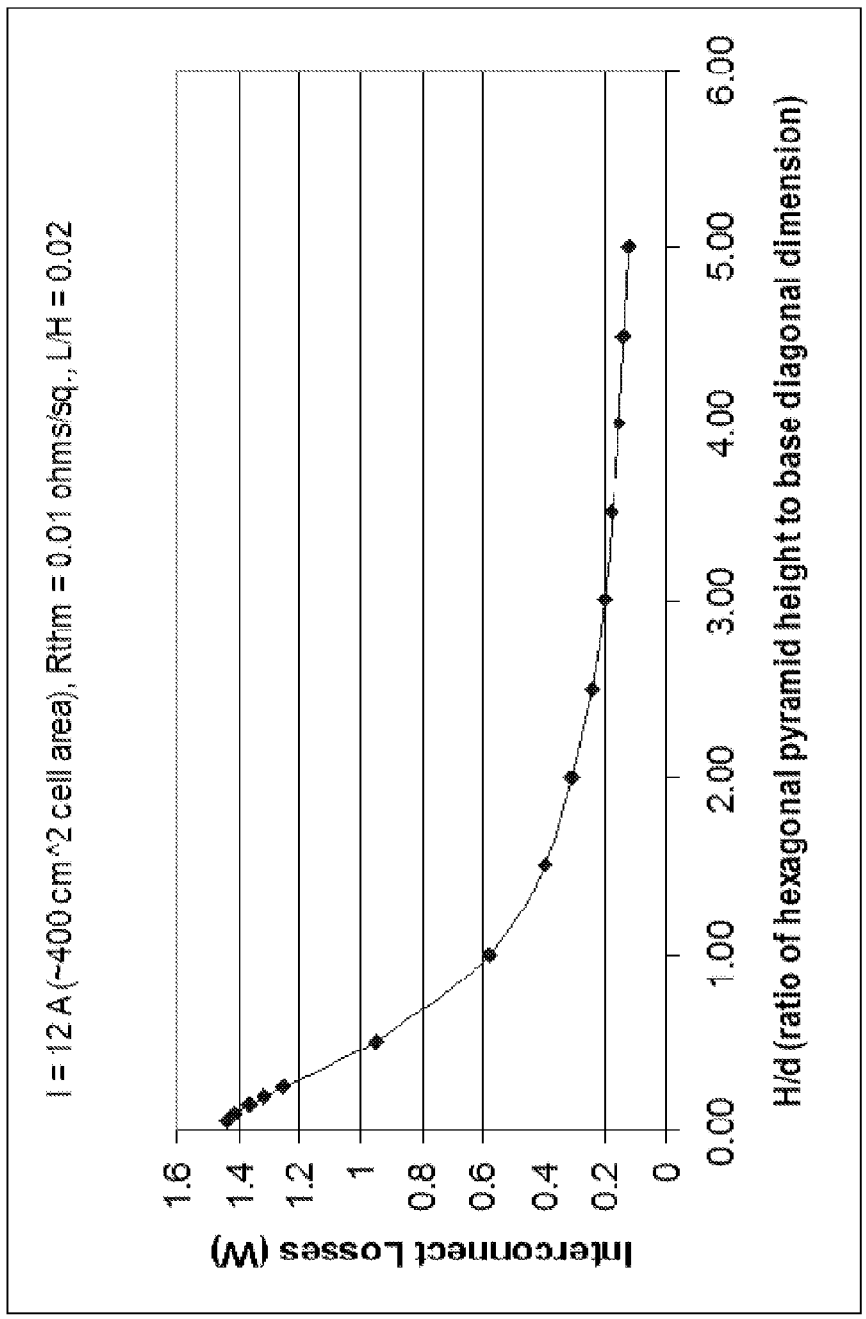
Figure 83:
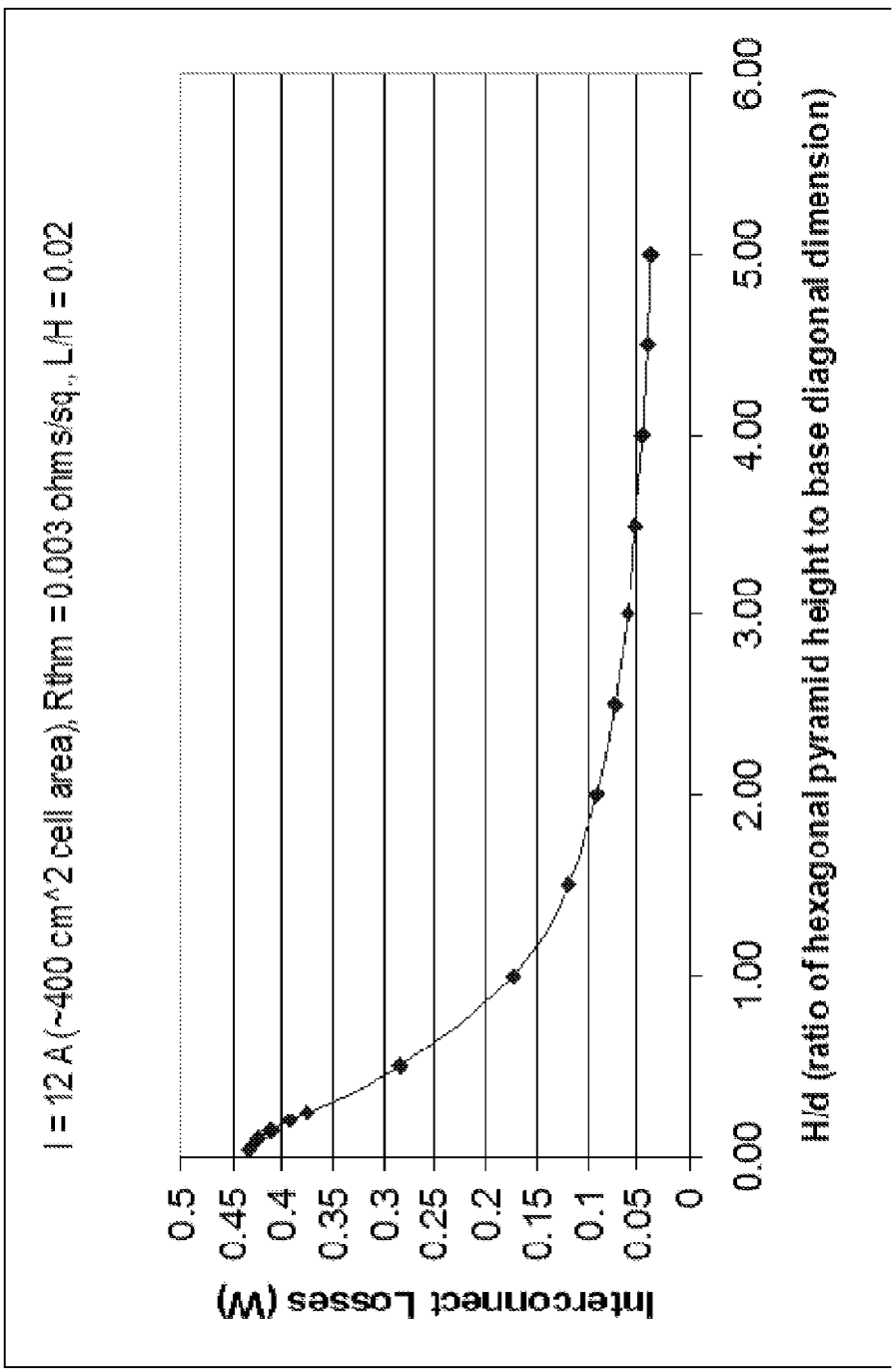
Figure 84:
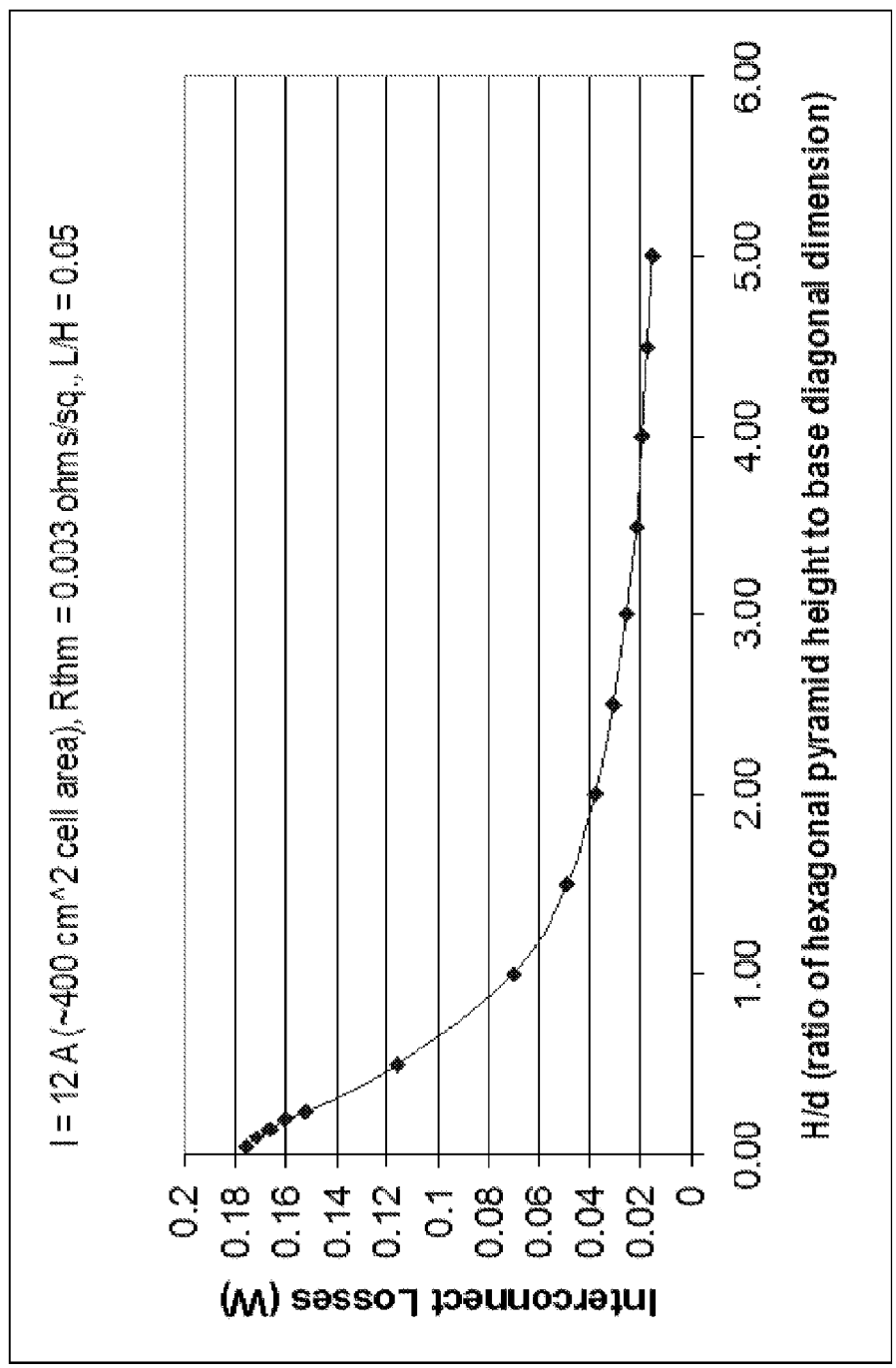

The following FIGURES show plots for various values of $R_{thm}$ and L/H. FIG. 75 shows $R_{thm}$ of 0.002Ω/square and L/H of 0.05; and FIG. 76 shows $R_{thm}$ of 0.002Ω/square and L/H of 0.01. FIG. 77 shows $R_{thm}$ of 0.005Ω/square and L/H of 0.01; and FIG. 78 shows $R_{thm}$ of 0.005Ω/square and L/H of 0.02. FIG. 79 shows $R_{thm}$ of 0.005Ω/square and L/H of 0.05; and FIG. 80 shows $R_{thm}$ of 0.005Ω/square and L/H of 0.1. FIG. 81 shows $R_{thm}$ of 0.01Ω/square and L/H of 0.05; and FIG. 82 shows $R_{thm}$ of 0.01Ω/square and L/H of 0.02. FIG. 83 shows $R_{thm}$ of 0.003Ω/square and L/H of 0.02; and FIG. 84 shows $R_{thm}$ of 0.003Ω/square and L/H of 0.05.

In summary, the disclosed subject matter provides multiple embodiments of pyramidal three-dimensional thin-film solar cells. The pyramidal three-dimensional thin-film solar cell comprises a semiconductor substrate with self-aligned selective emitter regions and self-aligned base diffusion regions. The pyramidal three-dimensional thin-film solar cell further includes self-aligned emitter contact metallization regions and self-aligned base contact metallization regions.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A pyramidal three-dimensional monocrystalline silicon thin-film solar cell comprising:
   a three-dimensional monocrystalline silicon thin-film solar cell substrate having an area measuring at least 125 mm×125 mm and having a set of structural surface topography features;
   said set of structural surface topography features at predetermined locations on said three-dimensional monocrystalline silicon thin-film solar cell substrate comprising a plurality of discrete and isolated inverted pyramidal cavities on a light capturing surface of said three-dimensional monocrystalline silicon thin-film solar cell substrate, said plurality of discrete and isolated inverted pyramidal cavities having a pyramidal cavity height in the range of 100 to 400 microns, said plurality of discrete and isolated pyramidal cavities having sloped sidewalls and having central axes substantially perpendicular to said light capturing surface of said three-dimensional monocrystalline silicon thin-film solar cell substrate;

said sloped sidewalls further comprising a plurality of interconnected continuous ridges interspersed among and bordering said plurality of discrete and isolated pyramidal cavities and associated to construct said monocrystalline silicon thin-film solar cell substrate as a free-standing substrate, and further associated with a set of geometrical aspect ratios and dimensions, said set of geometrical aspect ratios and dimensions comprising a ridge width ranging approximately between 0.5 to 5 microns on said light capturing side of said three-dimensional monocrystalline silicon thin-film solar cell substrate;

said three-dimensional monocrystalline silicon thin-film solar cell substrate and said set of structural surface topography features cooperating to comprise a free standing, self supporting three-dimensional monocrystalline silicon thin-film solar cell with sufficient mechanical rigidity for a reduced cell breakage rate in a solar cell production factory; and an in-situ doped base region comprising a first dopant formed within and comprising a substantial portion of said three-dimensional monocrystalline silicon thin-film solar cell substrate;

a doped emitter region comprising a second dopant of opposite polarity to said first dopant and formed on at least a portion of a surface of said three-dimensional monocrystalline silicon thin-film solar cell substrate and forming an emitter-base junction structure; and metallization regions contacting at least portions of said in-situ doped base region and said doped emitter region.

2. The pyramidal three-dimensional monocrystalline silicon thin-film solar cell of claim 1, wherein said doped emitter region comprises a selective emitter region.

3. The pyramidal three-dimensional monocrystalline silicon thin-film solar cell of claim 1, wherein said in-situ doped base region comprises a self-aligned base region, and further wherein said doped emitter region comprises a self-aligned emitter region, and further wherein said metallization regions comprise self-aligned metallization regions.

4. The pyramidal three-dimensional monocrystalline silicon thin-film solar cell of claim 1, wherein said plurality of discrete and isolated inverted pyramidal cavities comprises a plurality of polygonal-base discrete and isolated inverted pyramidal cavities.

5. The pyramidal three-dimensional monocrystalline silicon thin-film solar cell of claim 4, wherein said plurality of polygonal discrete and isolated inverted pyramidal cavities comprises a plurality of square-base discrete and isolated inverted pyramidal cavities.

6. The pyramidal three-dimensional monocrystalline silicon thin-film solar cell of claim 1, further comprising a rear mirror.

7. The pyramidal three-dimensional monocrystalline silicon thin-film solar cell of claim 6, wherein said rear mirror comprises an integrated rear mirror.

* * * * *